US012742115B2

(12) United States Patent
Shim et al.

(10) Patent No.: US 12,742,115 B2
(45) Date of Patent: Sep. 22, 2026

(54) ORGANOELECTROLUMINESCENT DEVICE USING POLYCYCLIC AROMATIC COMPOUNDS

(71) Applicant: SFC CO., LTD, Cheongju-si (KR)

(72) Inventors: So-young Shim, Cheongju-si (KR); Se-jin Yu, Cheongju-si (KR); Jin-hwi Cho, Cheongju-si (KR); Yong-woon Yang, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 1042 days.

(21) Appl. No.: 17/912,293

(22) PCT Filed: Mar. 18, 2021

(86) PCT No.: PCT/KR2021/003379

§ 371 (c)(1),
(2) Date: Sep. 16, 2022

(87) PCT Pub. No.: WO2021/187924

PCT Pub. Date: Sep. 23, 2021

(65) Prior Publication Data

US 2023/0140927 A1 May 11, 2023

(30) Foreign Application Priority Data

Mar. 18, 2020 (KR) ........................ 10-2020-0033291

(51) Int. Cl.

| | |
|---|---|
| ***H01L 51/54*** | (2006.01) |
| ***C09K 11/06*** | (2006.01) |
| ***H10K 50/15*** | (2023.01) |
| ***H10K 85/40*** | (2023.01) |
| ***H10K 85/60*** | (2023.01) |
| *H10K 50/85* | (2023.01) |
| *H10K 102/00* | (2023.01) |

(52) U.S. Cl.
CPC .............. *C09K 11/06* (2013.01); *H10K 50/15* (2023.02); *H10K 85/40* (2023.02); *H10K 85/621* (2023.02); *H10K 85/636* (2023.02); *H10K 85/652* (2023.02); *H10K 85/657* (2023.02); *H10K 85/6572* (2023.02); *H10K 85/6574* (2023.02); *H10K 85/6576* (2023.02); *H10K 85/658* (2023.02); *H10K 50/85* (2023.02); *H10K 2102/302* (2023.02)

(58) Field of Classification Search
None
See application file for complete search history.

(56) References Cited

U.S. PATENT DOCUMENTS

| | | | | |
|---|---|---|---|---|
| 2005/0221124 | A1 | 10/2005 | Hwang et al. | |
| 2014/0299856 | A1 | 10/2014 | Kitamura et al. | |
| 2016/0301005 | A1 | 10/2016 | Pfister et al. | |
| 2017/0213969 | A1 | 7/2017 | Shin et al. | |
| 2018/0301629 | A1 | 10/2018 | Hatakeyama et al. | |
| 2020/0411771 | A1 | 12/2020 | Kim et al. | |
| 2022/0352473 | A1* | 11/2022 | Kim ....................... | C09K 11/06 |

FOREIGN PATENT DOCUMENTS

| | | | | |
|---|---|---|---|---|
| CN | 104037361 | A | 9/2014 | |
| JP | 2005-290000 | A | 10/2005 | |
| JP | 2017-532753 | A | 11/2017 | |
| KR | 10-2005-0097670 | A | 10/2005 | |
| KR | 10-2015-0006199 | A | 1/2015 | |
| KR | 10-2017-0089094 | A | 8/2017 | |
| KR | 10-2019-0140421 | A | 9/2019 | |
| KR | 10-2053569 | B1 | 12/2019 | |
| WO | WO-2015041428 | A1 * | 3/2015 | ........... C07D 401/04 |
| WO | 2015/082056 | A1 | 6/2015 | |
| WO | WO 2019/240462 | A1 | 12/2019 | |

OTHER PUBLICATIONS

Machine translation of WO 2015/041428. (Year: 2015).*
International Search Report issued on Jul. 6, 2021, in counterpart PCT Patent Application No. PCT/KR2021/003379 (4 pages in Korean).
Japanese Office Action issued on Sep. 26, 2023, in counterpart Japanese Patent Application No. 2022-556274 (5 pages in Japanese).
Extended European search report issued on Feb. 8, 2024, in counterpart European Patent Application No. 21771374.2 (11 pages).
Chinese Office Action Issued on Feb. 12, 2026, in Counterpart Chinese Patent Application No. 202180029258.2 (8 Pages in English, 8 Pages in Chinese).

* cited by examiner

*Primary Examiner* — Andrew K Bohaty
(74) *Attorney, Agent, or Firm* — NSIP Law

(57) ABSTRACT

An organoelectroluminescent device according to the present invention employs compounds of characteristic structures as a hole transport material and a dopant material in a hole injection layer or a hole transport layer, and in an emissive layer, respectively, and thus can be driven at a low voltage and realize highly efficient emission characteristics with excellent external quantum efficiency. Thus, the organoelectroluminescent device may be industrially advantageously used in a flexible display device, a flexible display device, a single-color or white-color flat lighting device, a single-color or shite-color flexible lighting device, and the like.

8 Claims, No Drawings

ORGANOELECTROLUMINESCENT DEVICE USING POLYCYCLIC AROMATIC COMPOUNDS

CROSS REFERENCE TO RELATED APPLICATIONS

This application is a U.S. National Stage Application of International Application No. PCT/KR2021/003379, filed on Mar. 18, 2021, which claims the benefit under 35 USC 119 (a) and 365(b) of Korean Patent Application No. 10-2020-0033291 filed on Mar. 18, 2020 in the Korean Intellectual Property Office, the entire disclosures of which are incorporated herein by reference for all purposes.

TECHNICAL FIELD

The present invention relates to a highly efficient organic light-emitting device that exhibits remarkably improved luminous efficacy using a polycyclic aromatic derivative compound in an organic layer therein.

BACKGROUND ART

An organic light-emitting device is a self-luminous device that emits light when energy is released from excitons which are formed by recombination of electrons injected from an electron injection electrode (cathode) and holes injected from a hole injection electrode (anode) in a light-emitting layer. Such an organic light-emitting device attracts a great deal of attention as a next-generation light source due to applicability to full-color flat panel light-emitting displays based on advantages such as low driving voltage, high luminance, wide viewing angle, and rapid response speed thereof.

In order for the organic light-emitting device to exhibit the characteristics, the structure of the organic layer in the organic light-emitting device should be optimized, and the material constituting each organic layer, namely, a hole injection material, a hole transport material, a light-emitting material, an electron transport material, an electron injection material, or an electron blocking material should be based on stable and efficient ingredients. However, there is a continuing need to develop organic layer structures and respective materials thereof for stable and efficient organic light-emitting devices.

As such, there is a continuing need for the development of the structure of an organic light-emitting device capable of improving the luminous characteristics thereof and the development of novel materials supporting the structure.

DISCLOSURE

Technical Problem

Therefore, the present invention has been made in view of the above problems, and it is one object of the present invention to provide a highly efficient organic light-emitting device that can be operated at a low voltage and exhibits excellent external quantum efficiency based on compounds used for a light-emitting layer and compounds for a hole transport layer or a hole injection layer.

Technical Solution

In accordance with the present invention, the above and other objects can be accomplished by the provision of an organic light-emitting device including a first electrode, a second electrode facing the first electrode, and a hole injection layer or a hole transport layer and a light-emitting layer interposed between the first electrode and the second electrode.

The organic light-emitting device according to the present invention includes (i) at least one compound represented by the following [Formula A] in the hole injection layer or the hole transport layer, and (ii) a compound represented by the following [Formula B], [Formula C] or [Formula D] in the light-emitting layer.

[Formula A]

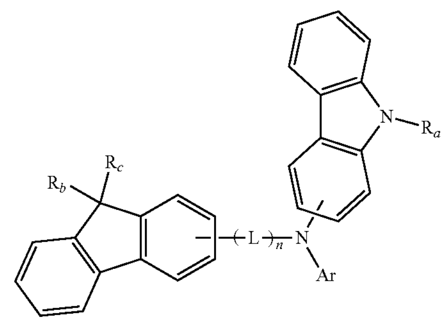

[Formula B]

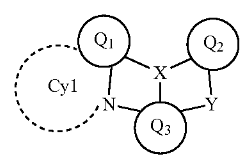

[Formula C]

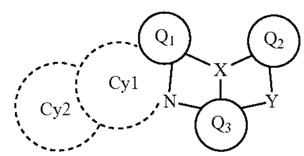

[Formula D]

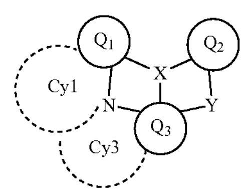

Details of structures of [Formula A] to [Formula D], the compounds obtained thereby, and substituents thereof will be described later.

Advantageous Effects

The organic light-emitting device according to the present invention can be operated at a lower driving voltage, and exhibits excellent external quantum efficiency and thus high luminous efficacy by utilizing the compounds having characteristic structures as the hole transport material and the dopant material, respectively, in the hole injection layer or the hole transport layer, and the light-emitting layer.

Best Mode

Hereinafter, the present invention will be described in detail with reference to the annexed drawings.

In one aspect, the present invention is directed to an organic light-emitting device including a first electrode, a second electrode facing the first electrode, and a hole injection layer or a hole transport layer and a light-emitting layer interposed between the first electrode and the second electrode, wherein (i) the hole injection layer or the hole transport layer includes at least one compound represented by the following [Formula A] and (ii) the light-emitting layer includes a compound represented by the following [Formula B] to [Formula D]. Based on this configuration, a highly efficient organic light-emitting device can be obtained.

[Formula A]

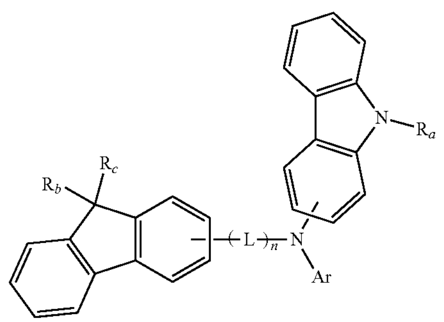

wherein

L is a single bond, a substituted or unsubstituted aromatic C6-C50 hydrocarbon ring, or a substituted or unsubstituted C2-C50 aromatic heterocyclic ring, and n is an integer of 1 to 3, with the proviso that when n is 2 or more, L's are identical to or different from each other.

In an embodiment, in [Formula A], L is a single bond or a substituted or unsubstituted aromatic C6-C50 hydrocarbon ring, wherein the substituted or unsubstituted aromatic C6-C50 hydrocarbon ring is a substituted or unsubstituted phenyl group, a substituted or unsubstituted biphenyl group, a substituted or unsubstituted naphthyl group, a substituted or unsubstituted phenanthryl group, or a substituted or unsubstituted fluorenyl group.

Ar is selected from a substituted or unsubstituted C5-C50 aryl group and a substituted or unsubstituted C2-C50 heteroaryl group.

$R_a$ to $R_c$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group.

Also, $R_b$ and $R_c$ are bonded to each other to further form an alicyclic or aromatic monocyclic or polycyclic ring.

Next, the compounds represented by the following [Formula B] to [Formula D] used in the light-emitting layer in the organic light-emitting device according to the present invention will be described as follows.

[Formula B]

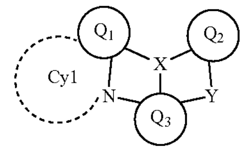

[Formula C]

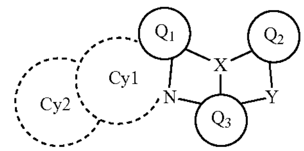

[Formula D]

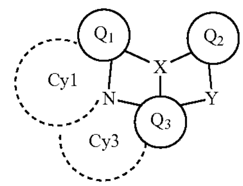

wherein $Q_1$ to $Q_3$ are identical to or different from each other, and are each independently a substituted or unsubstituted aromatic C6-C50 hydrocarbon ring, or a substituted or unsubstituted C2-050 aromatic heterocyclic group, and Y is each independently selected from N—$R_1$, $CR_2R_3$, O, S, Se, and $SiR_4R_5$, with the proviso that Y's are identical to or different from each other.

In an embodiment of the present invention, in [Formula B] to [Formula D], Y may be $NR_1$.

X is selected from B, P and P═O and, in a preferred embodiment of the present invention, X is B, and in this case, a polycyclic aromatic derivative compound containing boron (B) is structurally used as a dopant in the light-emitting layer of a device to impart high efficiency to the organic light-emitting device.

$R_1$ to $R_5$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group.

Each of $R_1$ to $R_5$ is bonded to the ring $Q_1$ to $Q_3$ to further form an alicyclic or aromatic monocyclic or polycyclic ring, and $R_2$ and $R_3$, and $R_4$ and $R_5$ are bonded to each other to further form an alicyclic or aromatic monocyclic or polycyclic ring.

In addition, in [Formula B] to [Formula D], each of Cy1, Cy2, and Cy3 represents a moiety to form a ring as follows.

Cy1 is linked to an adjacent nitrogen (N) atom and an aromatic carbon atom in the adjacent $Q_1$ ring to form a fused ring including a nitrogen (N) atom, an aromatic carbon atom in the $Q_1$ ring to which the nitrogen (N) atom is bonded, and an aromatic carbon atom in the $Q_1$ ring to which Cy1 is bonded.

In addition, the fused ring formed by Cy1 is a substituted or unsubstituted C2-C5 alkylene group, provided that the nitrogen (N) atom, the aromatic carbon atom in the $Q_1$ ring to which the nitrogen (N) atom is bonded, and the aromatic carbon atom in the $Q_1$ ring to which Cy1 is bonded are excluded.

Cy2 is added to Cy1 to form a saturated hydrocarbon ring.

In addition, the ring formed by Cy2 is a substituted or unsubstituted C2-C5 alkylene group, provided that the carbon atom included in Cy1 is excluded.

Cy3 is linked to a carbon atom bonded to a nitrogen atom in the adjacent Cy1, and an aromatic carbon atom in the $Q_3$ ring to form a fused ring including the aromatic carbon atom in the $Q_3$ ring to which Cy3 is bonded, the nitrogen (N) atom and the carbon atom in Cy1 bonded to the nitrogen (N) atom.

In addition, the fused ring formed by Cy3 is a substituted or unsubstituted C1-C4 alkylene group, provided that the aromatic carbon atom in the $Q_3$ ring to which Cy3 is bonded, the nitrogen (N) atom and the carbon atom in Cy1 bonded to the nitrogen (N) atom are excluded.

The compounds represented by [Formula B] to [Formula D] may form various polycyclic aromatic skeleton structures based on the definitions of substituents given above. The specific structures thereof can be clearly identified from specific compounds described later and a high-efficiency organic light-emitting device can be realized by satisfying the characteristics required for the compounds used for the light-emitting layer of the organic light-emitting device based thereon.

Meanwhile, as used herein, the term "substituted" indicates substitution of various substituents defined in [Formula A] to [Formula D] with one or more substituents selected from deuterium, a cyano group, a halogen group, a hydroxyl group, a nitro group, an alkyl group, a halogenated alkyl group, a cycloalkyl group, an alkenyl group, an alkynyl group, a heteroalkyl group, an aryl group, an arylalkyl group, an alkylaryl group, a heteroaryl group, a heteroarylalkyl group, an alkoxy group, an amine group, a silyl group, an aryloxy group and a mixed aliphatic-aromatic ring group, or substitution with a substituent including two or more of the substituents linked to each other. The term "unsubstituted" in the same definition indicates having no substituent.

In addition, the range of the number of the carbon atoms of the alkyl group or aryl group in the term "substituted or unsubstituted C1-C30 alkyl group", "substituted or unsubstituted C6-C50 aryl group" or the like refers to the total number of carbon atoms constituting the alkyl or aryl moiety when the corresponding group is not substituted without considering the number of carbon atoms in the substituent(s). For example, a phenyl group substituted at the para position with a butyl group corresponds to an aryl group having 6 carbon atoms substituted with a butyl group having 4 carbon atoms.

In addition, as used herein, the expression "a substituent is bonded to an adjacent substituent to form a ring" means that the corresponding substituent is bonded to the adjacent substituent to form a substituted or unsubstituted alicyclic or aromatic ring, and the term "adjacent substituent" may mean a substituent substituted for an atom which is directly attached to an atom substituted with the corresponding substituent, a substituent sterically disposed at the nearest position to the corresponding substituent, or another substituent substituted for an atom which is substituted with the corresponding substituent. For example, two substituents substituted at the ortho position in a benzene ring and two substituents substituted at the same carbon in the aliphatic ring may be considered "adjacent" to each other.

As used herein, the alkyl group may be a linear or branched alkyl group. Examples of the alkyl group include, but are not limited to, a methyl group, an ethyl group, a propyl group, an n-propyl group, an isopropyl group, a butyl group, an n-butyl group, an isobutyl group, a tert-butyl group, a sec-butyl group, a 1-methylbutyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group, and the like.

As used herein, the alkenyl group may include a linear or branched alkenyl group and may be further substituted with another substituent. Specifically, examples of the alkenyl group include, but are not limited to, a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group, and the like.

As used herein, the alkynyl group may also include a linear or branched alkynyl group, and may be further substituted with another substituent, and examples of the substituent may include, but are not limited to, ethynyl, 2-propynyl, and the like.

As used herein, the aromatic hydrocarbon ring or the aryl group may be monocyclic or polycyclic, examples of the monocyclic aryl group include a phenyl group, a biphenyl group, a terphenyl group, a stilbene group, and the like, and examples of the polycyclic aryl group include, but are not limited to, a naphthyl group, an anthracenyl group, a phenanthrenyl group, a pyrenyl group, a perylenyl group, a tetracenyl group, a chrysenyl group, a fluorenyl group, an acenaphthcenyl group, a triphenylene group, a fluoranthene group, and the like, but the scope of the present invention is not limited thereto.

As used herein, the aromatic heterocyclic or heteroaryl group is an aromatic ring containing at least one heteroatom and examples thereof include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups and the like.

As used herein, the aliphatic hydrocarbon ring refers to a non-aromatic ring that contains only carbon and hydrogen atoms, for example, includes a monocyclic or polycyclic ring, and may be further substituted with another substituent. The term "polycyclic" means that the polycyclic group may be directly attached to or fused with at least one other cyclic group, the other cyclic group may be an aliphatic hydrocarbon ring, or a different type of ring group, for example, an aliphatic heterocyclic group, an aryl group, a heteroaryl group, and the like. Specifically, examples thereof include, but are not limited to, cycloalkyls such as a cyclopropyl group, a cyclobutyl group, a cyclopentyl group, an adamantyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, and a cyclooctyl group, cycloalkanes such as cyclohexane and cyclopentane, and cycloalkenes such as cyclohexene and cyclobutene.

As used herein, the aliphatic heterocyclic ring refers to an aliphatic ring that contains at least one of heteroatoms such as O, S, Se, N and Si, also includes a monocyclic or polycyclic ring, and may be further substituted with another substituent. The term "polycyclic" means that the polycyclic group may be directly attached to or fused with at least one other cyclic group, and the other cyclic group may be an aliphatic hydrocarbon ring, or a different type of ring group, for example, an aliphatic heterocyclic group, an aryl group, a heteroaryl group, or the like.

As used herein, the mixed aliphatic-aromatic ring group refers to a ring in which two or more rings are attached to and fused with each other, and aliphatic and aromatic rings are fused together to be overall non-aromatic, and a polycyclic mixed aliphatic-aromatic ring may contain a heteroatom selected from N, O, P and S, in addition to C.

As used herein, specifically, the alkoxy group may be methoxy, ethoxy, propoxy, isobutyloxy, sec-butyloxy, pentyloxy, iso-amyloxy, hexyloxy, or the like, but is not limited thereto.

As used herein, the silyl group is represented by —$SiH_3$, and may be an alkylsilyl group, an arylsilyl group, an alkylarylsilyl group, an arylheteroarylsilyl group, or the like, and specific examples of the silyl group include trimethylsilyl, triethylsilyl, triphenylsilyl, trimethoxysilyl, dimethoxyphenylsilyl, diphenylmethylsilyl, diphenylvinylsilyl, methylcyclobutylsilyl, dimethylfurylsilyl, and the like.

As used herein, the amine group is represented by —$NH_2$, or may be an alkylamine group, an arylamine group, an arylheteroarylamine group, or the like. The arylamine group refers to amine substituted with aryl, the alkylamine group refers to amine substituted with alkyl, and the arylheteroarylamine group refers to an amine substituted with aryl and heteroaryl. For example, the arylamine group includes a substituted or unsubstituted monoarylamine group, a substituted or unsubstituted diarylamine group, or a substituted or unsubstituted triarylamine group. The aryl group and the heteroaryl group in the arylamine group and the arylheteroarylamine group may be a monocyclic aryl group or a monocyclic heteroaryl group, or a polycyclic aryl group or a polycyclic heteroaryl group. The arylamine group and the arylheteroarylamine group that contain two or more aryl groups and two or more heteroaryl groups, respectively, include a monocyclic aryl group (heteroaryl group), a polycyclic aryl group (heteroaryl group), or both of the monocyclic aryl group (heteroaryl group) and the polycyclic aryl group (heteroaryl group). In addition, the aryl group and the heteroaryl group in the arylamine group and the arylheteroarylamine group may be selected from examples of aryl groups and heteroaryl groups described above.

As used herein, examples of the aryl group in the aryloxy group and the arylthioxy group are identical to examples of the aryl group described above and specifically, examples of the aryloxy group include a phenoxy group, a p-tolyloxy group, an m-tolyloxy group, a 3,5-dimethylphenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, and examples of the arylthioxy group include, but are not limited to, a phenylthioxy group, a 2-methylphenylthioxy group, a 4-tert-butylphenylthioxy group, and the like.

In the present invention, examples of the halogen group include fluorine, chlorine, bromine, and iodine.

More specifically, the compound represented by [Formula A] according to the present invention is selected from the following [Compound 1] to [Compound 255], which clearly show specific substituents, but these compounds should not be construed as limiting the scope of [Formula A] according to the present invention.

1

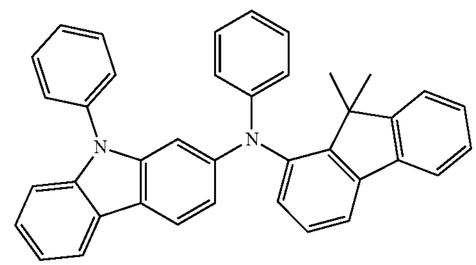

2

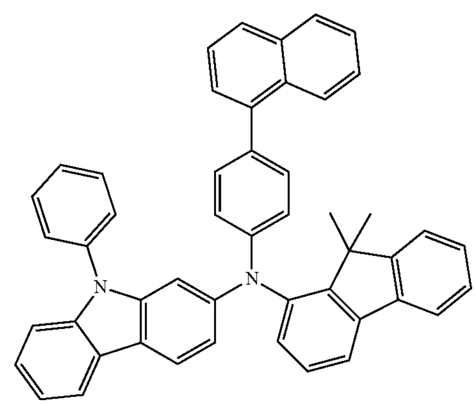

3

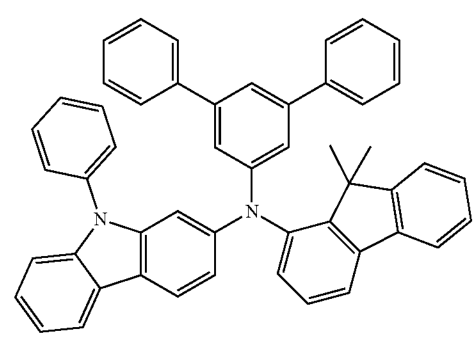

-continued
4
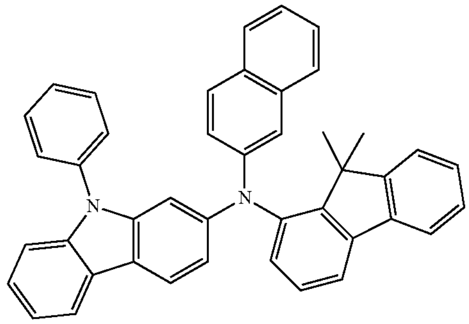
5
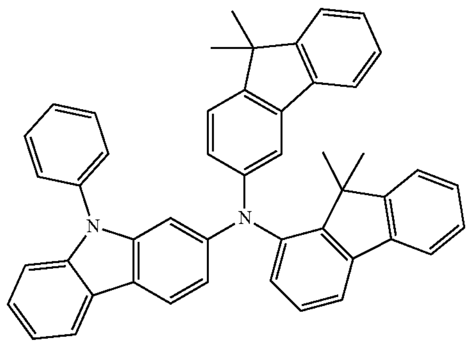
6
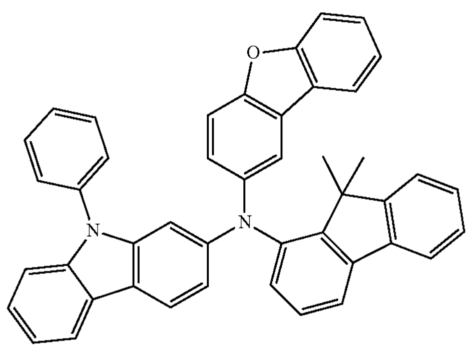
7
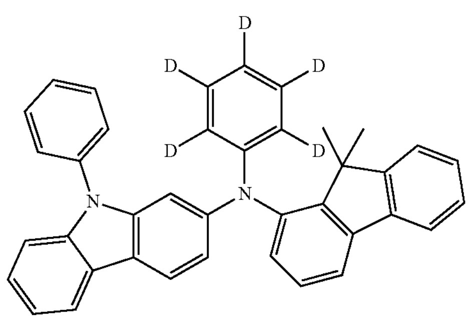
8
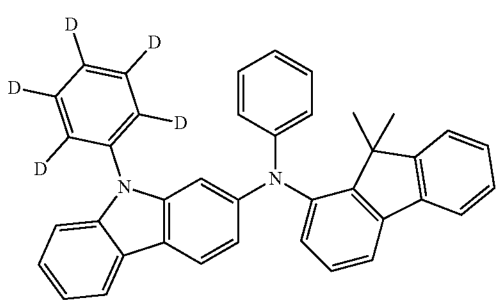
-continued
9
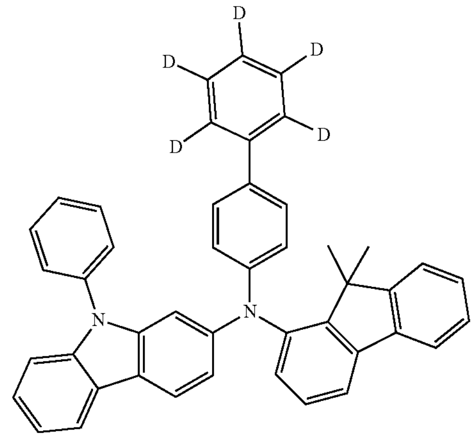
10
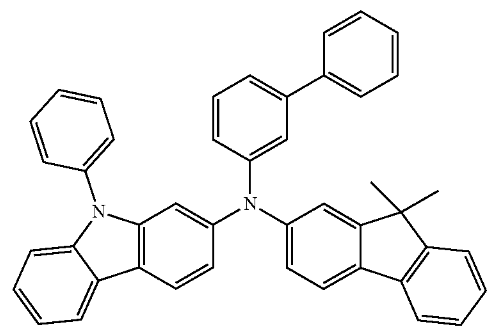
11
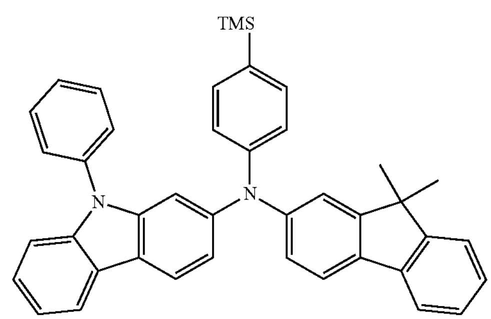
12
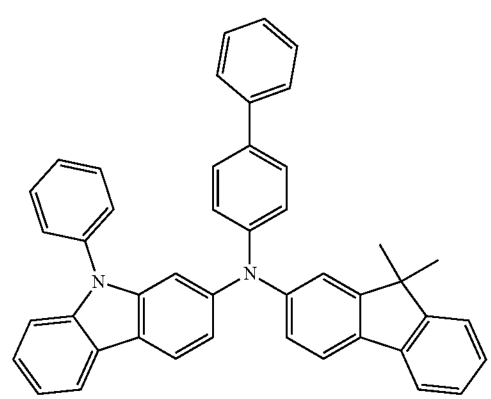

-continued
13
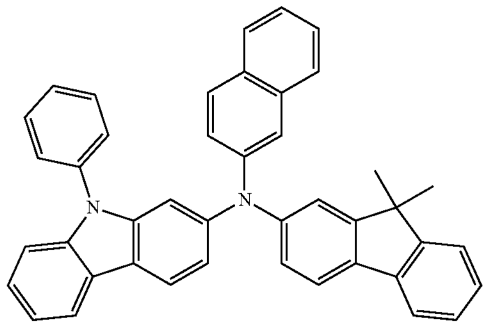
14
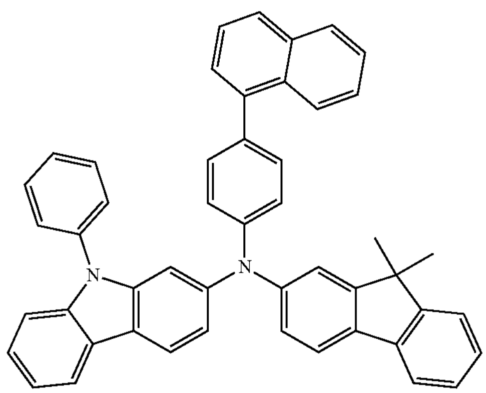
15
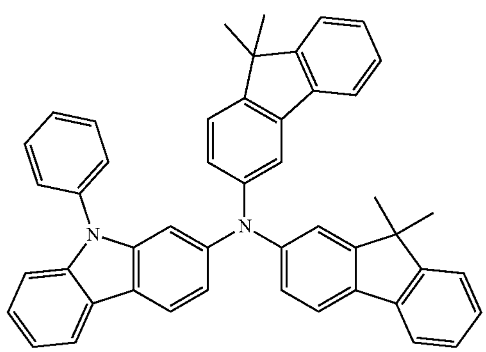
16
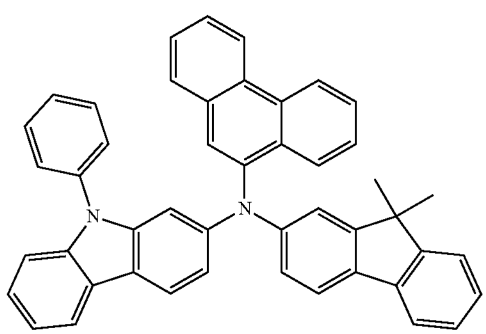
-continued
17
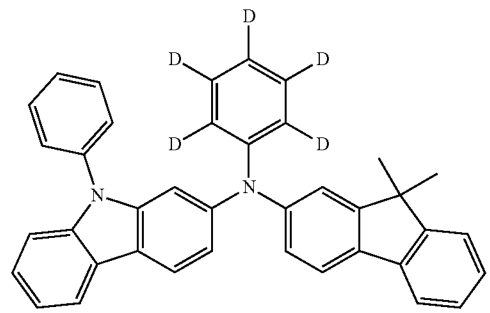
18
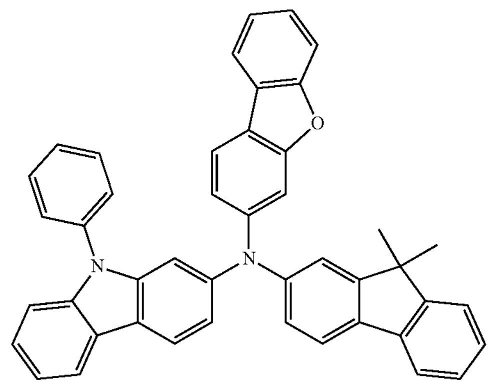
19
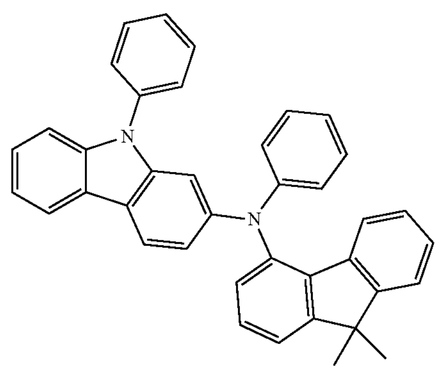
20
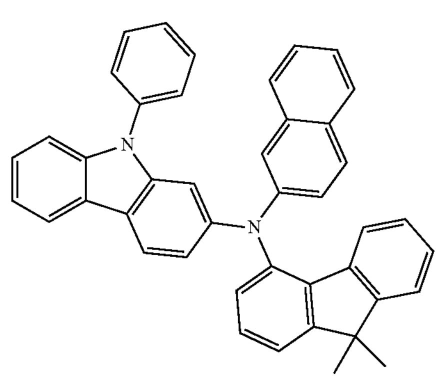

-continued
21
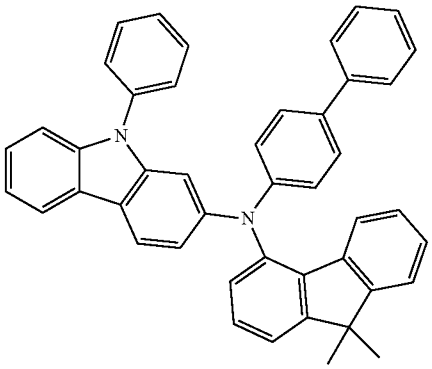
22
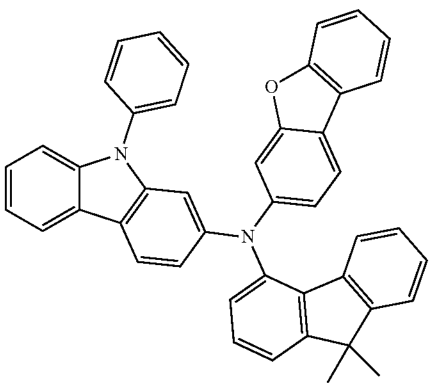
23
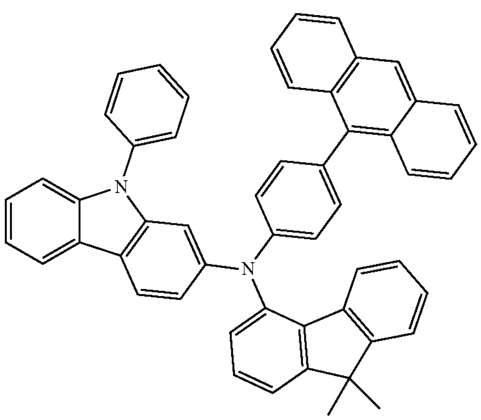
24
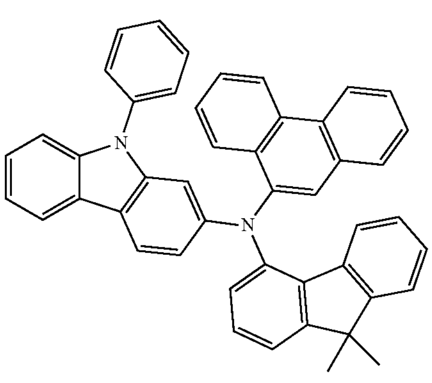
-continued
25
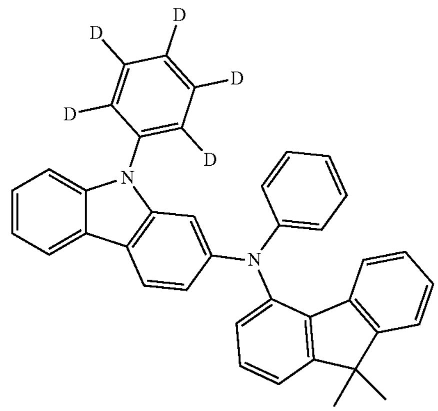
26
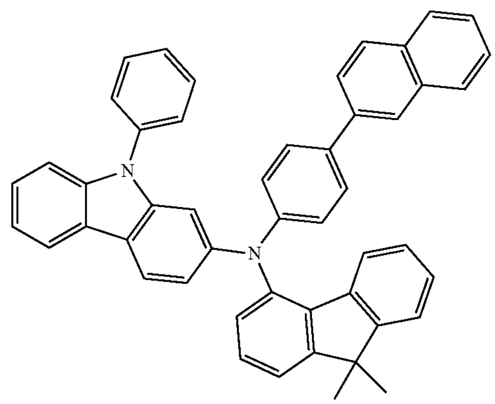
27
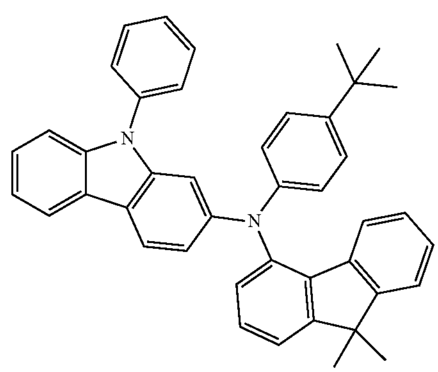
28
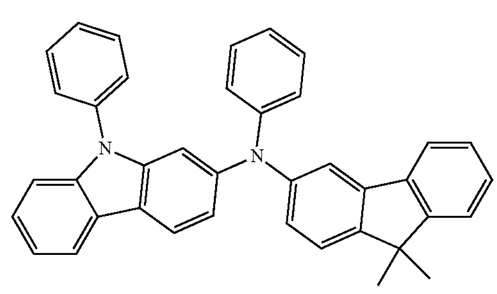

-continued
29
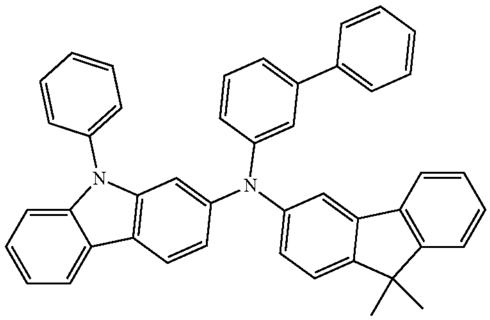
30
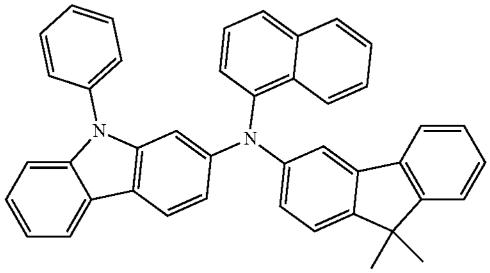
31
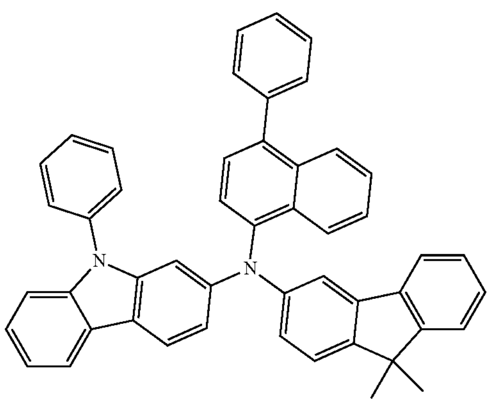
32
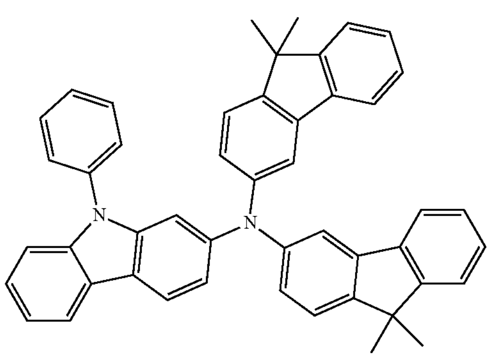
-continued
33
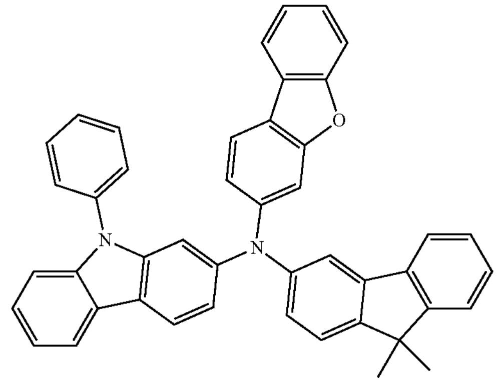
34
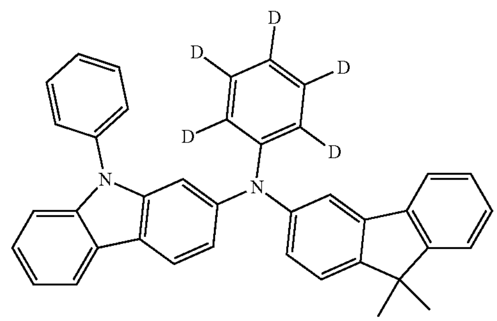
35
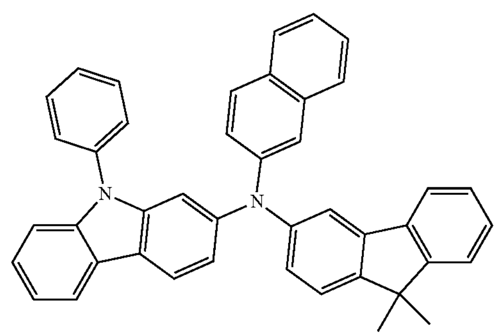
36
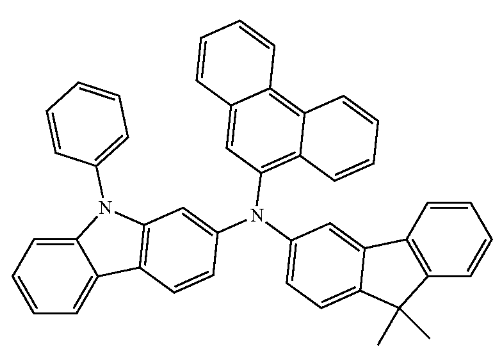

-continued
37
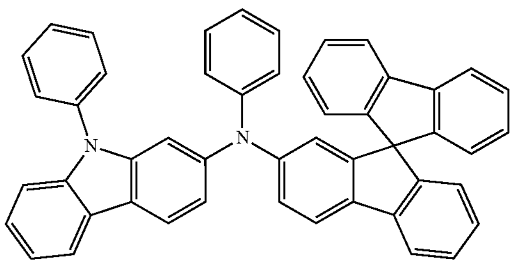
38
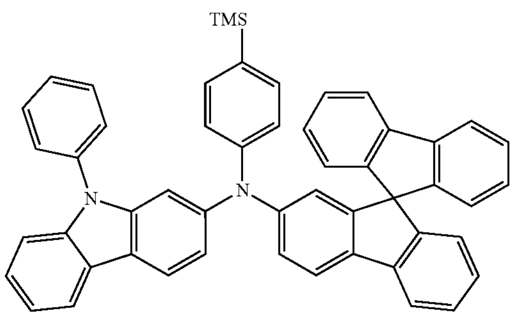
39
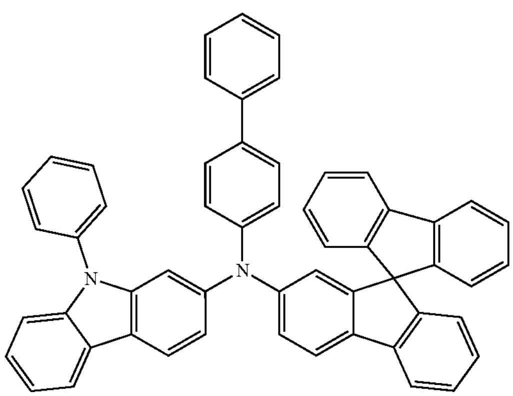
40
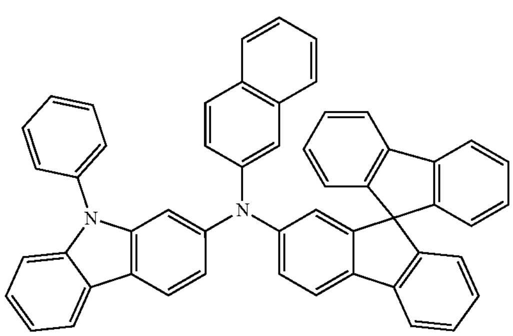
-continued
41
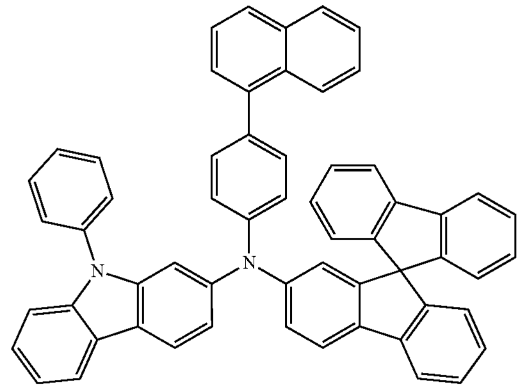
42
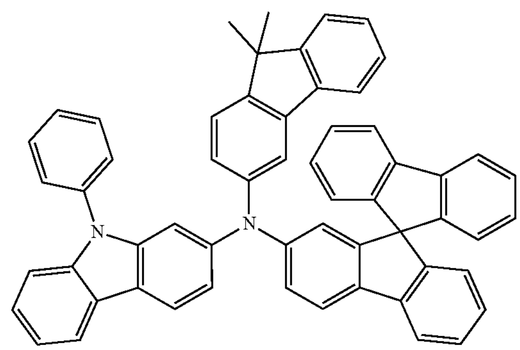
43
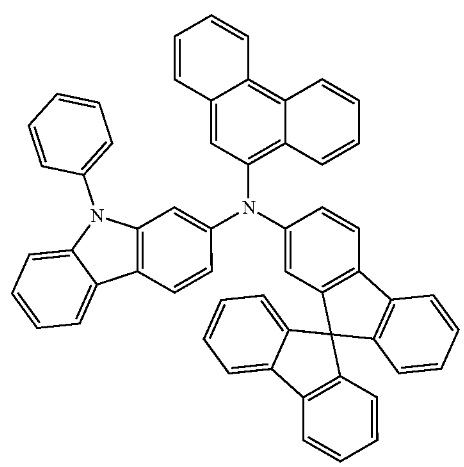

-continued
44
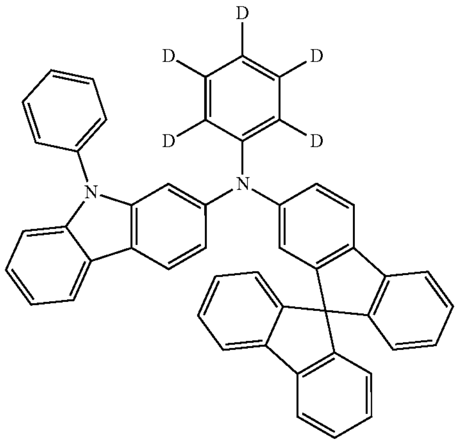
45
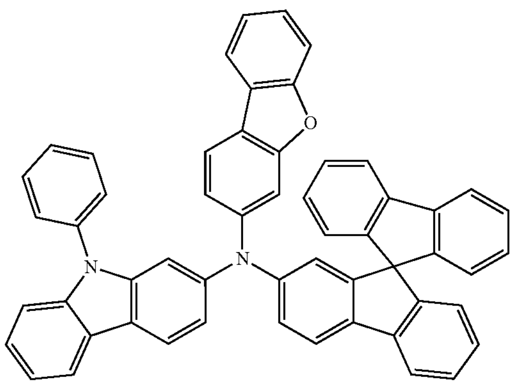
46
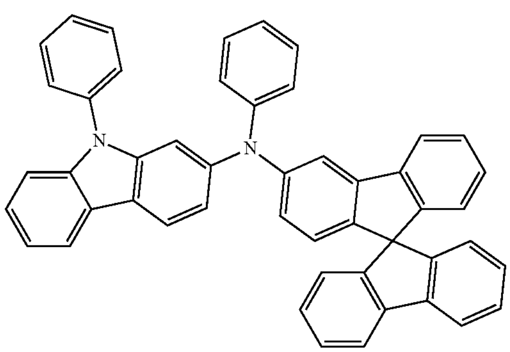
47
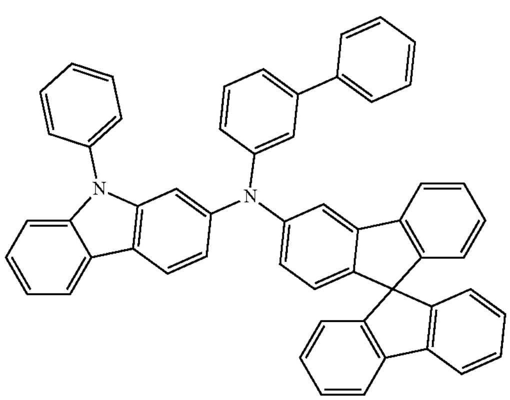
-continued
48
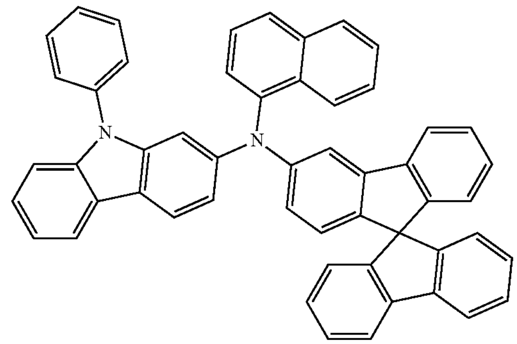
49
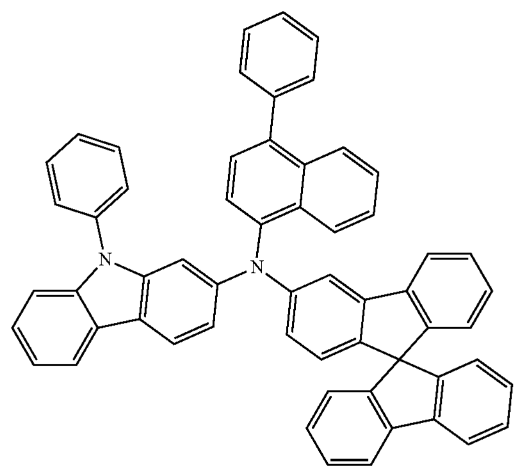
50
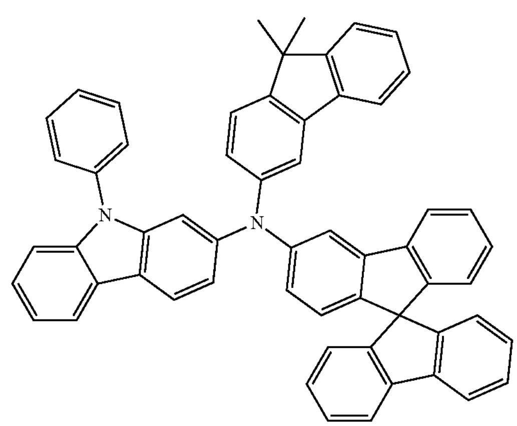

-continued
51
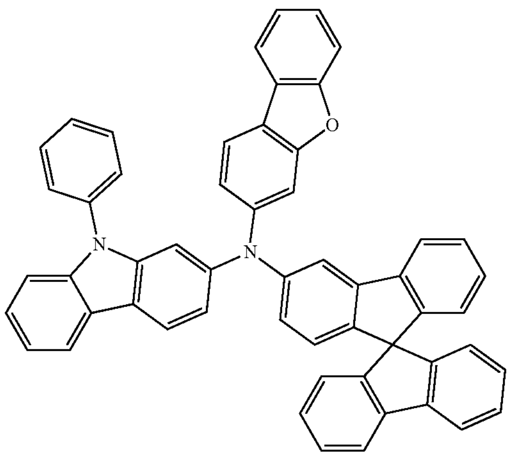
52
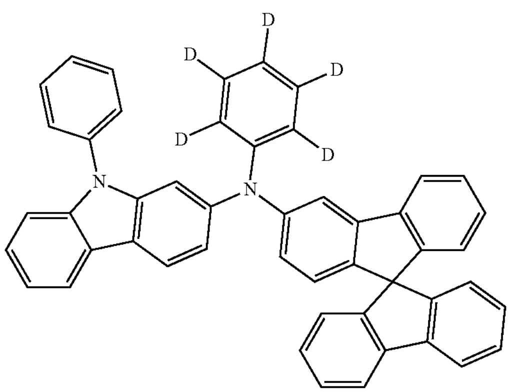
53
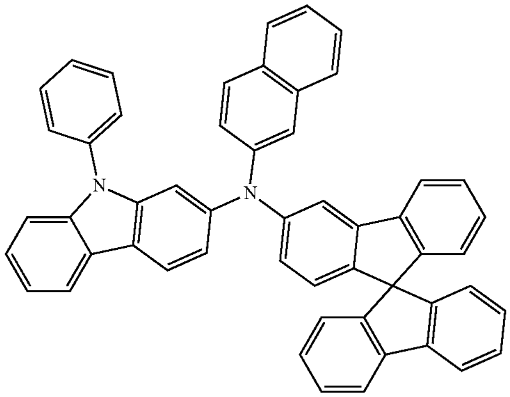
-continued
54
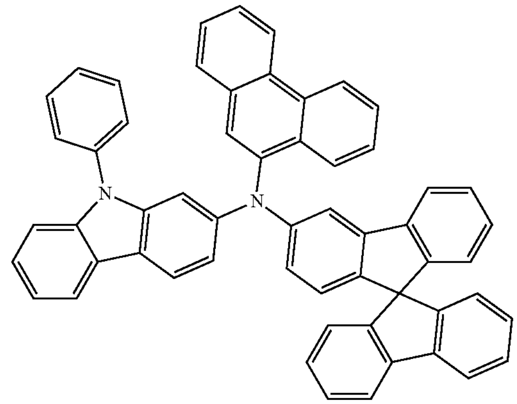
55
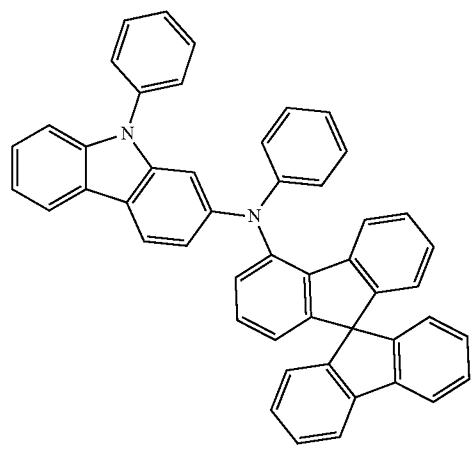
56
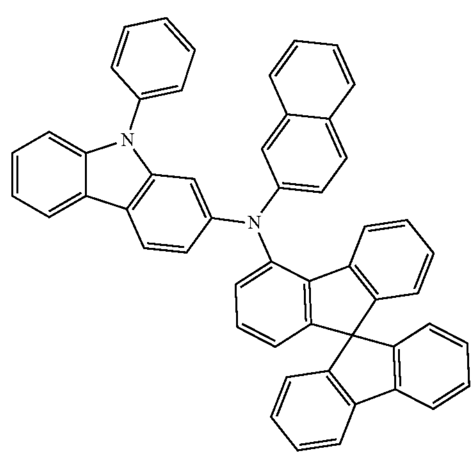

-continued
57
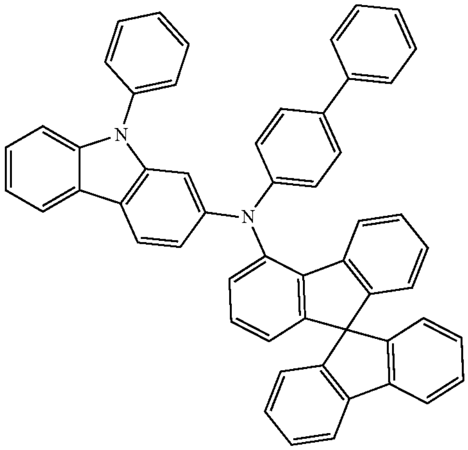
58
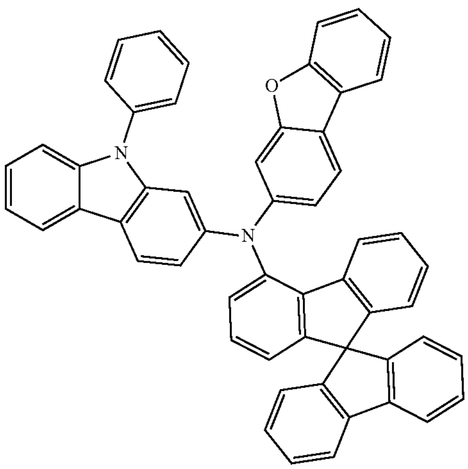
59
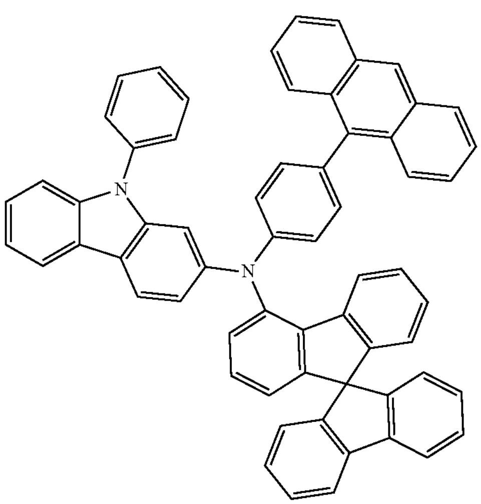
-continued
60
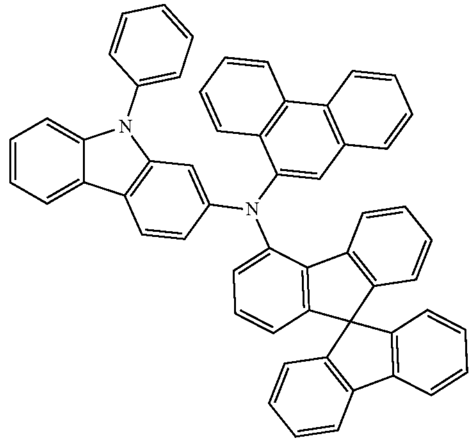
61
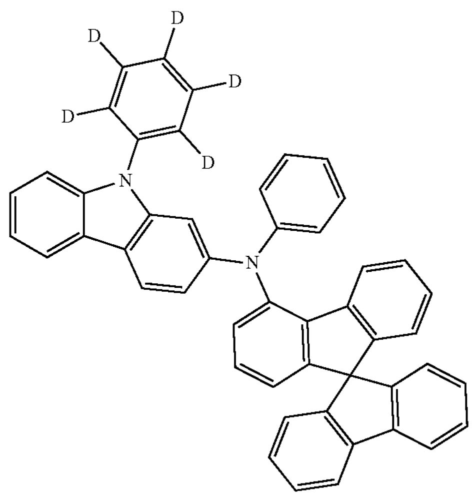
62
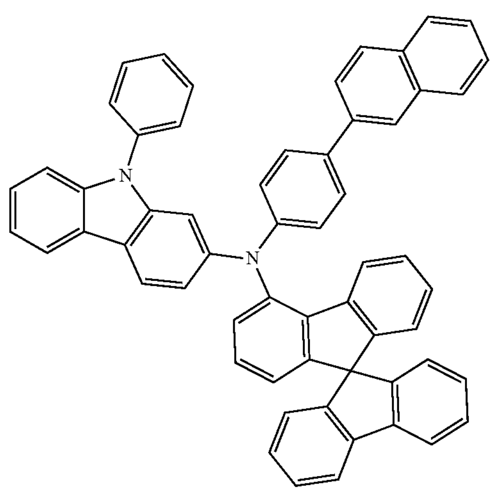

-continued
63
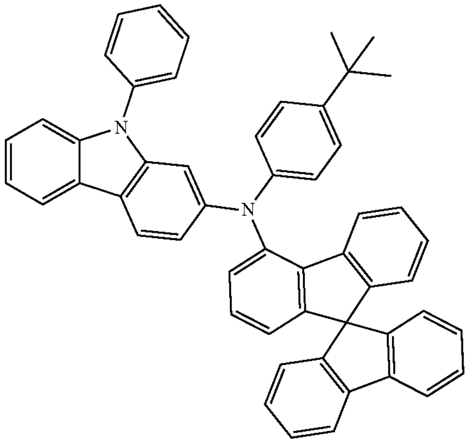
64
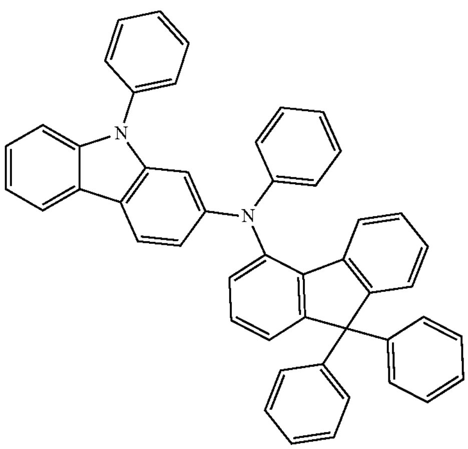
65
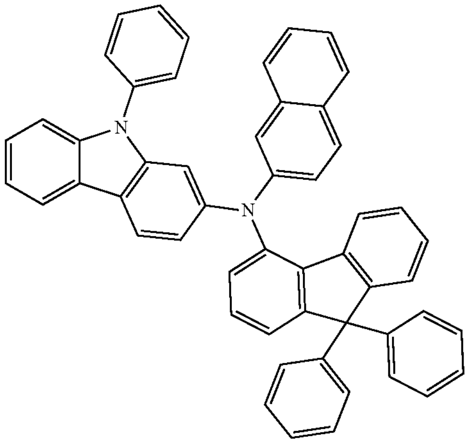
-continued
66
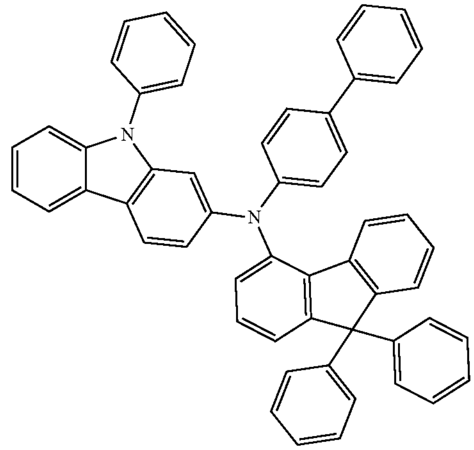
67
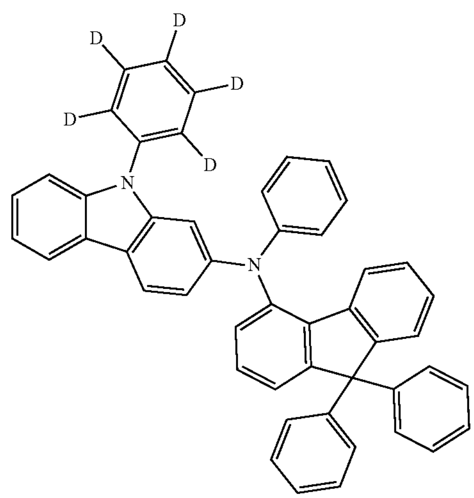
68
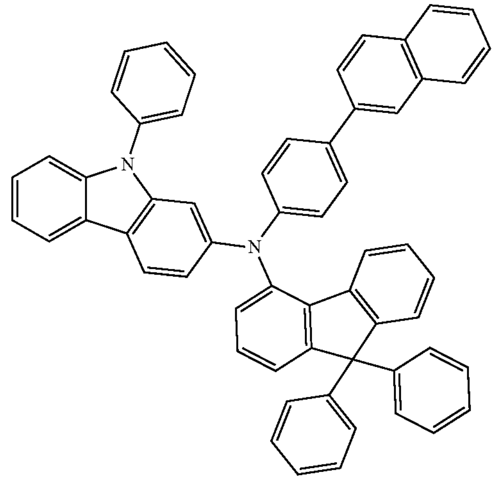

-continued
69
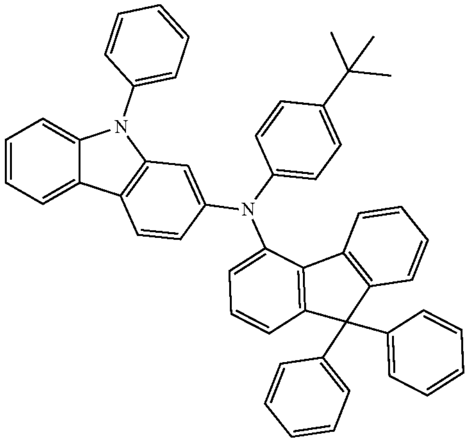
70
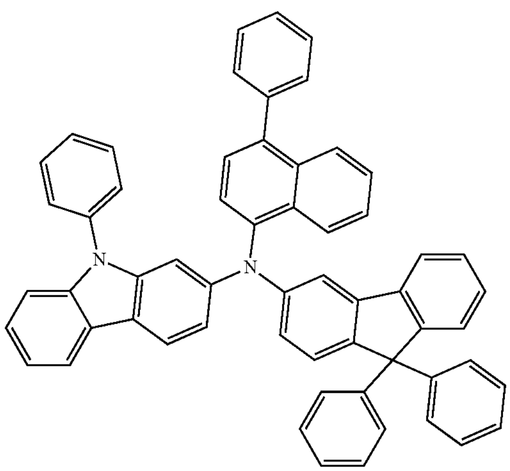
71
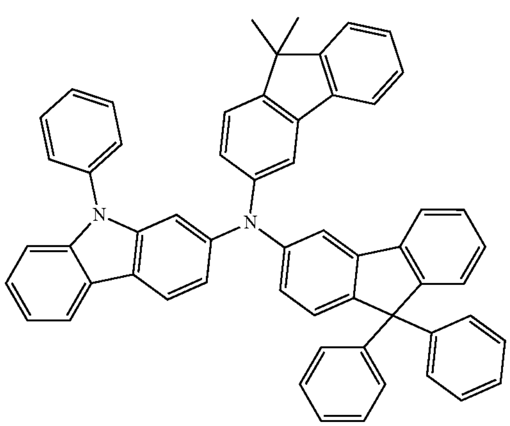
-continued
72
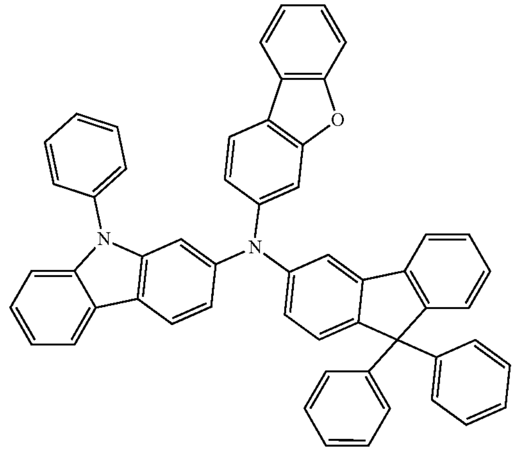
73
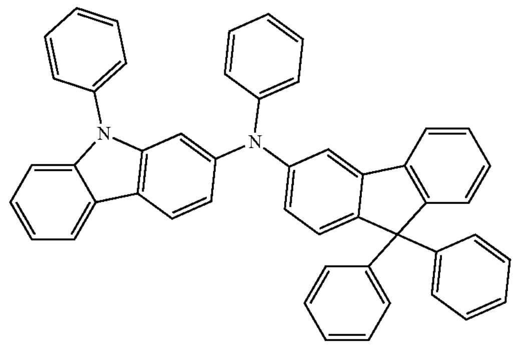
74
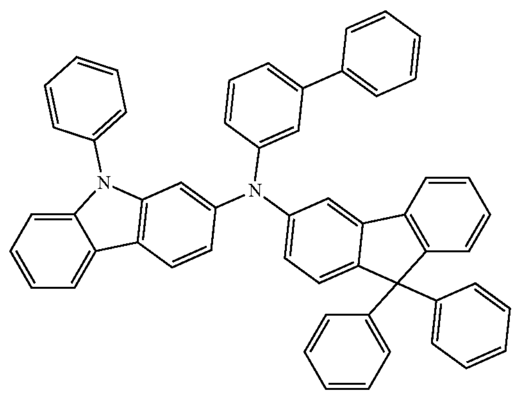
75
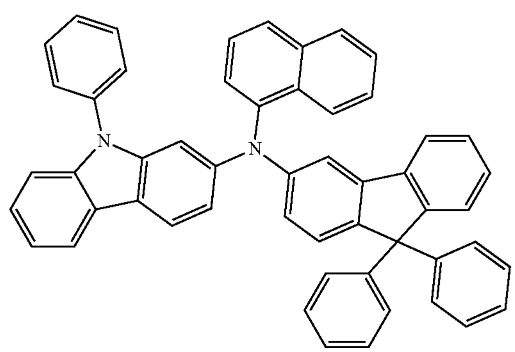

-continued
76
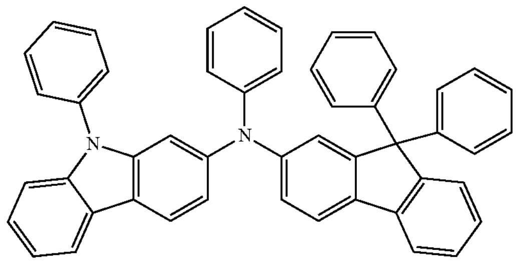
77
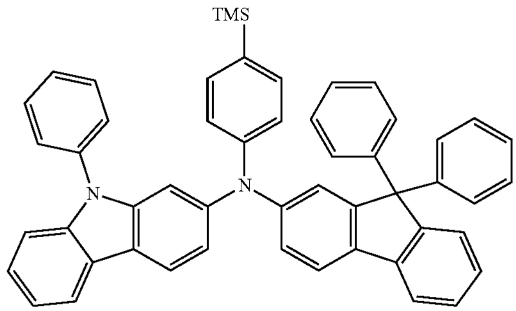
78
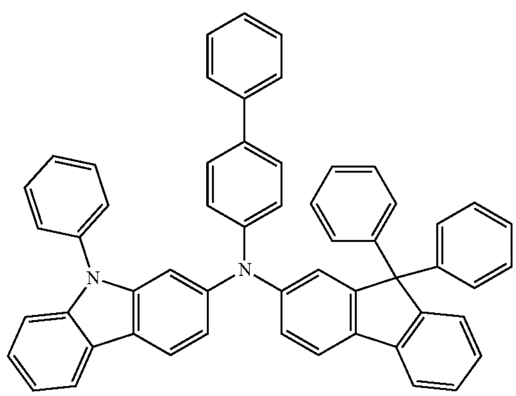
79
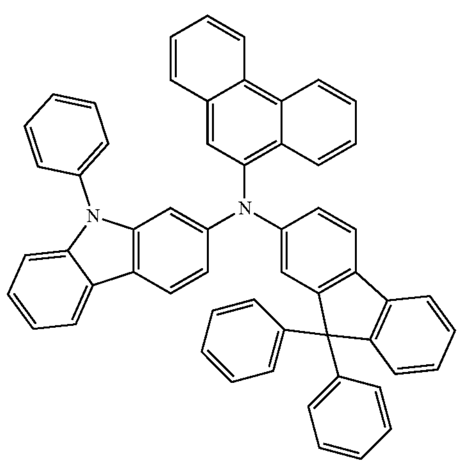
-continued
80
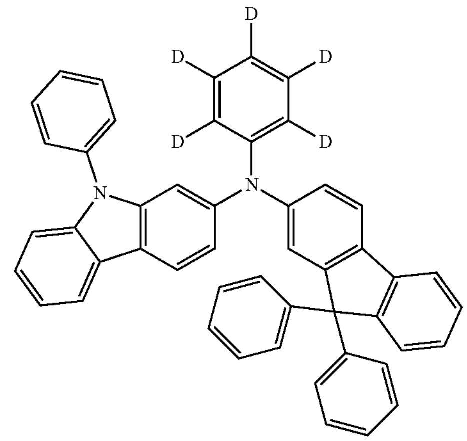
81
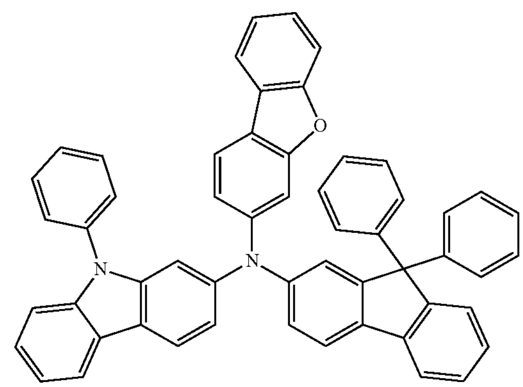
82
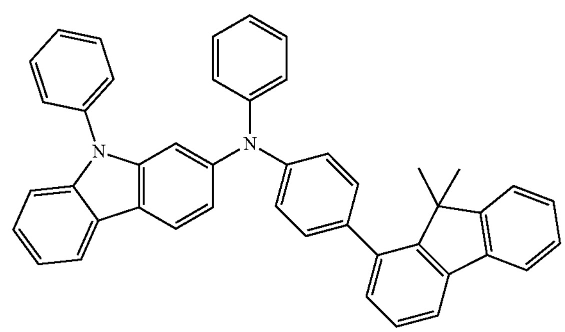
83
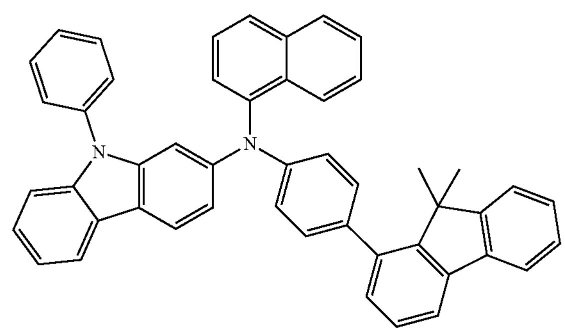

-continued
84
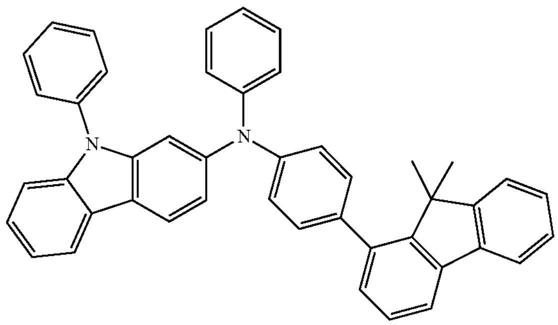
85
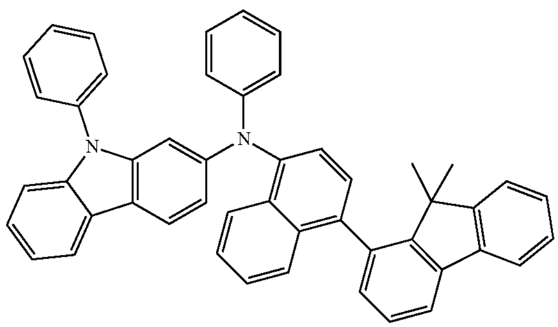
86
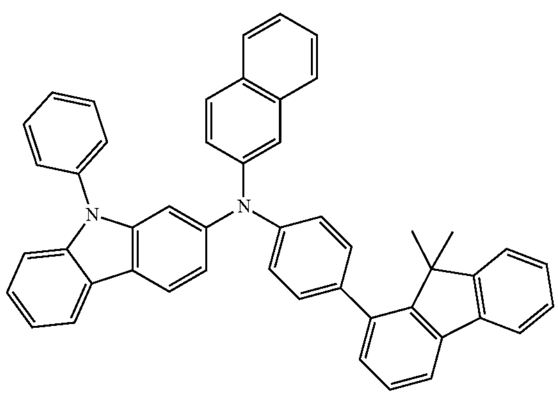
87
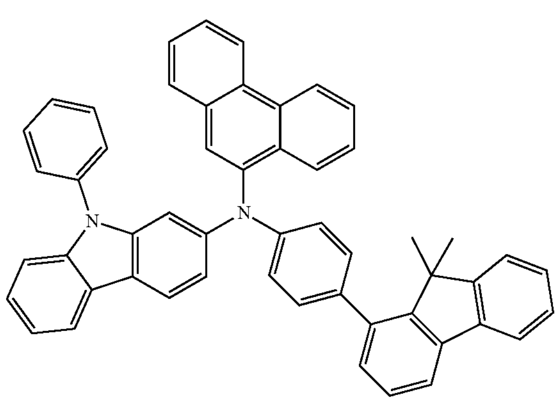
-continued
88
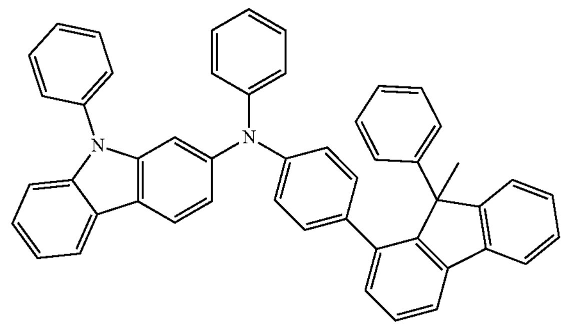
89
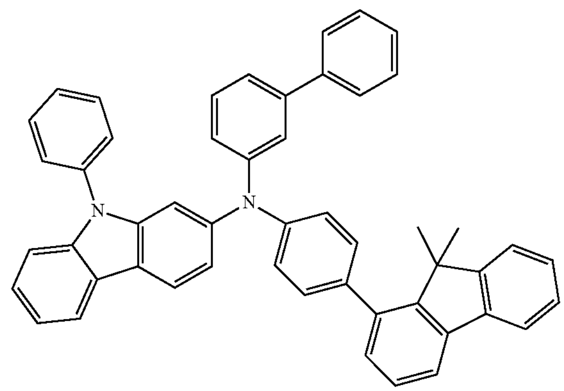
90
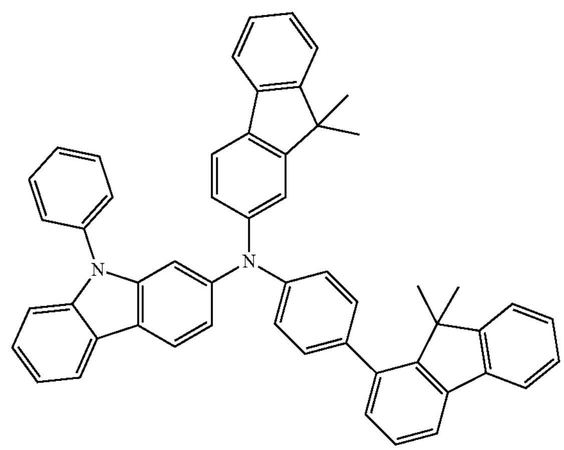
91
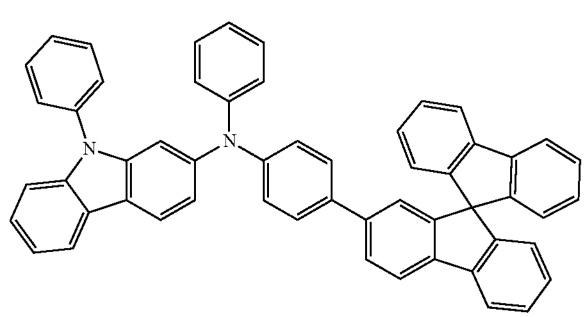

92
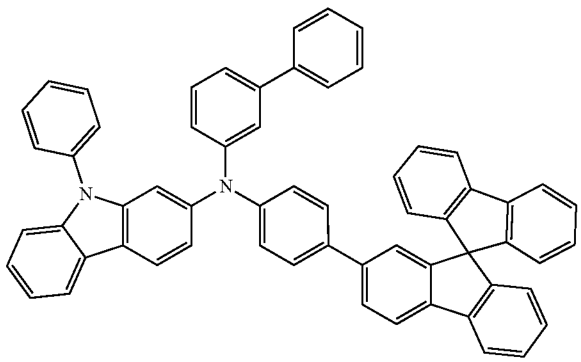
93
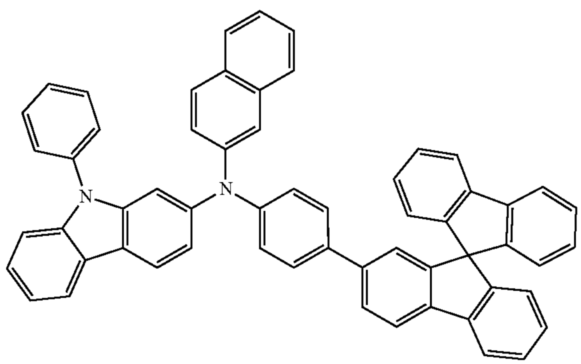
94
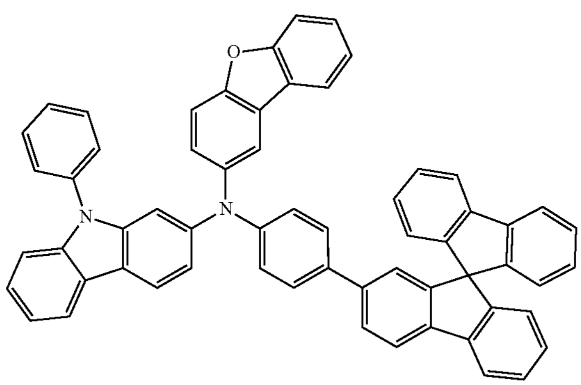
95
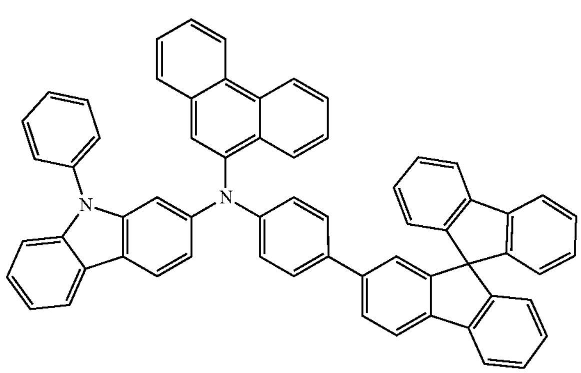
96
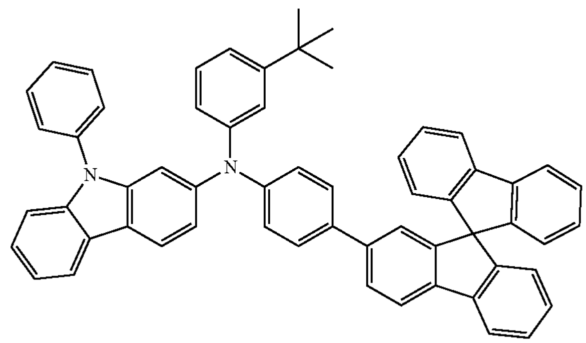
97
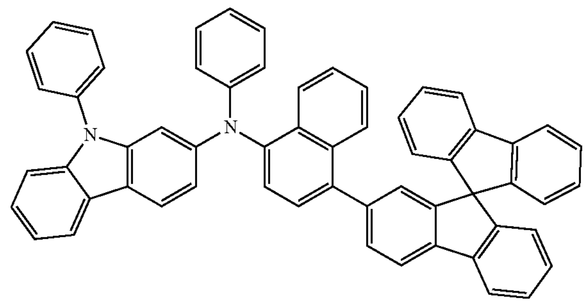
98
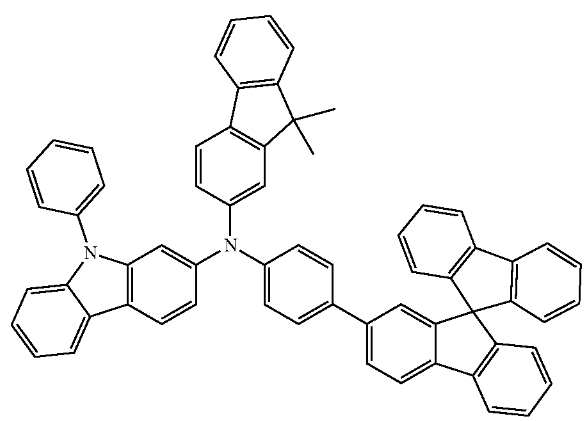
99
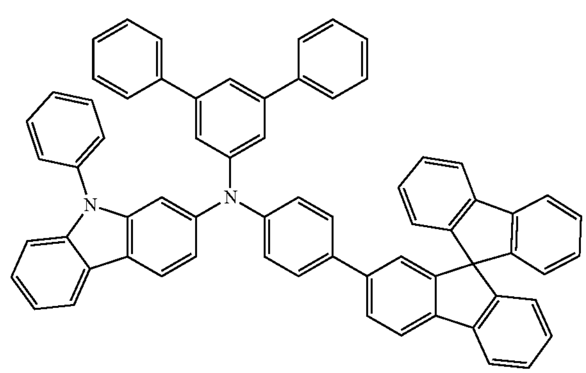

100
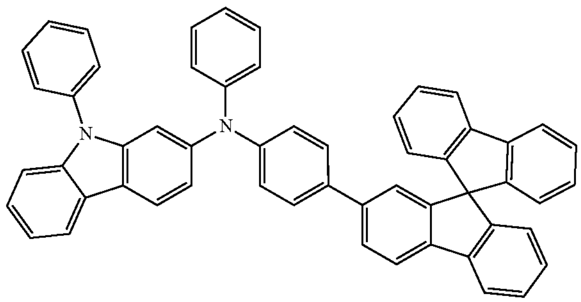
101
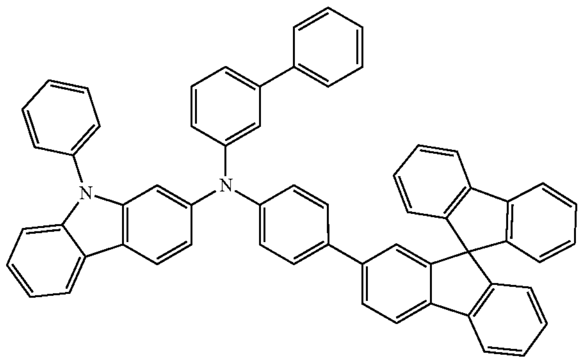
102
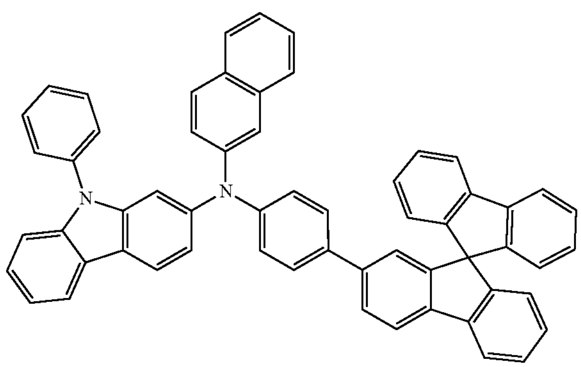
103
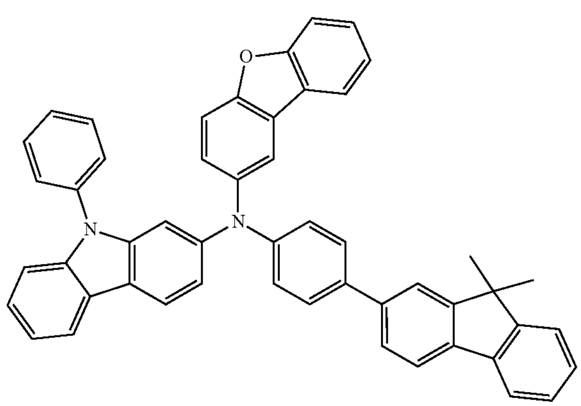
104
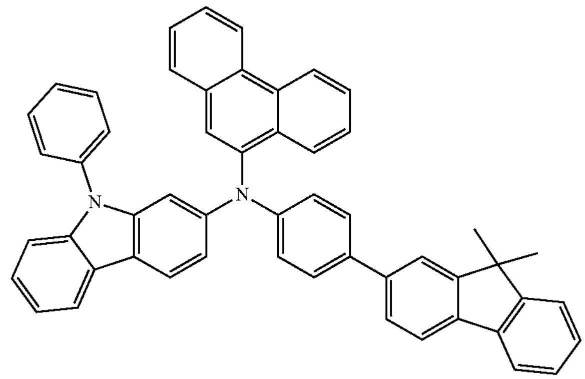
105
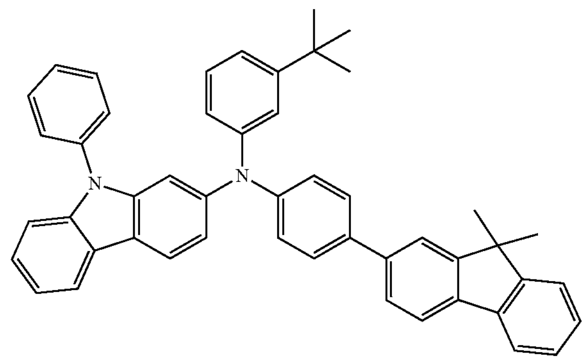
106
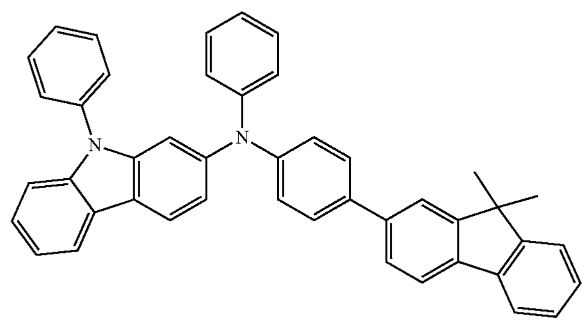
107
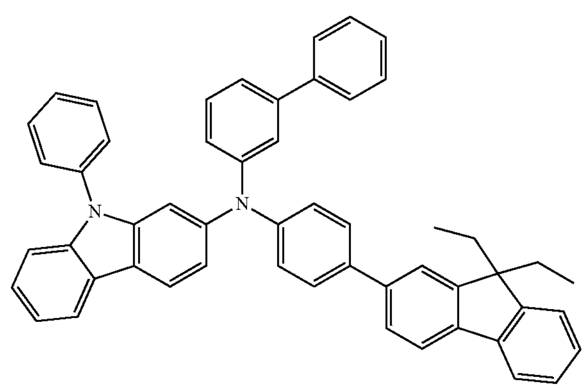

-continued
108
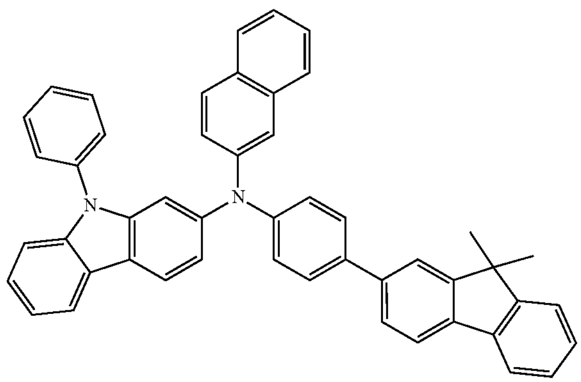
109
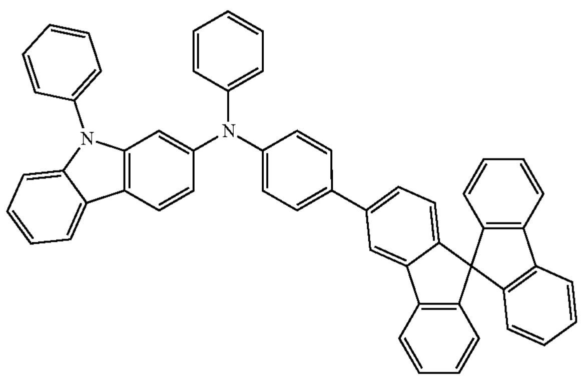
110
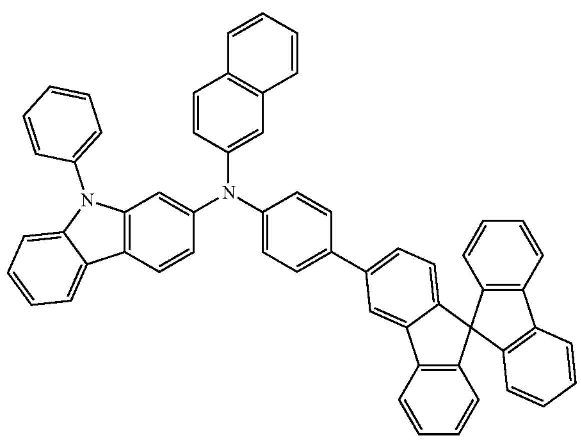
111
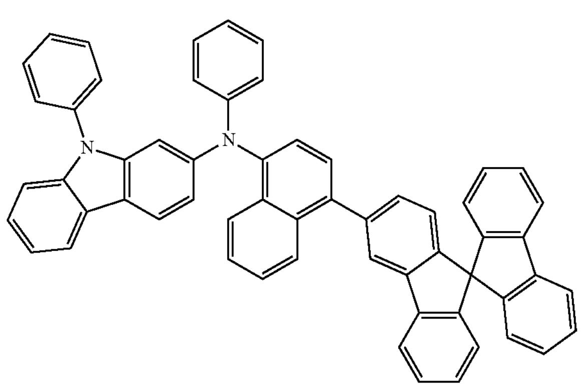
-continued
112
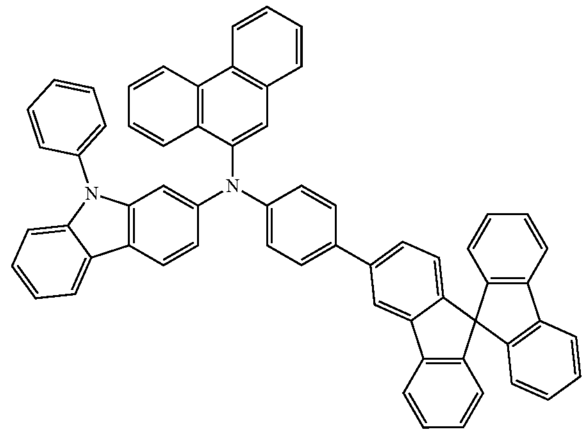
113
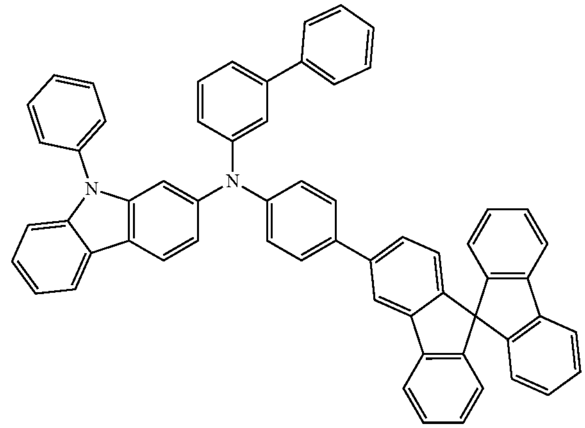
114
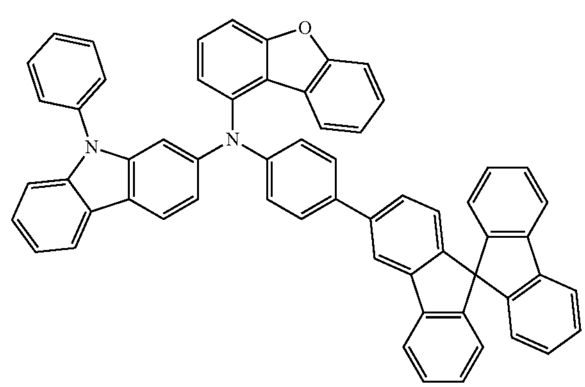

-continued
115
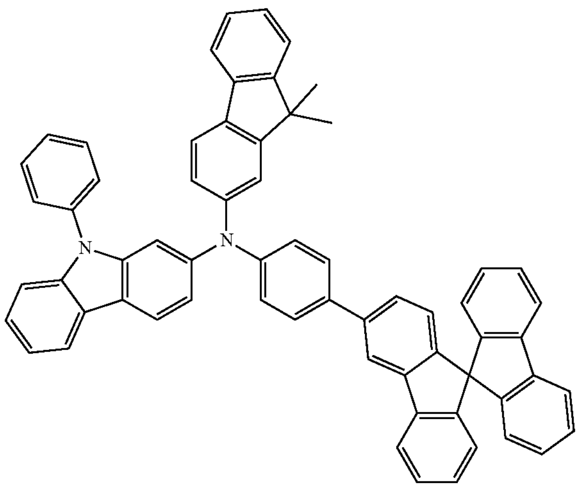
116
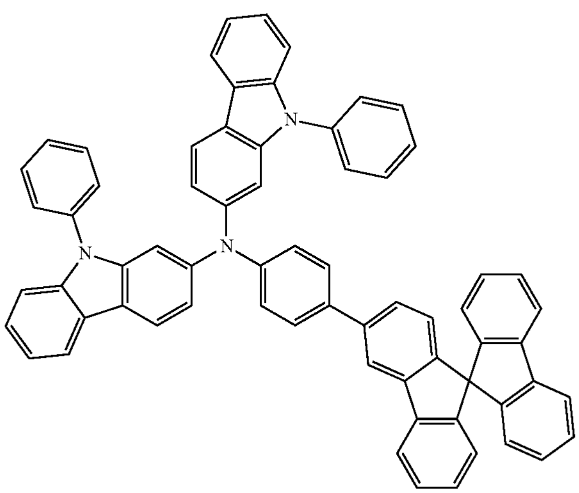
117
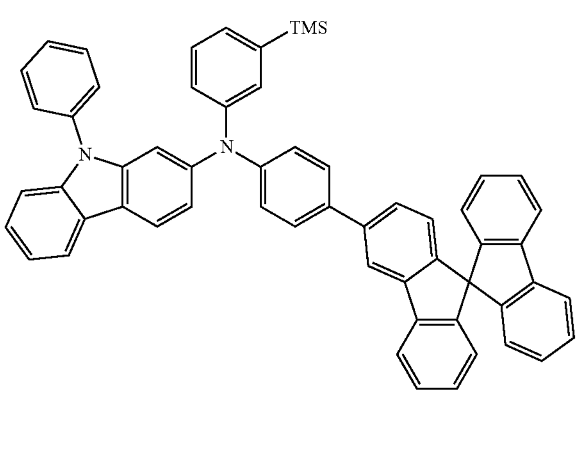
-continued
118
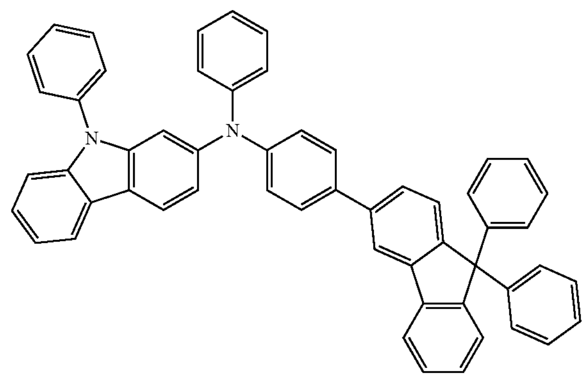
119
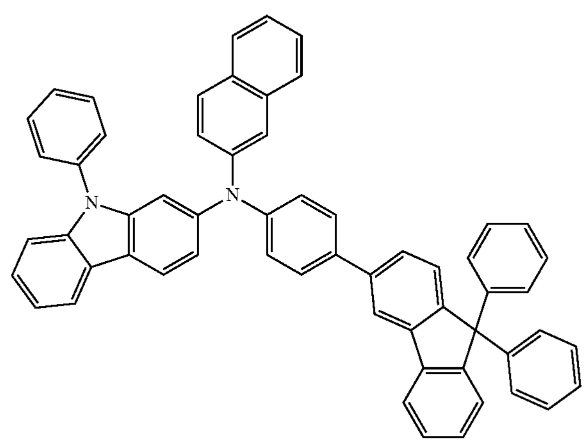
120
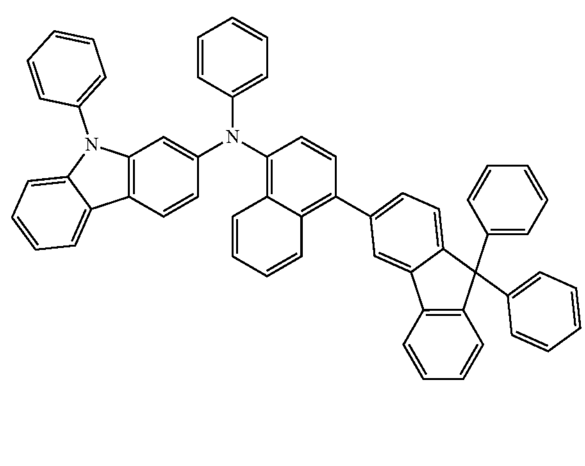

121
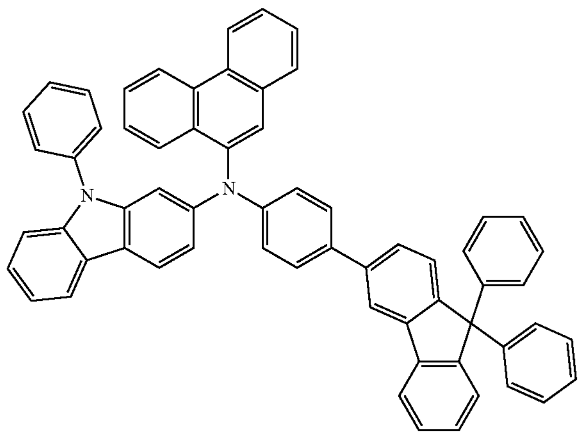
122
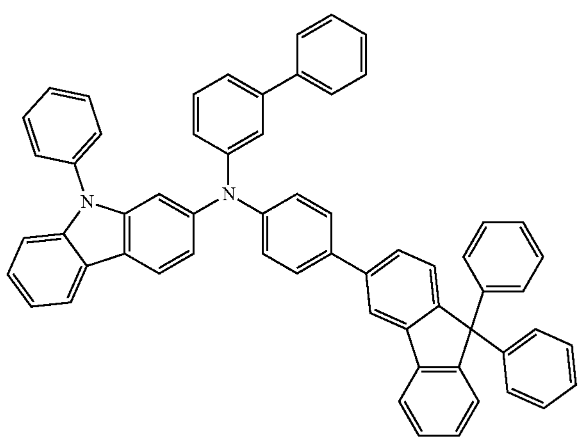
123
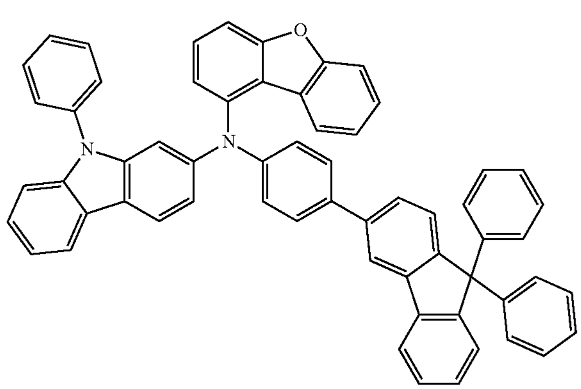
124
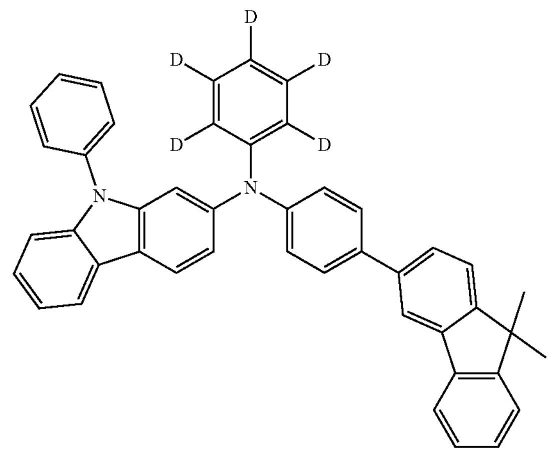
125
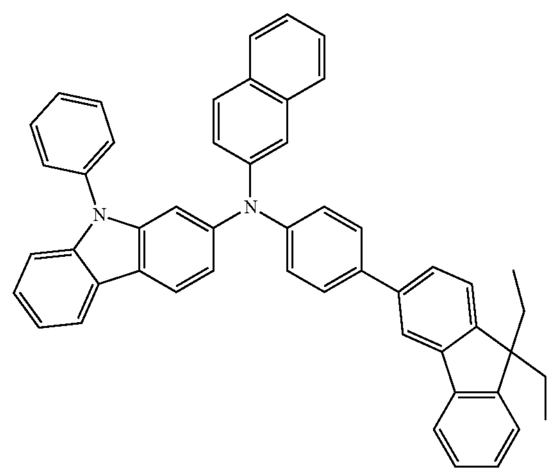
126
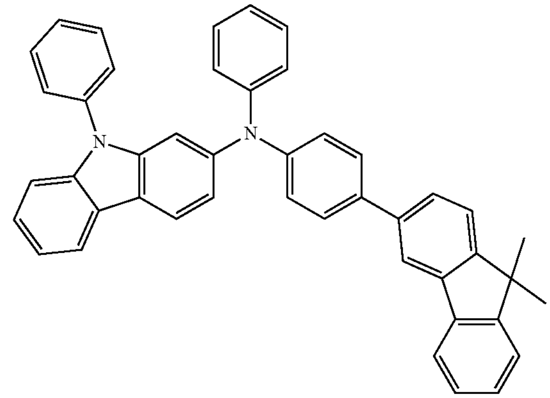

-continued
127
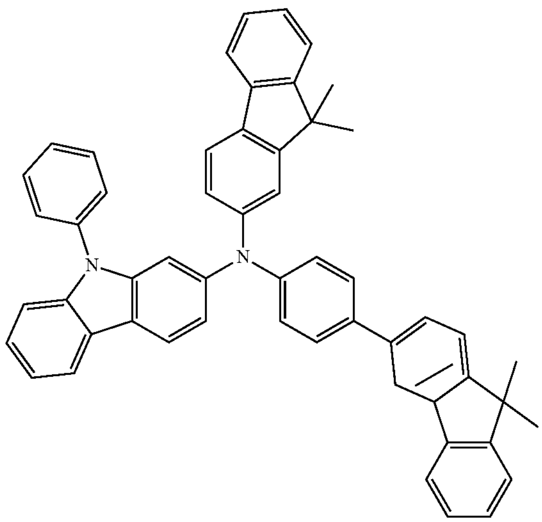
128
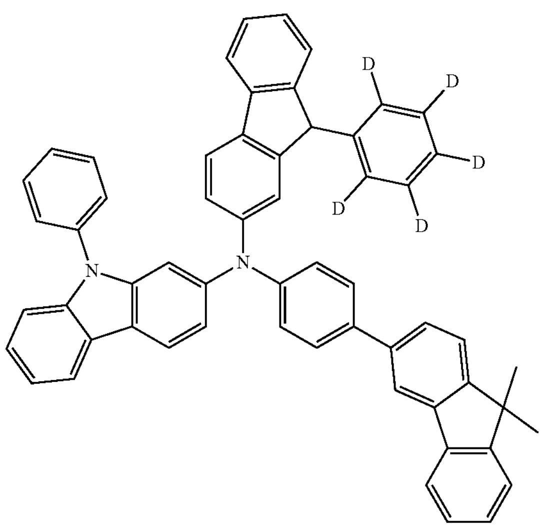
129
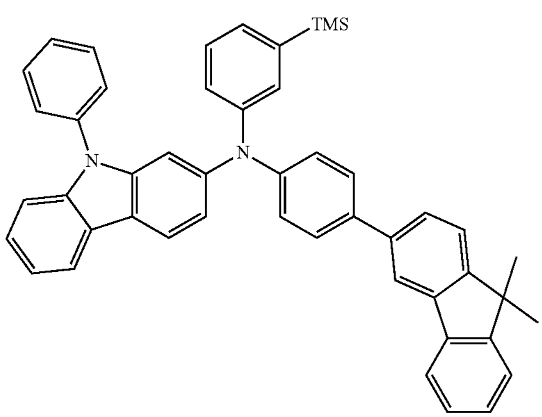
-continued
130
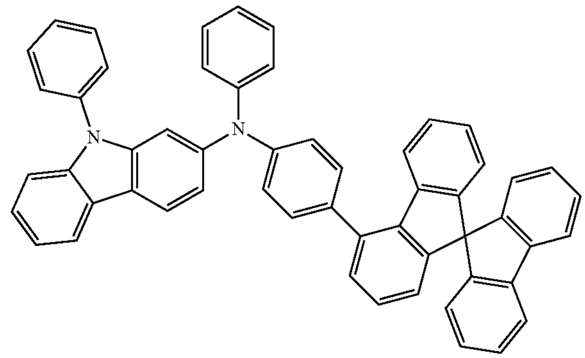
131
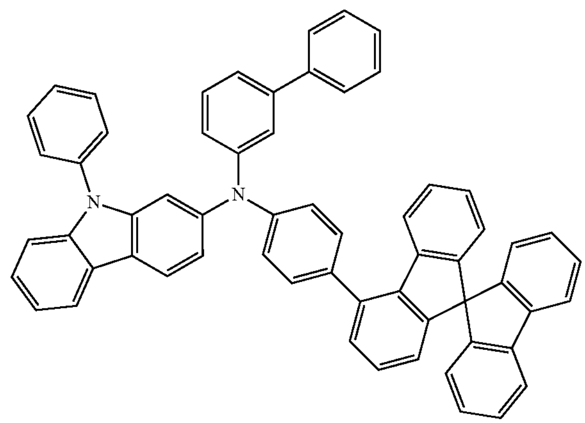
132
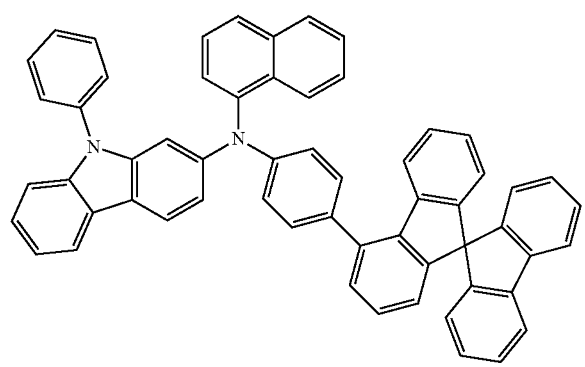
133
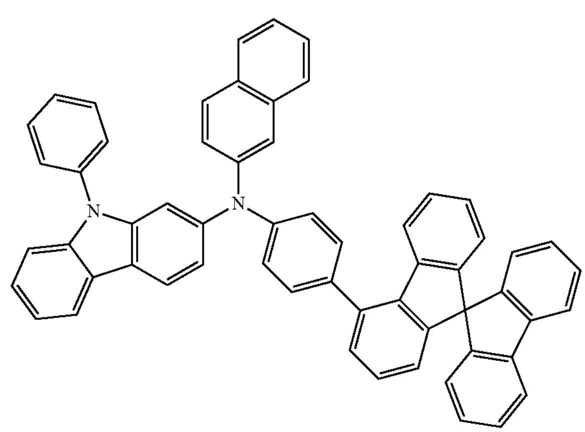

-continued
134
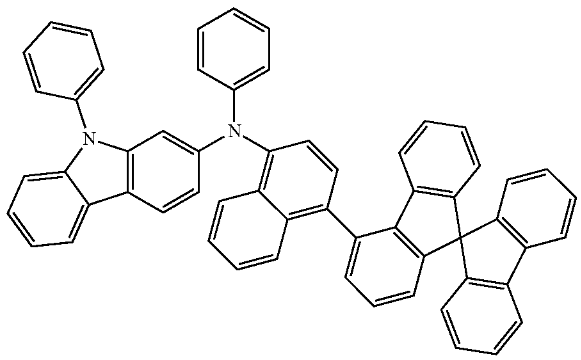
135
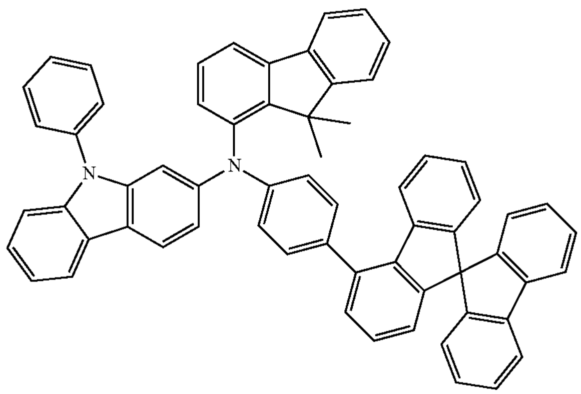
136
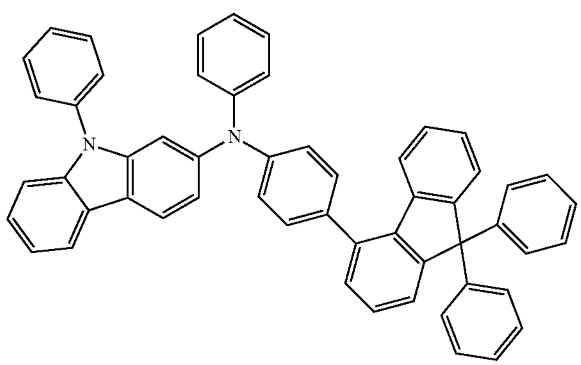
137
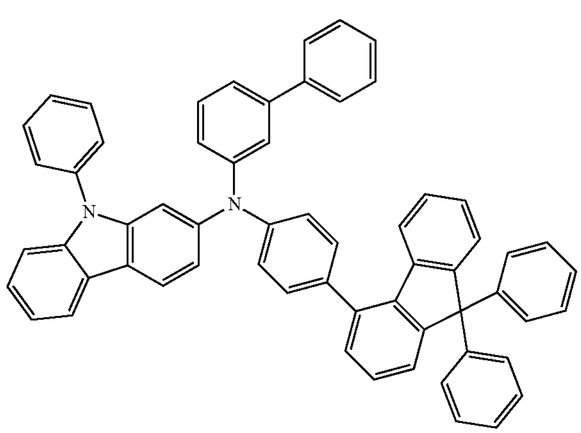
-continued
138
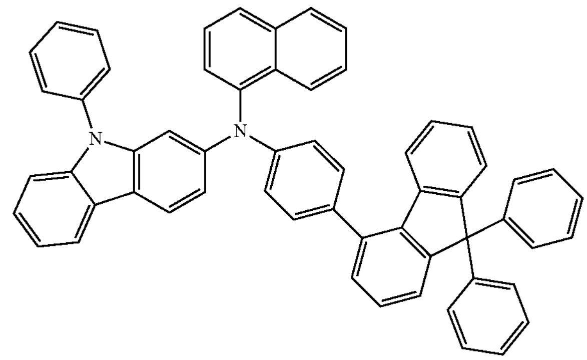
139
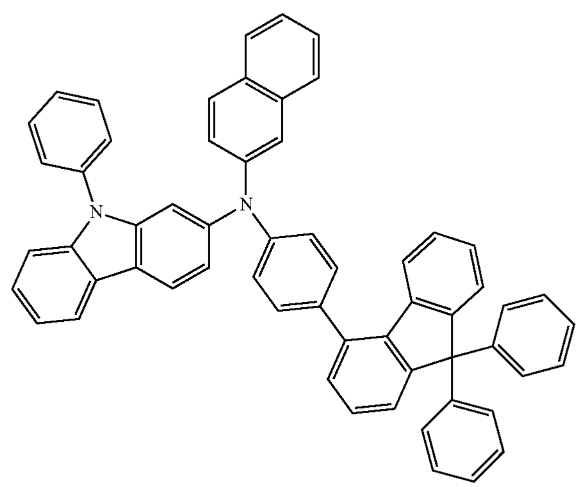
140
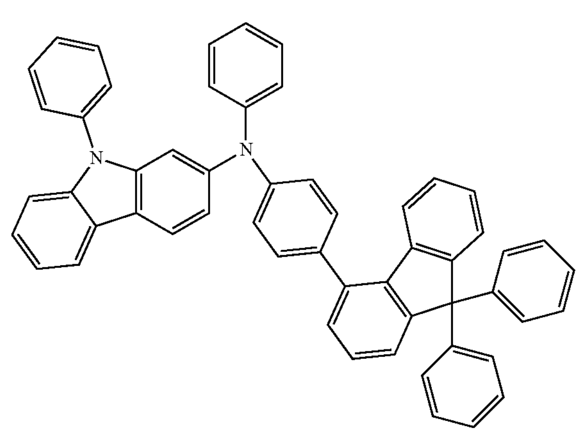

-continued
141
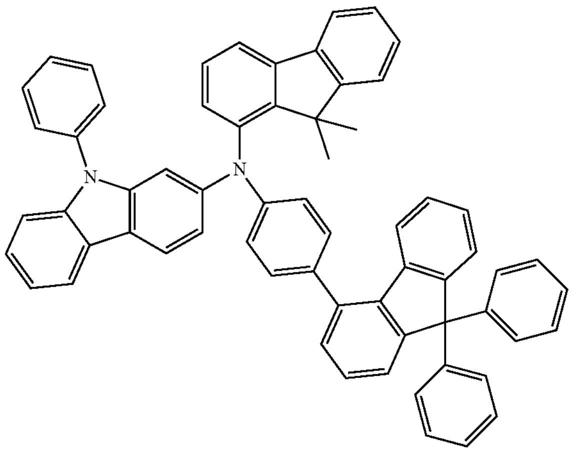
142
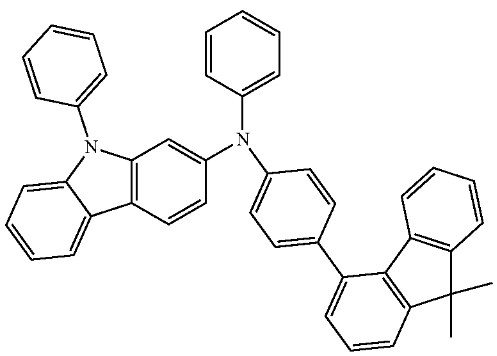
143
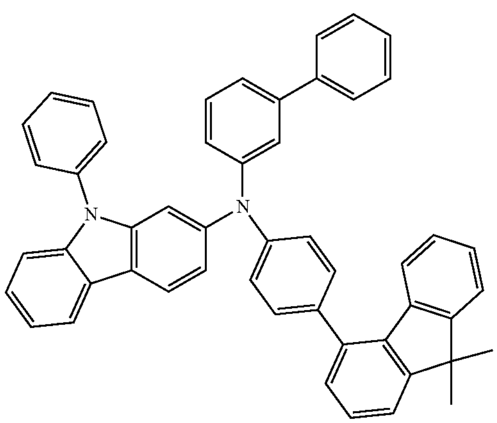
144
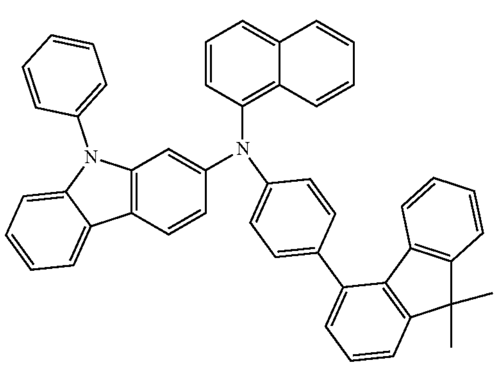
-continued
145
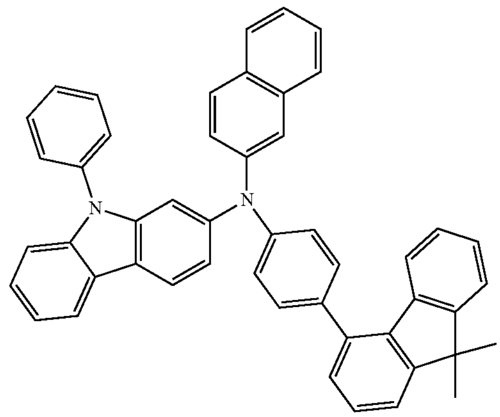
146
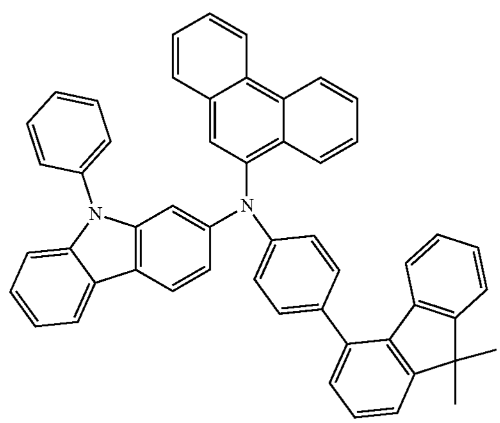
147
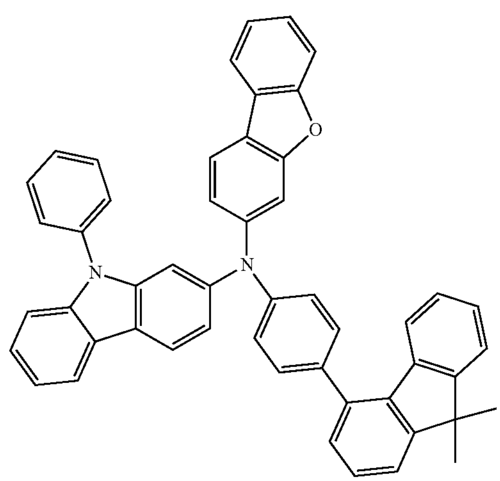

-continued
148
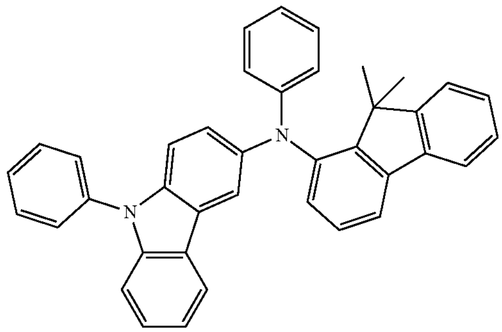
149
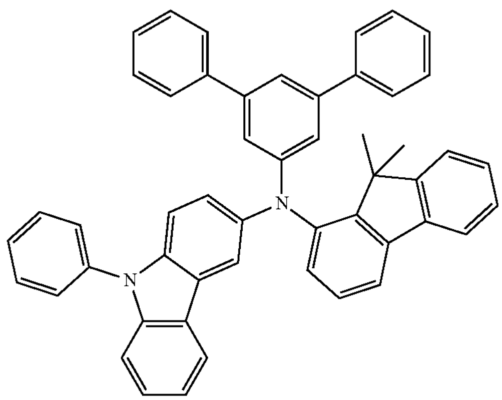
150
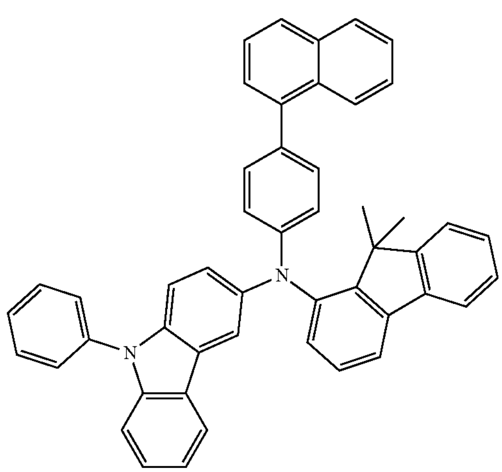
-continued
151
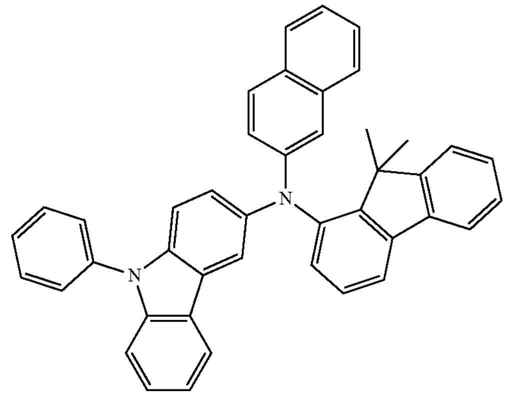
152
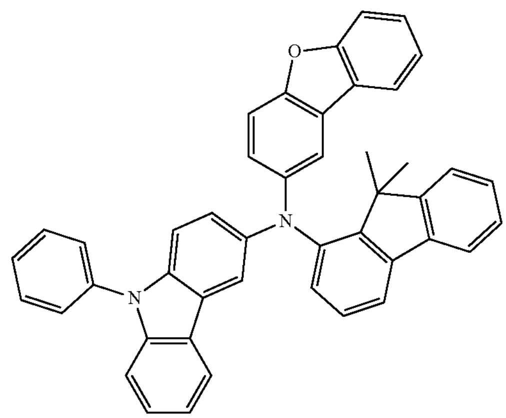
153
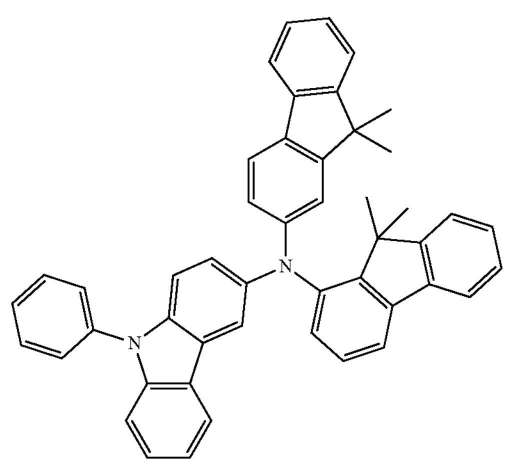

-continued
154
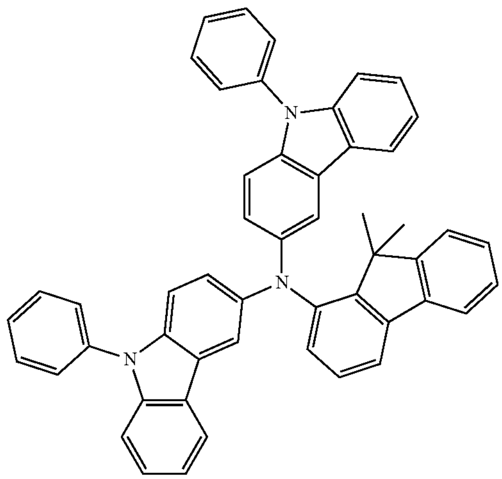
155
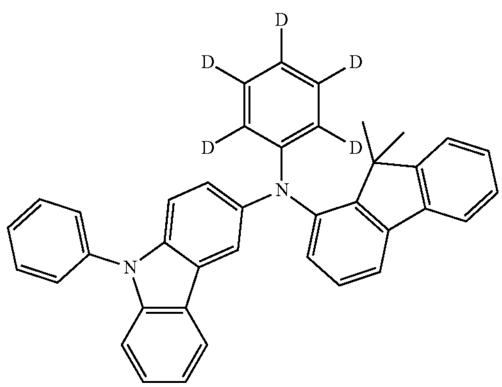
156
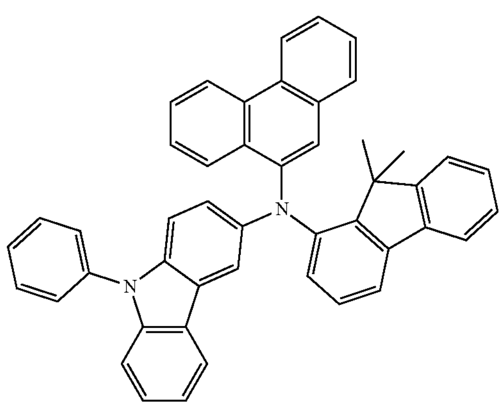
-continued
157
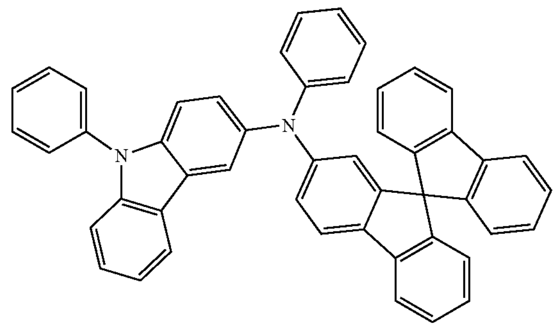
158
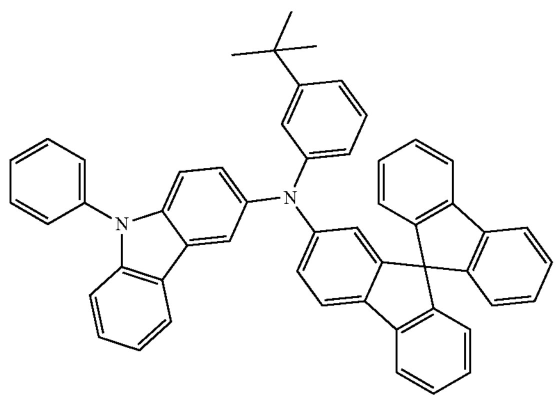
159
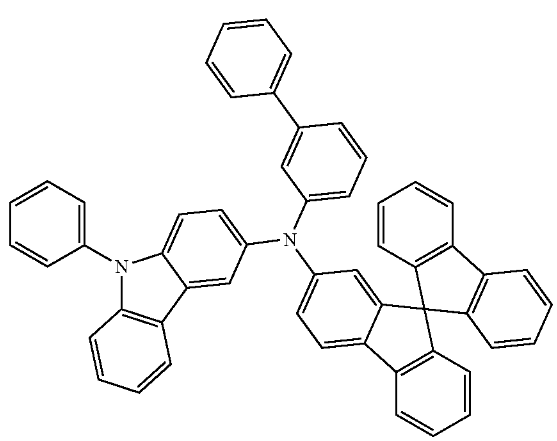

-continued
160
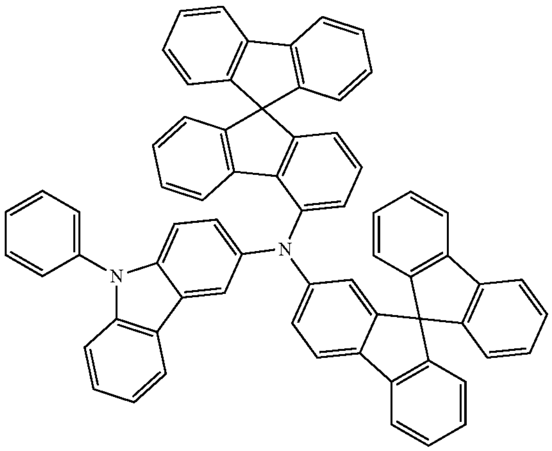
161
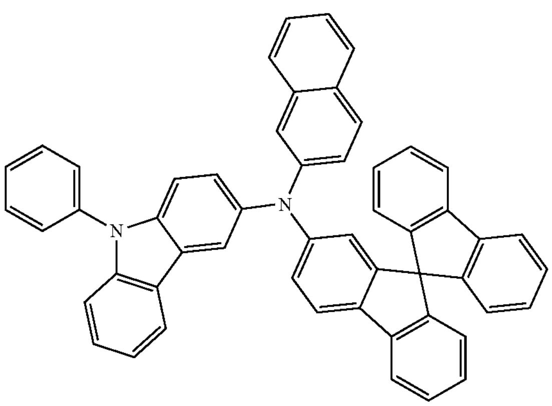
162
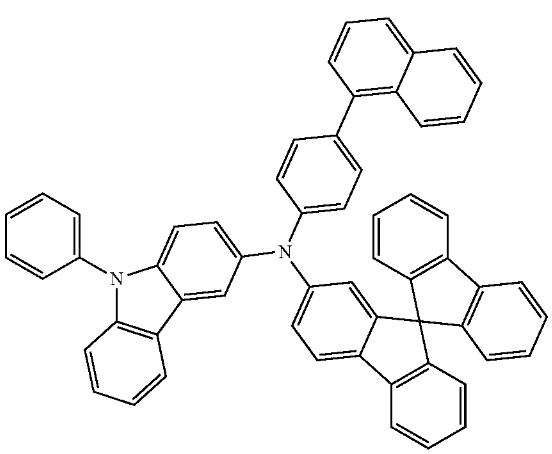
-continued
163
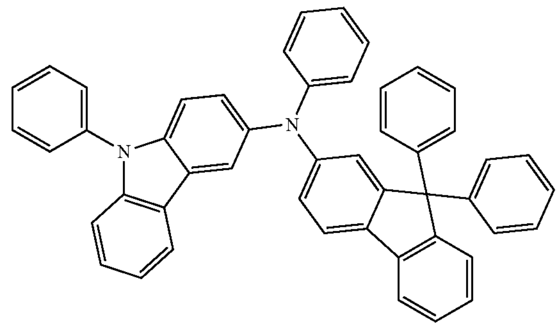
164
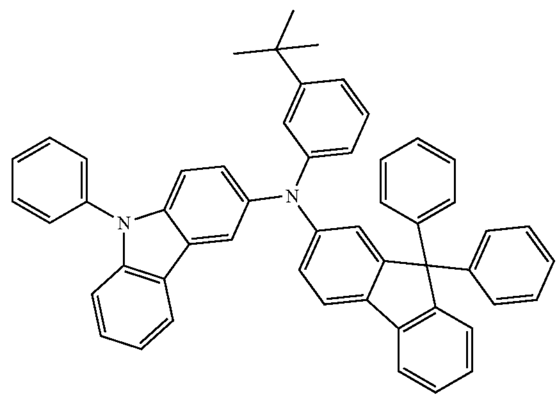
165
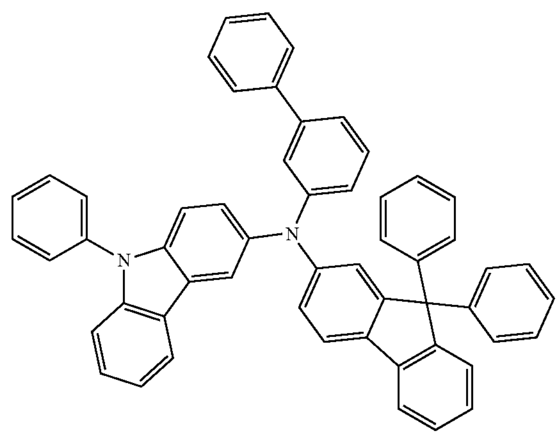
166
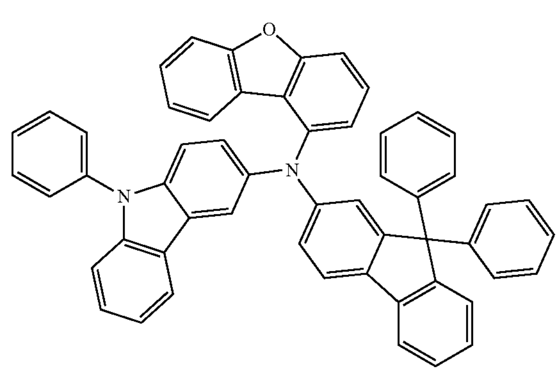

-continued
167
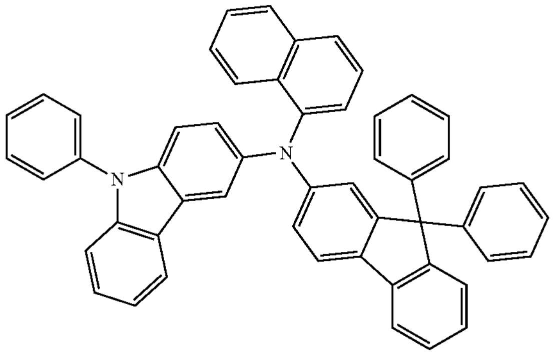
168
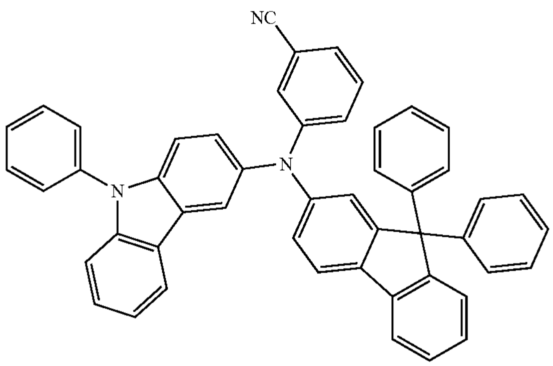
169
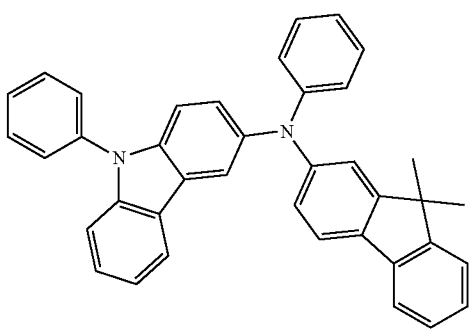
170
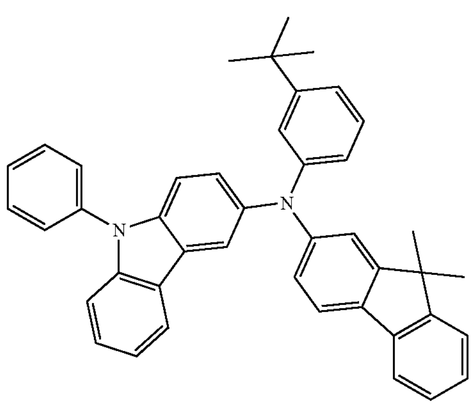
-continued
171
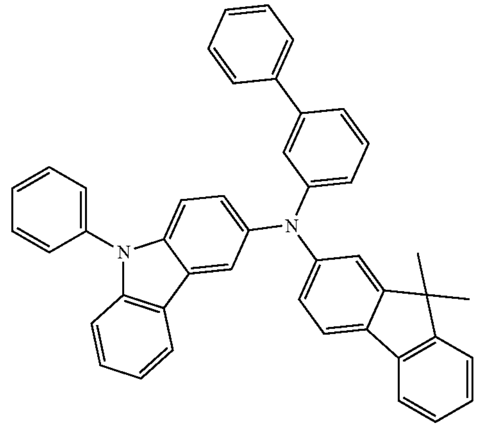
172
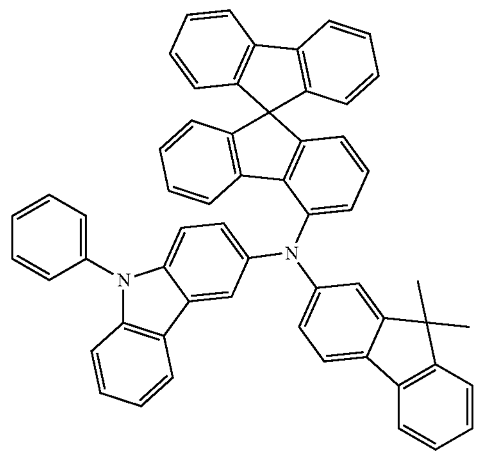
173
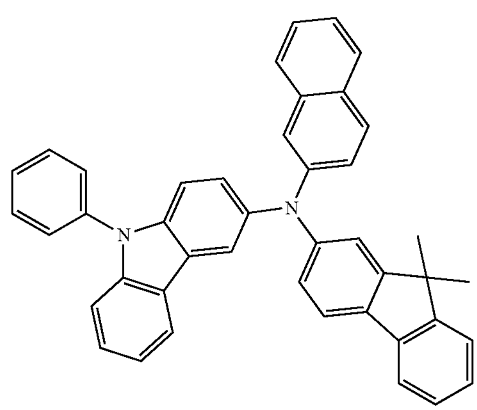

174
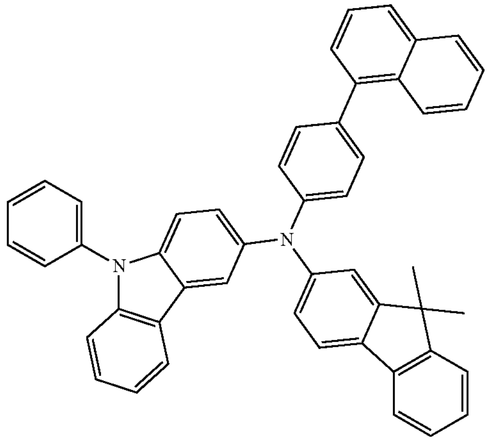
175
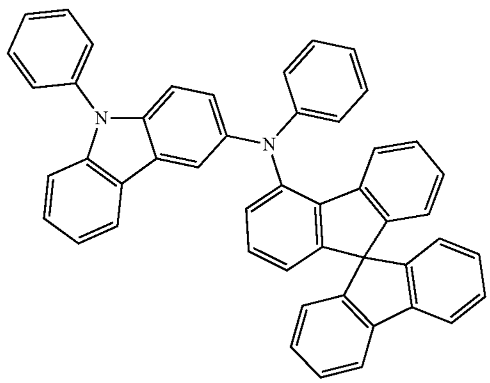
176
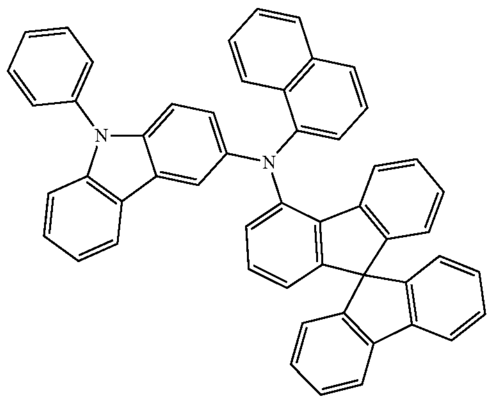
177
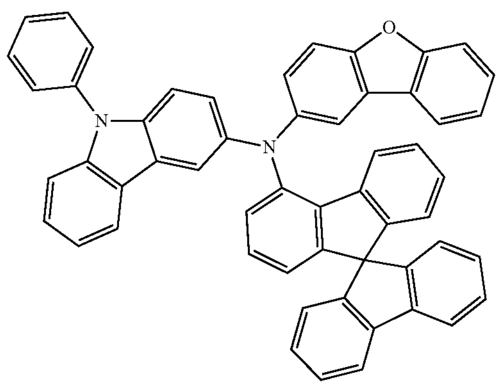
178
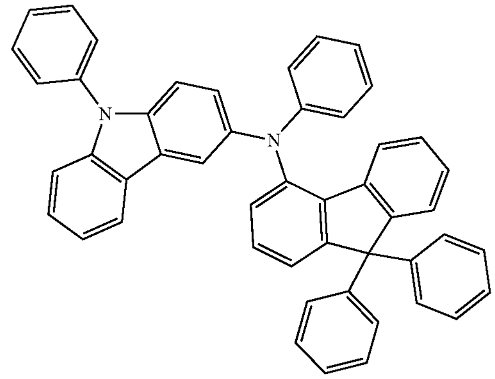
179
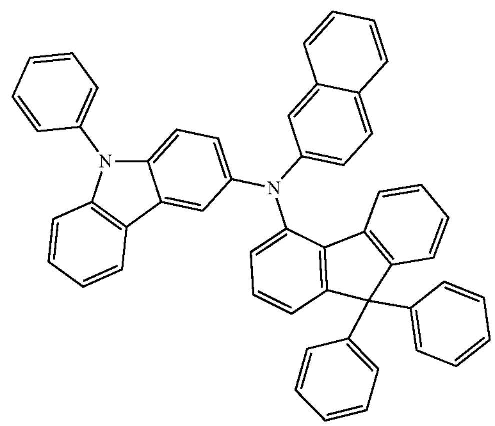
180
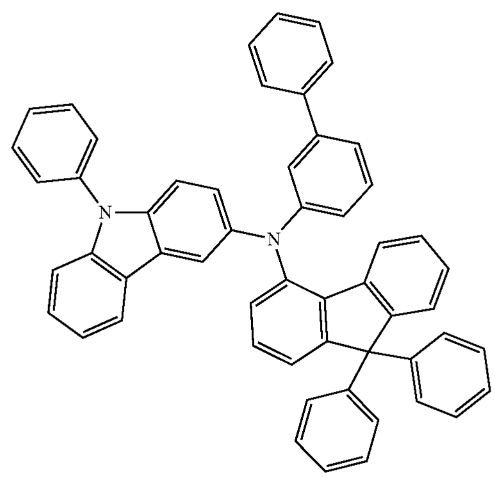
181
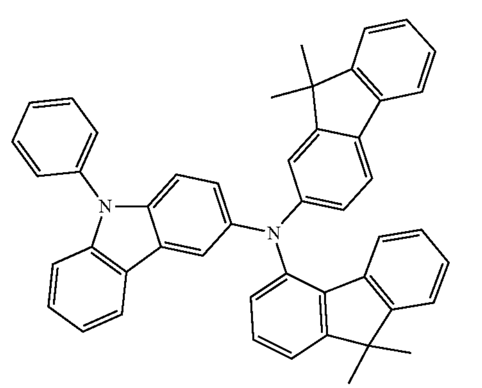

-continued
182
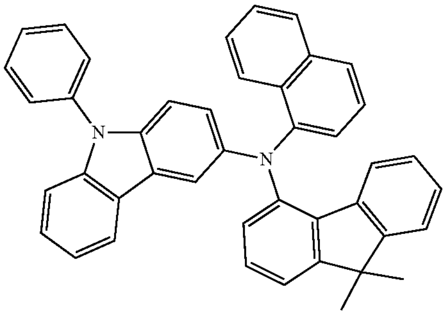
183
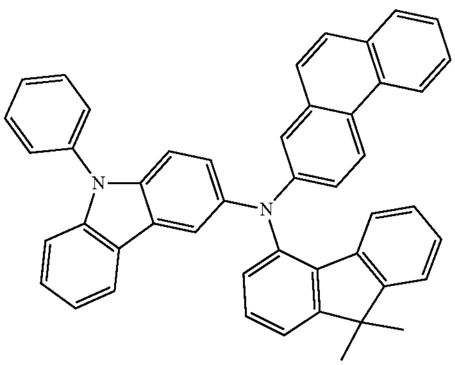
184
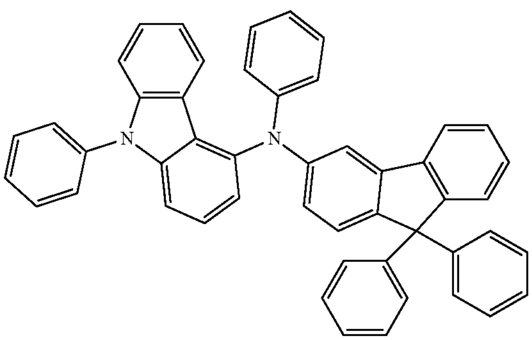
185
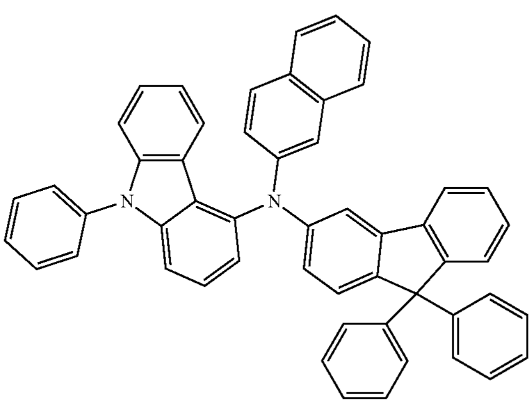
-continued
186
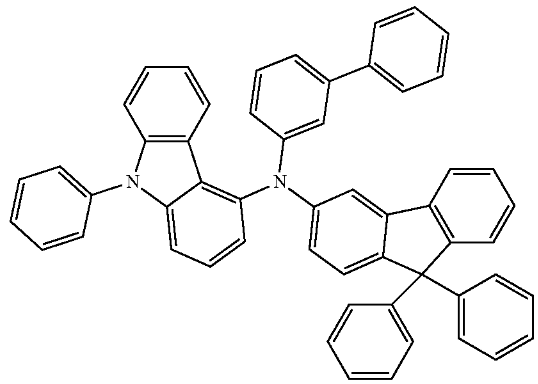
187
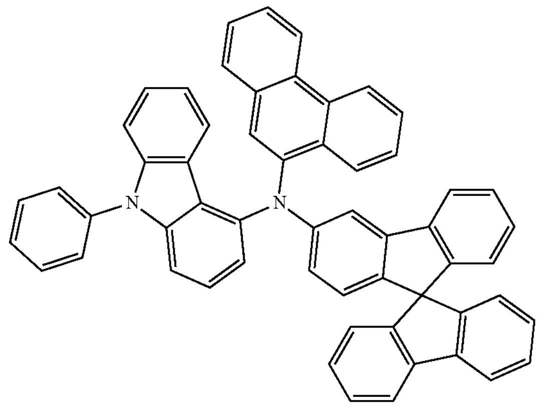
188
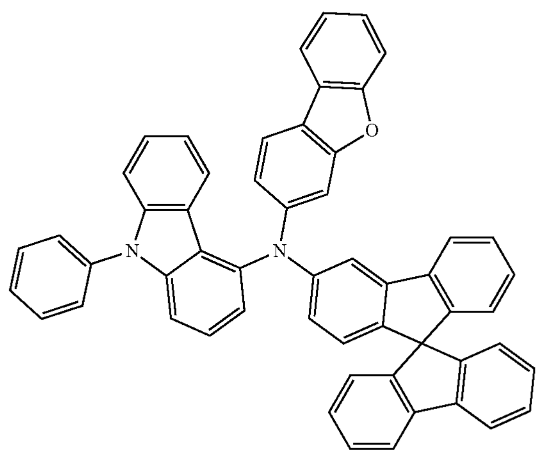
189
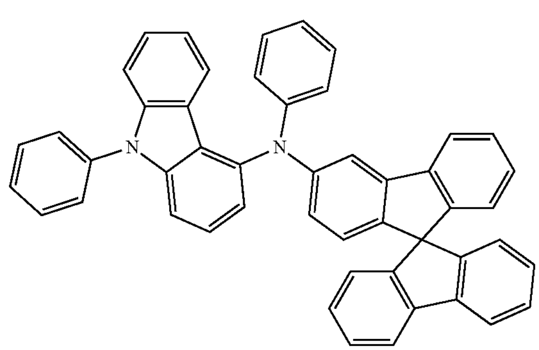

-continued
190
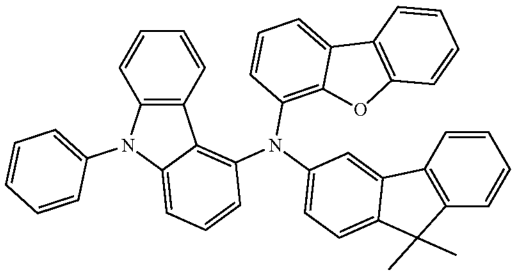
191
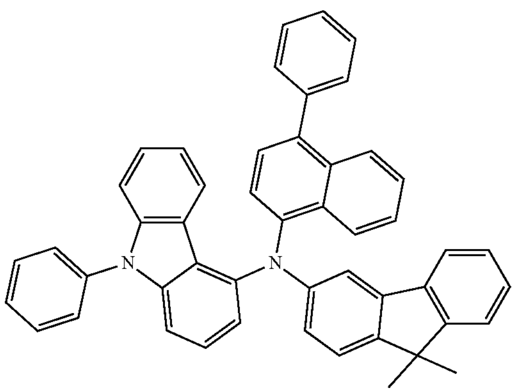
192
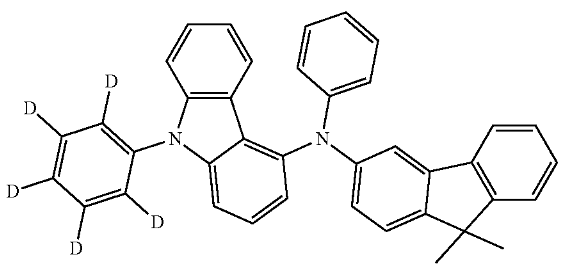
193
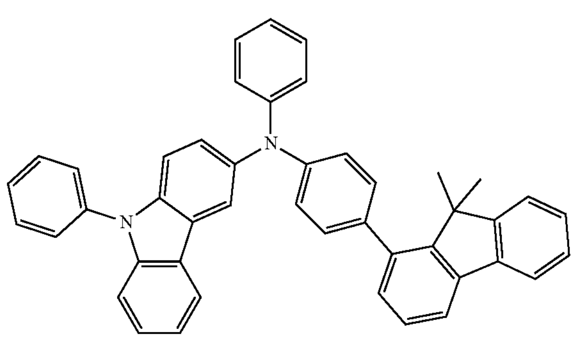
-continued
194
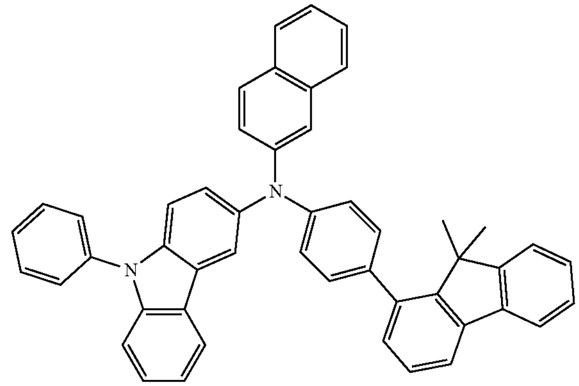
195
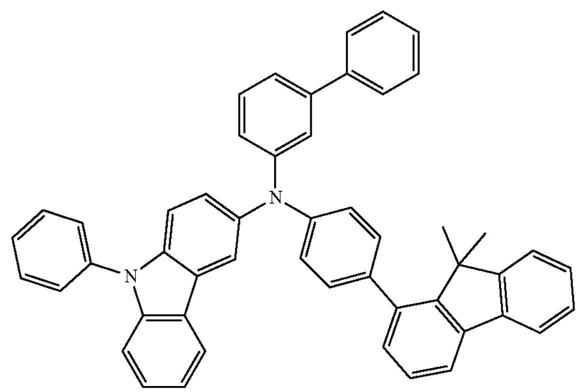
196
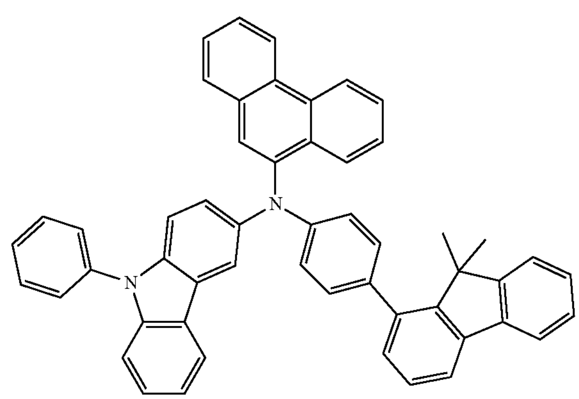

197
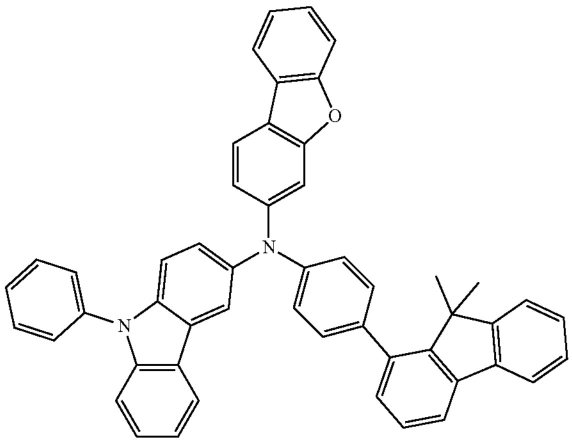
198
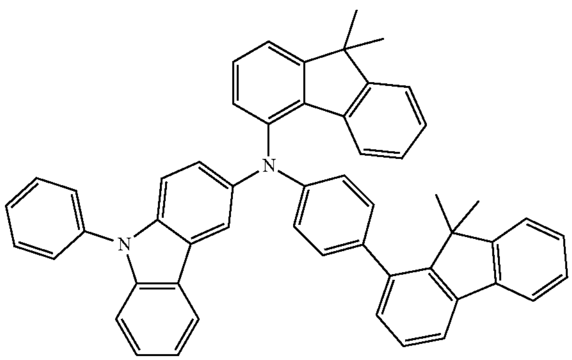
199
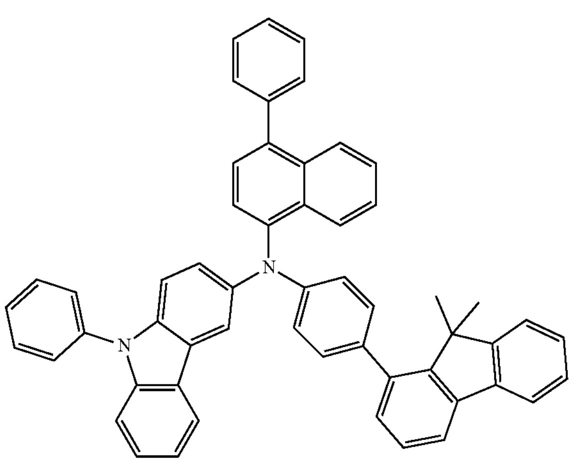
200
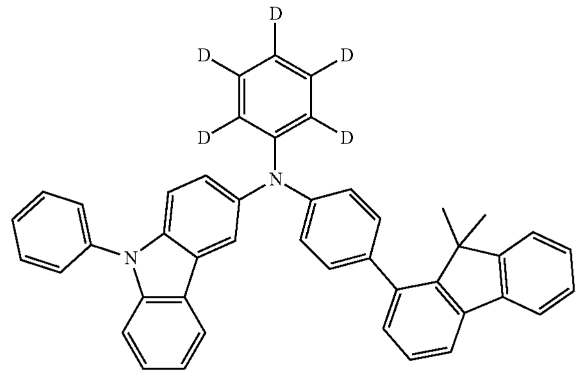
201
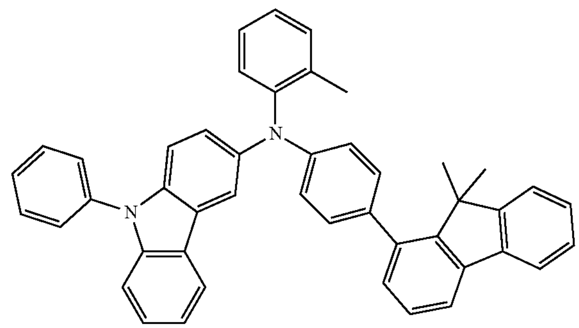
202
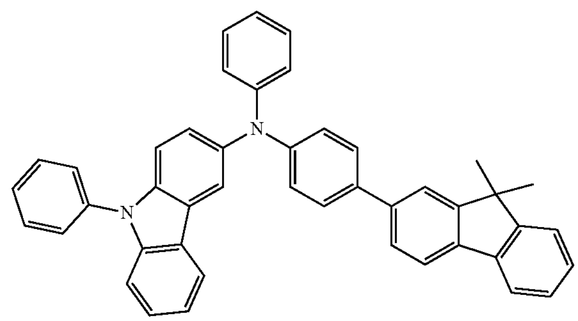
203
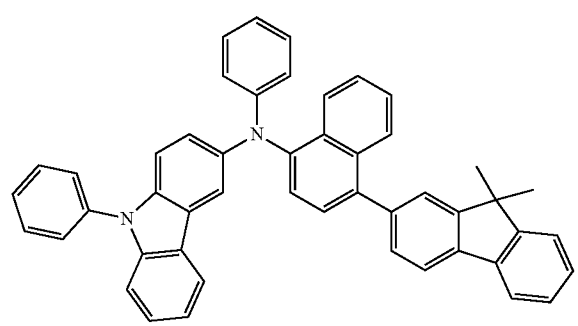

-continued
204
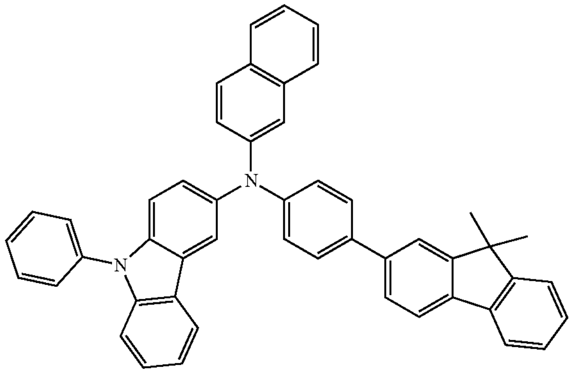
205
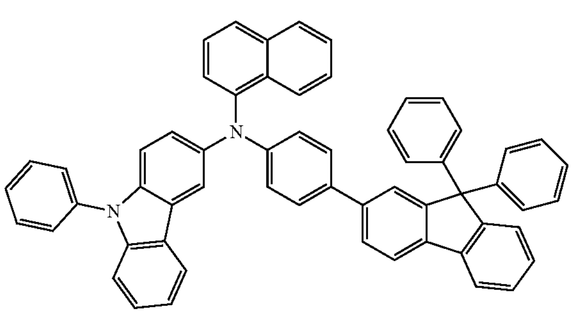
206
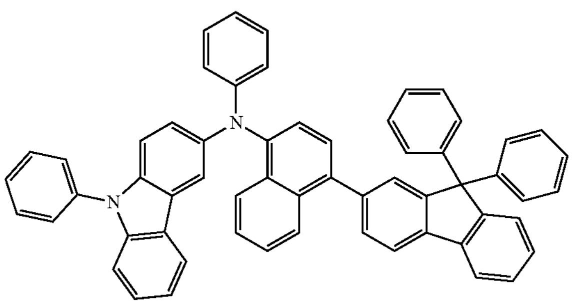
207
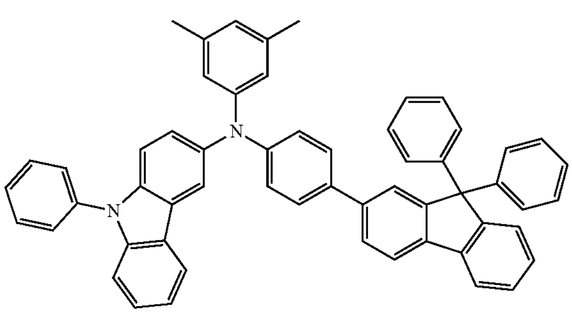
-continued
208
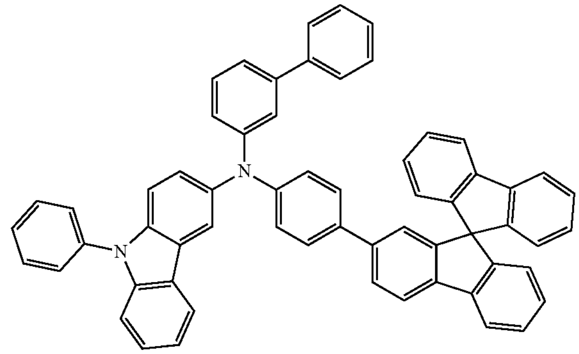
209
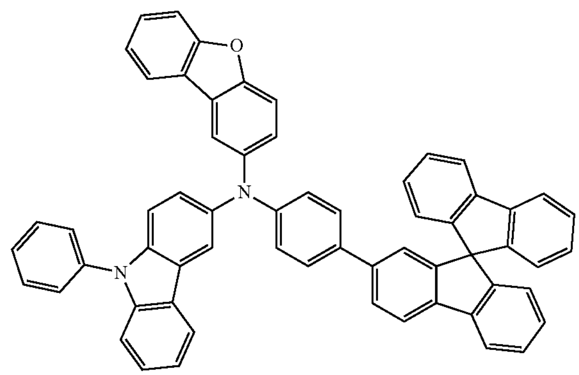
210
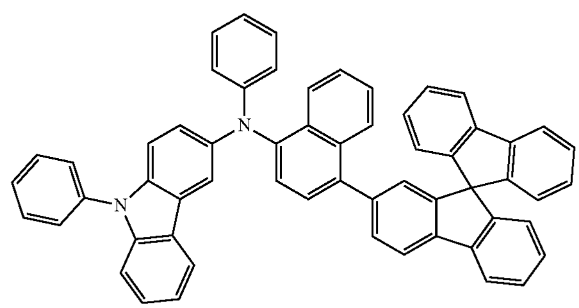
211
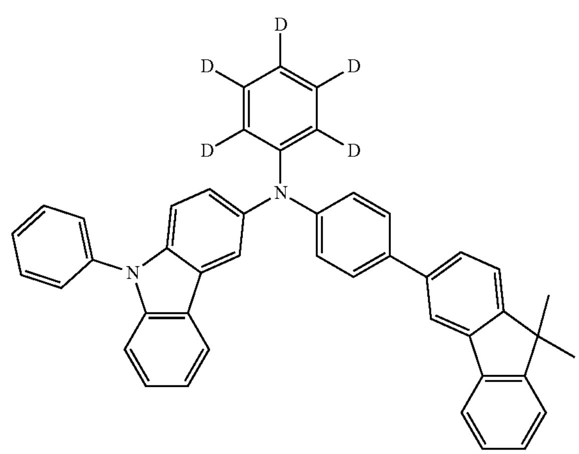

-continued
212
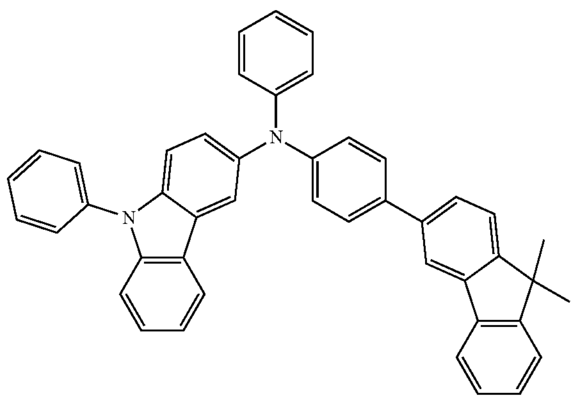
213
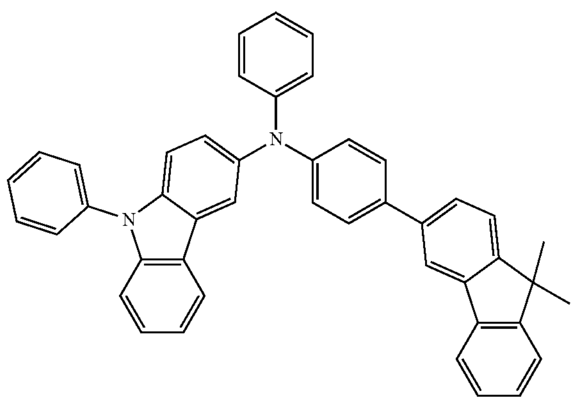
214
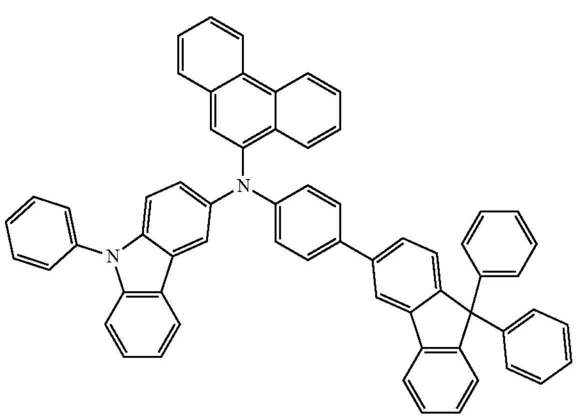
215
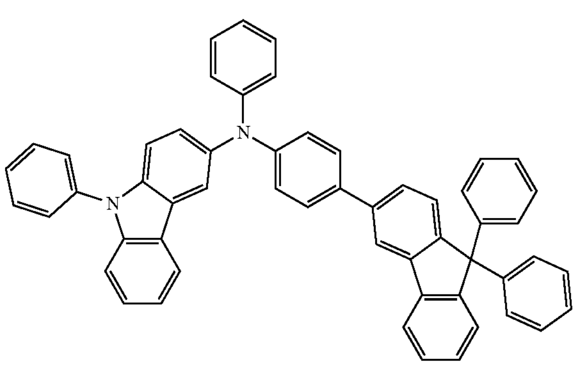
-continued
216
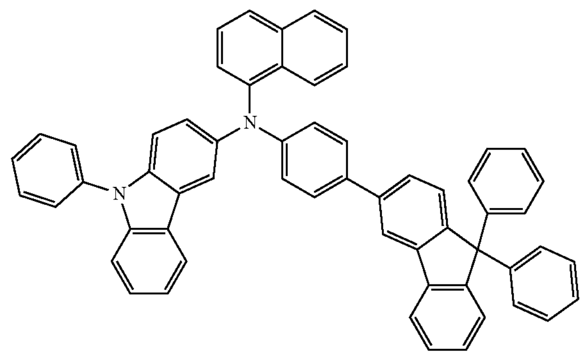
217
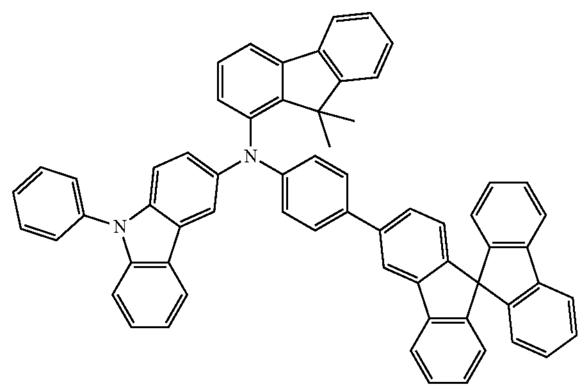
218
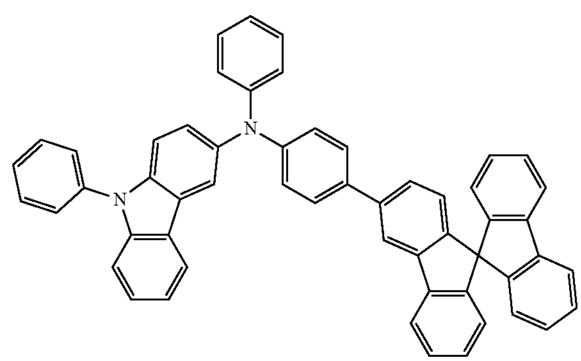
219
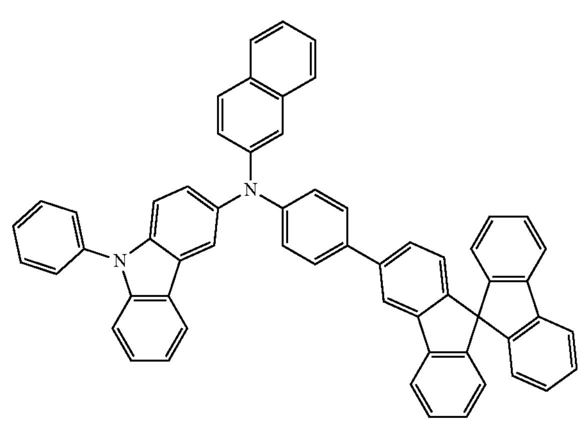

220
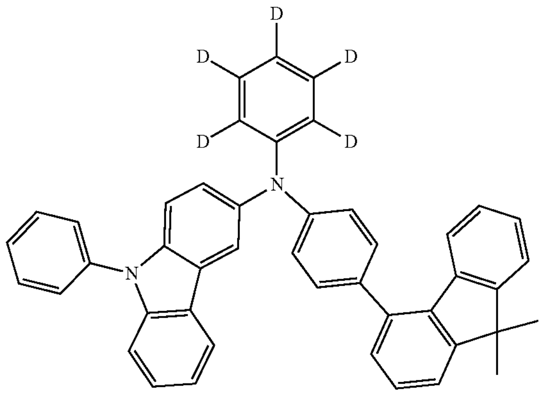
221
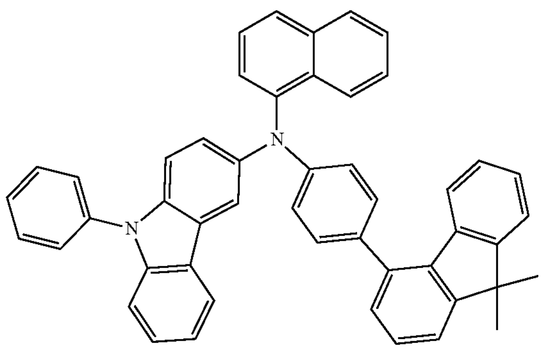
222
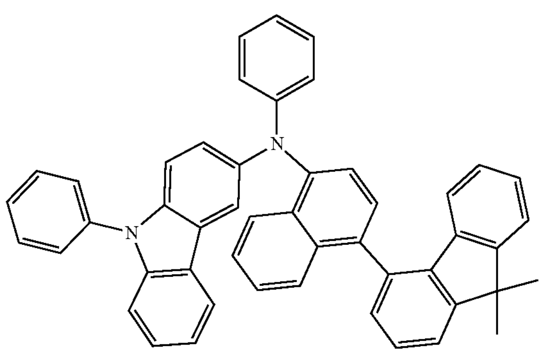
223
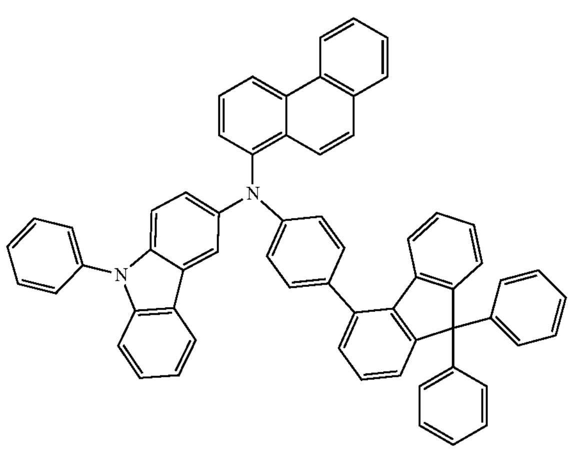
224
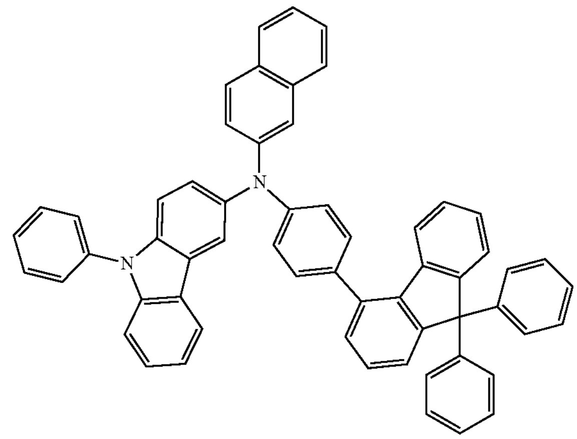
225
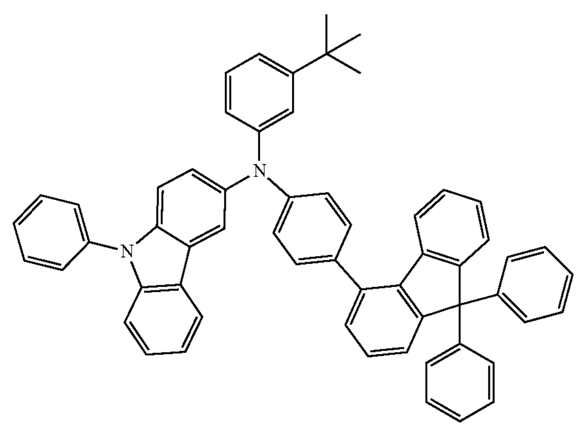
226
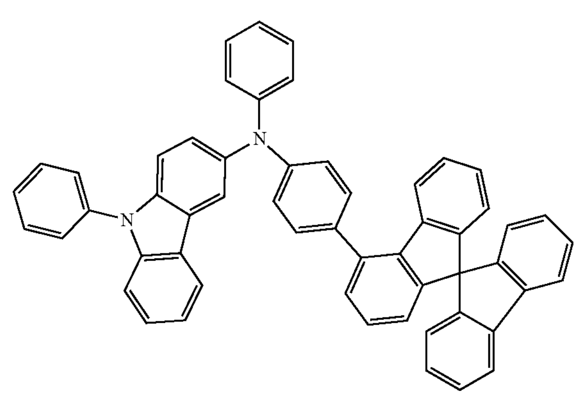

-continued
227
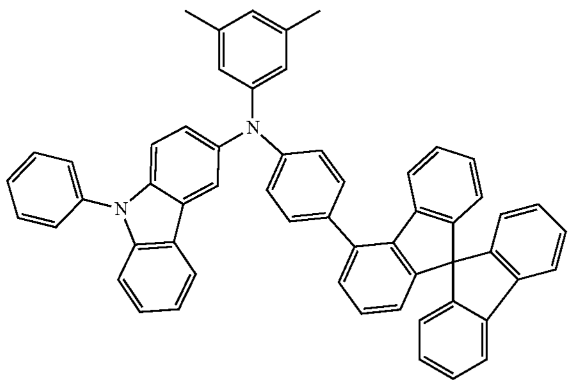
228
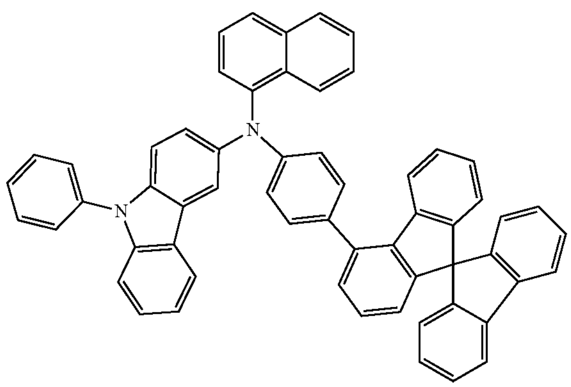
229
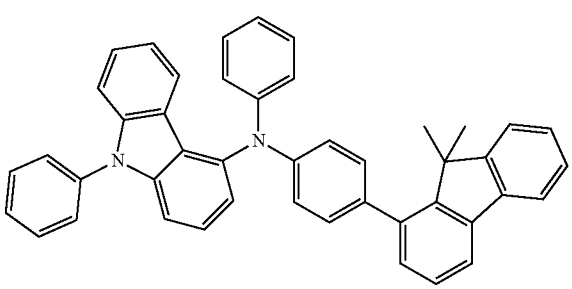
230
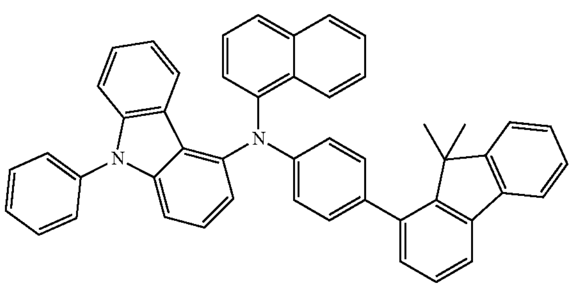
-continued
231
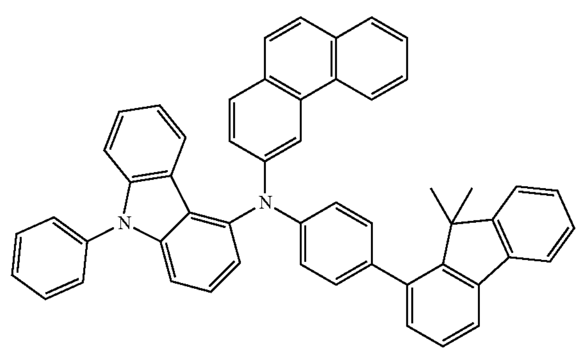
232
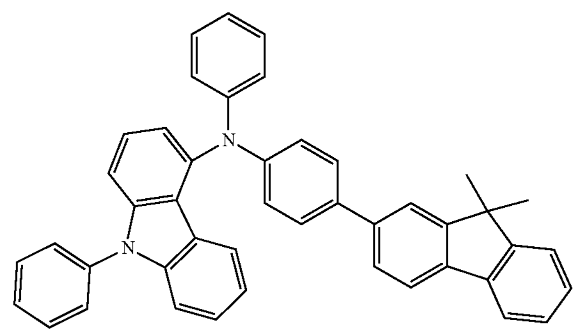
233
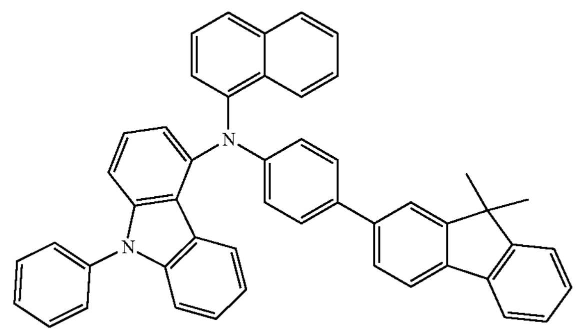
234
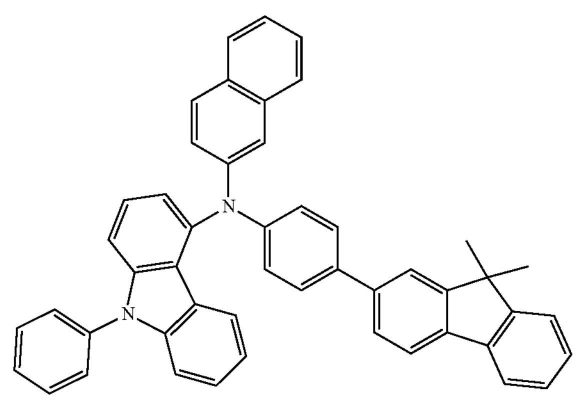

-continued
235
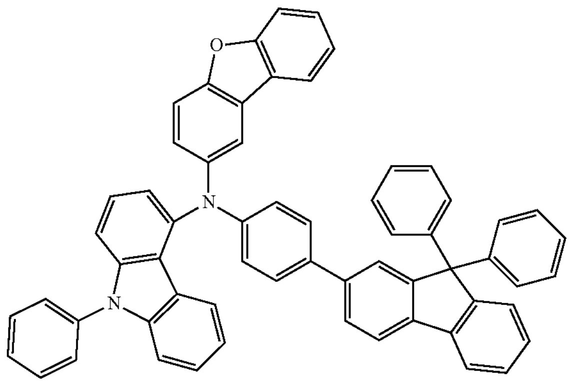
236
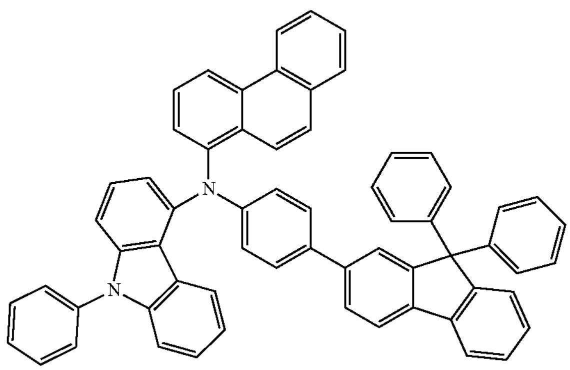
237
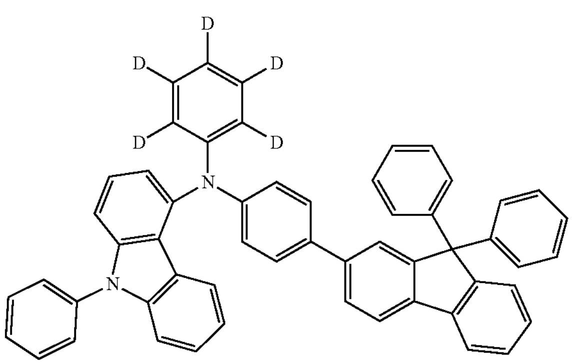
238
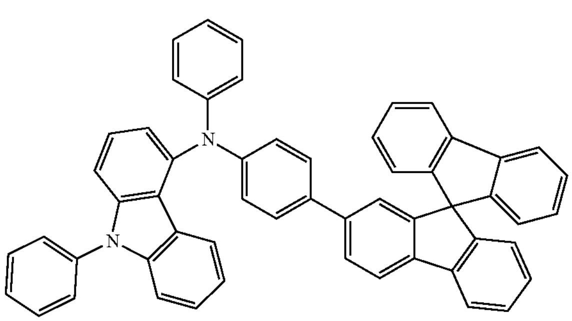
-continued
239
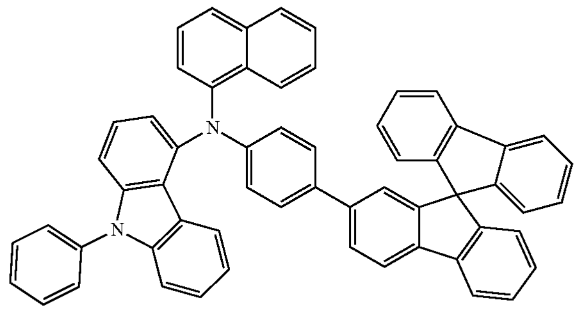
240
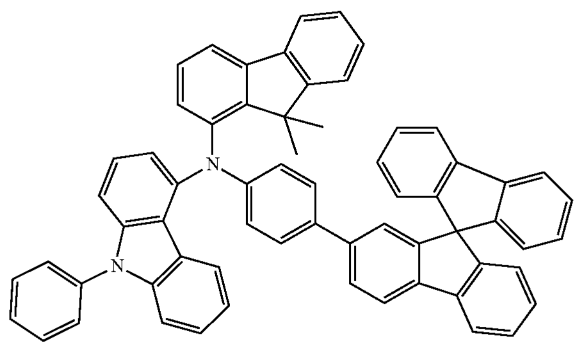
241
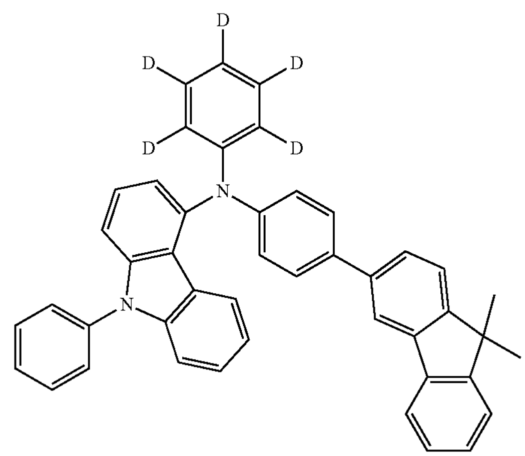
242
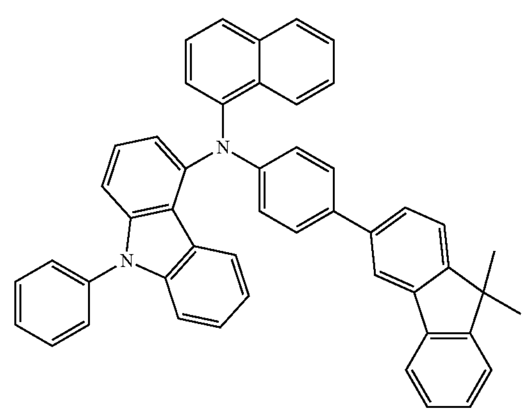

-continued
243
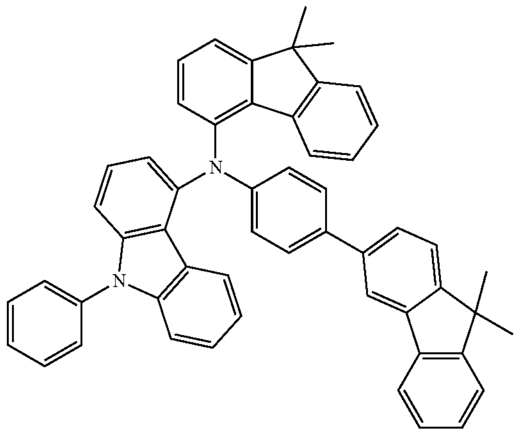
244
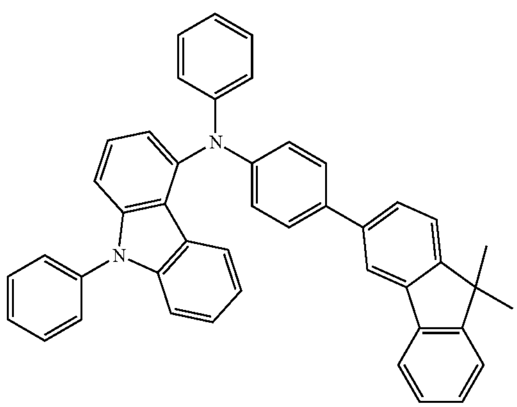
245
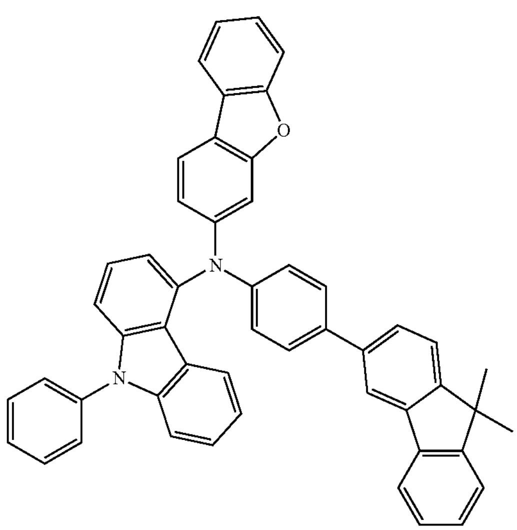
-continued
246
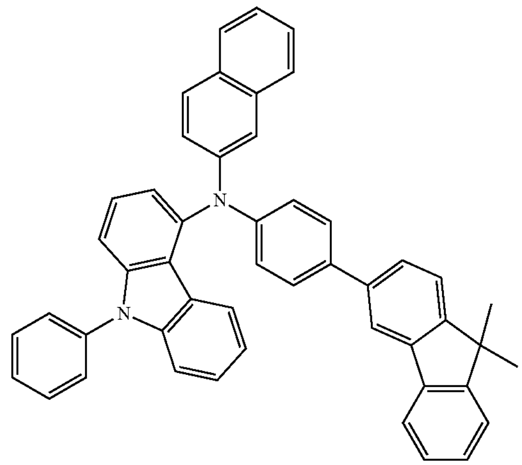
247
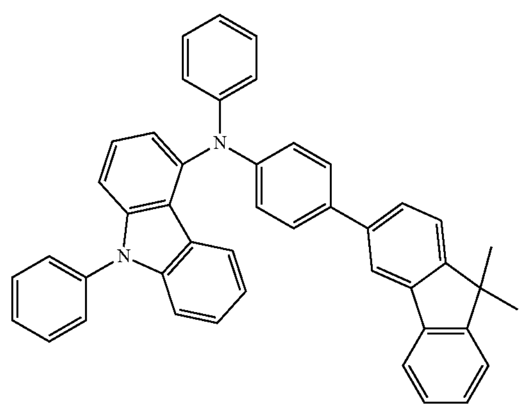
248
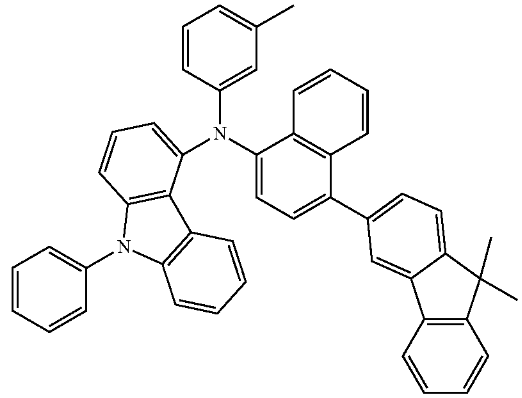

249
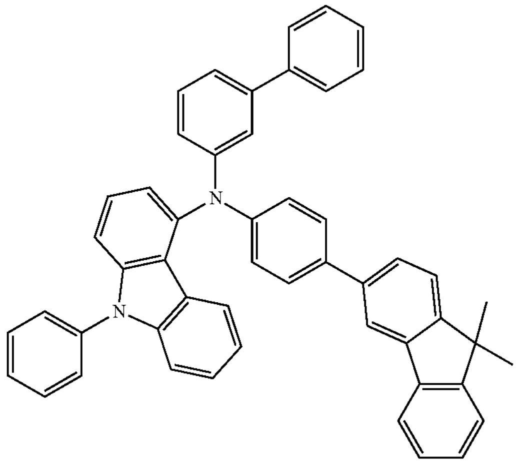
250
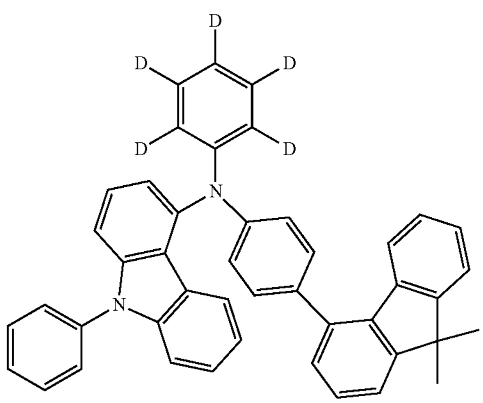
251
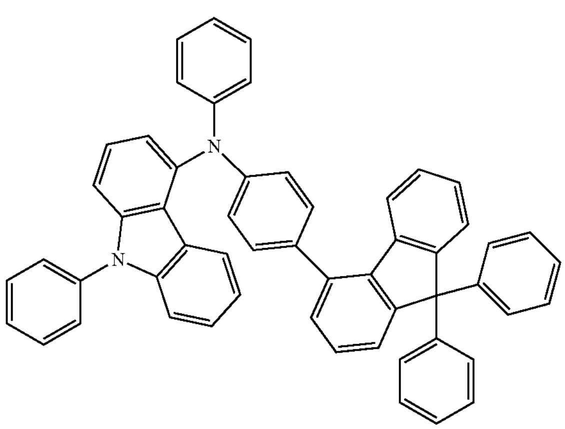
252
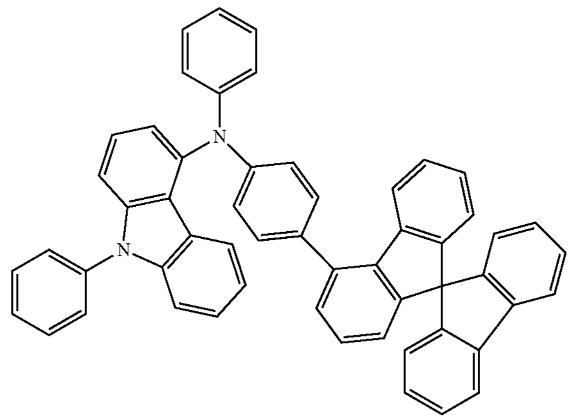
253
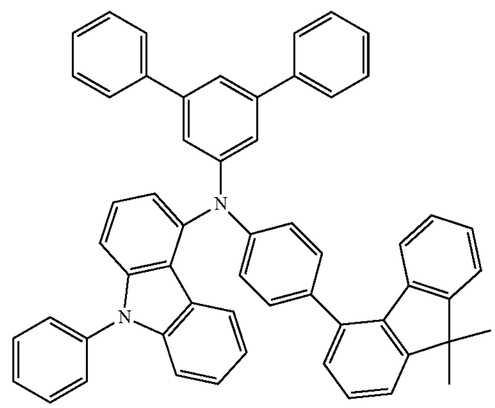
254
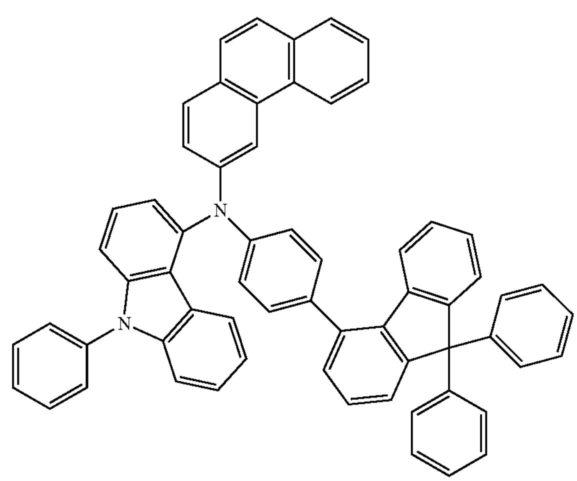

255

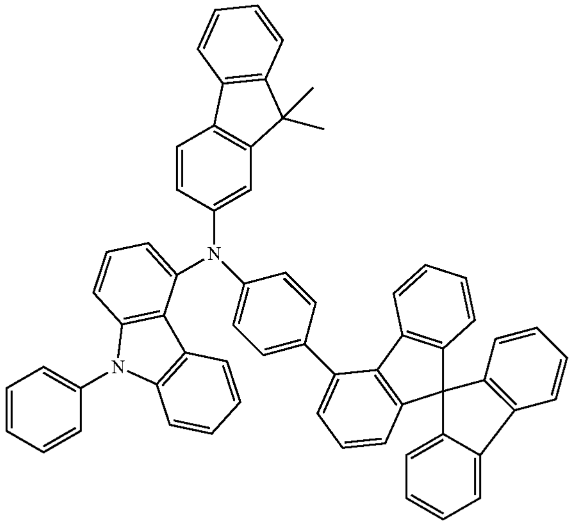

In addition, more specifically, the polycyclic aromatic derivative compound represented by one of [Formula B] to [Formula D] according to the present invention, used as the dopant for the light-emitting layer, is selected from the following compounds, which clearly show specific substituents, but these compounds should not be construed as limiting the scope of [Formula B] to [Formula D] according to the present invention.

1

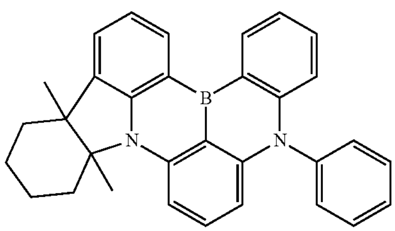

2

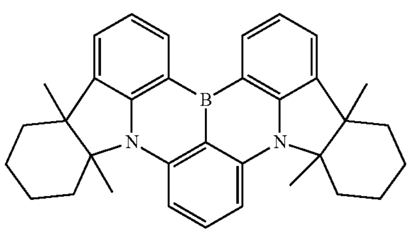

3

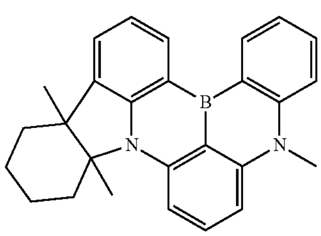

4

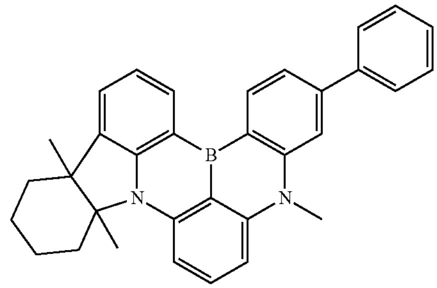

5

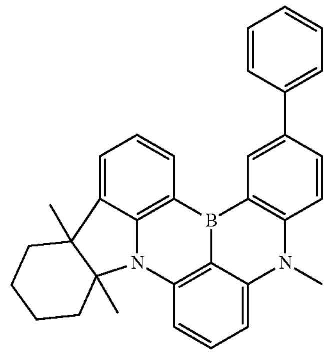

6

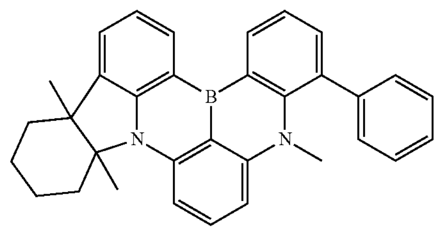

7

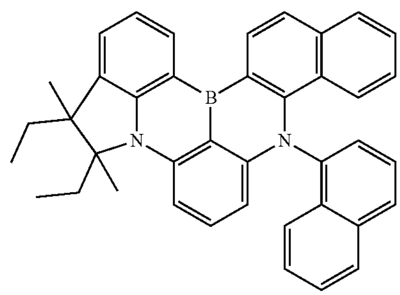

8

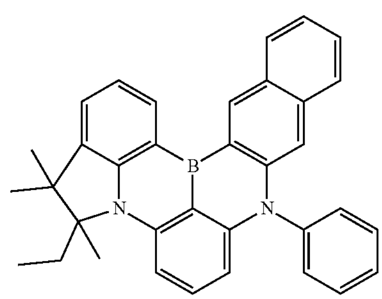

-continued
9
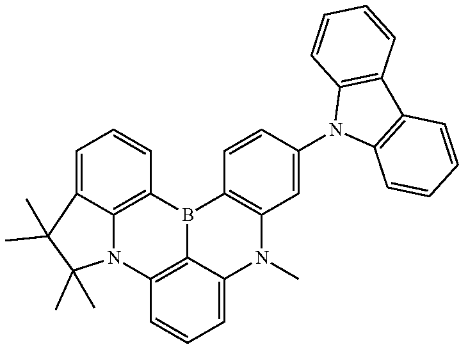
10
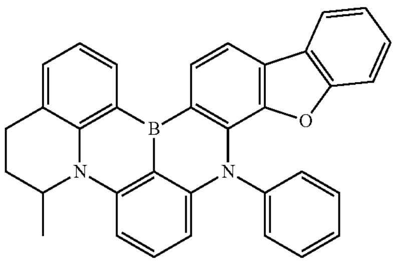
11
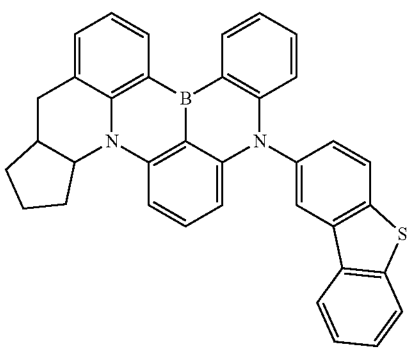
12
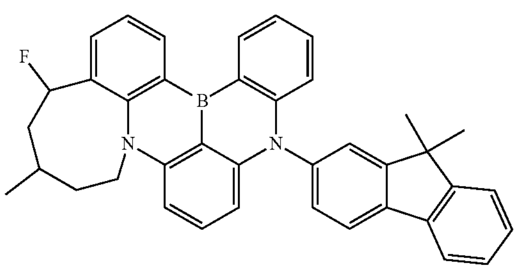
13
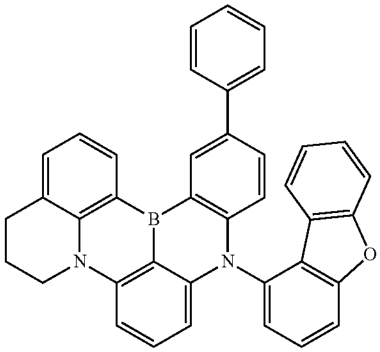
-continued
14
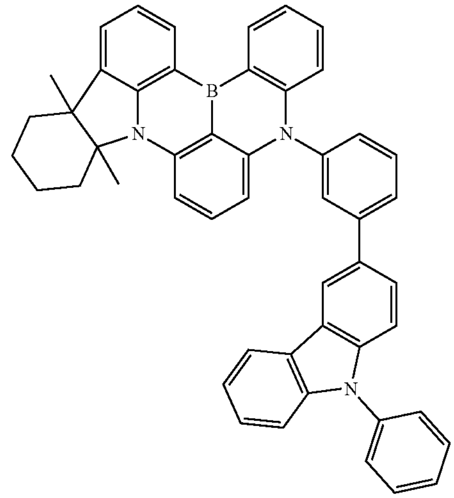
15
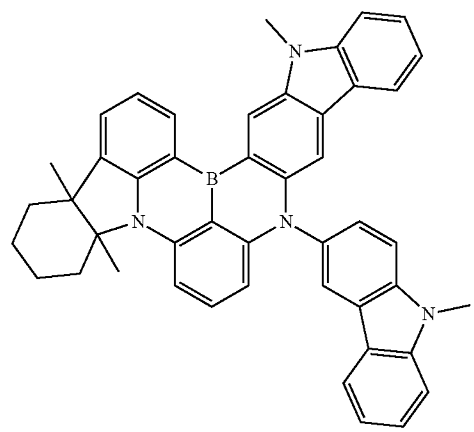
16
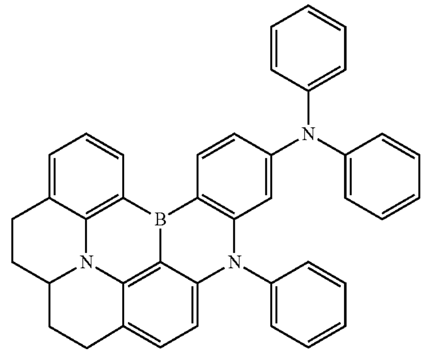

-continued
17
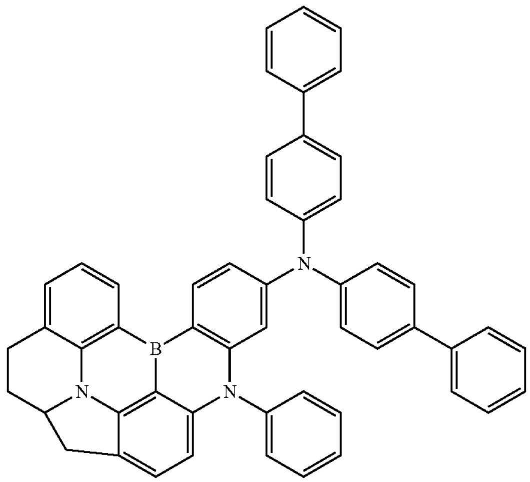
18
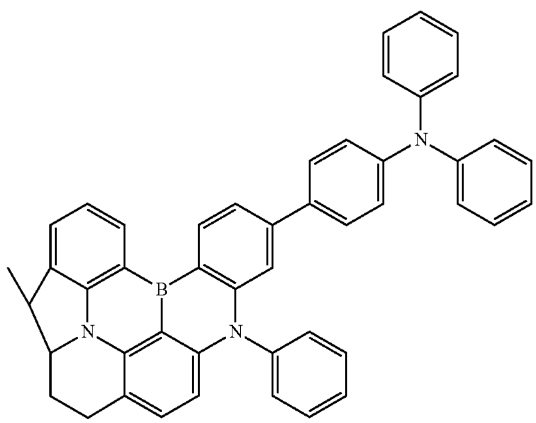
19
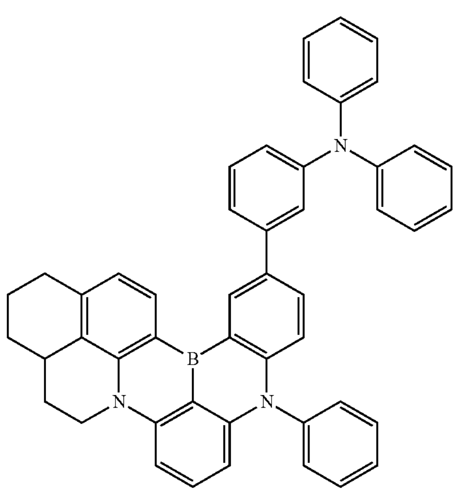
-continued
20
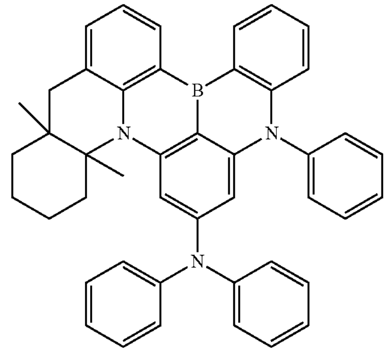
21
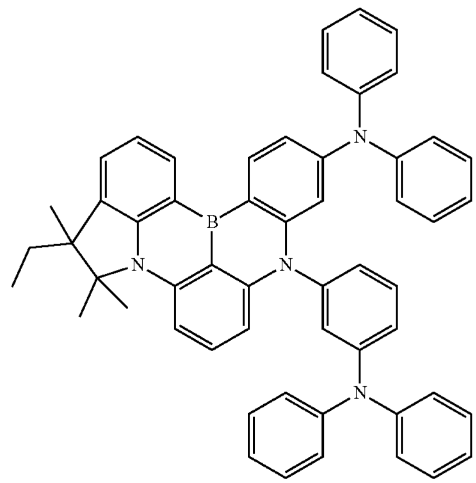
22
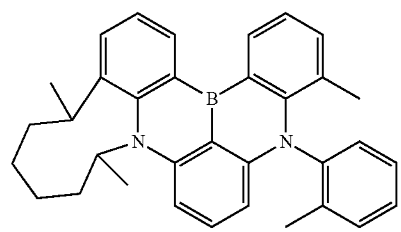
23
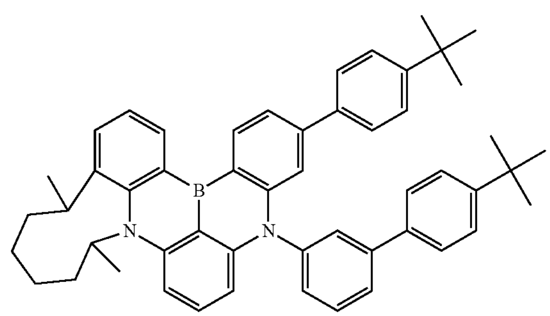
24
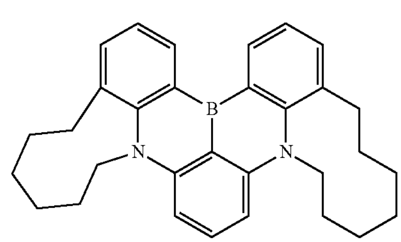

-continued
25
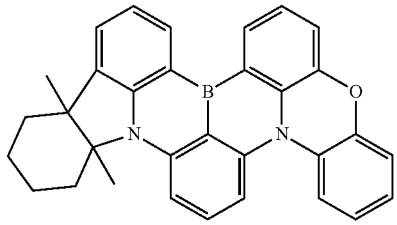
26
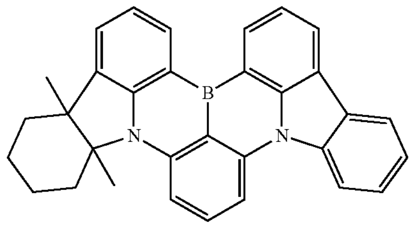
27
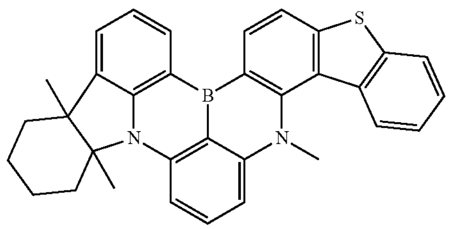
28
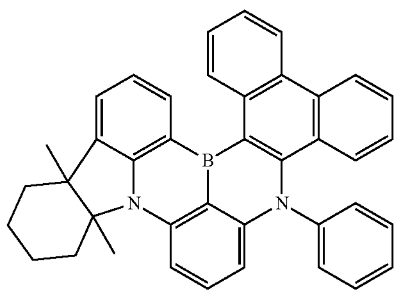
29
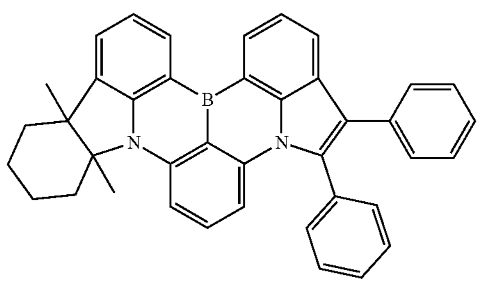
30
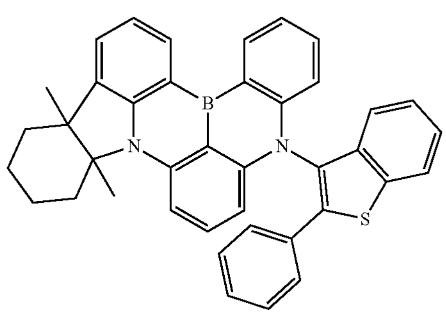
-continued
31
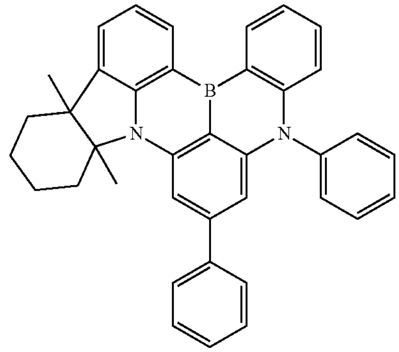
32
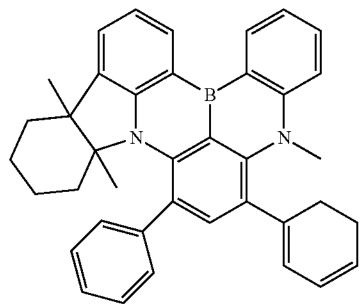
33
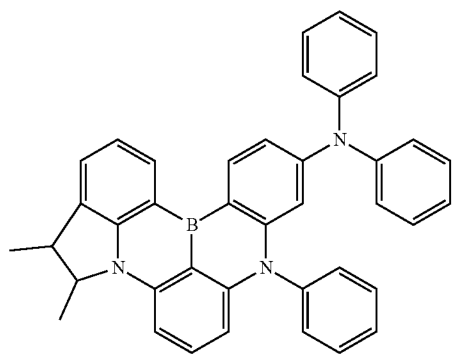
34
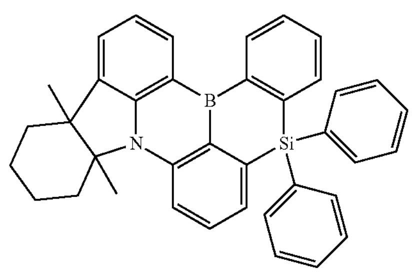

-continued
35
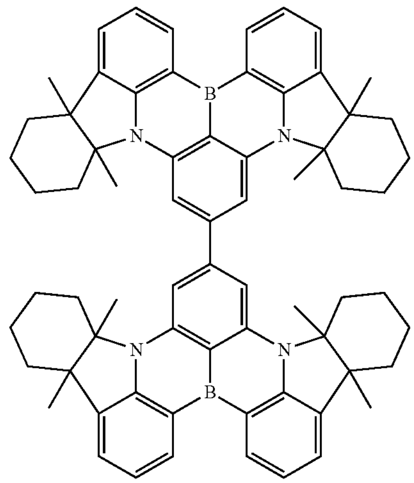
36
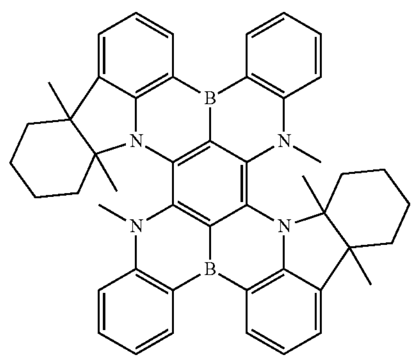
37
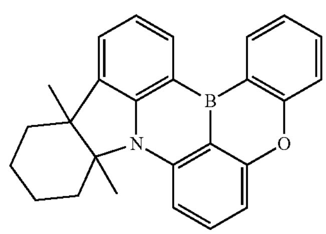
38
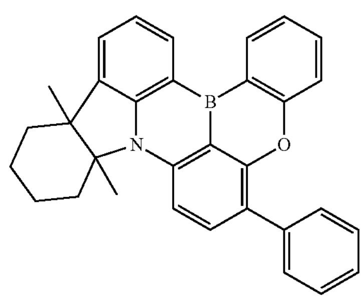
-continued
39
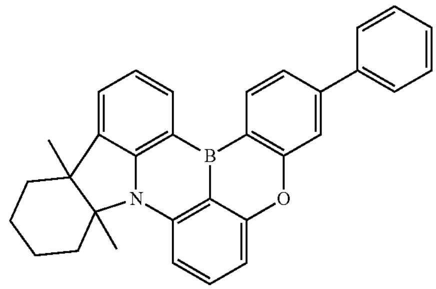
40
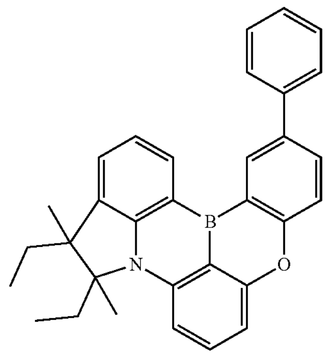
41
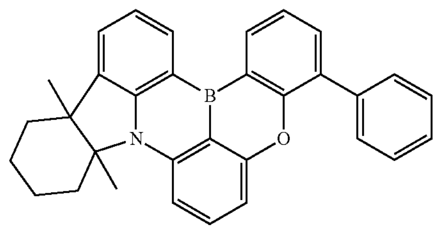
42
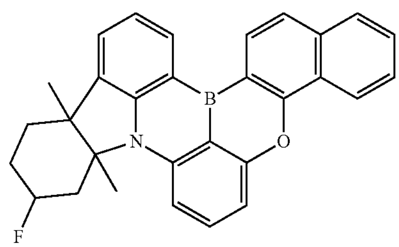
43
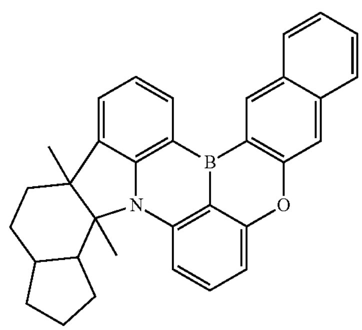

-continued
44
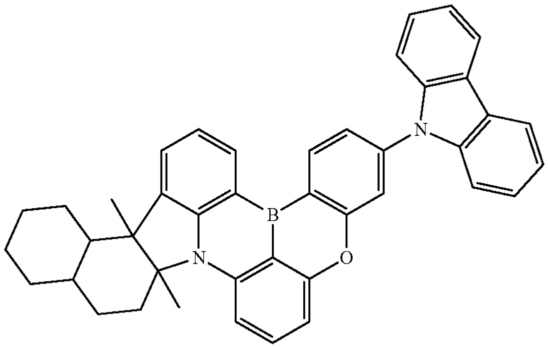
45
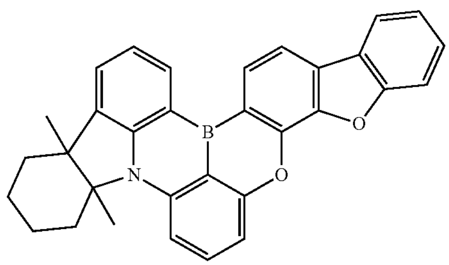
46
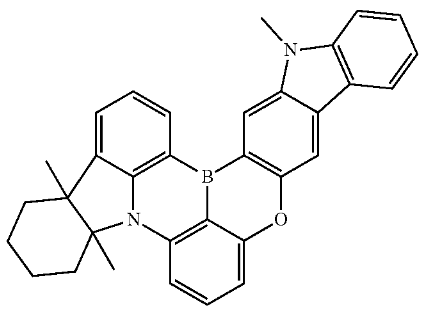
47
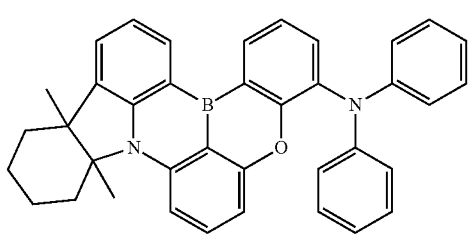
48
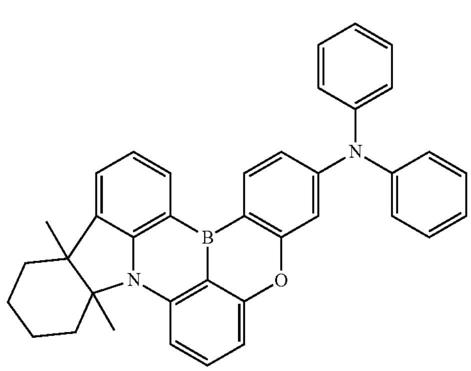
-continued
49
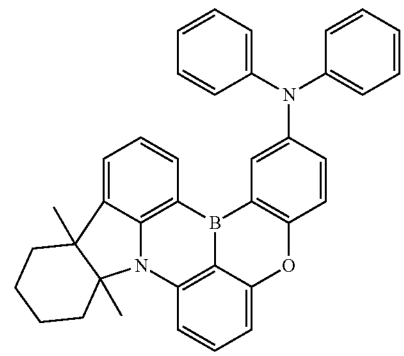
50
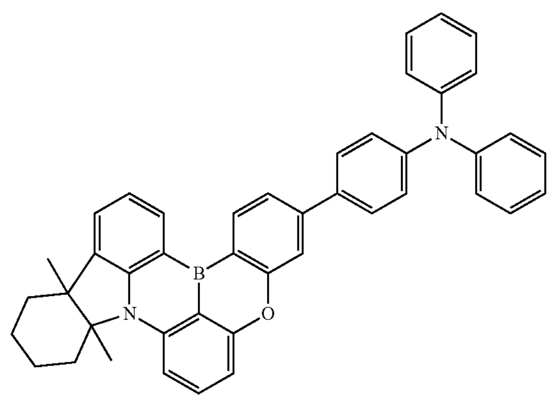
51
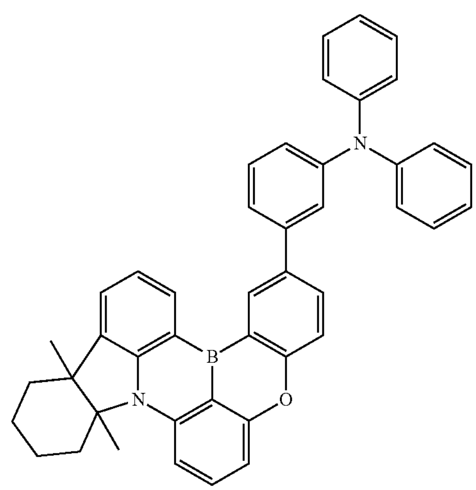
52
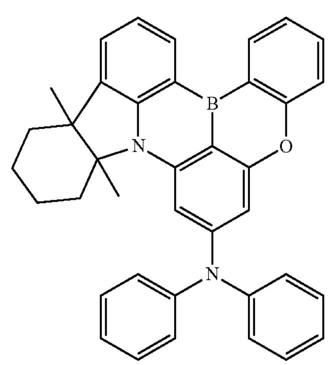

53
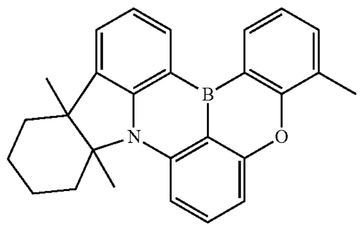
54
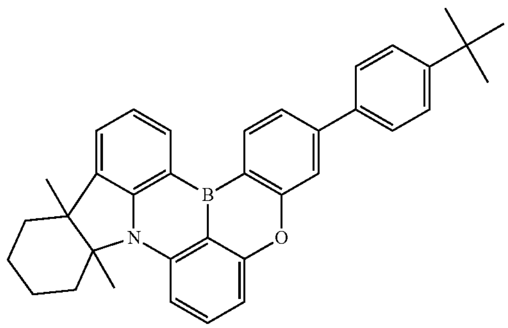
55
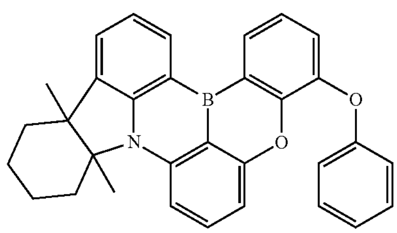
56
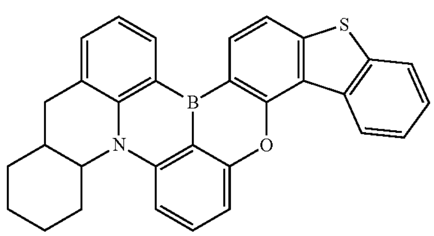
57
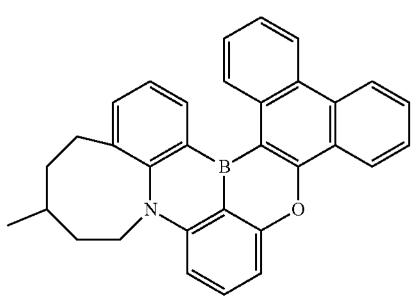
58
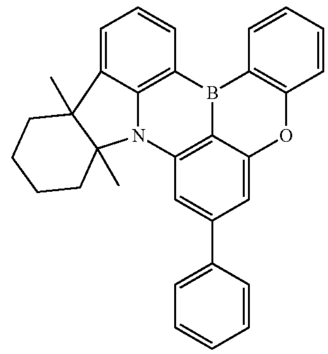
59
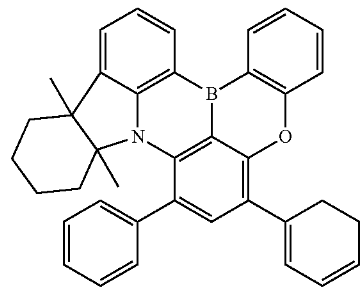
60
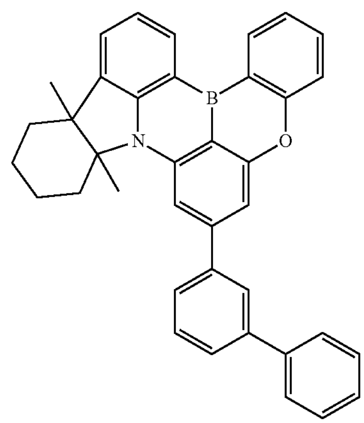
61
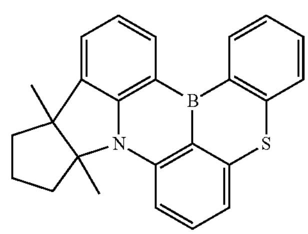
62
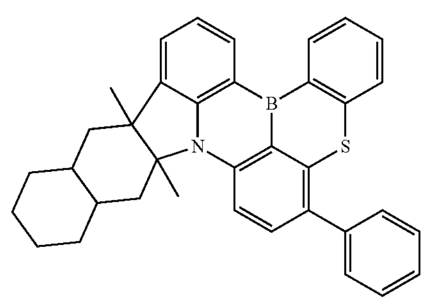

63
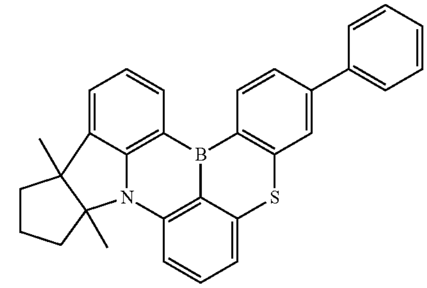
64
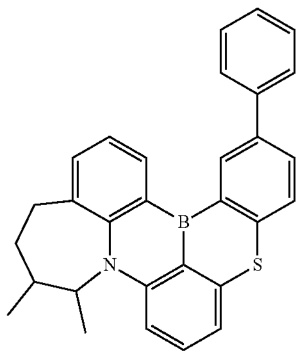
65
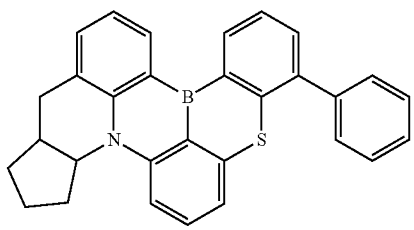
66
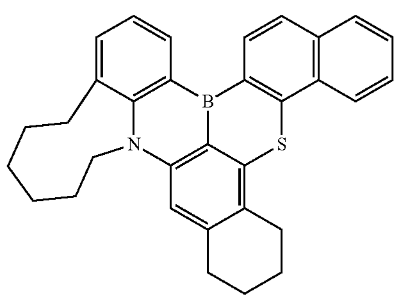
67
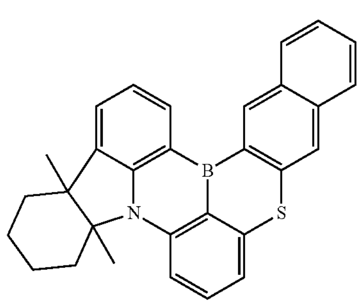
68
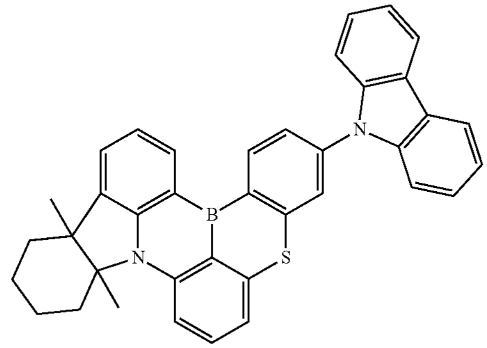
69
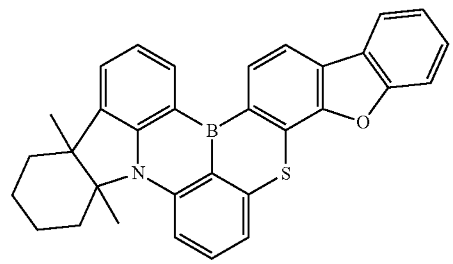
70
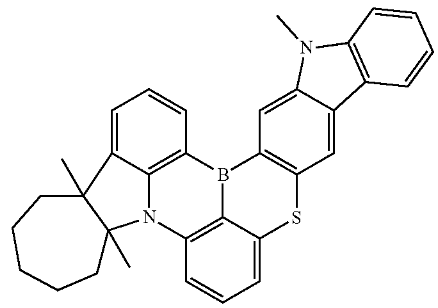
71
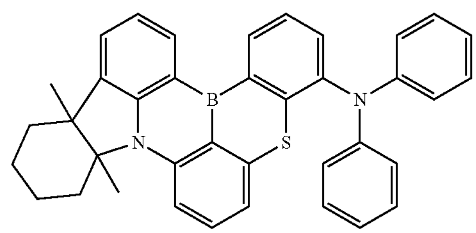
72
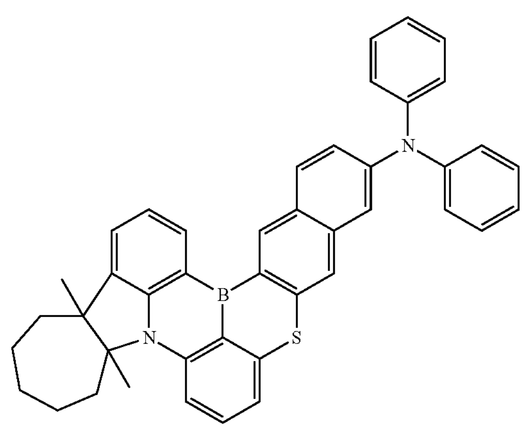

-continued
73
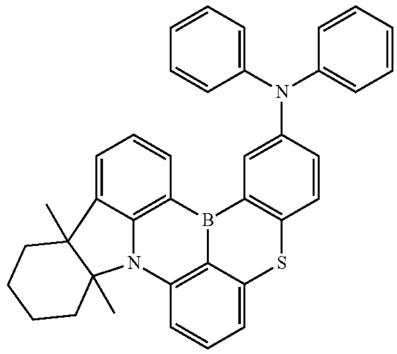
74
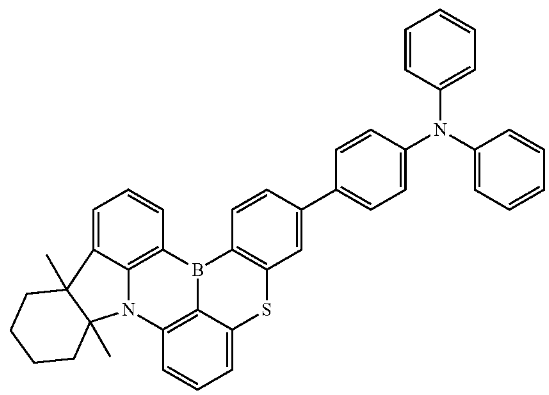
75
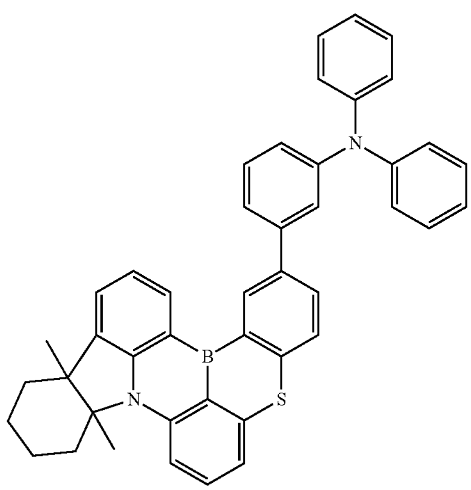
76
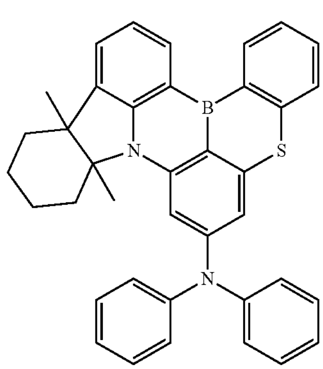
-continued
77
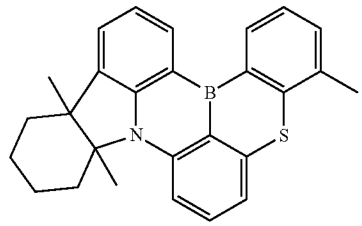
78
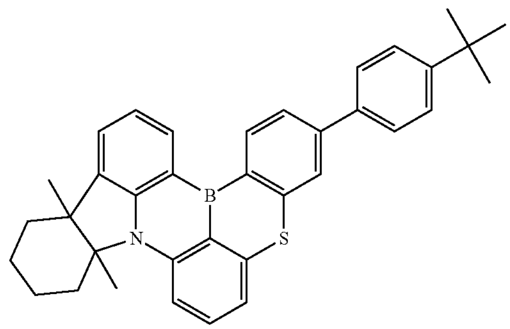
79
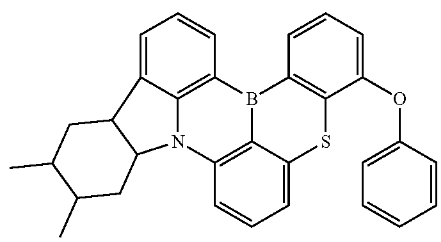
80
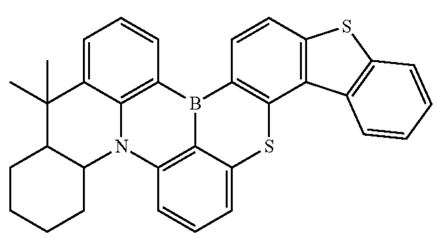
81
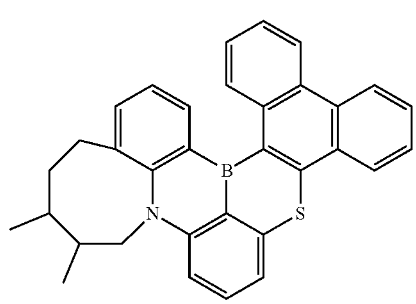

82
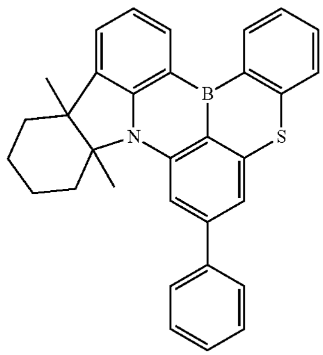
83
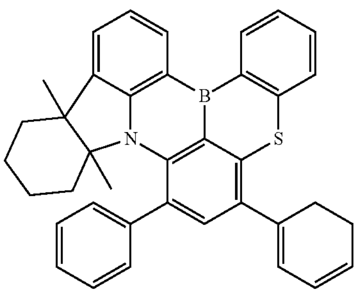
84
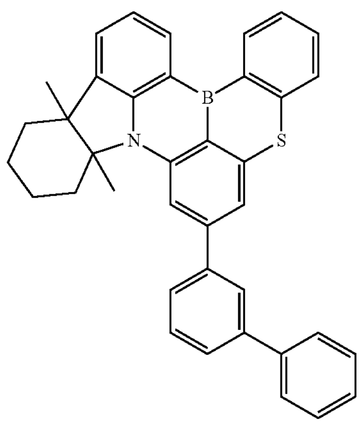
85
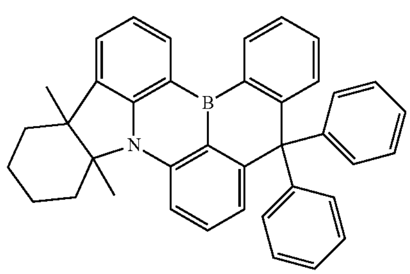
86
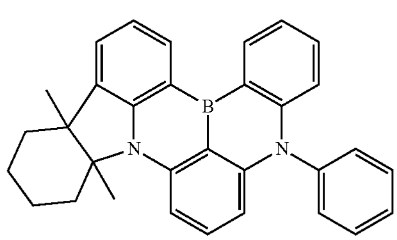
87
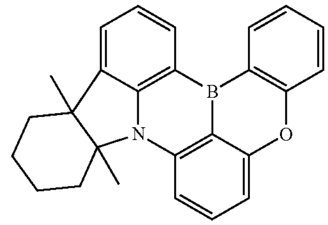
88
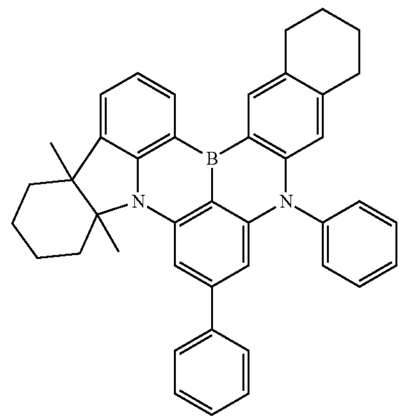
89
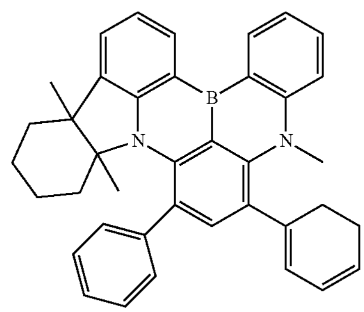
90
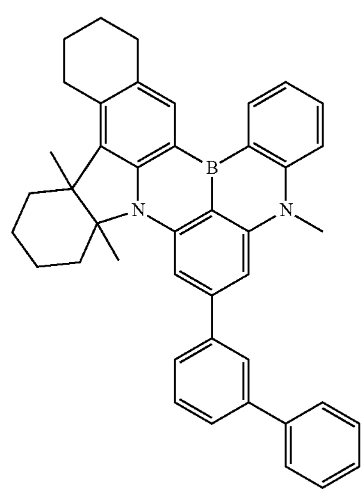

-continued
91
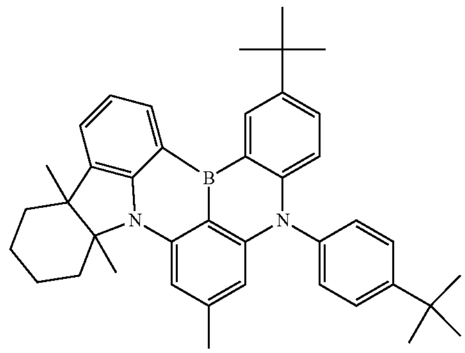
92
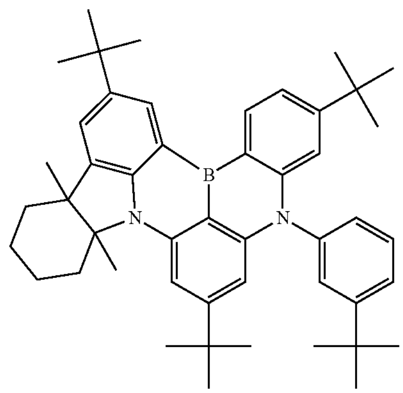
93
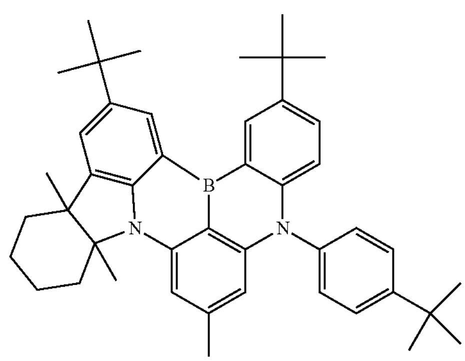
94
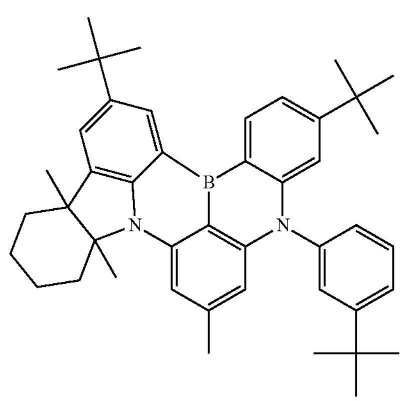
-continued
95
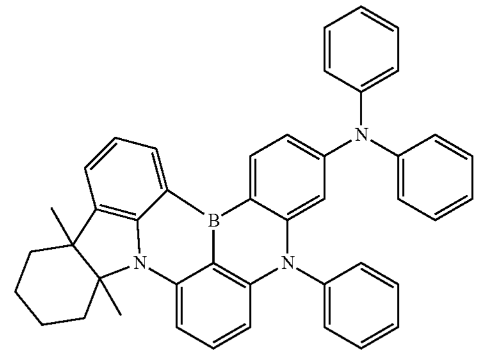
96
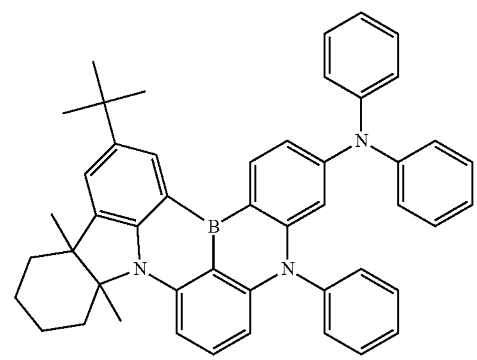
97
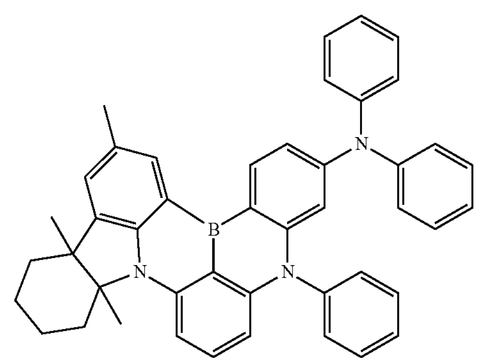
98
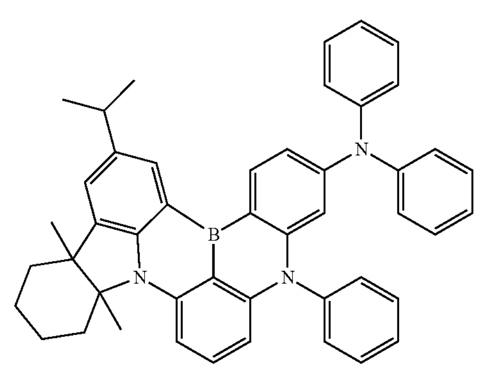

-continued
99
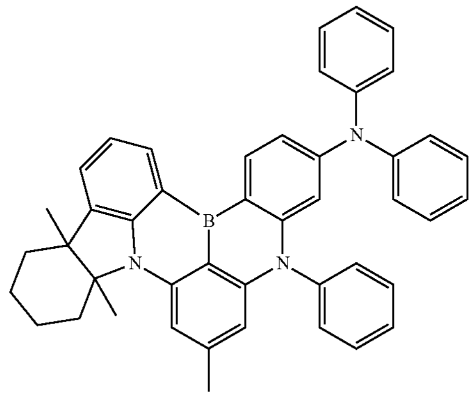
100
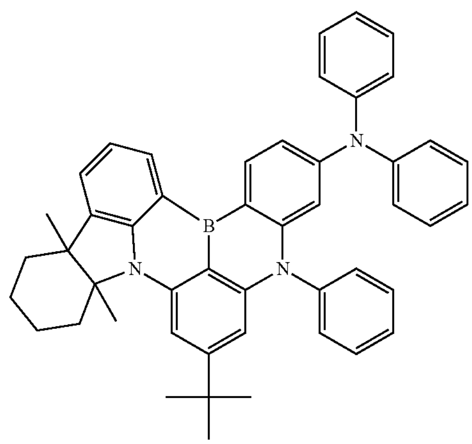
101
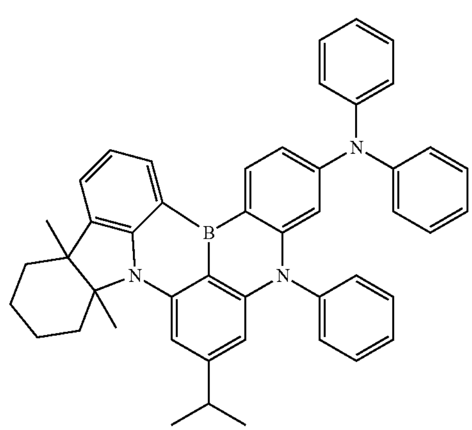
-continued
102
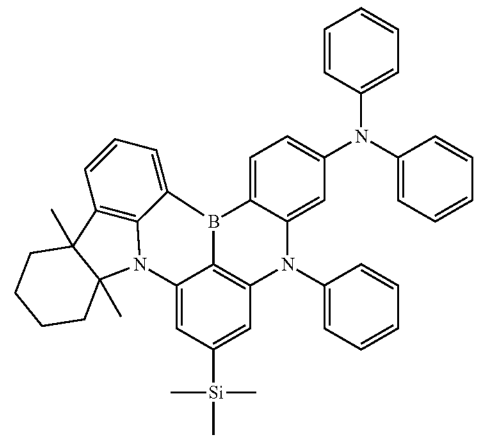
103
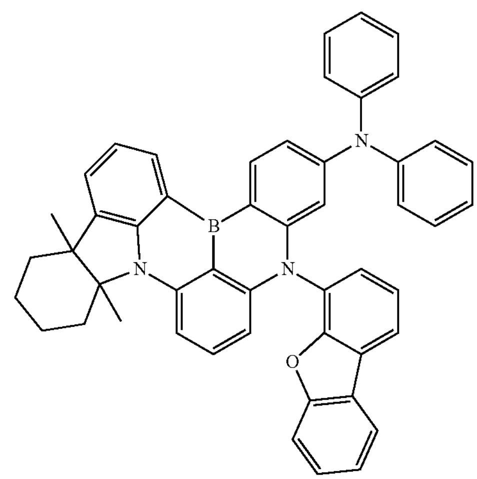
104
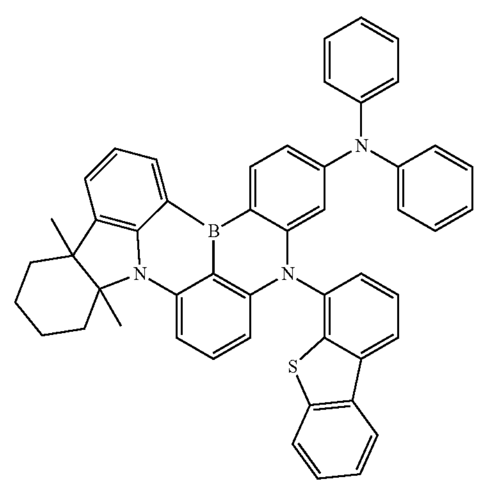

-continued
105
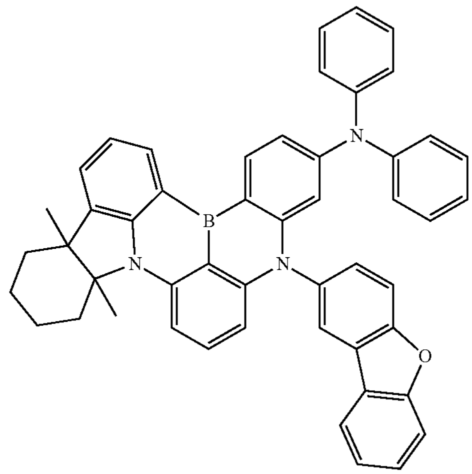
106
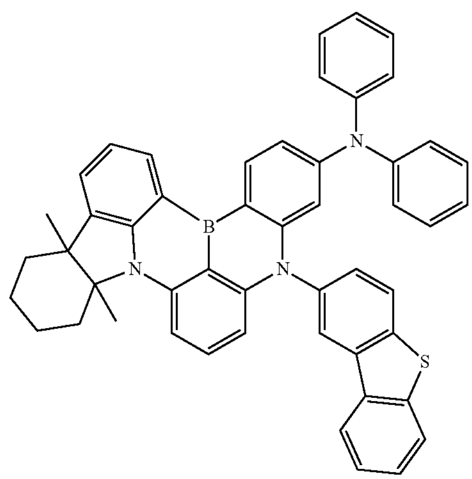
107
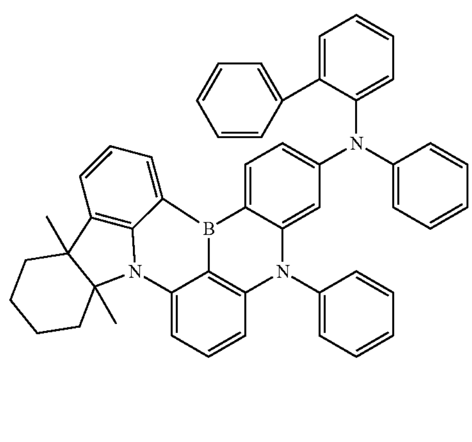
-continued
108
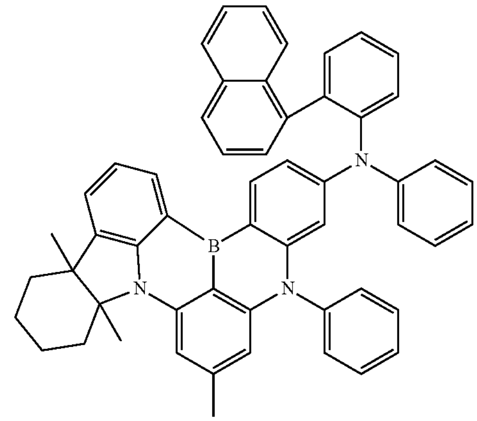
109
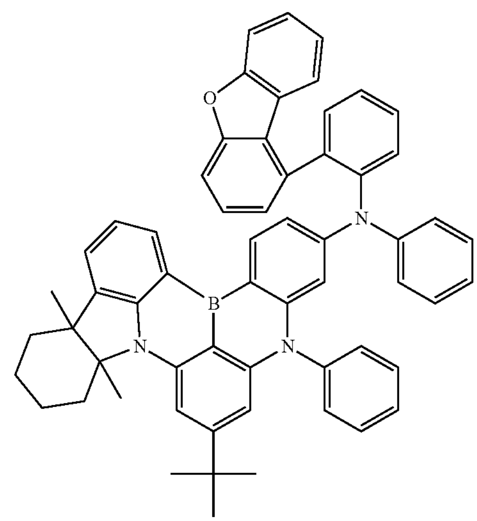
110
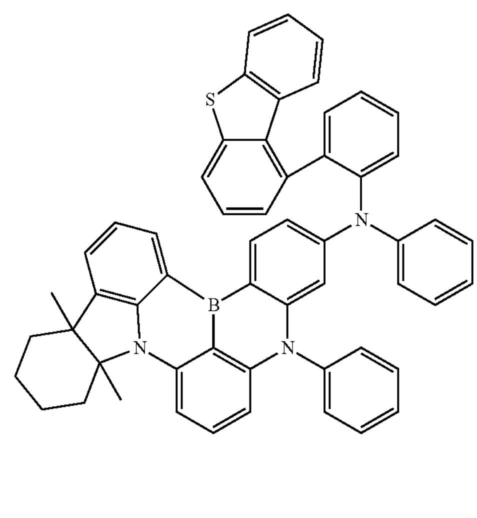

-continued
111
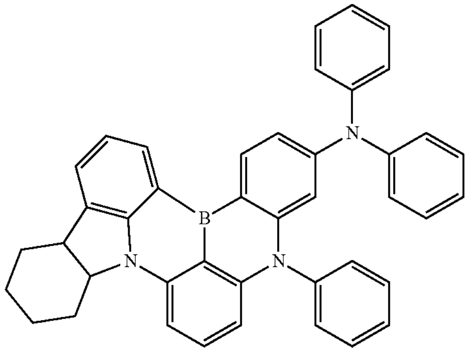
112
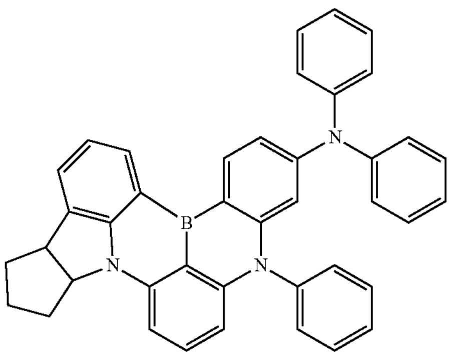
113
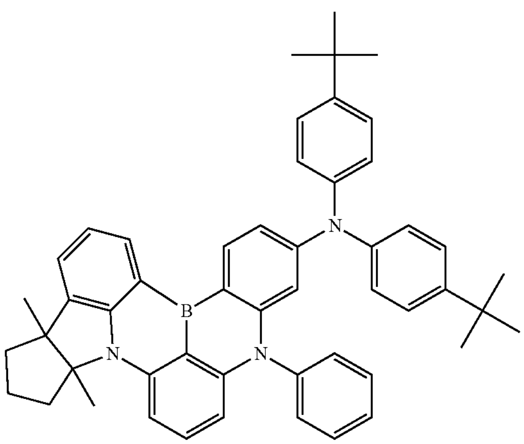
114
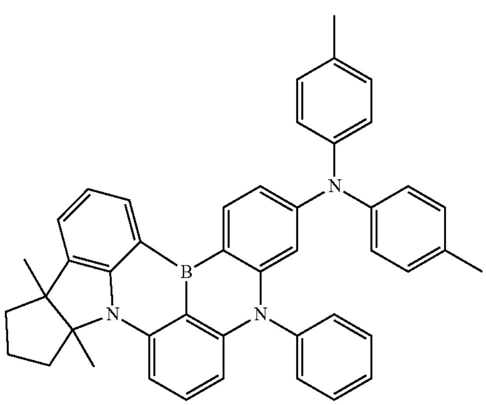
-continued
115
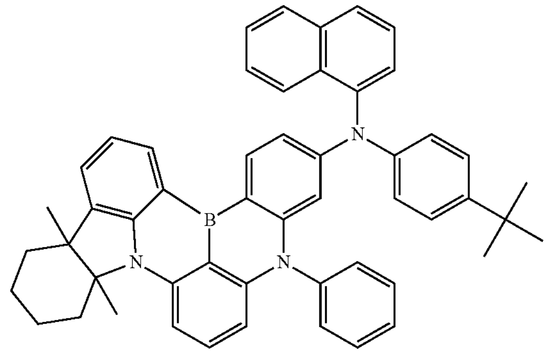
116
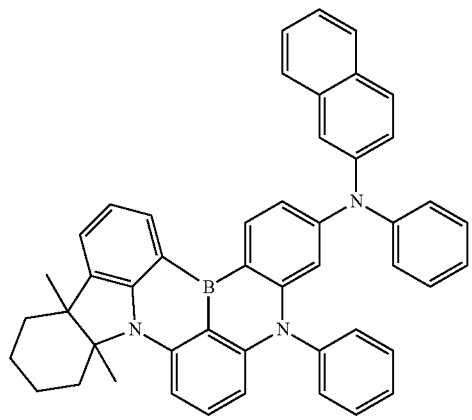
117
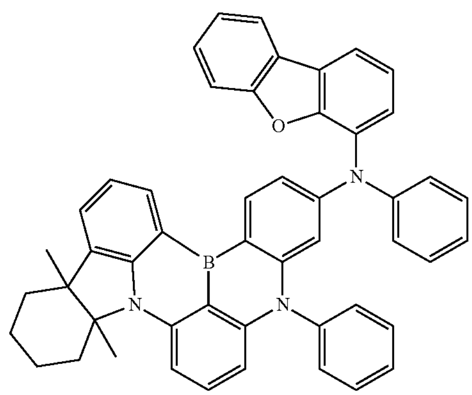
118
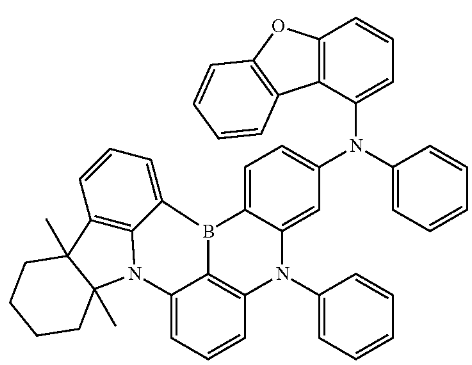

-continued
119
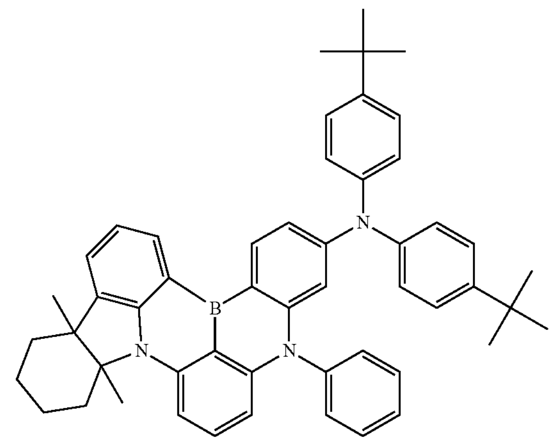
120
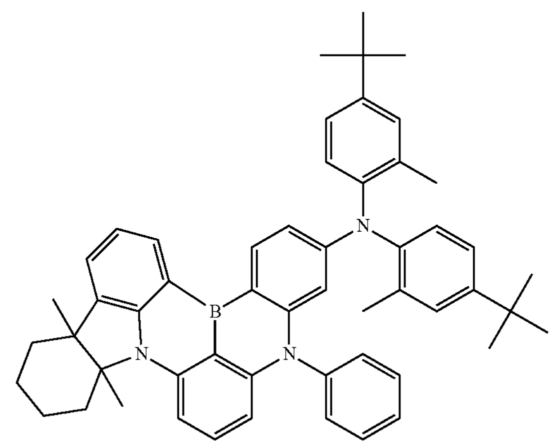
121
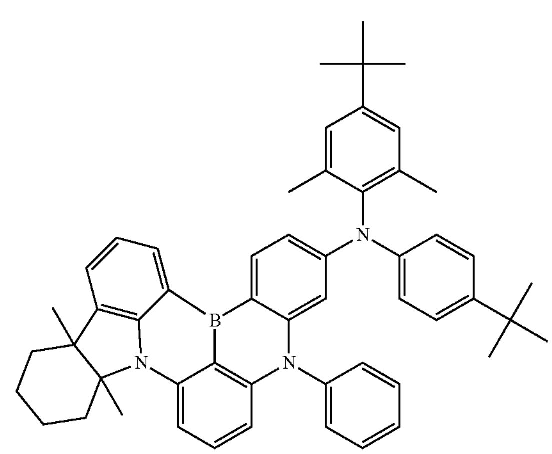
-continued
122
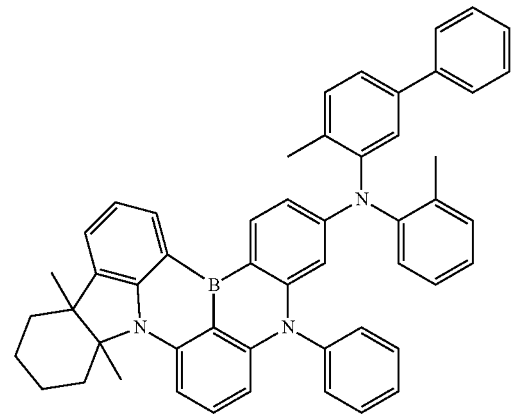
123
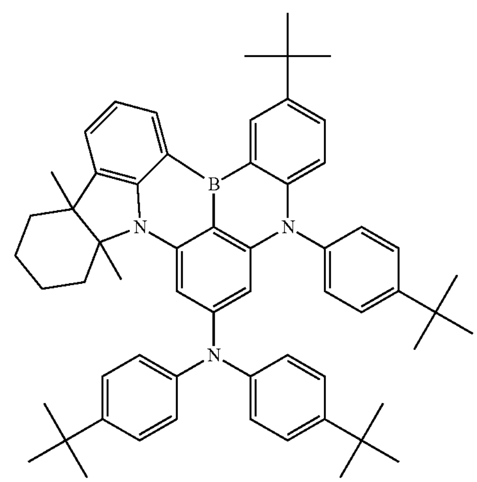
124
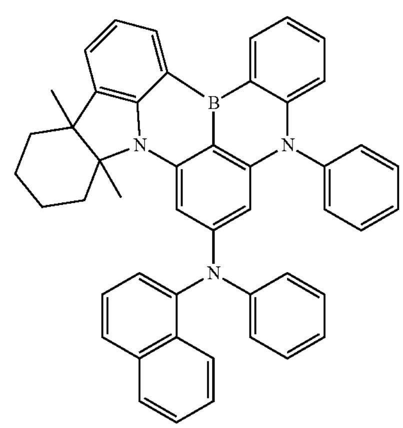

-continued
125
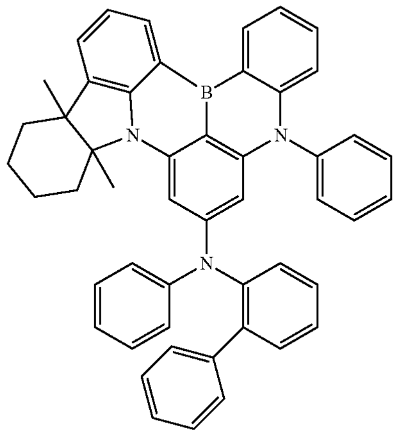
126
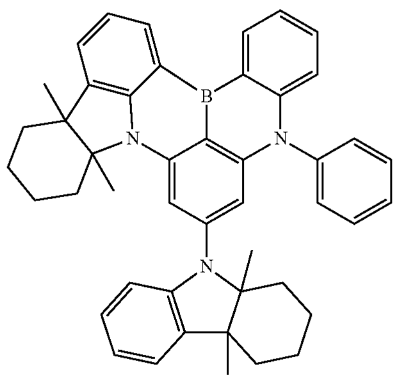
127
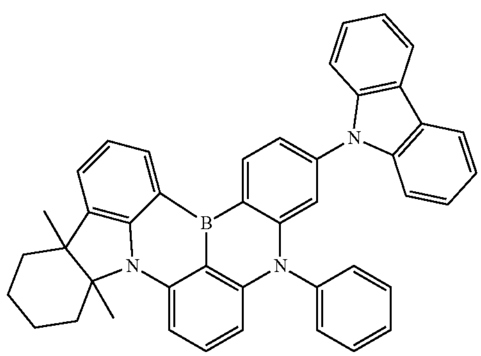
128
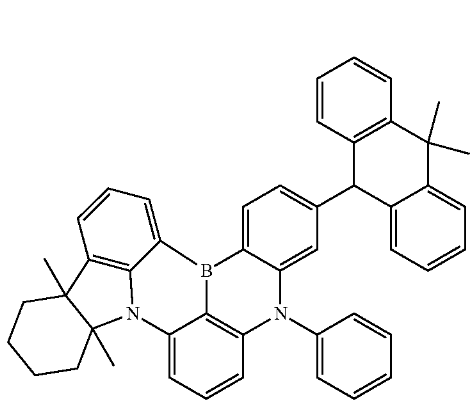
-continued
129
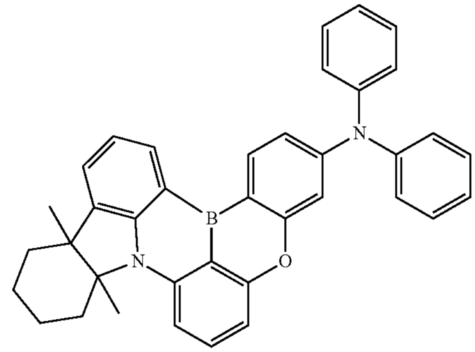
130
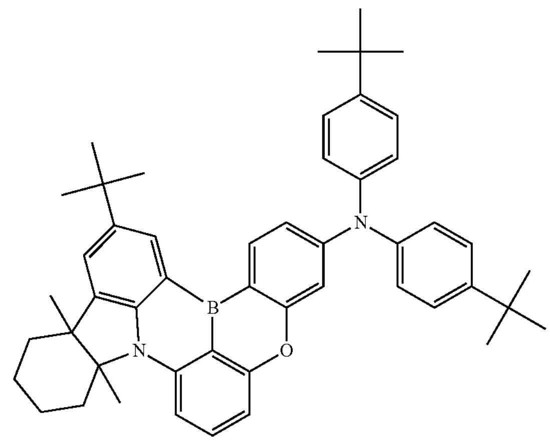
131
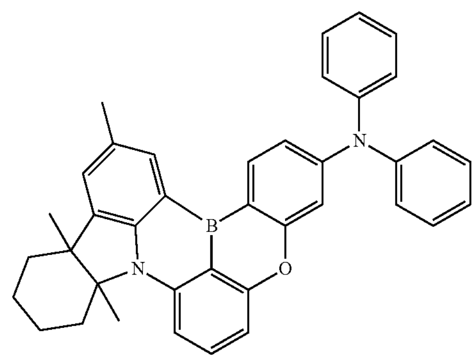
132
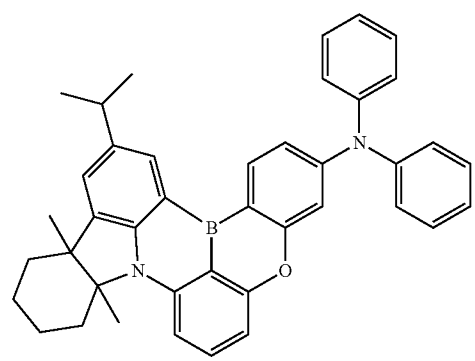
As can be seen from the specific compounds, an organic light-emitting material having the intrinsic properties of the substituent can be synthesized, in particular, a dopant material used in the light-emitting layer can be prepared by forming a polycyclic aromatic structure including B, P, and P═O and introducing substituents therein and a highly efficient organic light-emitting device can be realized by applying the compound represented by [Formula A] according to the present invention to the device.

In addition, in another aspect, the present invention is directed to an organic light-emitting device including a first electrode, a second electrode, and a hole injection layer and/or a hole transport layer and a light-emitting layer interposed between the first electrode and the second electrode, and the organic light-emitting device may be fabricated using a conventional method and materials for fabricating devices using the compound of [Formula A] in the hole injection layer, the hole transport layer, and a functional layer capable of injecting and/or transporting holes, and the compounds of [Formula B] to [Formula D] as dopants in the light-emitting layer.

In addition to the light-emitting layer, the hole injection layer, the hole transport layer, and the functional layer capable of injecting and/or transporting holes, the organic light-emitting device according to the present invention may further include an electron transport layer, an electron injection layer, an electron blocking layer, a hole blocking layer, and the like, and the organic light-emitting device may use materials for the respective layers.

Specifically, the organic light-emitting device according to the present invention may use the following anthracene derivative compound as a host compound for the light-emitting layer.

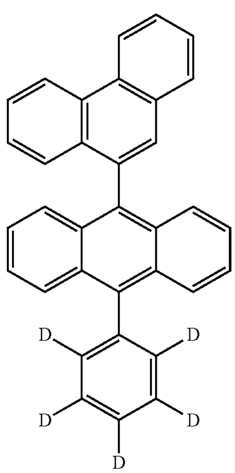

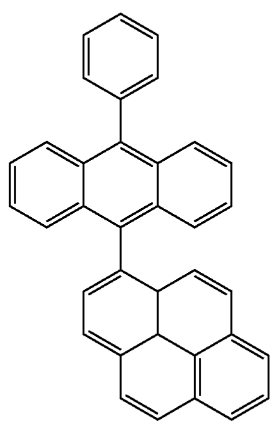

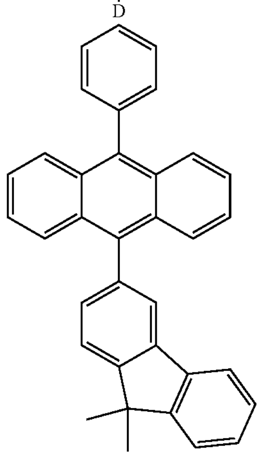

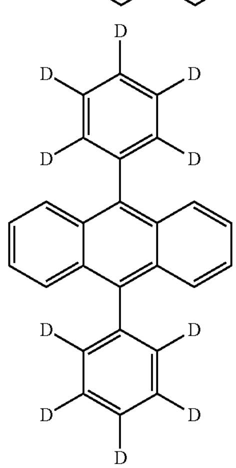

-continued

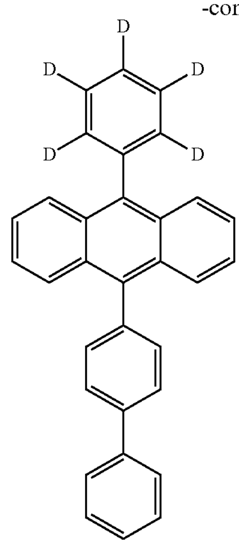

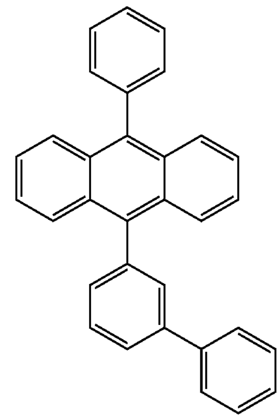

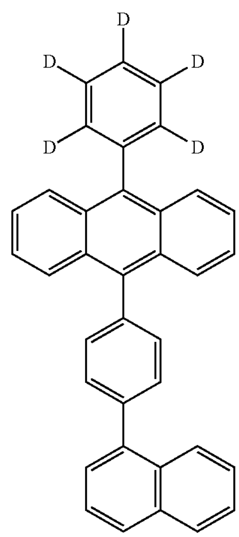

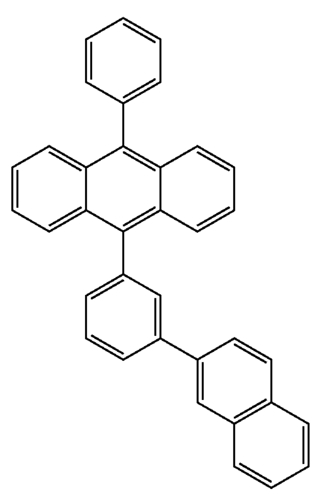

-continued
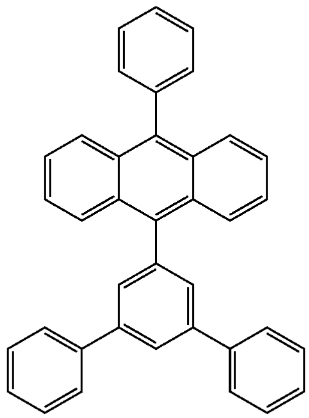
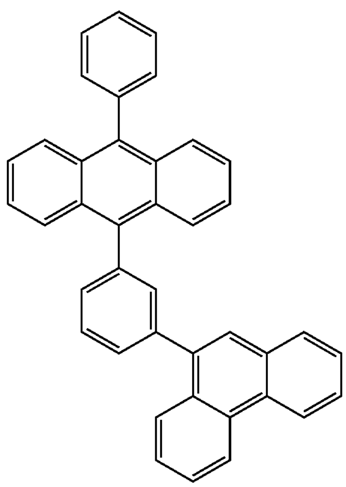
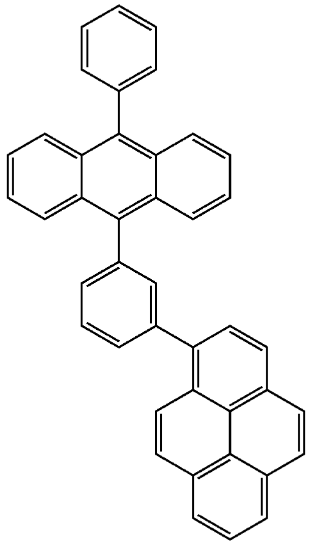
-continued
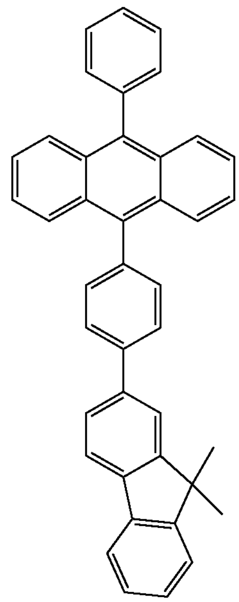
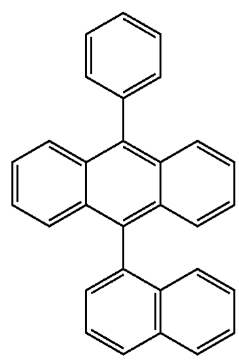
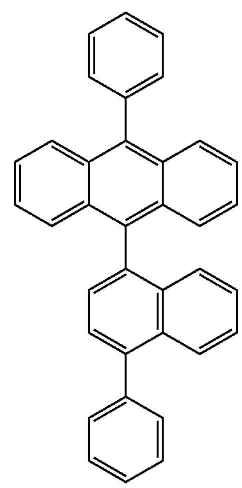
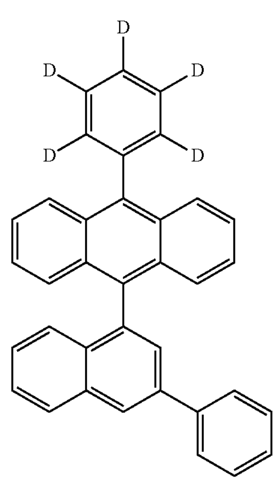
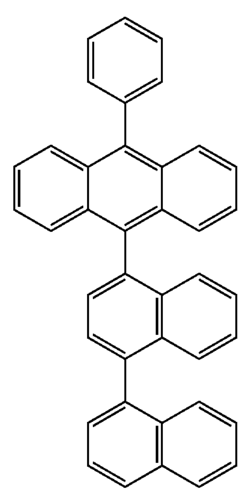

-continued
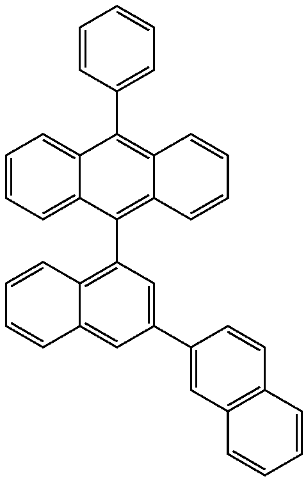
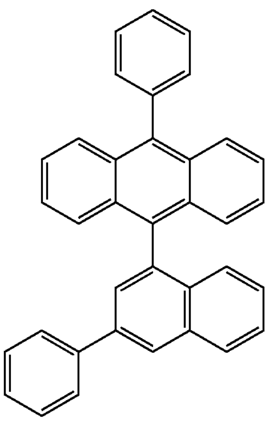
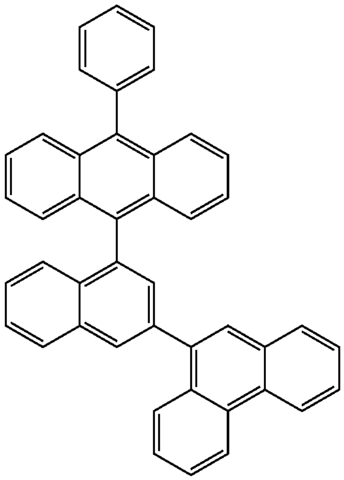
-continued
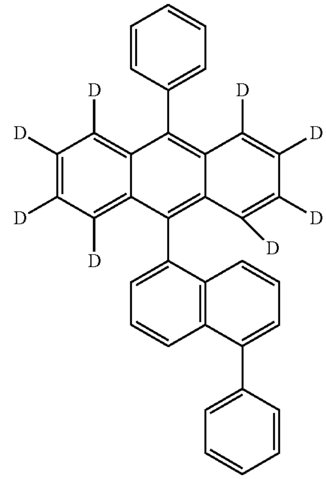
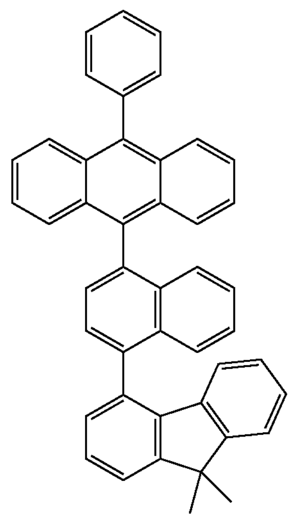
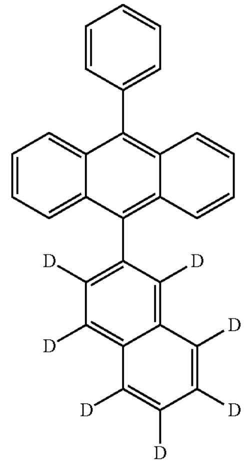

-continued
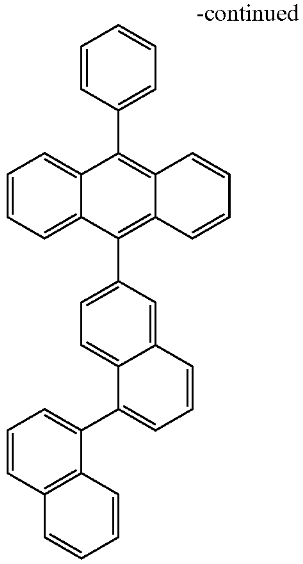
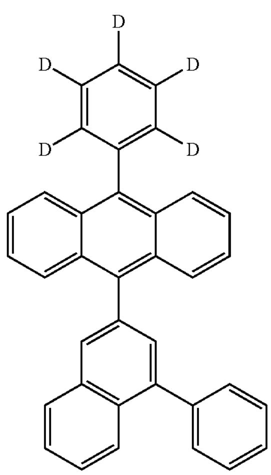
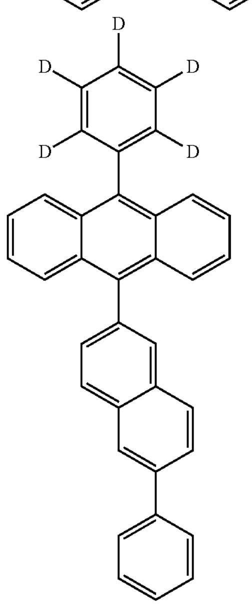
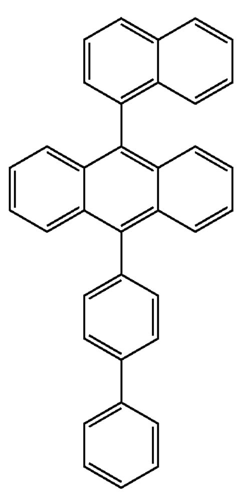
-continued
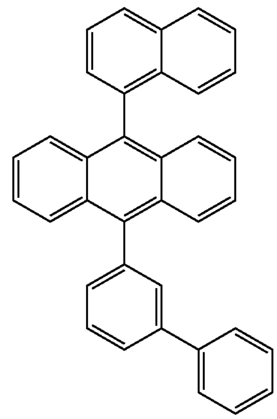
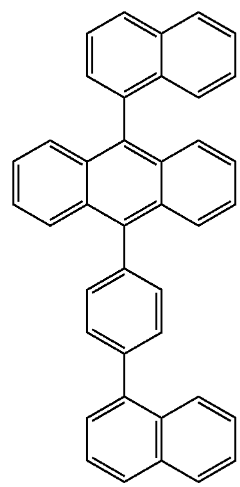
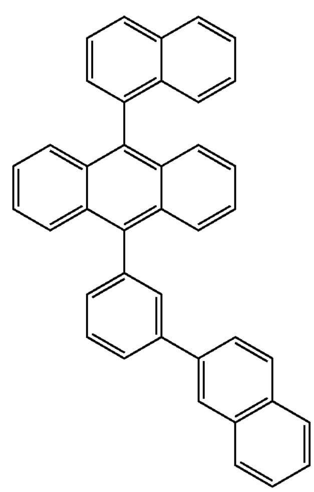

-continued
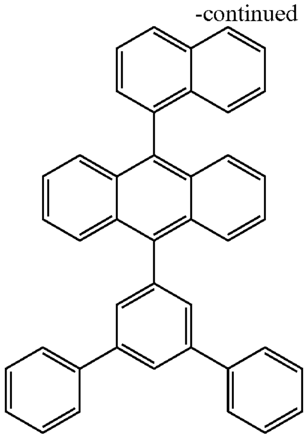
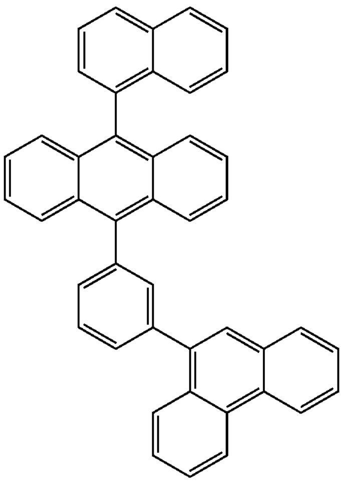
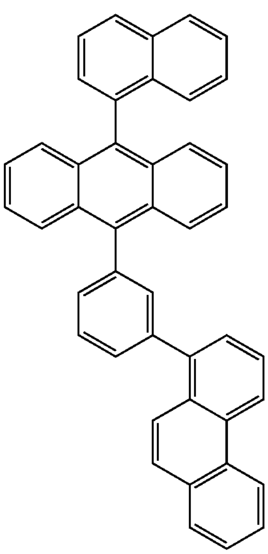
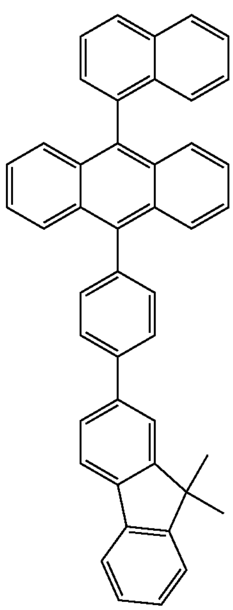
-continued
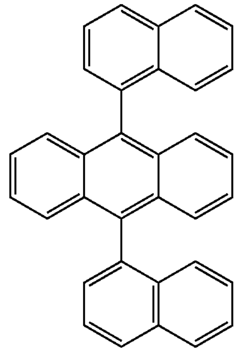
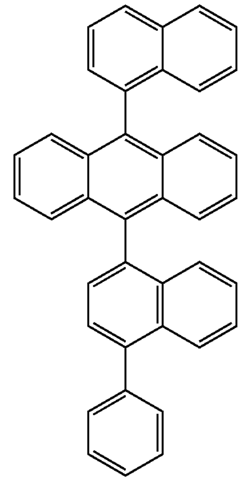
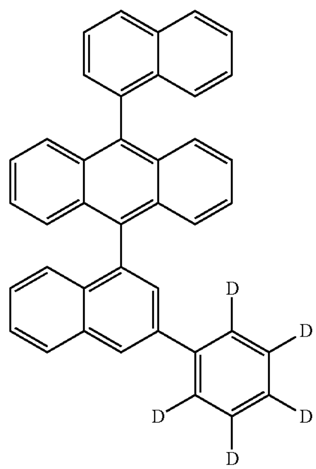
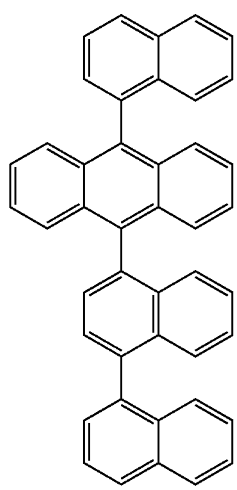

-continued
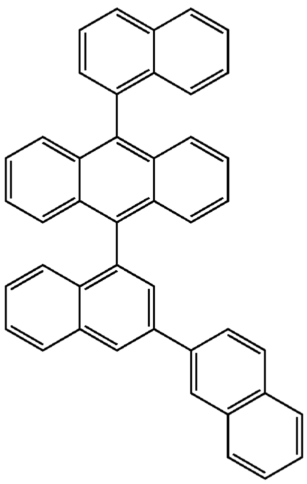
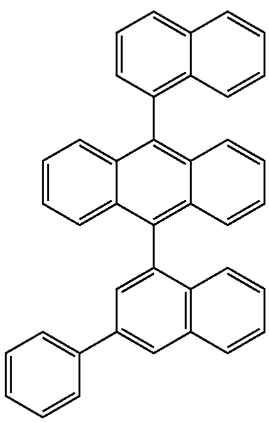
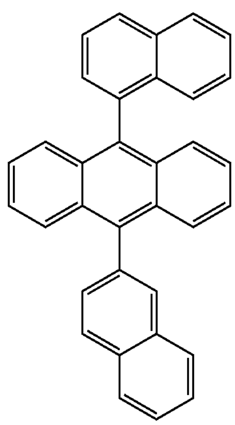
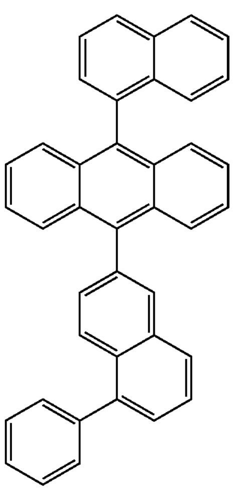
-continued
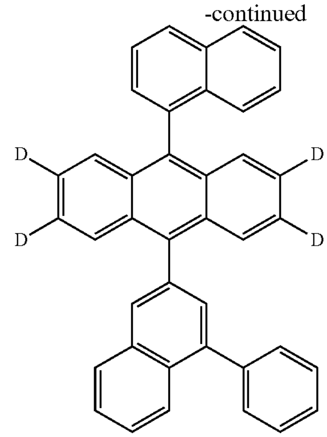
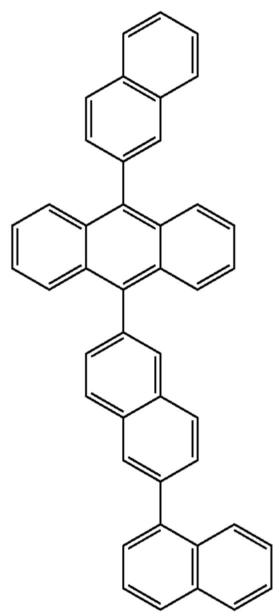
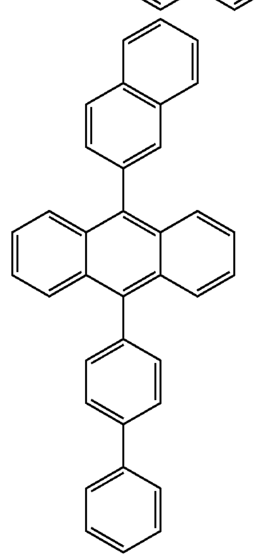

-continued
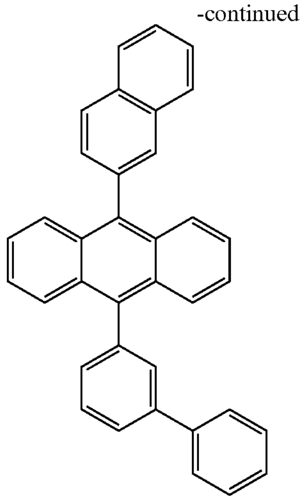
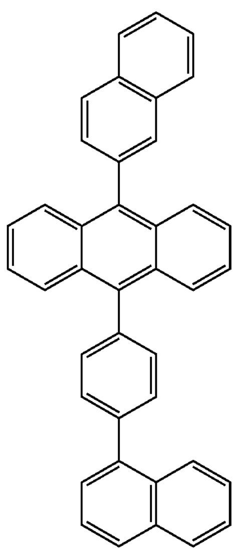
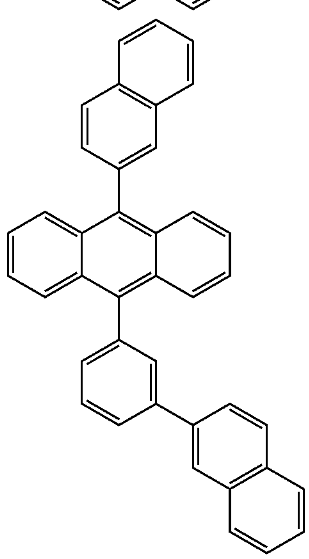
-continued
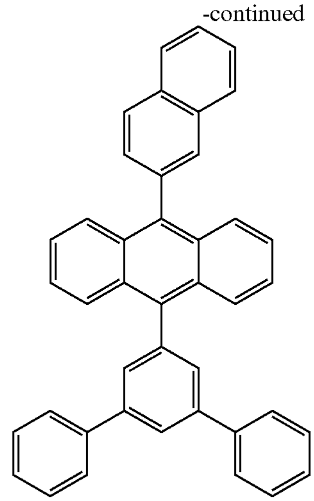
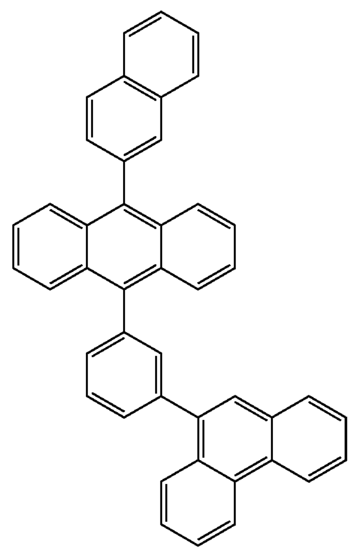
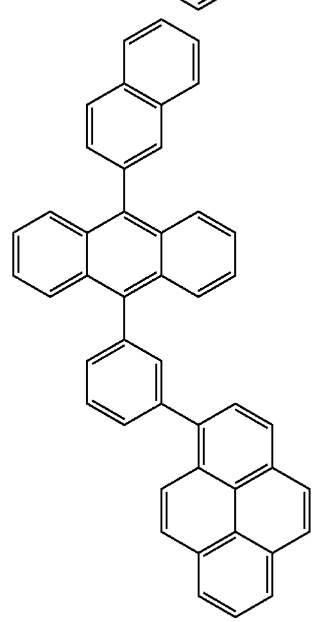

-continued
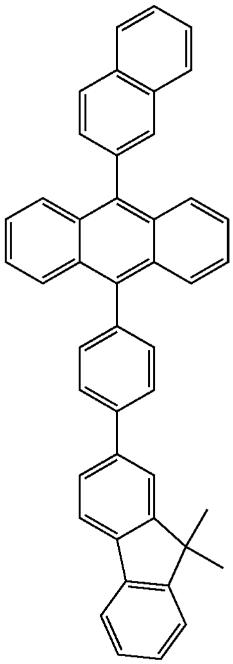
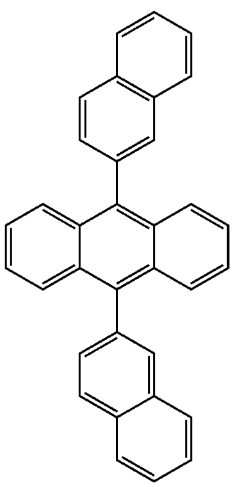
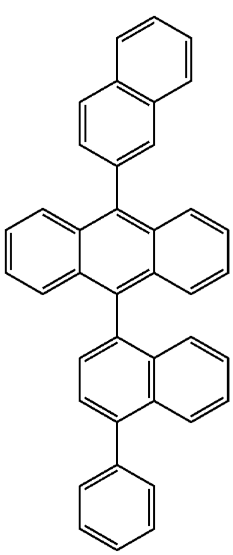
-continued
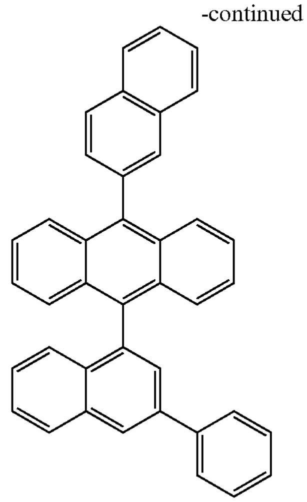
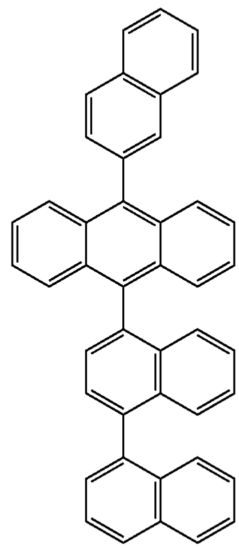
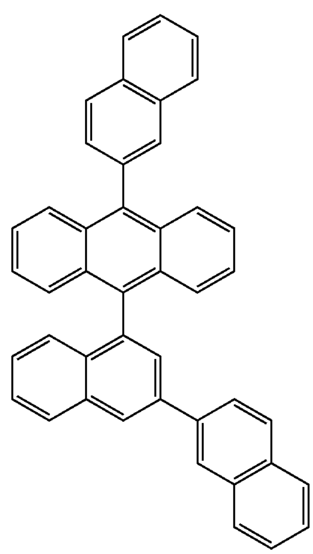

-continued
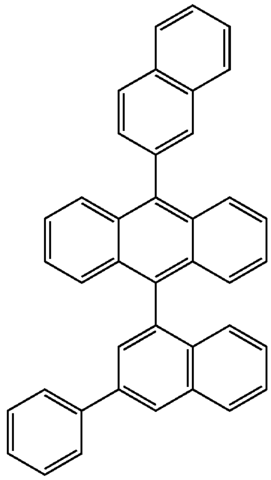
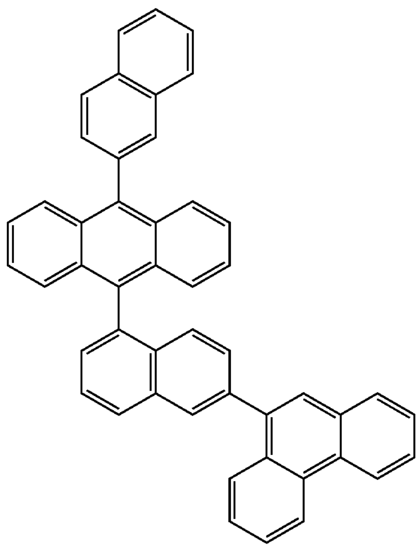
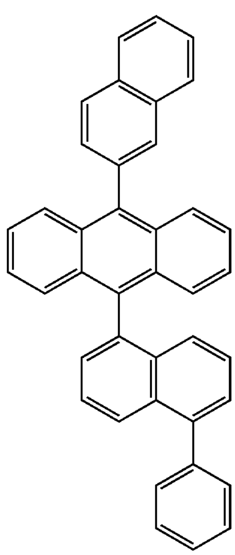
-continued
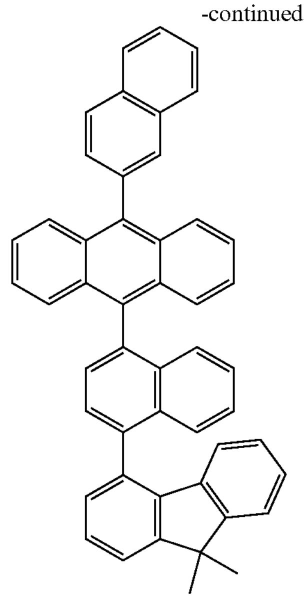
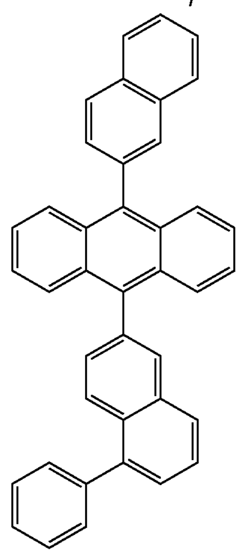
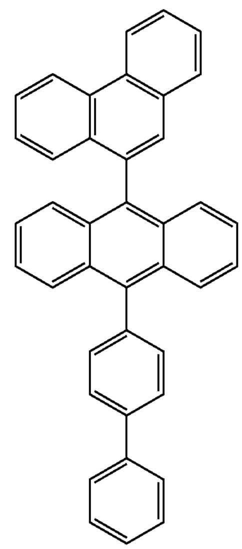
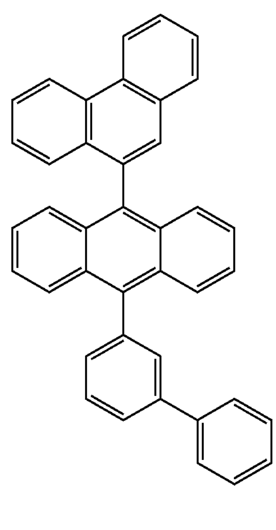
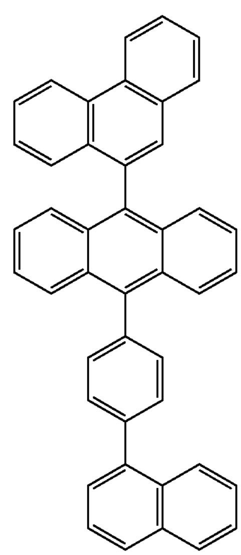

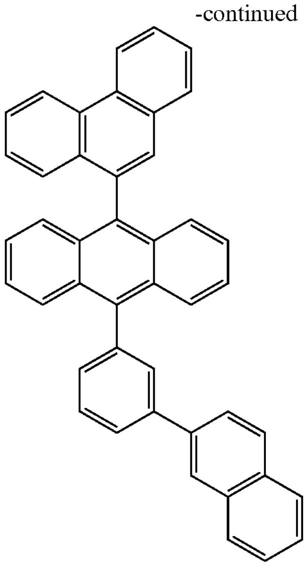
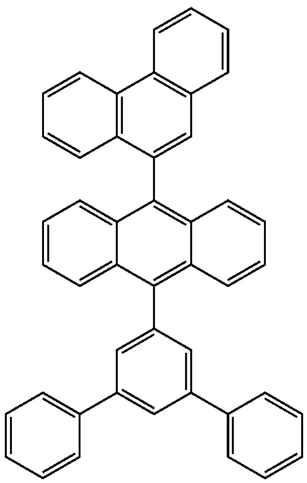
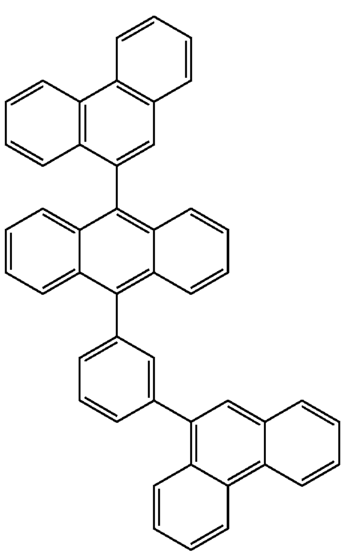
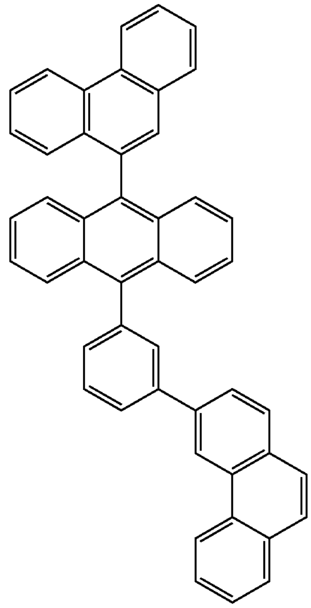
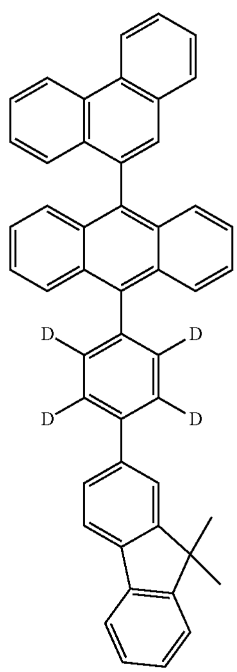
D
D
D
D

-continued
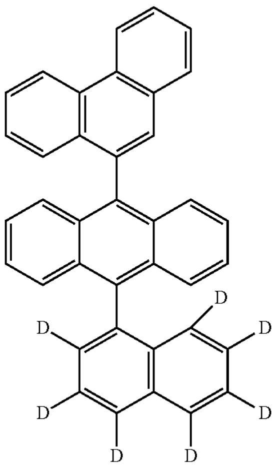
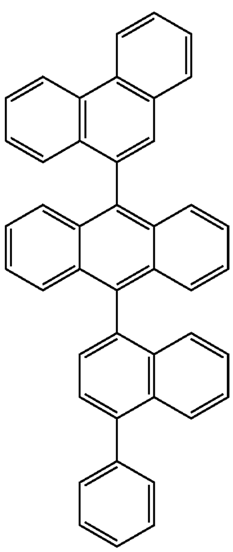
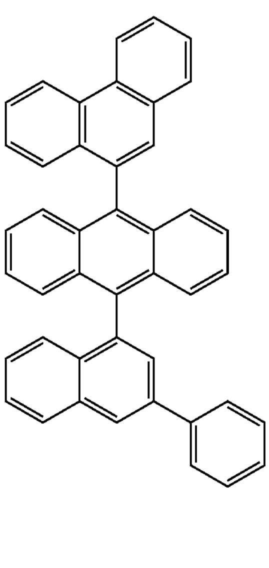
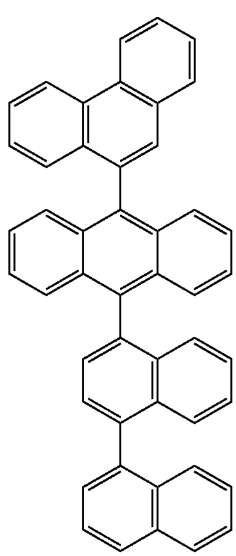
-continued
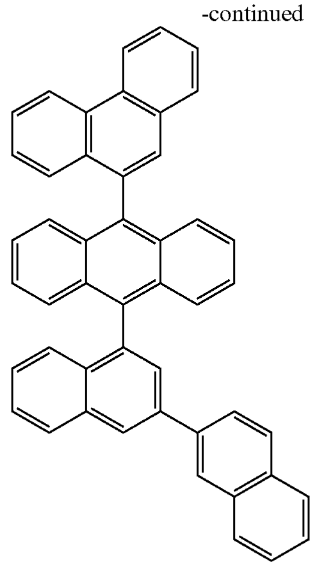
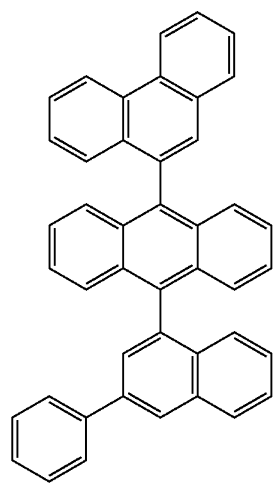
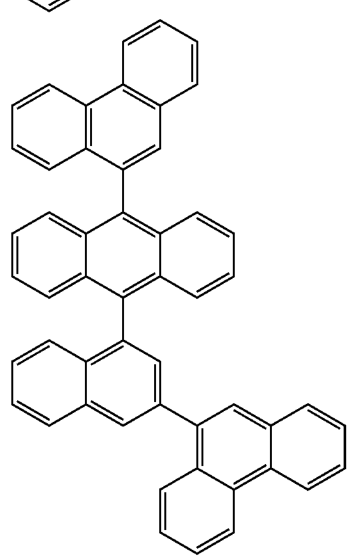

-continued
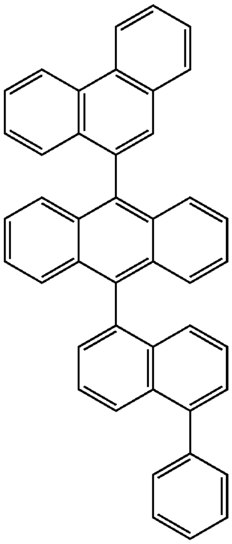
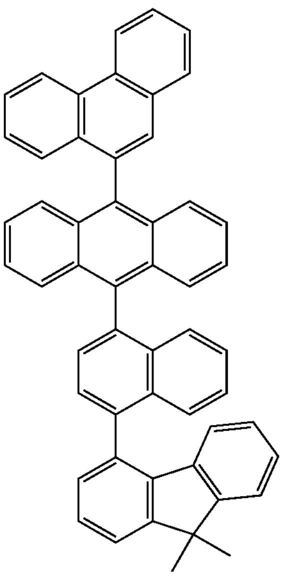
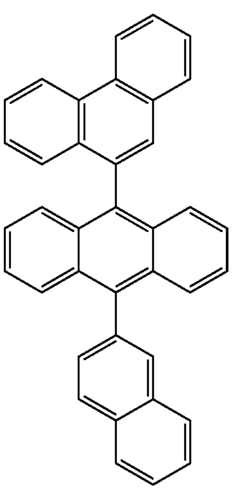
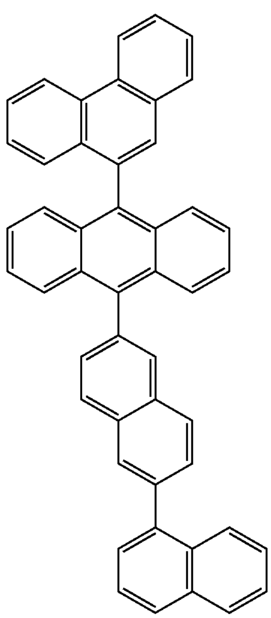
-continued
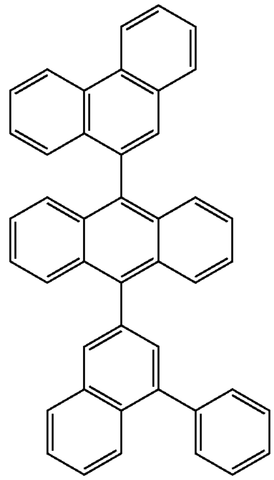
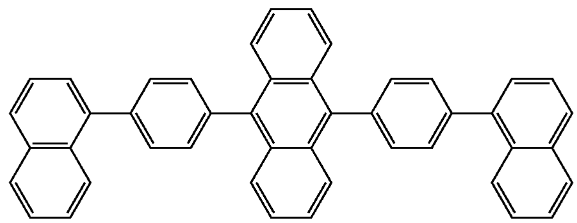
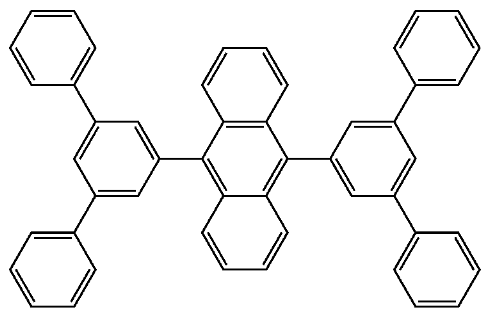
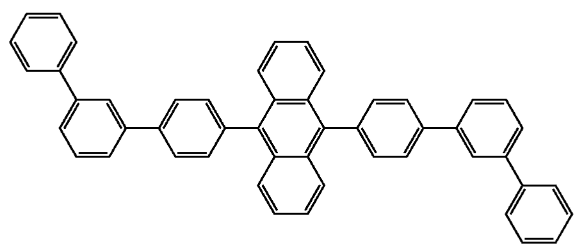
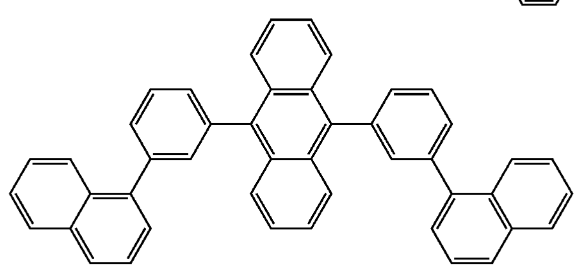
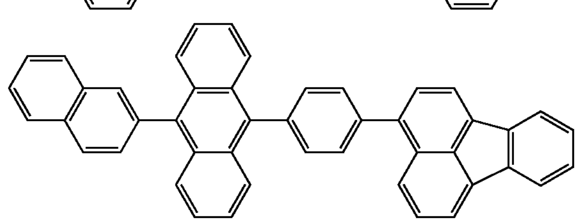

-continued
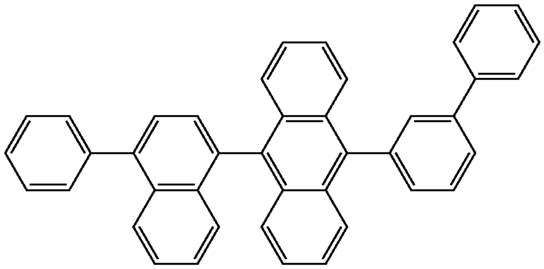
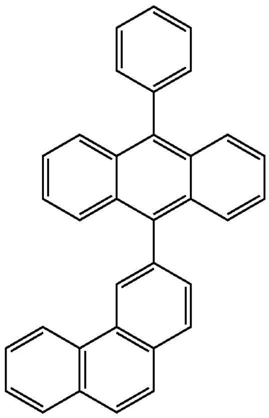
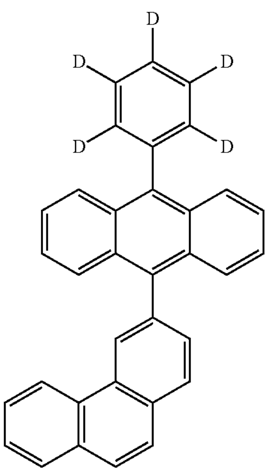
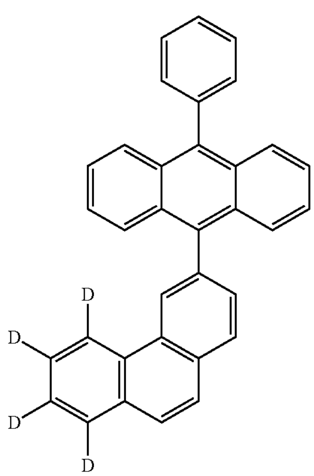
-continued
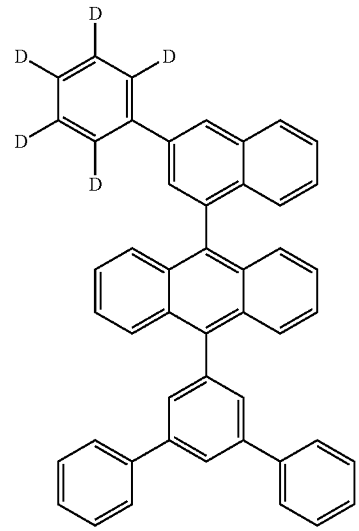
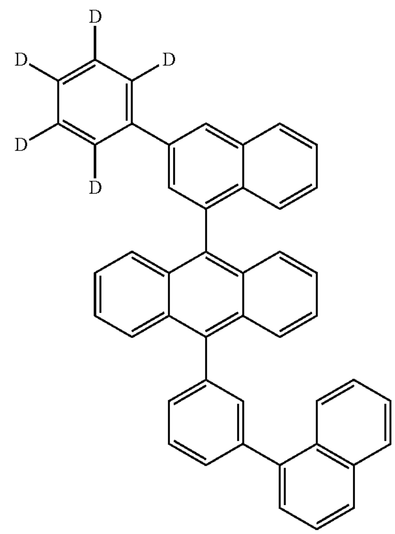
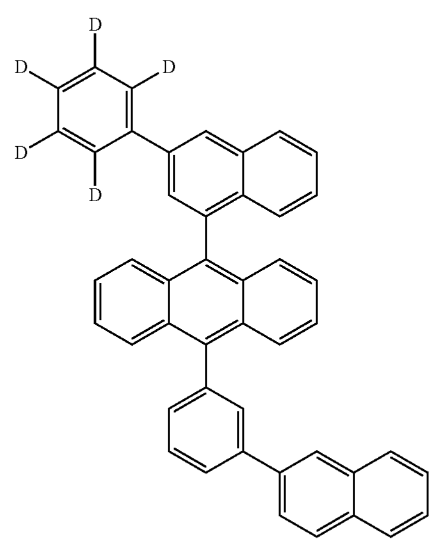

-continued
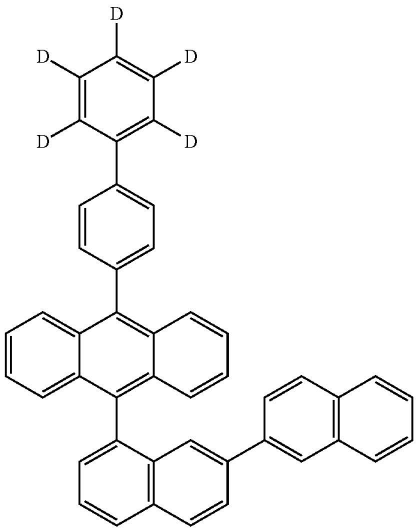
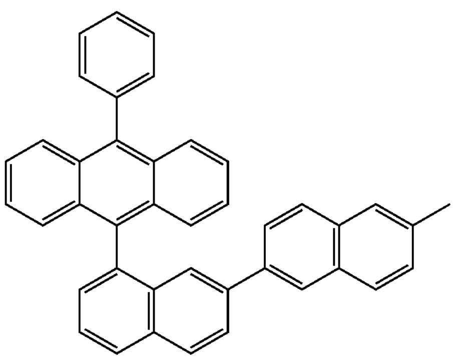
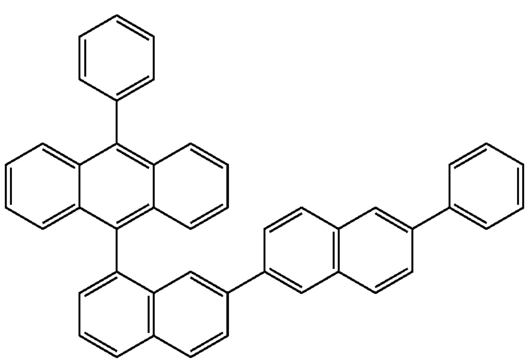
-continued
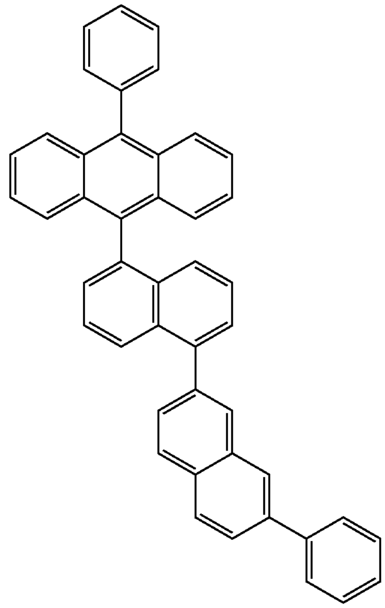
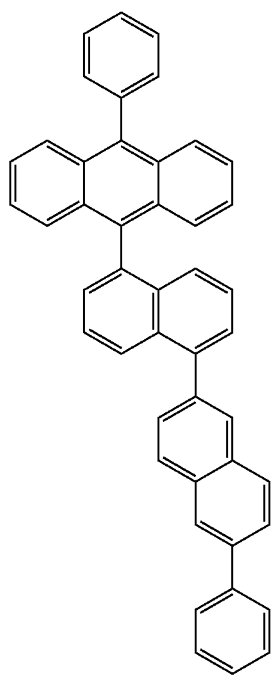

-continued
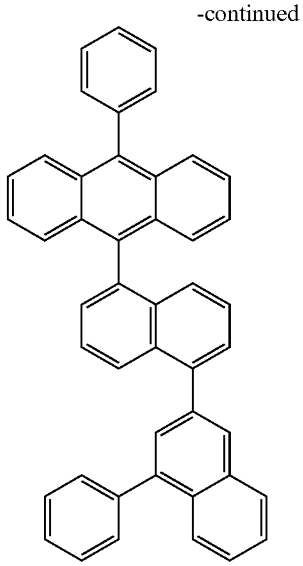
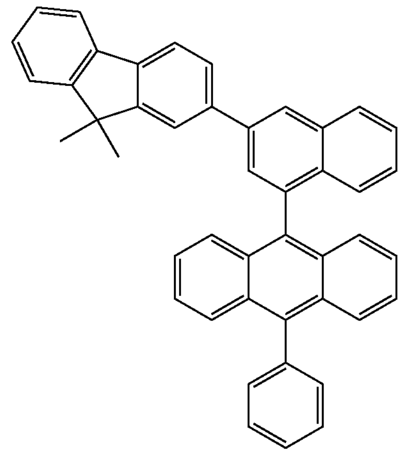
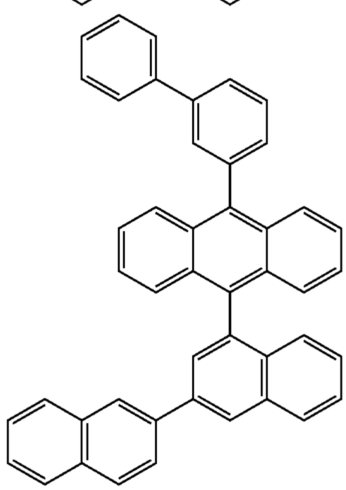
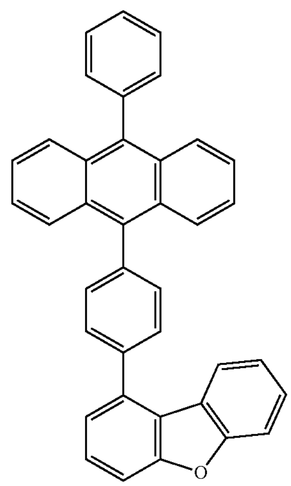
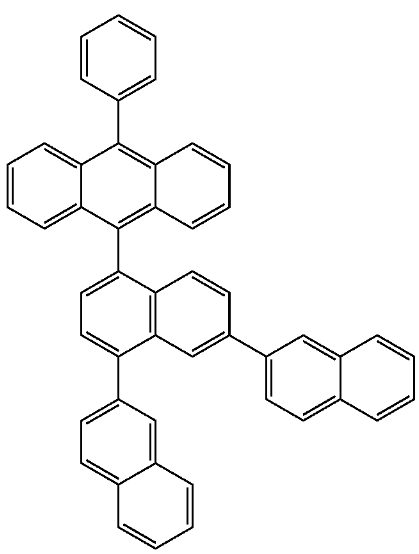
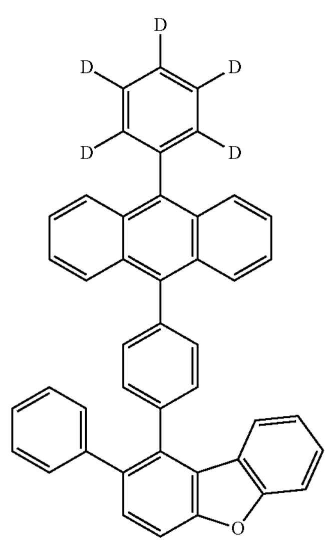

-continued
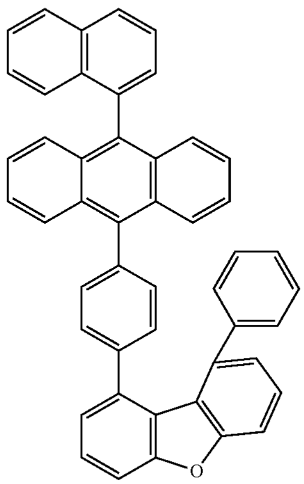
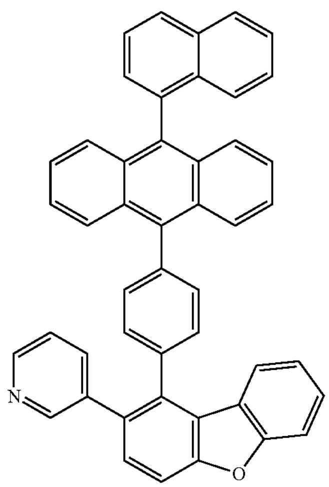
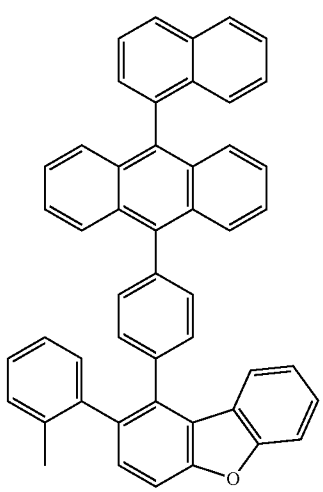
-continued
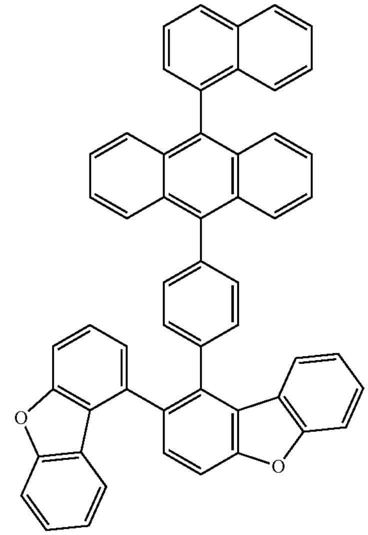
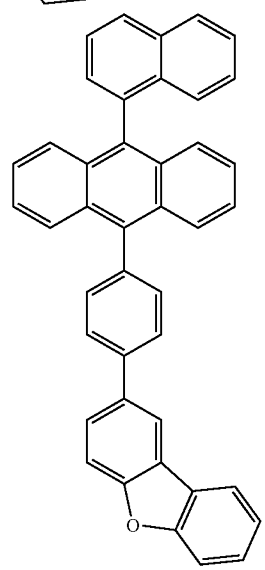
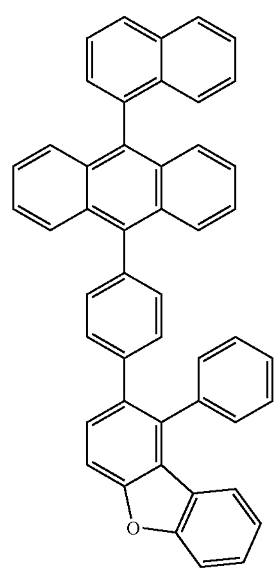

-continued
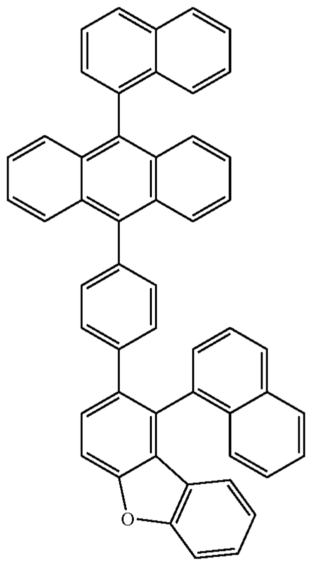
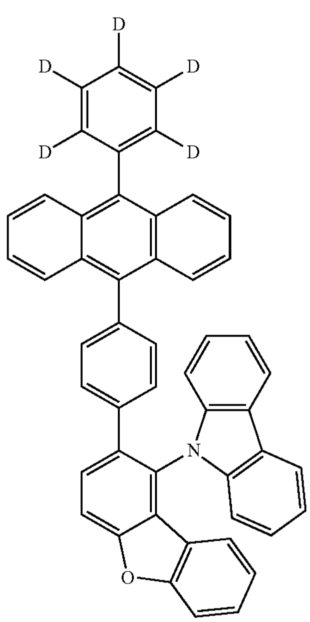
-continued
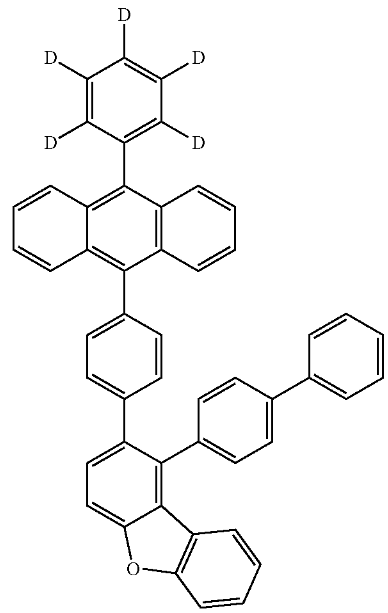
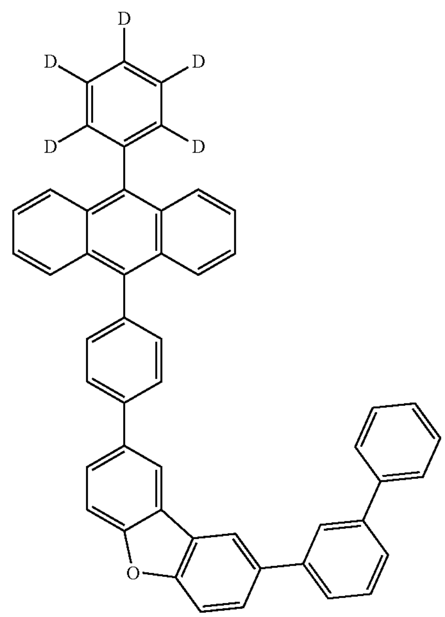
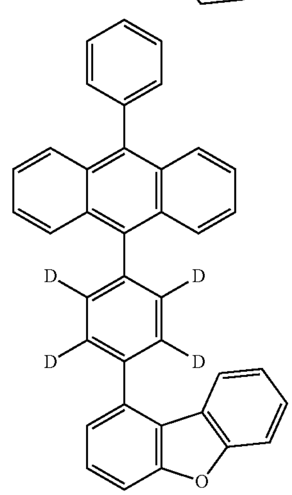

-continued
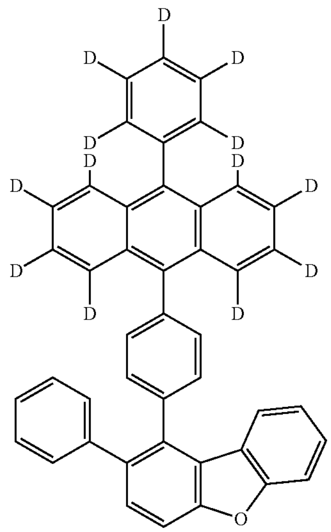
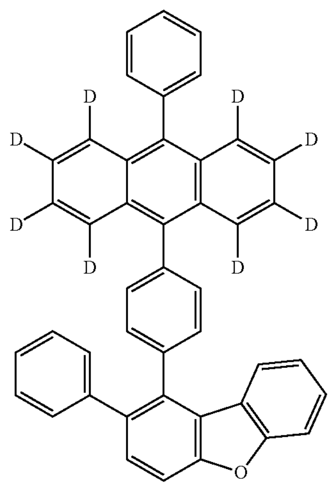
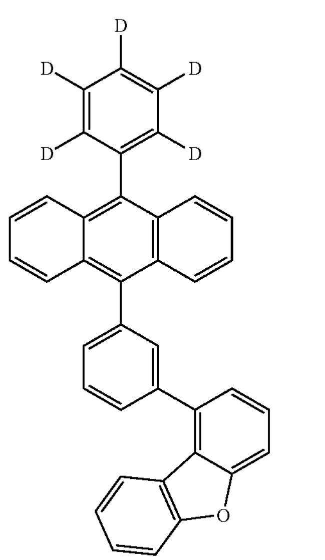
-continued
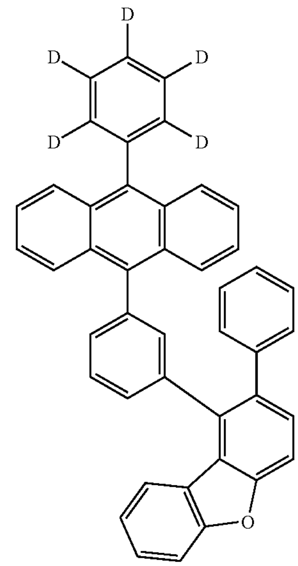
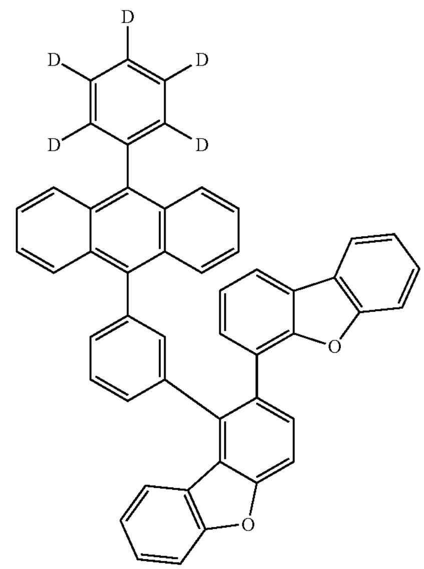
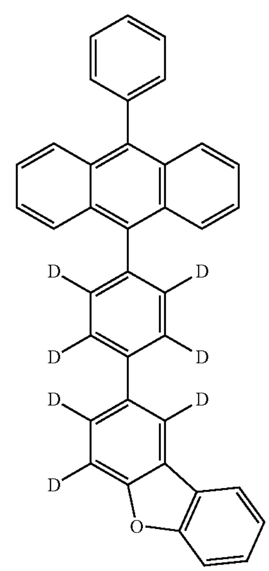

-continued
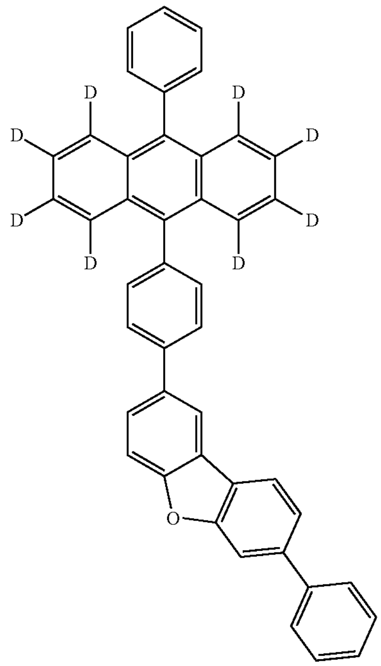
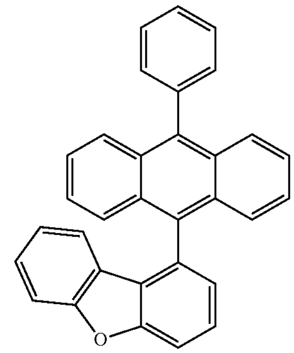
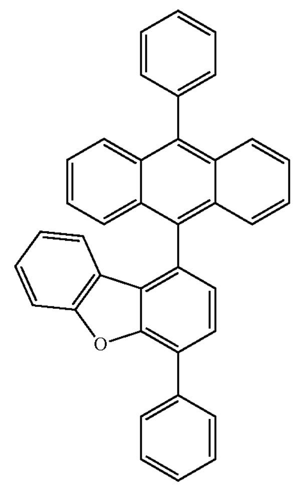
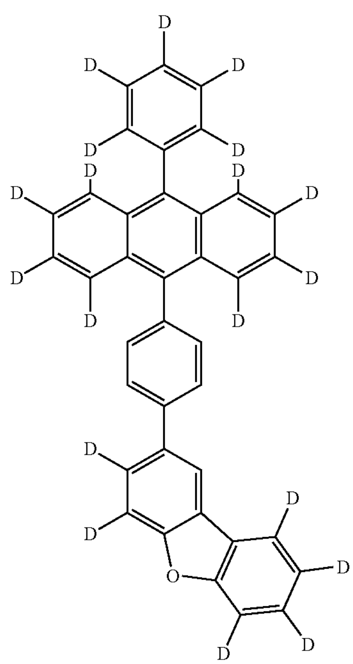
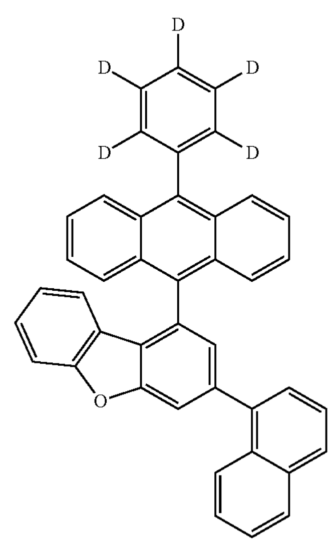

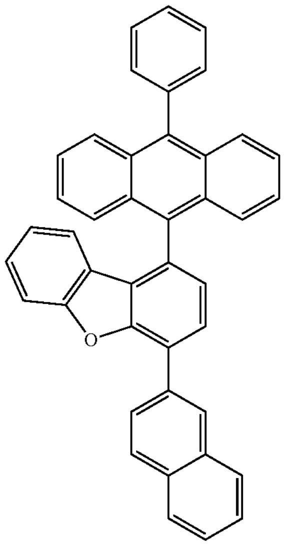
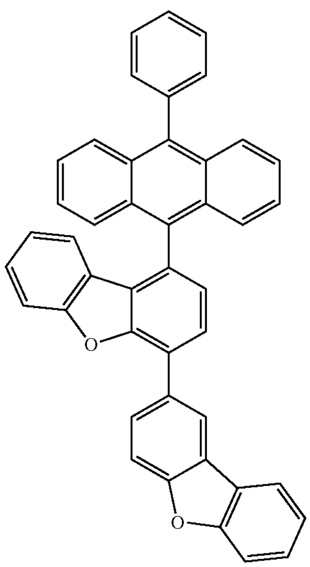
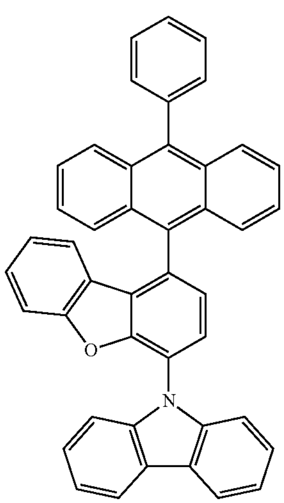
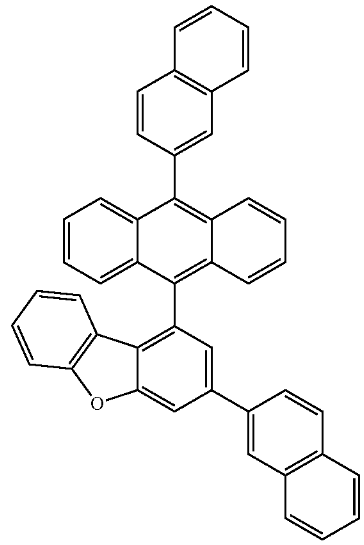
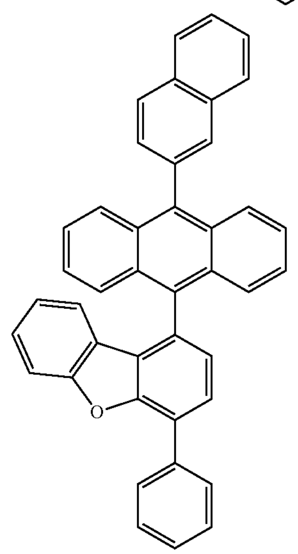
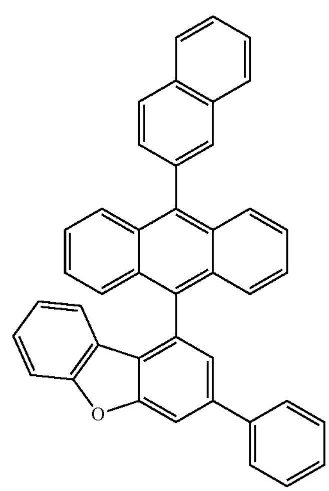

-continued
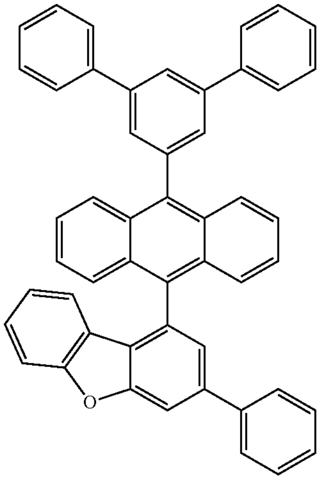
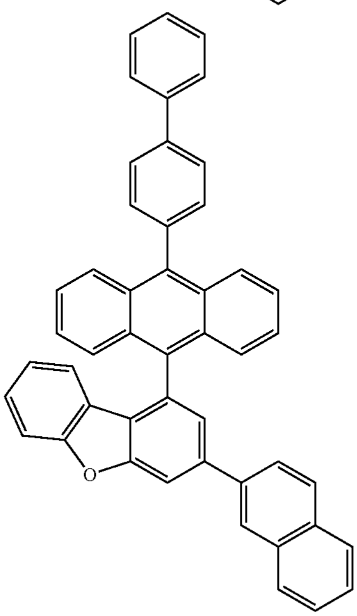
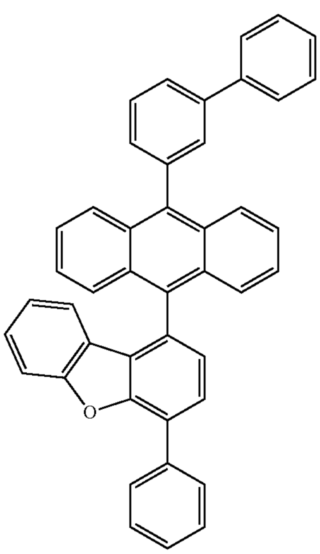
-continued
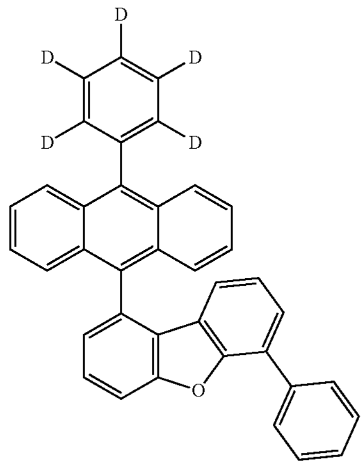
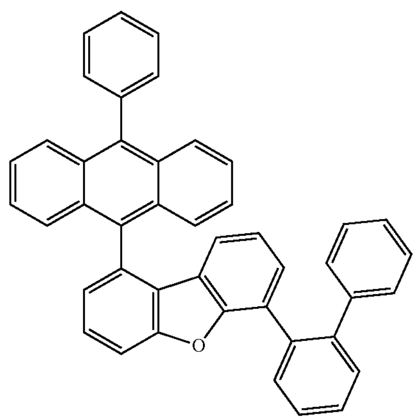
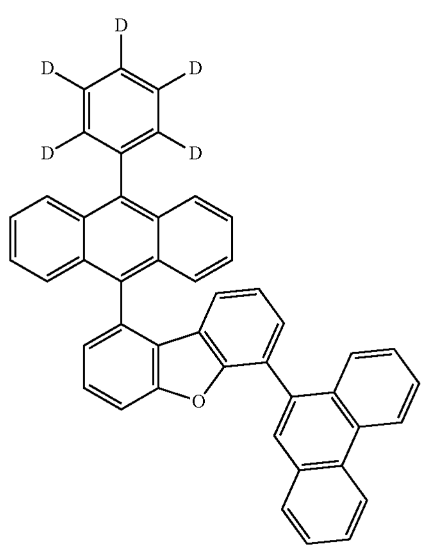

-continued
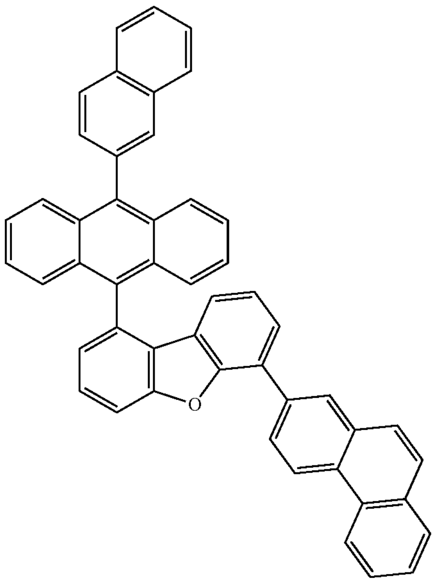
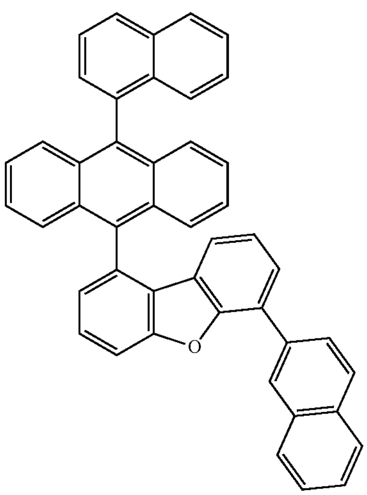
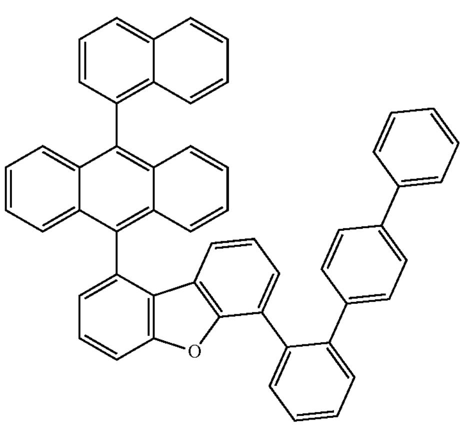
-continued
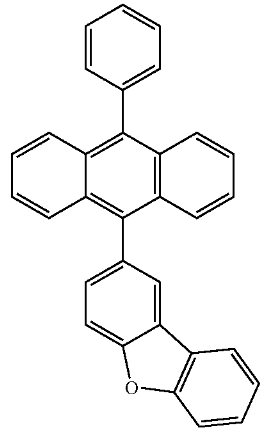
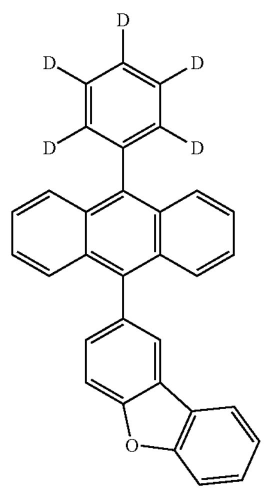
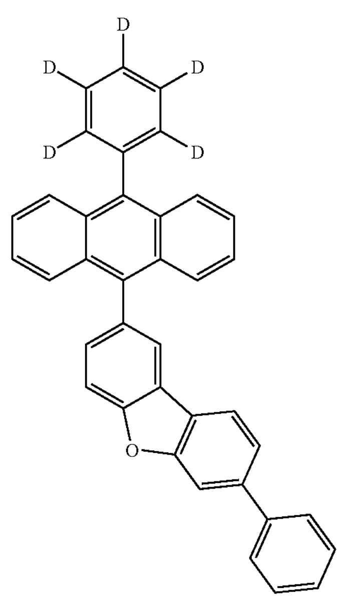

-continued
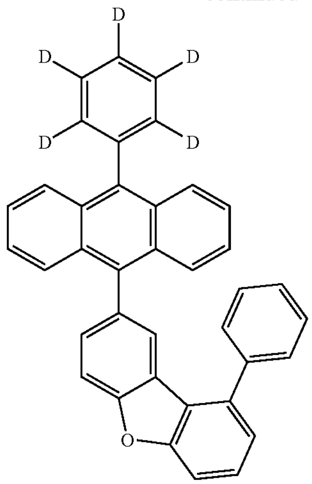
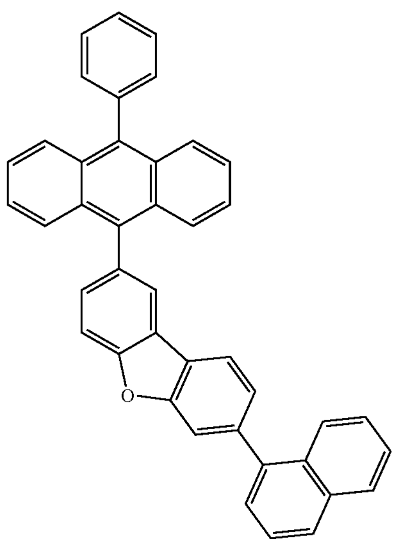
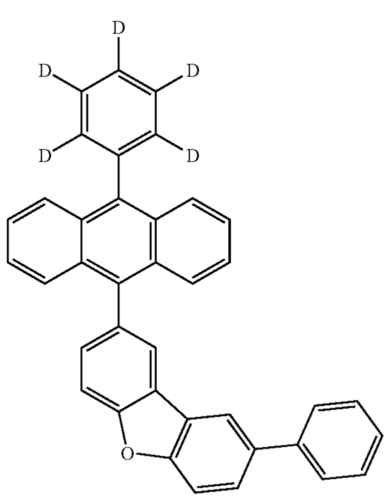
-continued
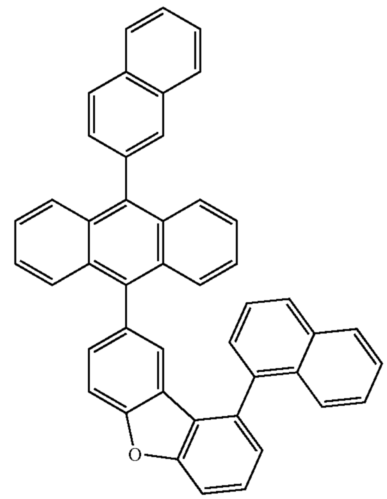
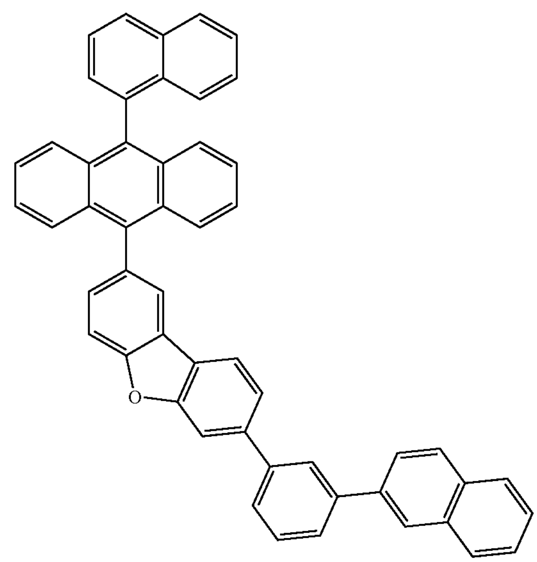
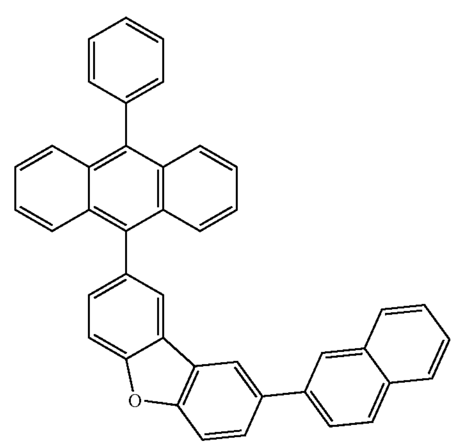

-continued
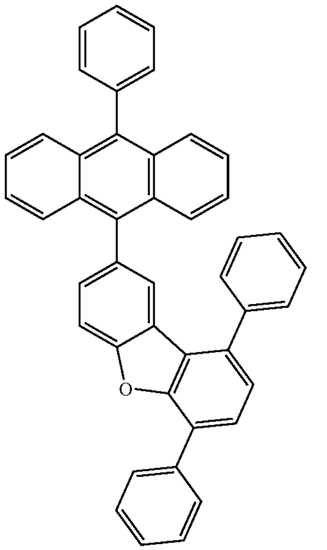
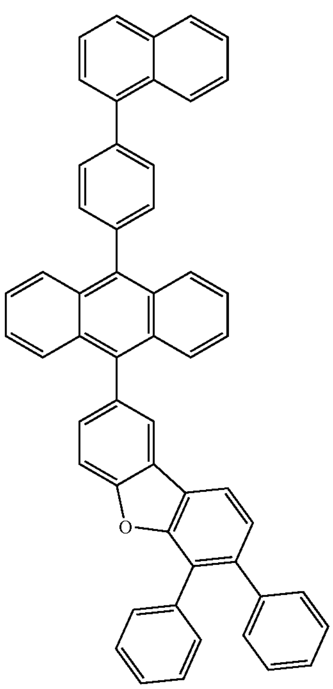
-continued
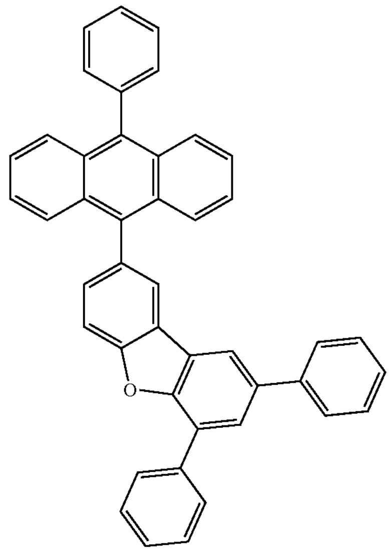
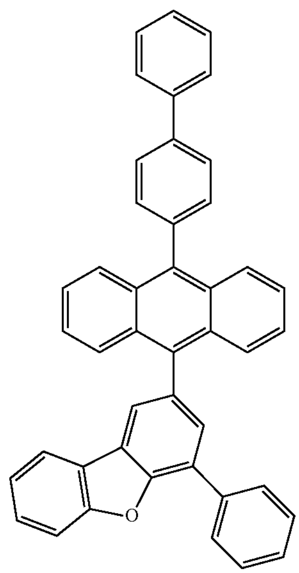
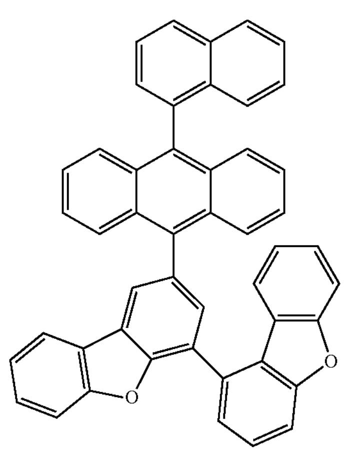

-continued
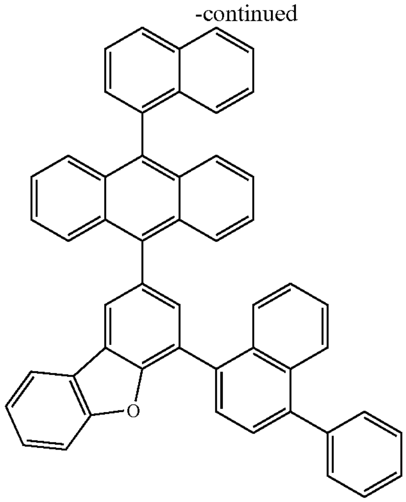
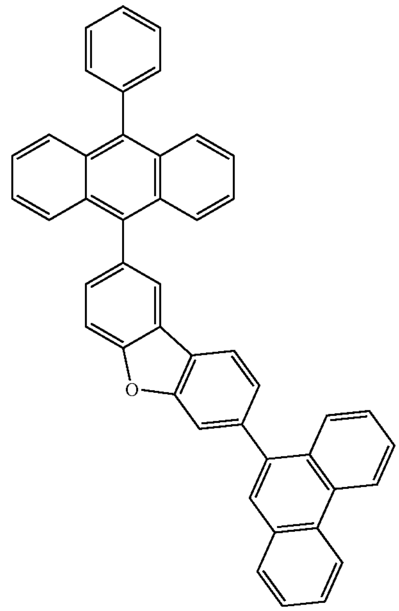
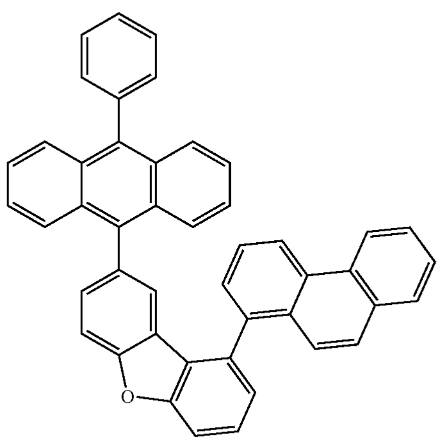
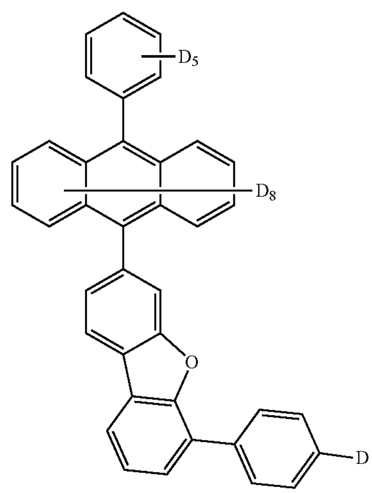
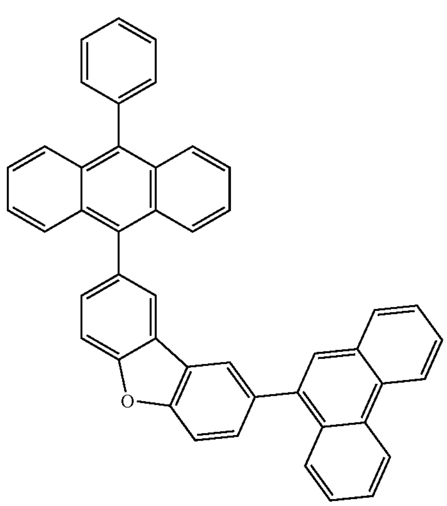
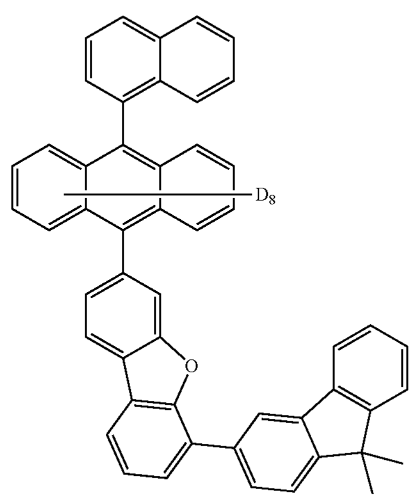

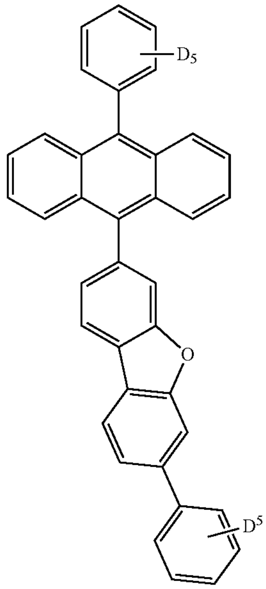
D5
O
D5
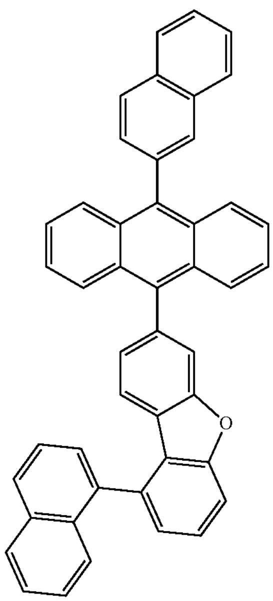
O
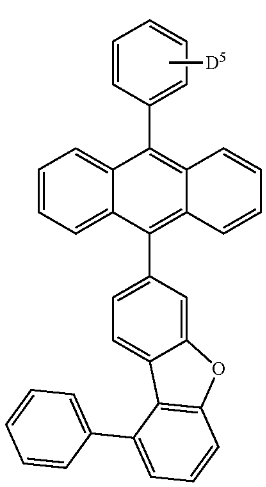
D5
O
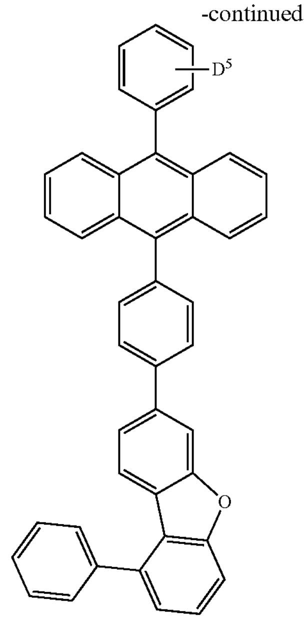
D5
O
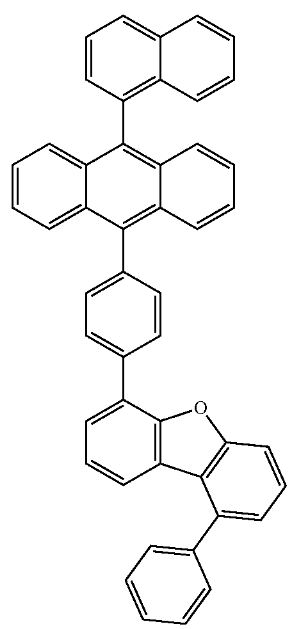
O

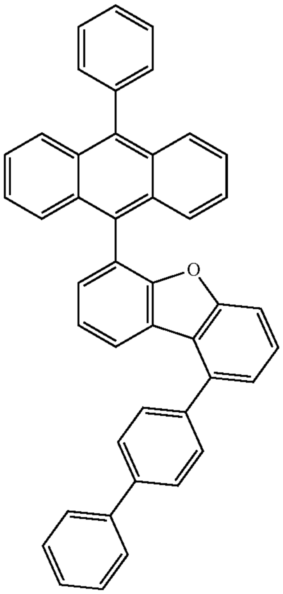
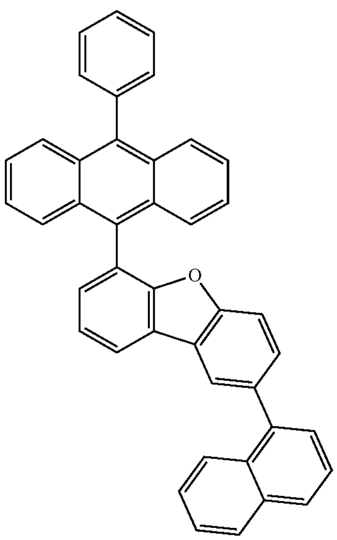
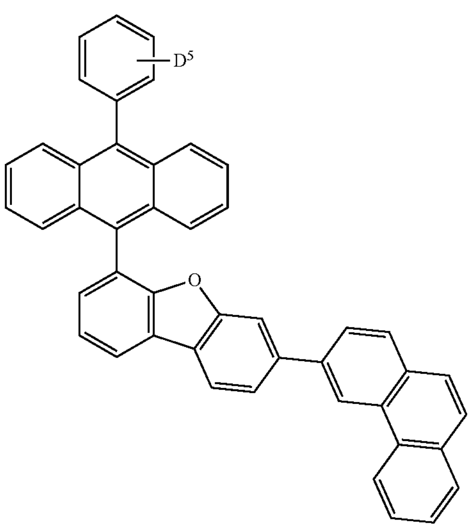
D5
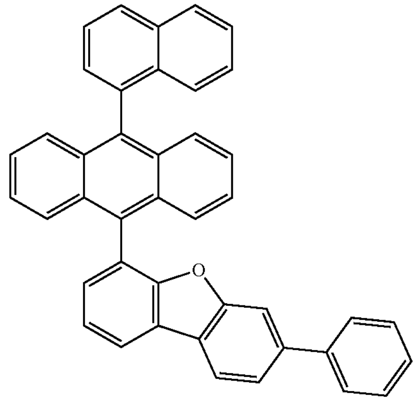
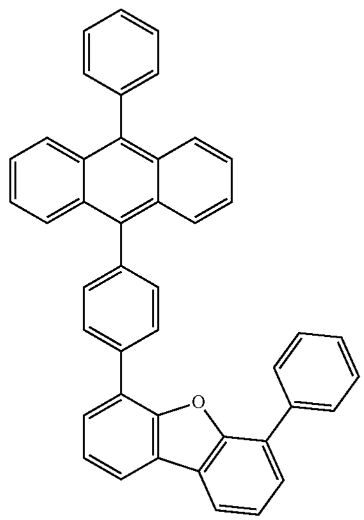
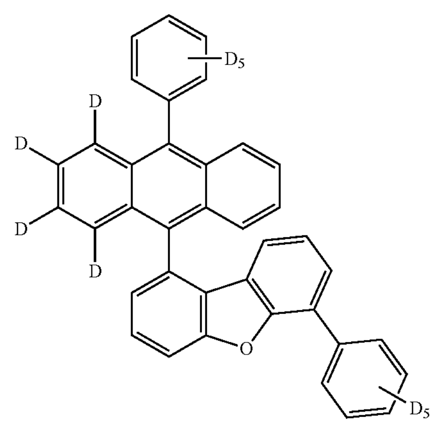
D5
D
D
D
D
D5

-continued
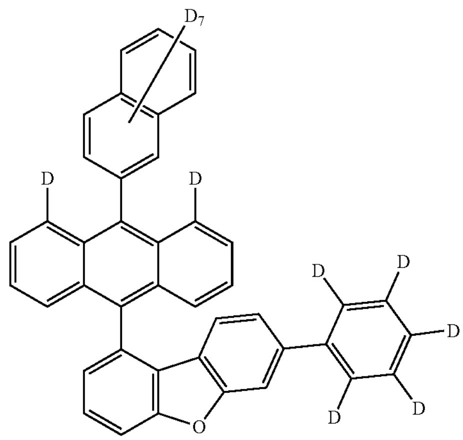
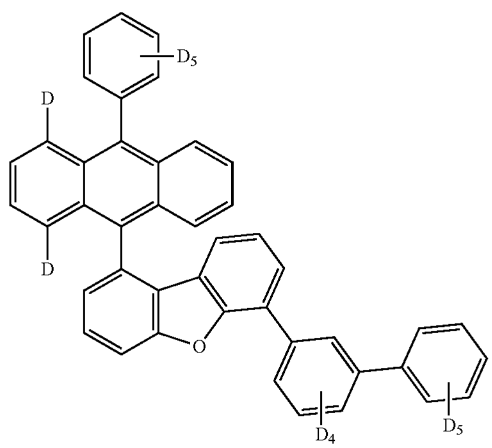
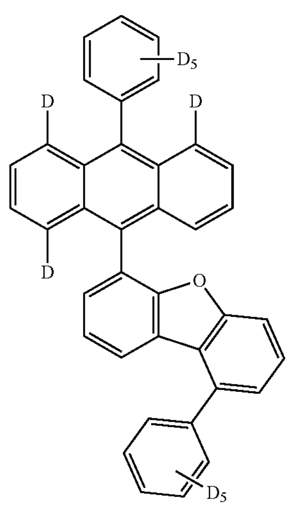
-continued
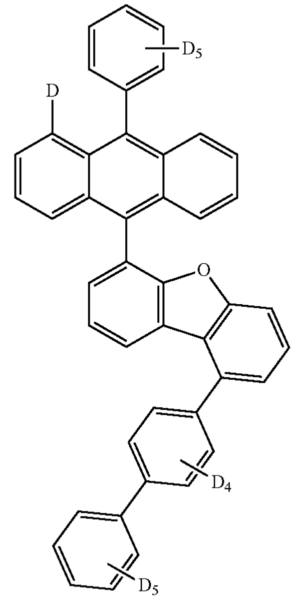
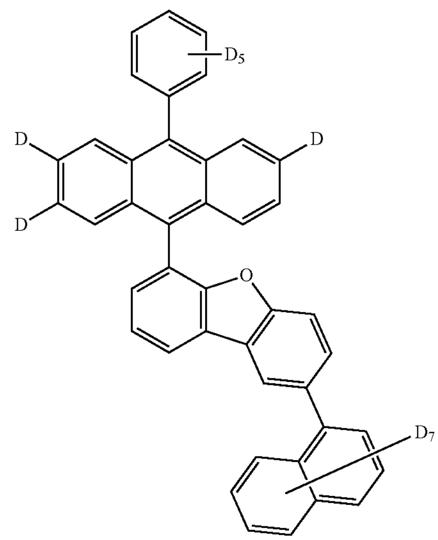
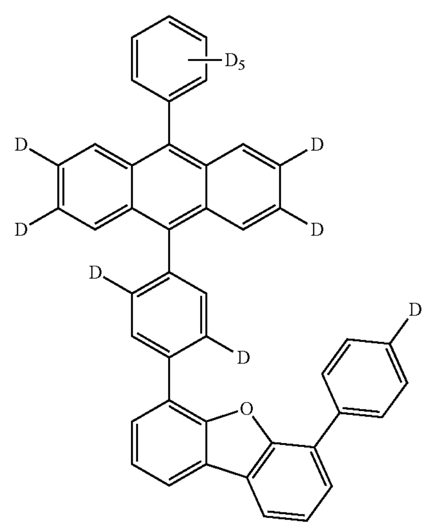

-continued
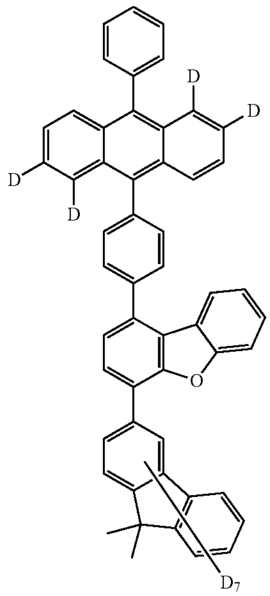
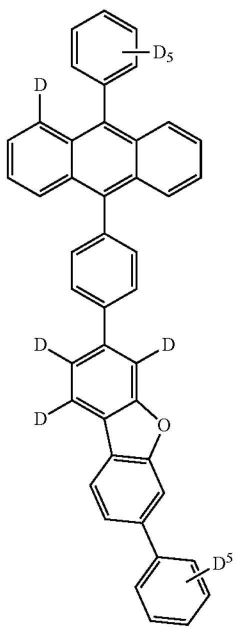
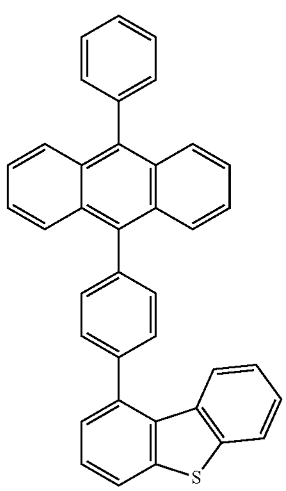
-continued
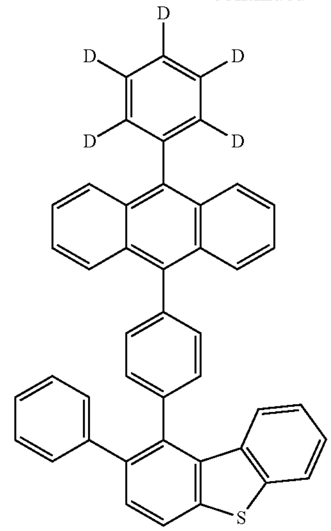
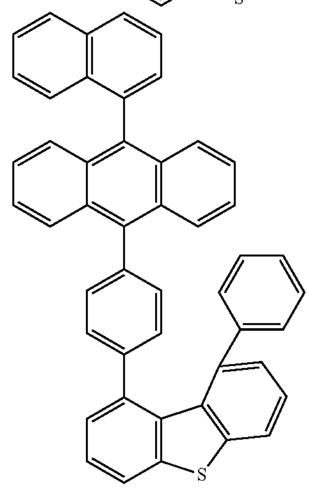
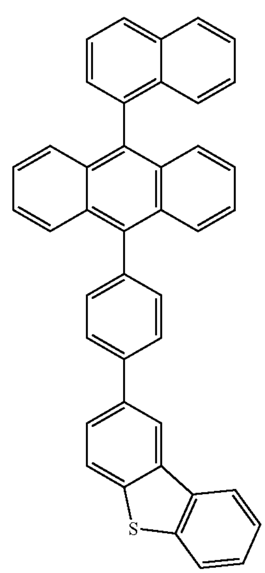

-continued
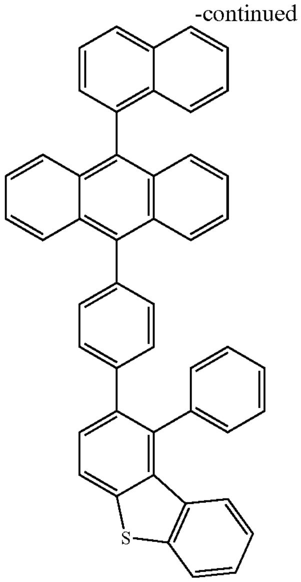
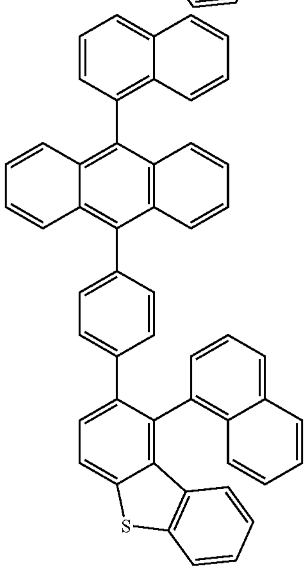
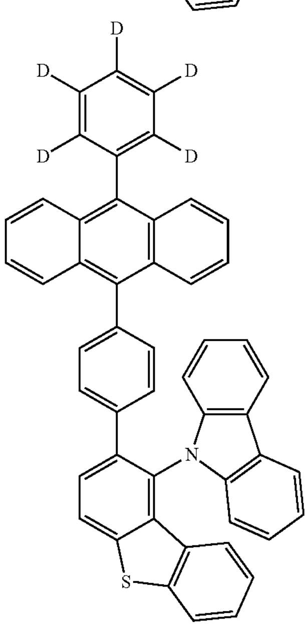
-continued
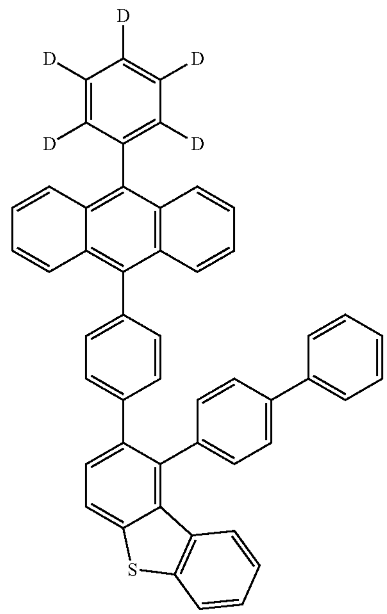
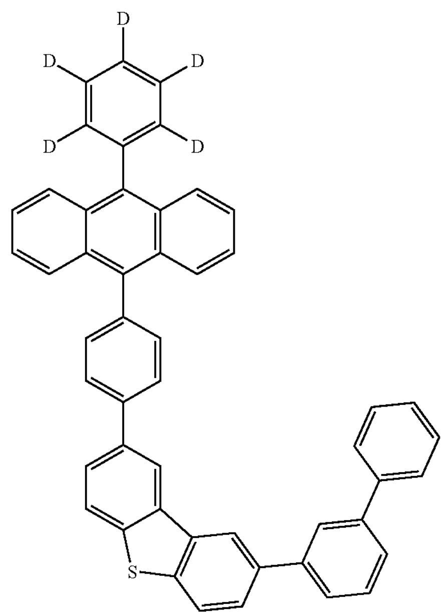
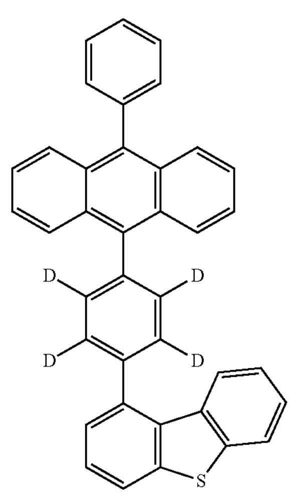

-continued
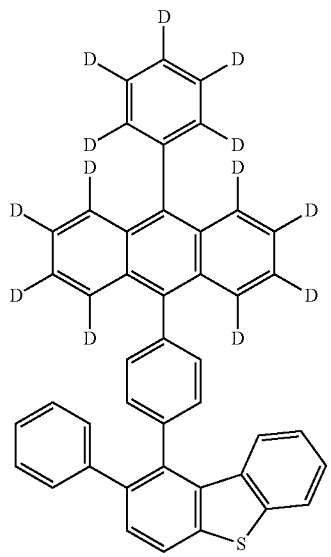
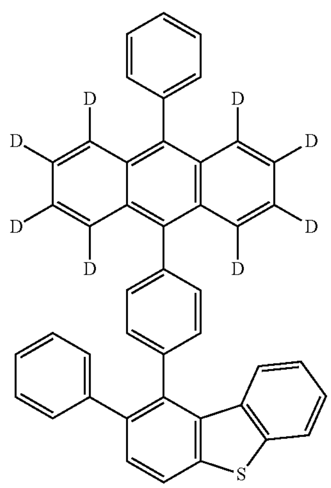
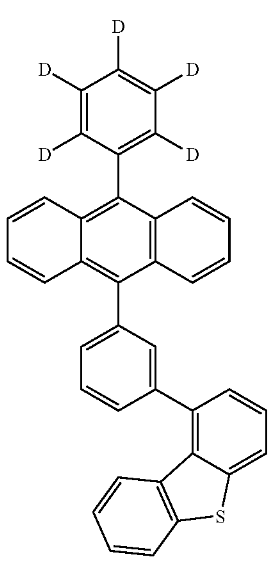
-continued
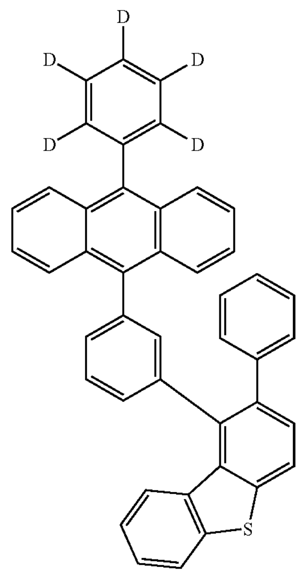
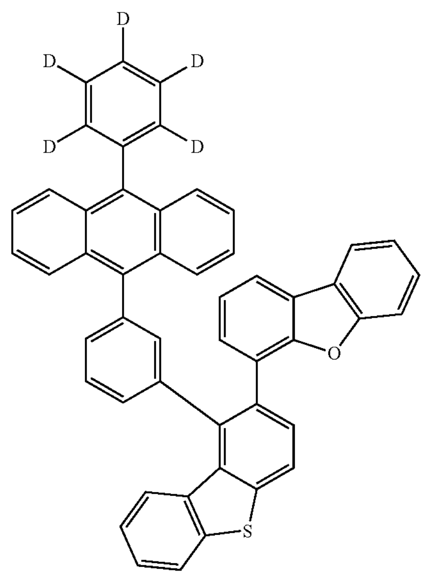
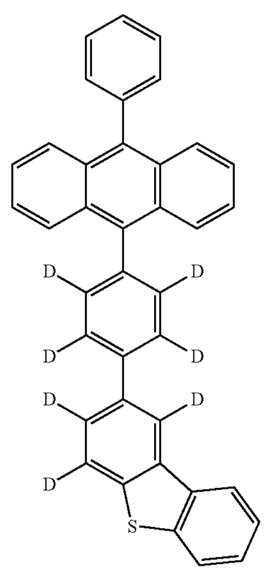

-continued
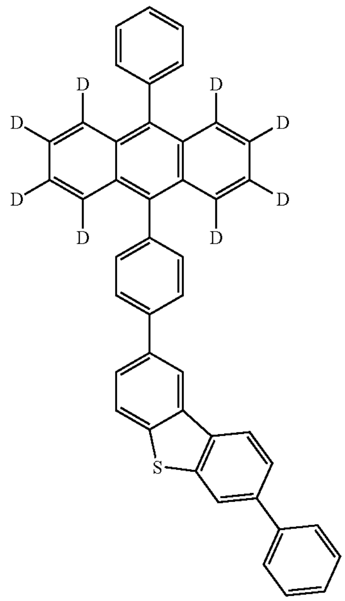
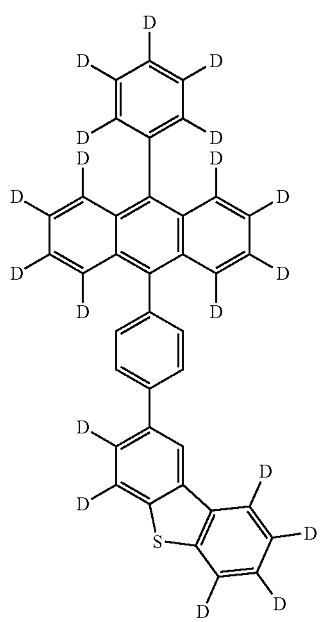
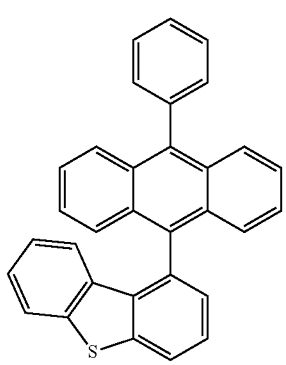
-continued
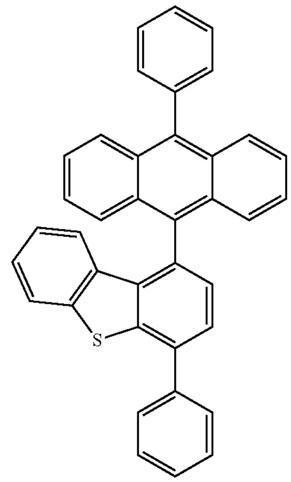
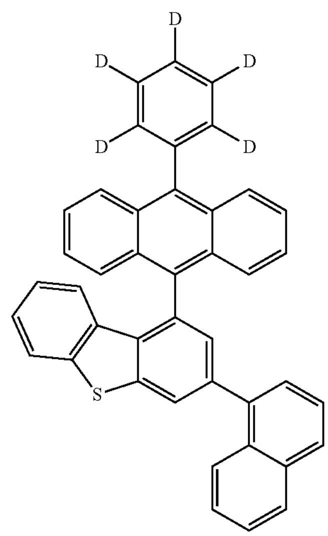
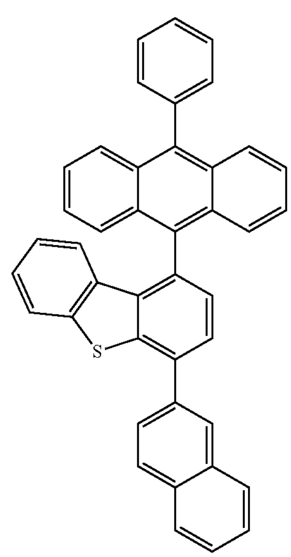

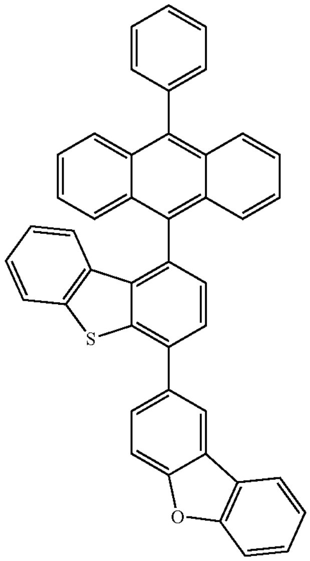
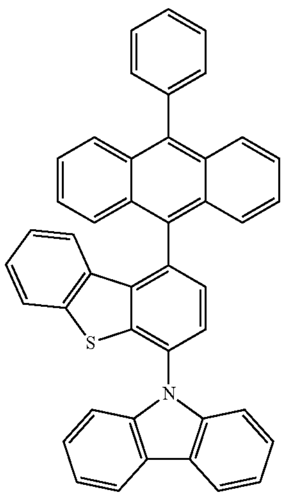
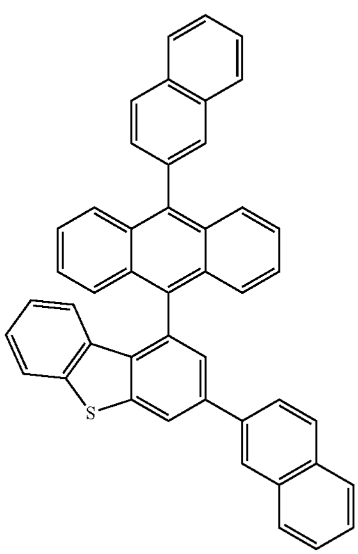
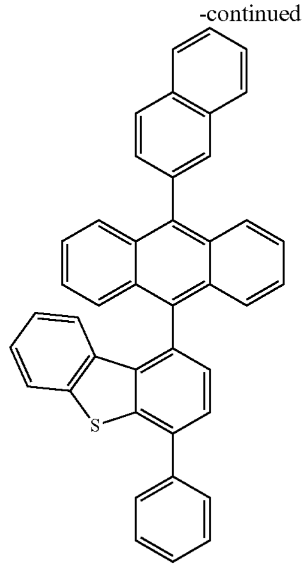
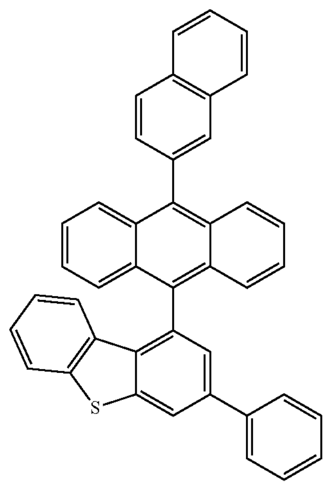
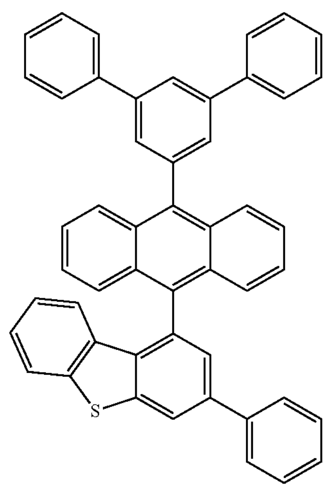

-continued
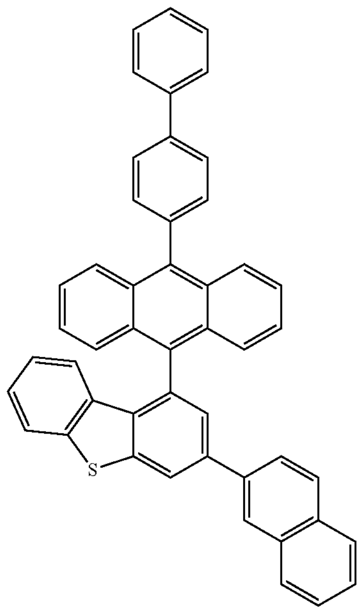
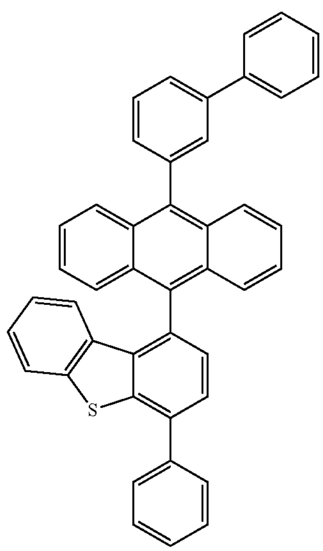
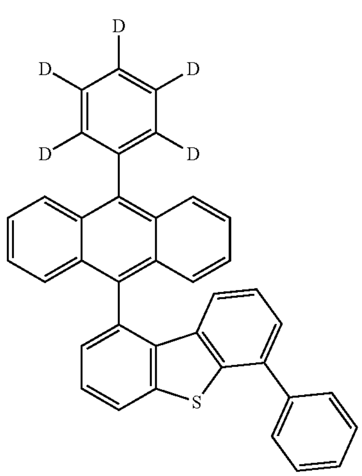
-continued
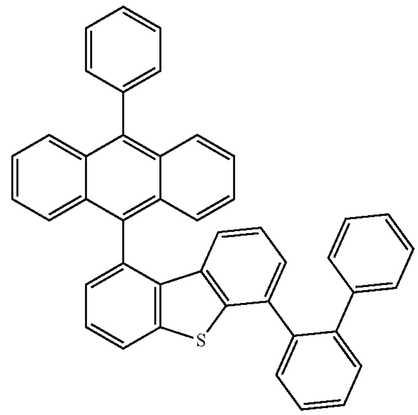
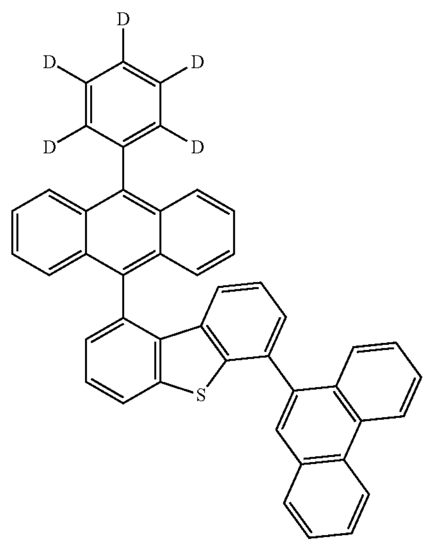
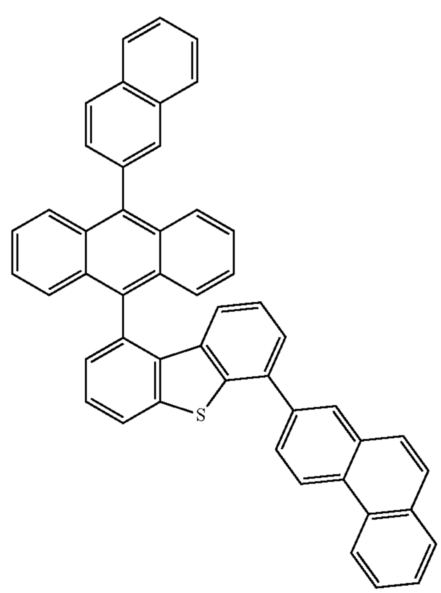

-continued
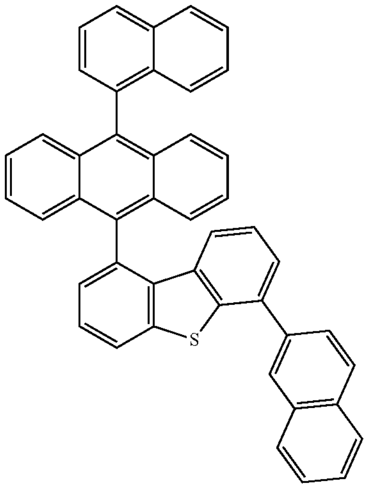
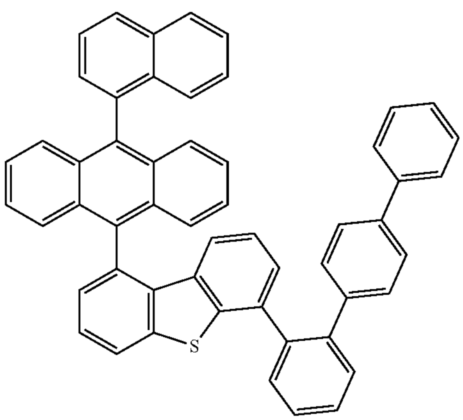
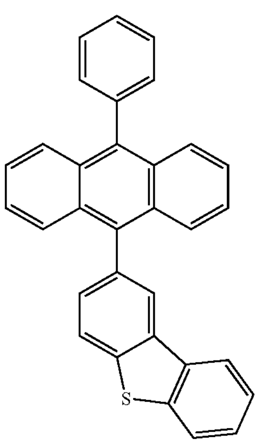
-continued
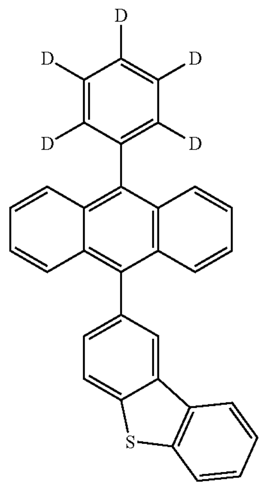
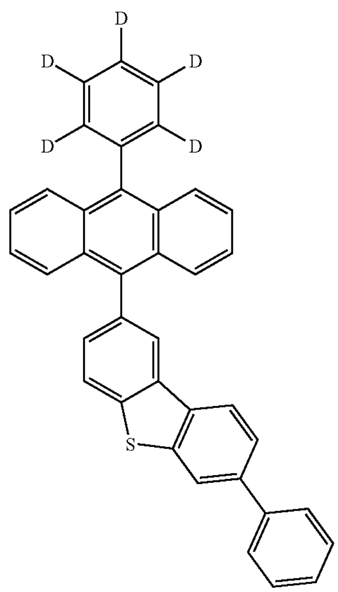
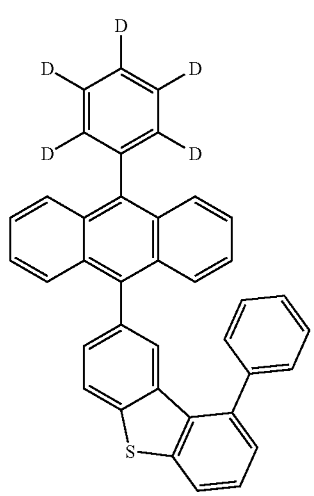

-continued
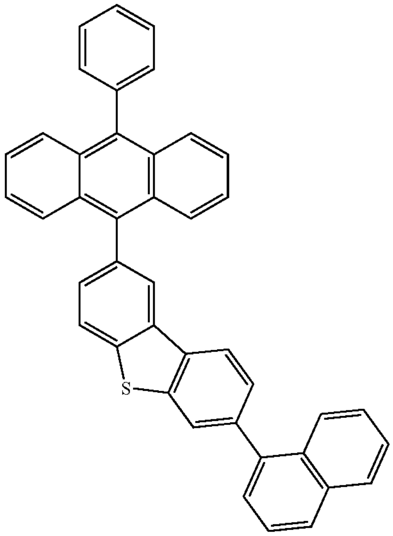
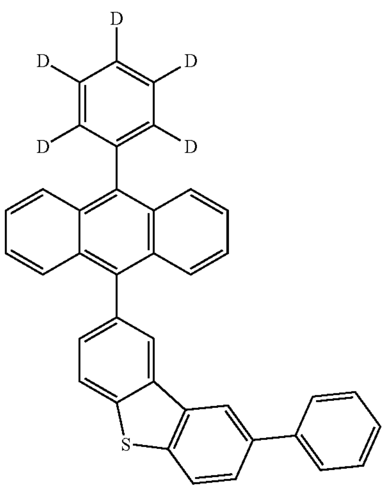
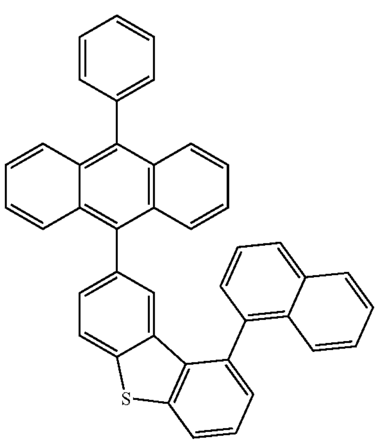
-continued
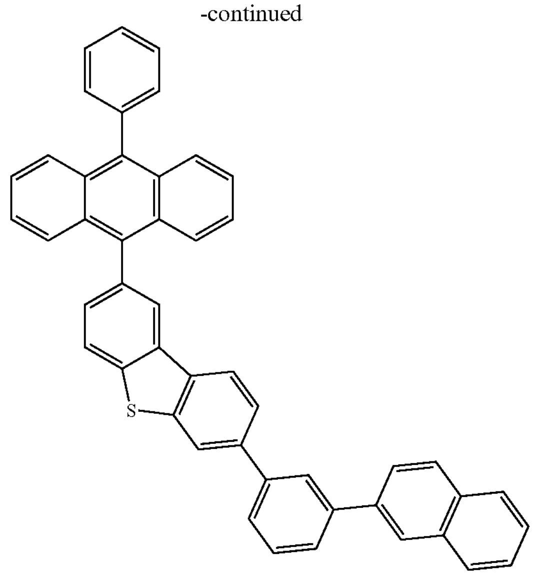
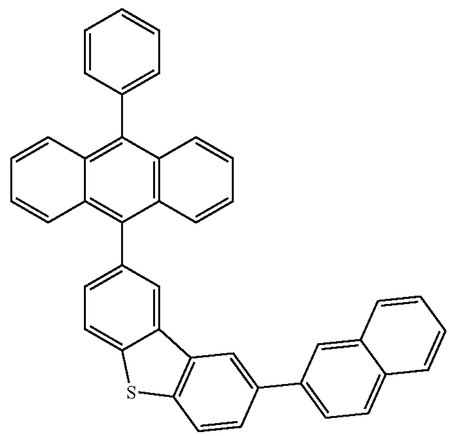
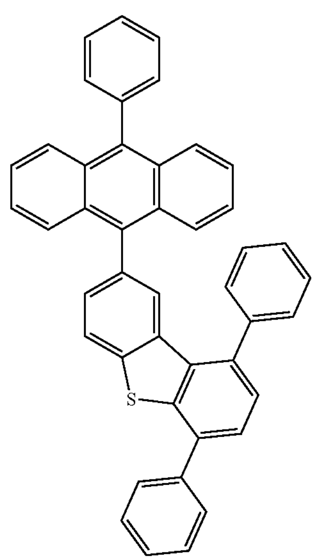

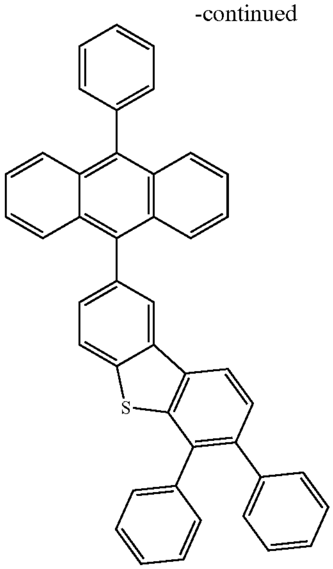
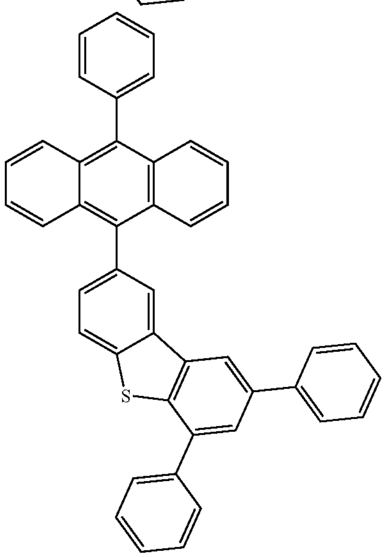
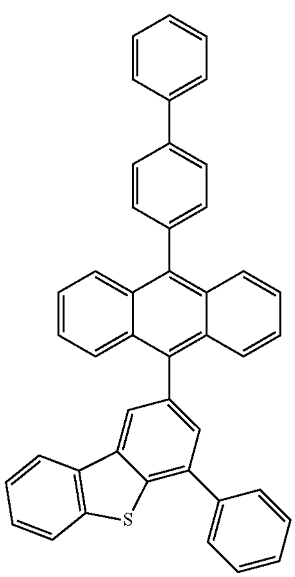
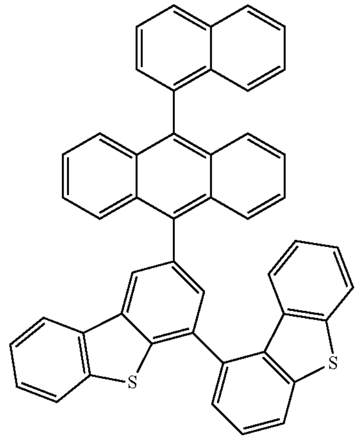
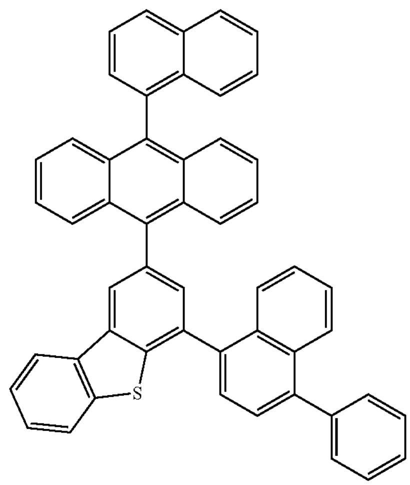
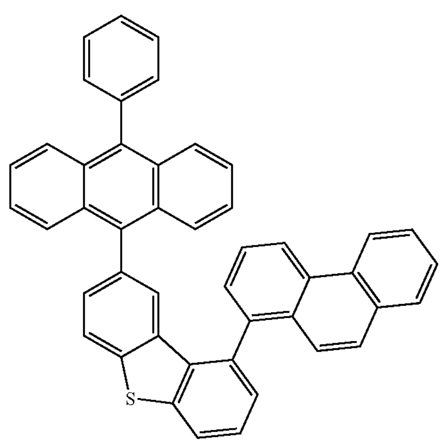

-continued
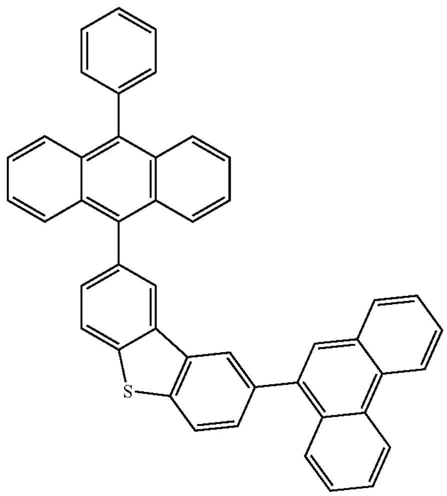
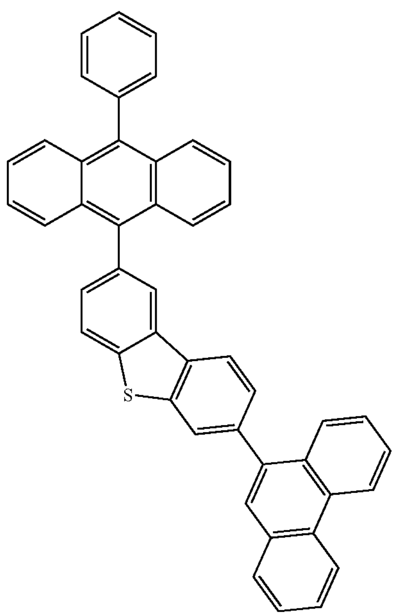
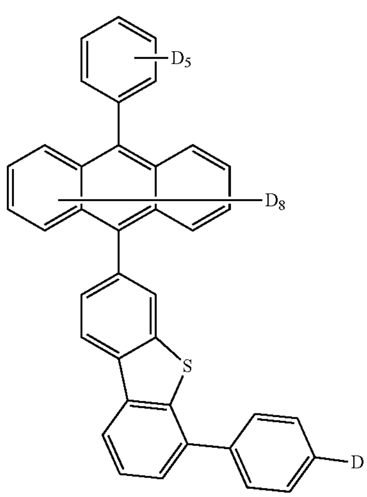
-continued
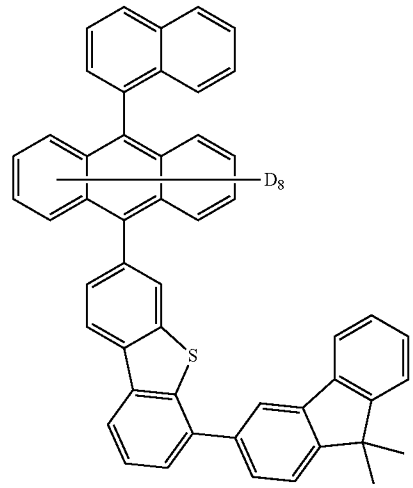
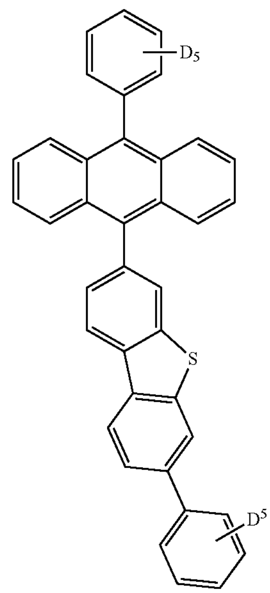
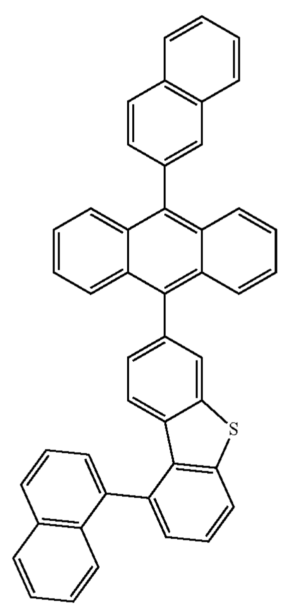

-continued
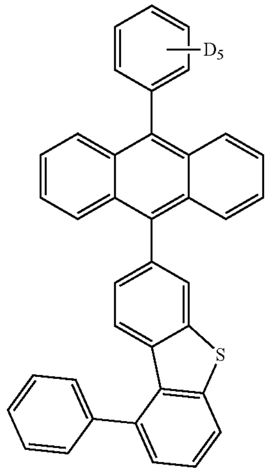
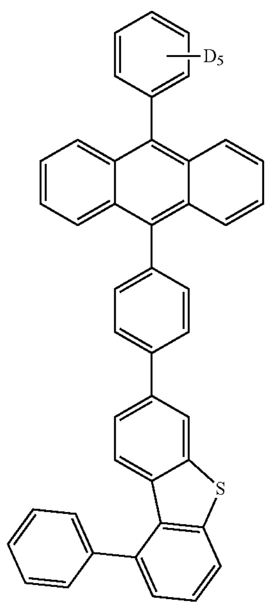
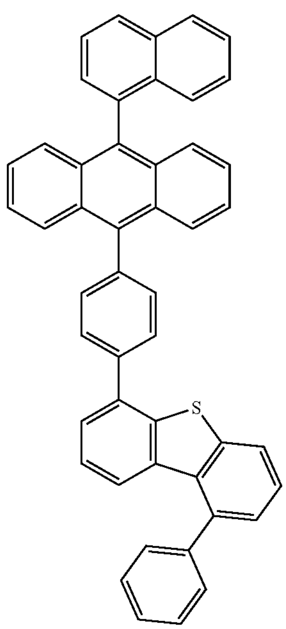
-continued
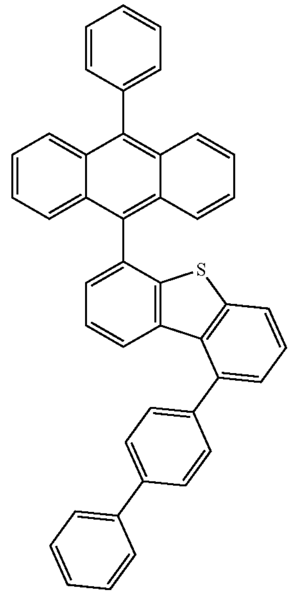
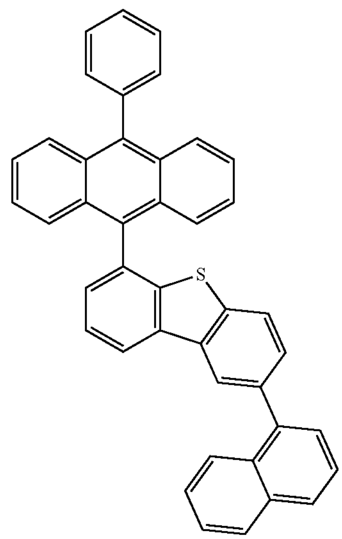
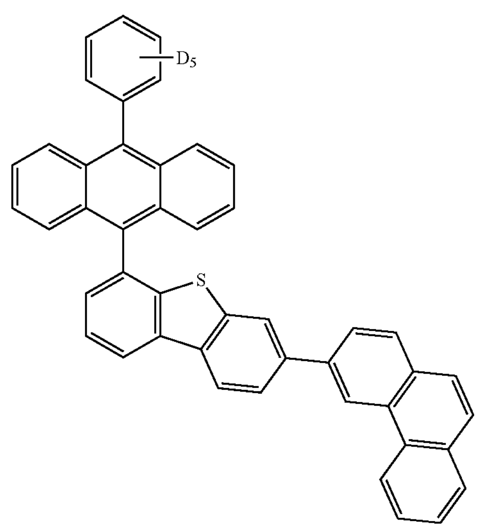

-continued
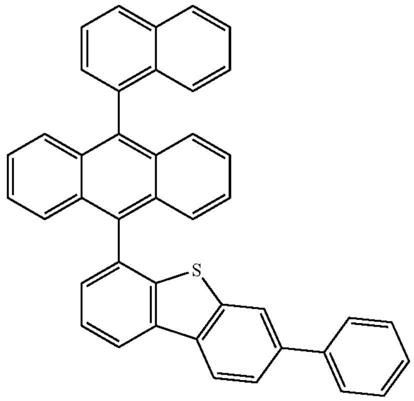
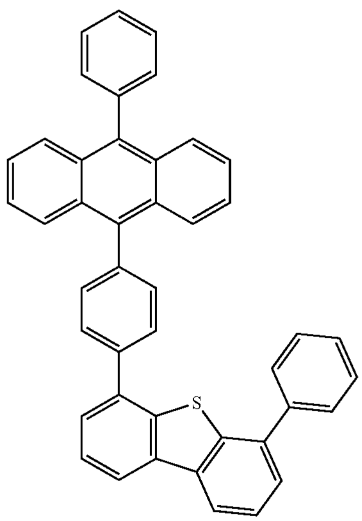
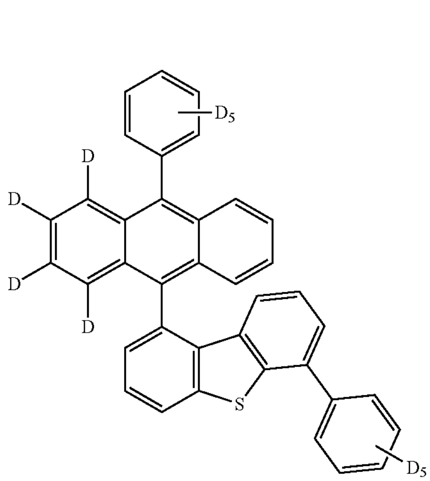
-continued
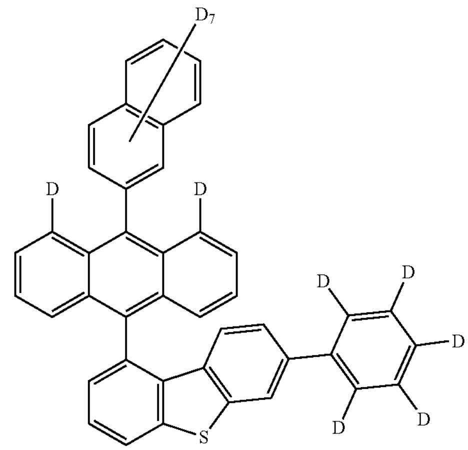
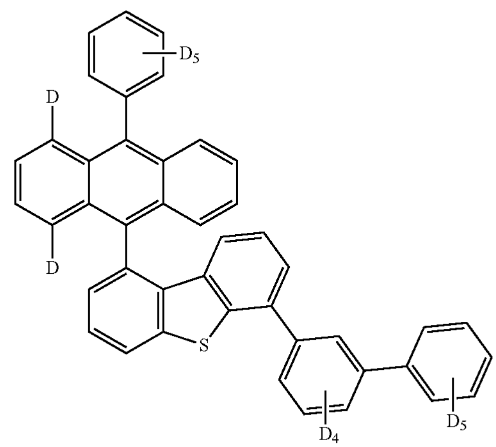
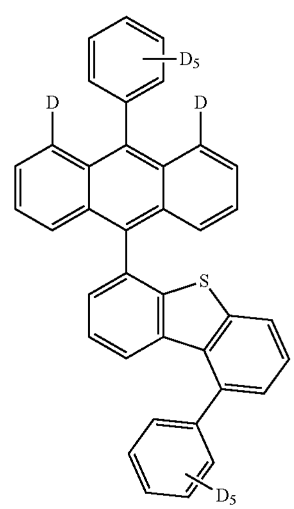

-continued

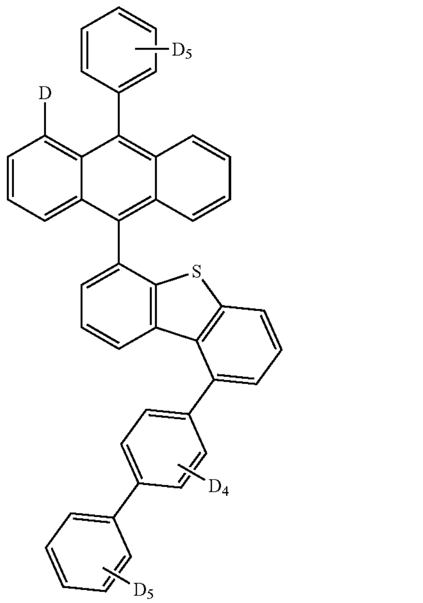

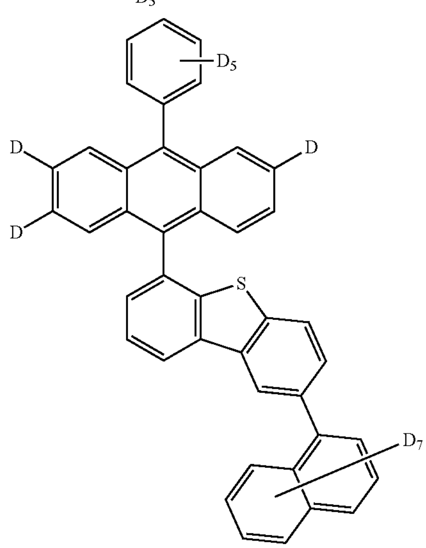

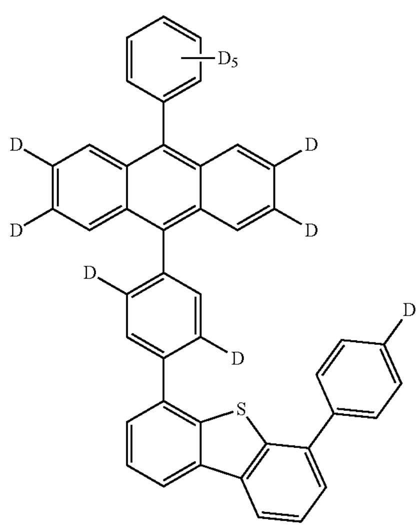

-continued

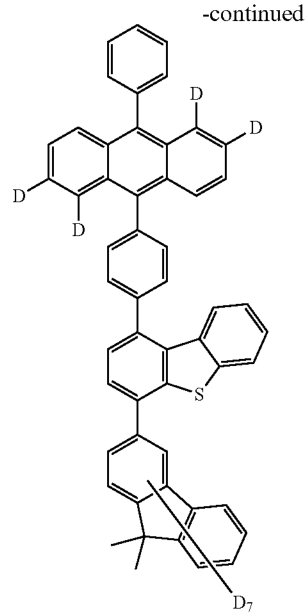

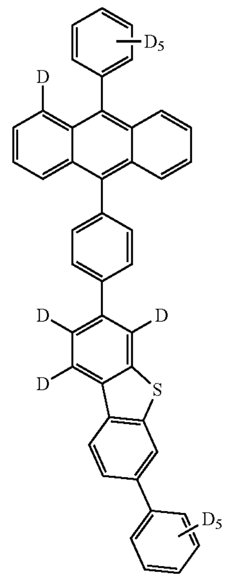

The organic material layer structure of the preferred organic light-emitting device according to the present invention will be described in more detail in the following Examples.

Meanwhile, a detailed structure of the organic light-emitting device according to an embodiment of the present invention, a method of manufacturing the same, and materials for the organic layers will be described as follows.

First, a substrate is coated with a material for an anode to form the anode. The substrate used herein is a substrate generally used for organic light-emitting devices and is preferably an organic substrate or a transparent plastic substrate that has excellent transparency, surface evenness, handleability and waterproofness. In addition, a material for the anode is indium tin oxide (ITO), indium zinc oxide (IZO), tin oxide ($SnO_2$), zinc oxide (ZnO), or the like, which is transparent and has excellent conductivity.

A hole injection layer is formed on the anode by vacuum thermal evaporation or spin coating using a material for the hole injection layer, and then a hole transport layer is formed on the hole injection layer by vacuum thermal evaporation or spin coating using a material for the hole transport layer.

The material for the hole injection layer may be used without particular limitation as long as it is commonly used in the art and specific examples thereof include 2-TNATA [4,4',4"-tris(2-naphthylphenyl-phenylamino)-triphenylamine], NPD [N,N'-di(1-naphthyl)-N,N'-diphenylbenzidine)], TPD [N,N'-diphenyl-N,N'-bis(3-methylphenyl)-1,1'-biphenyl-4,4'-diamine], DNTPD [N,N'-diphenyl-N,N'-bis-[4-(phenyl-m-tolyl-amino)-phenyl]-biphenyl-4,4'-diamine], and the like.

In addition, the material for the hole transport layer is also used without particular limitation as long as it is commonly used in the art and is, for example, N,N'-bis(3-methylphenyl)-N,N'-diphenyl-[1,1-biphenyl]-4,4'-diamine (TPD) or N,N'-di(naphthalen-1-yl)-N,N'-diphenylbenzidine (α-NPD).

Subsequently, a hole auxiliary layer and a light-emitting layer are sequentially stacked on the hole transport layer, and a hole blocking layer is selectively deposited on the light-emitting layer by vacuum deposition or spin coating to form a thin film. Because the lifetime and efficiency of the device are reduced when holes are introduced into the cathode through the organic light-emitting layer, the hole blocking layer is formed using a material having a very low HOMO (highest occupied molecular orbital) level so as to prevent this problem. The hole blocking material used herein is not particularly limited and is typically BAlq, BCP or TPBI that has an electron transport ability and has an ionization potential higher than that of a light-emitting compound.

The material used for the hole blocking layer may be BAlq, BCP, Bphen, TPBI, NTAZ, $BeBq_2$, OXD-7, Liq, or the like, but is not limited thereto.

An electron transport layer is deposited on the hole blocking layer through vacuum deposition or spin coating and a metal for forming a cathode is formed on the electron injection layer through vacuum thermal evaporation to form a cathode. As a result, an organic light-emitting device according to an embodiment is completed.

Here, the metal for forming the cathode may be lithium (Li), magnesium (Mg), aluminum (Al), aluminum-lithium (Al—Li), calcium (Ca), magnesium-indium (Mg—In), magnesium-silver (Mg—Ag) or the like. A transmissive cathode using ITO or IZO may be used in order to obtain a top-emission type light-emitting device.

The material for the electron transport layer functions to stably transport electrons injected from the cathode and may be a well-known electron transport material. Examples of the well-known electron transport material include quinoline derivatives, especially, tris(8-quinolinolate)aluminum (Alq3), TAZ, BAlq, beryllium bis(benzoquinolin-10-olate: Bebq2) and oxadiazole derivatives (PBD, BMD, BND, etc.).

In addition, each of the organic layers may be formed by a monomolecular deposition or solution process. The deposition is a method of forming a thin film by evaporating a material for forming each layer through heating in the presence of a vacuum or low pressure and the solution process is a method of forming a thin film by mixing a material for forming each layer with a solvent and forming the thin film from the mixture through a method such as inkjet printing, roll-to-roll coating, screen printing, spray coating, dip coating, or spin coating.

In addition, the organic light-emitting device according to the present invention may further include a light-emitting layer of a blue light-emitting material, a green light-emitting material, or a red light-emitting material that emits light in a wavelength range of 380 nm to 800 nm. That is, the light-emitting layer of the present invention includes a plurality of light-emitting layers, and a blue light-emitting material, a green light-emitting material, or a red light-emitting material in the additionally formed light-emitting layer may be a fluorescent material or a phosphorescent material.

In addition, the organic light-emitting device is used for a display or lighting system selected from flat panel displays, flexible displays, monochromatic or white flat panel lighting systems, monochromatic or white flexible lighting systems, vehicle displays, and displays for virtual or augmented reality.

MODE FOR INVENTION

Hereinafter, the present invention will be described in more detail with reference to preferred examples. However, it will be obvious to those skilled in the art that these examples are merely provided for illustration of the present invention, and should not be construed as limiting the scope of the present invention.

[Formula B] to [Formula D] Synthesis Example

Synthesis Example 1. Synthesis of Formula 1

Synthesis Example 1-1. Synthesis of <Intermediate 1-a

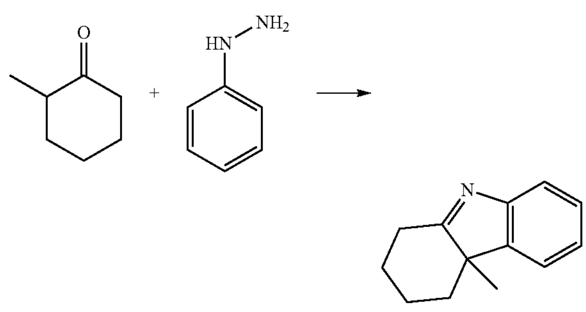

<Intermediate 1-a>

100 g (0.924 mol) of phenylhydrazine and 500 mL of acetic acid were stirred in a round-bottom flask and then heated to 60° C. 103.6 g (0.924 mol) of 2-methyl cyclohexanone was slowly added dropwise, followed by refluxing for 8 hours. After completion of the reaction, the reaction product was extracted with water and ethyl acetate, concentrated and separated by column chromatography to obtain 130 g of <Intermediate 1-a>. (yield 76%)

Synthesis Example 1-2. Synthesis of <Intermediate 1-b>

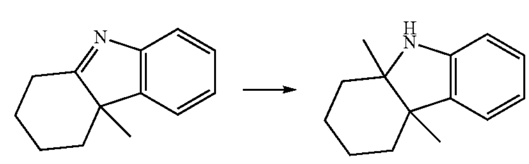

<Intermediate 1-b>

75 g (405 mmol) of <Intermediate 1-a> was added to a round-bottom flask containing 750 mL of toluene under a nitrogen atmosphere, cooled to −10° C., and then 380 mL (608 mmol) of 1.6 M methyl lithium was slowly added dropwise, followed by stirring at −10° C. for about 3 hours. After completion of the reaction, the product was extracted with water and ethyl acetate, concentrated and separated by column chromatography to obtain 50.5 g of <Intermediate 1-b>. (yield 62%)

Synthesis Example 1-3. Synthesis of <Intermediate 1-c>

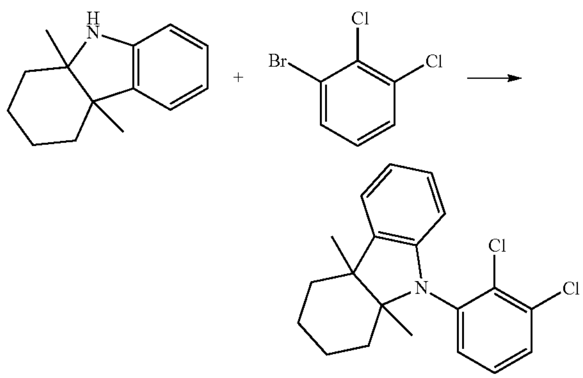

<Intermediate 1-c>

50 g (251 mmol) of <intermediate 1-b>, 56.7 g (251 mmol) of 1-bromo-2,3-dichlorobenzene, 4.5 g (5 mmol) of tris(dibenzylideneacetone)dipalladium, 2 g (10 mmol) of tritertiary butylphosphine, 35.8 g (373 mmol) of sodium tertiary butoxide, and 500 mL of toluene were added to a round-bottom flask under a nitrogen atmosphere, followed by refluxing for 24 hours. After completion of the reaction, the organic layer was concentrated under reduced pressure and separated by column chromatography to obtain 35.6 g of <Intermediate 1-c>. (yield 41%)

Synthesis Example 1-4. Synthesis of <Intermediate 1-d>

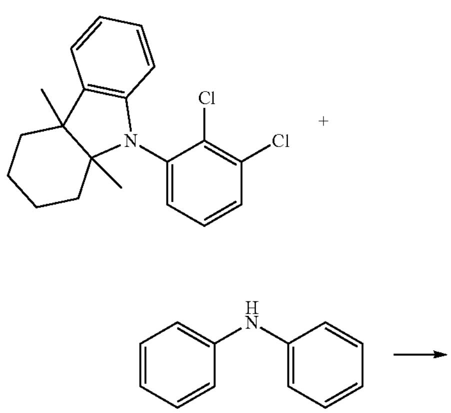

-continued

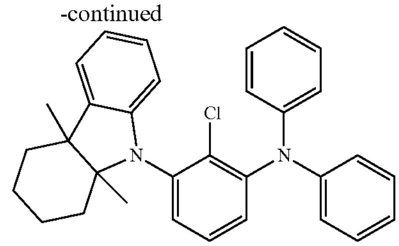

<Intermediate 1-d>

<Intermediate 1-d> was obtained in the same manner as in Synthesis Example 1-3, except that diphenylamine was used instead of <Intermediate 1-b> and <Intermediate 1-c> was used instead of 1-bromo-2,3-dichlorobenzene in Synthesis Example 1-3. (yield 73%)

Synthesis Example 1-5. Synthesis of <Compound 1>

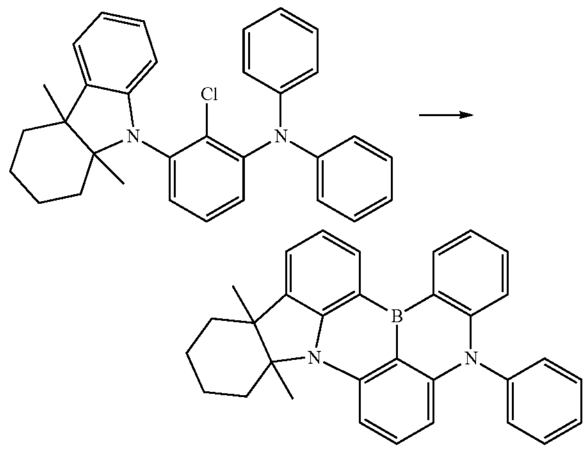

<Compound 1>

20 g (42 mmol) of <Intermediate 1-d> was added to a round-bottom flask containing 200 mL of tert-butylbenzene under a nitrogen atmosphere, cooled to −30° C., and 49.1 mL (84 mmol) of a 1.7 M tert-butyllithium pentane solution was slowly added dropwise. After completion of the dropwise addition, the temperature was raised to 60° C., followed by stirring for 3 hours and removal of pentane through distillation. The residue was cooled to −50° C., 20.8 g (84 mmol) of boron tribromide was added dropwise thereto, and the mixture was warmed to room temperature, followed by stirring for 1 hour. The reaction product was cooled to 0° C. again, and 10.7 g (84 mmol) of N,N-diisopropylethylamine was added thereto, followed by stirring at 120° C. for 3 hours. After completion of the reaction, tert-butylbenzene was removed by distillation under reduced pressure, extracted with water and ethyl acetate, and concentrated by column chromatography to obtain 5.3 g of <Compound 1>. (yield 28%)

MS (MALDI-TOF): m/z 452.24 $[M^{-}]$

Synthesis Example 2. Synthesis of Compound 33

Synthesis Example 2-1. Synthesis of <Intermediate 2-a>

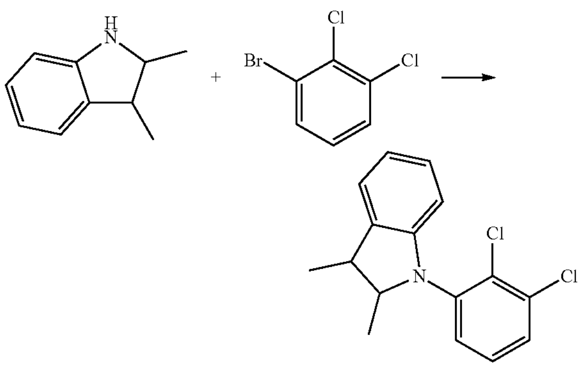

<Intermediate 2-a>

<Intermediate 2-a> was obtained in the same manner as in Synthesis Example 1-3, except that 2,3-dimethyl-2,3-dihydro-1H-indole was used instead of <Intermediate 1-b> in Synthesis Example 1-3. (yield 52%)

Synthesis Example 2-2. Synthesis of <Intermediate 2-b>

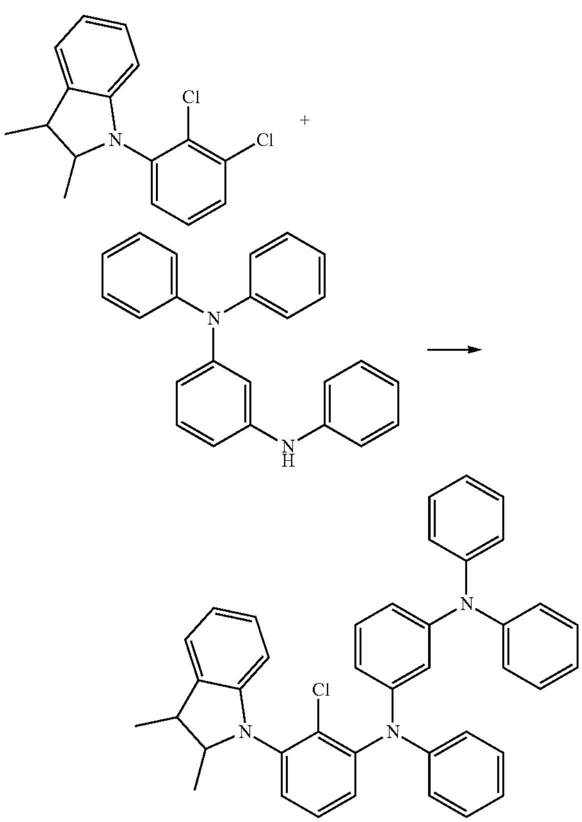

<Intermediate 2-b>

<Intermediate 2-b> was obtained in the same manner as in Synthesis Example 1-3, except that $N^1$,$N^2$,$N^3$-triphenylbenzene-1,3,-diamine was used instead of <Intermediate 1-b> and <Intermediate 2-a> was used instead of 1-bromo-2,3-dichlorobenzene. (yield 55%)

Synthesis Example 2-3. Synthesis of <Formula 33>

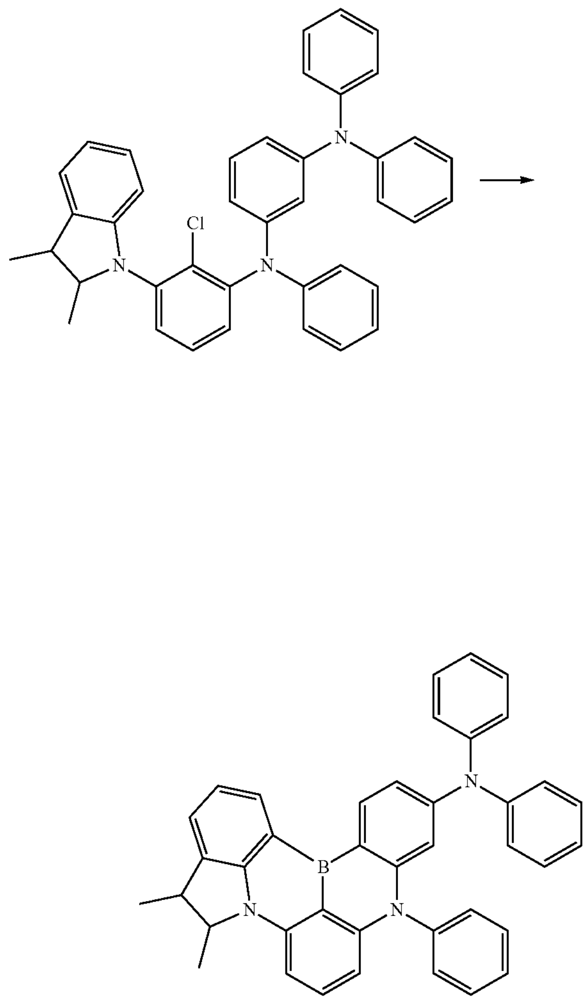

<Formula 33>

<Formula 33> was obtained in the same manner as in Synthesis Example 1-5, except that <Intermediate 2-b> was used instead of <Intermediate 1-d>. (yield 68%)

Synthesis Example 3. Synthesis of Formula 95

Synthesis Example 3-1. Synthesis of <Formula 95>

<Formula 95> was obtained in the same manner as in Synthesis Example 1-4, except that $N^1$,$N^2$,$N^3$-triphenyl-1,3-benzenediamine was used instead of diphenylamine. (yield 17%)

MS(MALDI-TOF): m/z 619.32 [$M^+$]

[Formula A] Synthesis Example>

Synthesis Example 11. Synthesis of Compound 12

Synthesis Example 11-1. Synthesis of <Intermediate 11-a

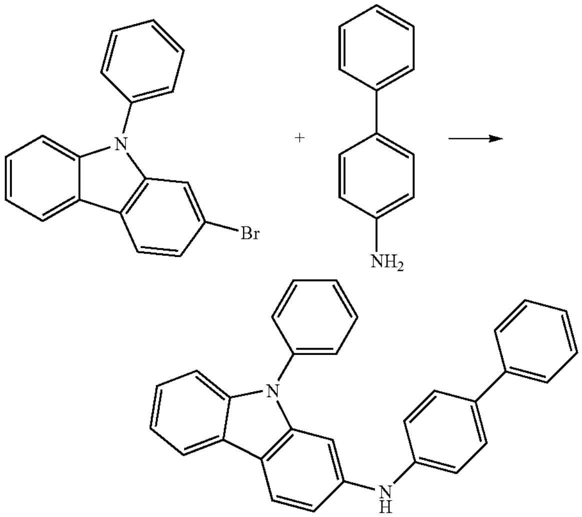

<Intermediate 11-a>

3-bromo-9-phenyl-9H-carbazole (11.3 g, 0.035 mol), 4-aminobiphenyl (6.6 g, 0.039 mol), tris(dibenzylideneacetone)dipalladium (0) (0.65 g, 0.0007 mol), sodium tert-butoxide (6.79 g, 0.0706 mol), 2,2'-bis(diphenylphosphino)-1,1'-binaphthalene (0.44 g, 0.0007 mol) and 100 mL of toluene were added to a round-bottom flask, followed by stirring under reflux for 3 hours. After completion of the reaction, the mixture was cooled to room temperature and extracted with ethyl acetate and water. The organic layer was separated, dehydrated with magnesium sulfate, and then concentrated under reduced pressure. The result was separated by column chromatography to obtain 12.2 g of <Intermediate 11-a>. (yield 85%)

Synthesis Example 11-2. Synthesis of <Compound 12>

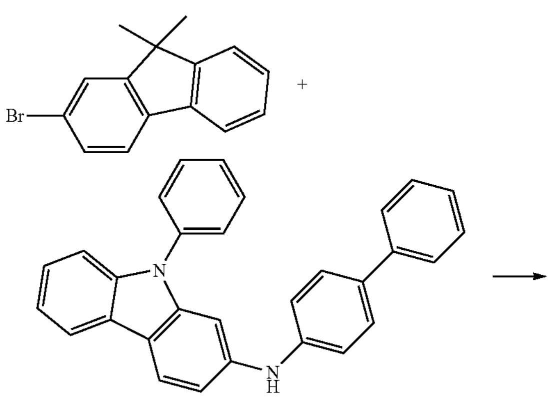

-continued

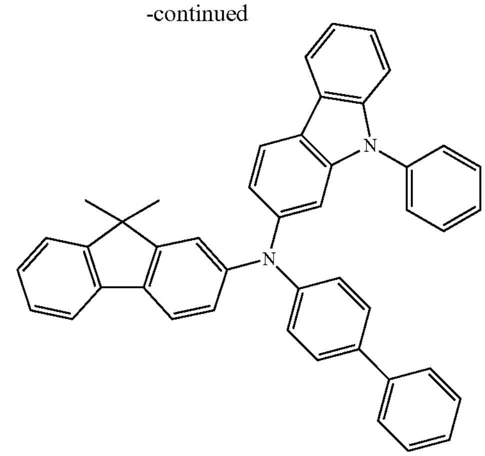

<Compound 12>

3-bromo-9,9-dimethylfluorene (2.4 g, 0.009 mol), <Intermediate 11-a> (5.3 g, 0.013 mol), palladium (II) acetate (0.08 g, 0.4 mmol), sodium tert-butoxide (3.4 g, 0.035 mol), tri-tert-butylphosphine (0.07 g, 0.4 mmol), and 60 mL of toluene were added to a round-bottom flask, followed by stirring under reflux for 2 hours. After completion of the reaction, the reaction solution was cooled to room temperature and extracted with ethyl acetate and water. The organic layer was separated, dehydrated with magnesium sulfate, and then concentrated under reduced pressure. The result was separated and purified by column chromatography and recrystallized with dichloromethane and acetone to obtain 2.6 g of <Compound 12>. (yield 48%)

MS (MALDI-TOF): m/z 602.27 $[M^-]$

Synthesis Example 12. Synthesis of Compound 30

Synthesis Example 12-(1): Synthesis of Compound 30

<Compound 30> was synthesized in the same manner as in Synthesis Example 11 except that 1-naphthylamine was used instead of 4-aminobiphenyl used in Synthesis Example 11-(1), and 3-bromo-9,9-dimethylfluorene was used instead of 2-bromo-9,9-dimethylfluorene used in Synthesis Example 11-(2) (yield 45%).

MS (MALDI-TOF): m/z 830.29 $[M^-]$

Synthesis Example 13. Synthesis of Compound 44

Synthesis Example 13-(1): Synthesis of Compound 44

<Compound 44> was synthesized in the same manner as in Synthesis Example 11 except that aniline-2,3,4,5,6-d5 was used instead of 4-aminobiphenyl used in Synthesis Example 11-(1), and 2-bromo-9,9'-dimethylfluorene was used instead of 2-bromo-9,9-dimethylfluorene used in Synthesis Example 11-(2) (yield 46%).

MS (MALDI-TOF): m/z 653.29 $[M^+]$

Synthesis Example 14. Synthesis of Compound 78

Synthesis Example 14-(1): Synthesis of Compound 78

<Compound 78> was synthesized in the same manner as in Synthesis Example 11 except that 2-bromo-9,9-diphenylfluorene was used instead of 2-bromo-9,9-dimethylfluorene used in Synthesis Example 11-(2) (yield 46%).

MS (MALDI-TOF): m/z 726.30 [$M^+$]

Synthesis Example 15. Synthesis of Compound 102

Synthesis Example 15-(1): Synthesis of Compound 102

<Compound 102> was synthesized in the same manner as in Synthesis Example 11, except that 2-naphthylamine was used instead of 4-aminobiphenyl used in Synthesis Example 11-(1) and 2-(4-bromophenyl)-9,9-diphenyl-9H-fluorene was used instead of 2-bromo-9,9-dimethylfluorene used in Synthesis Example 11-(2) (yield 45%).

MS (MALDI-TOF): m/z 776.32 [$M^+$]

Synthesis Example 16. Synthesis of Compound 174

Synthesis Example 16-(1): Synthesis of Compound 174

<Compound 174> was synthesized in the same manner as in Synthesis Example 11, except that 3-bromo-9-phenyl-9H-carbazole was used instead of 2-bromo-9-phenyl-9H-carbazole used in Synthesis Example 11-(1), and 4-(1-naphthyl) aniline was used instead of 4-aminobiphenyl (yield 47%).

MS (MALDI-TOF): m/z 652.29 [$M^+$]

Synthesis Example 17. Synthesis of Compound 195

Synthesis Example 17-(1): Synthesis of Compound 195

<Compound 195> was synthesized in the same manner as in Synthesis Example 11, except that 3-bromo-9-phenyl-9H-carbazole was used instead of 2-bromo-9-phenyl-9H-carbazole used in Synthesis Example 11-(1), 3-aminobiphenyl was used instead of 4-aminobiphenyl, and 1-(4-bromophenyl)-9,9-dimethyl-9H-fluorene was used instead of 2-bromo-9,9-dimethylfluorene used in Synthesis Example 11-(2) (yield 45%).

MS (MALDI-TOF): m/z 678.30 [$M^+$]

Examples 1 to 15: Fabrication of Organic Light-Emitting Devices

ITO glass was patterned such that a light-emitting area of the ITO glass was adjusted to 2 mm×2 mm and was then washed. The ITO glass was mounted in a vacuum chamber, a base pressure was set to $1\times10^{-7}$ torr, and 2-TNATA (400 Å) and a material for a hole transport layer shown in [Table 1] (200 Å) were sequentially deposited on the ITO glass. Then, a mixture of [BH] as a host and the compound shown in the following Table 1 as a dopant (3 wt %) was deposited to a thickness of 250 Å to form a light-emitting layer. Then, a compound of [Formula E-1] was deposited thereon to a thickness of 300 Å to form an electron transport layer, Liq was deposited thereon to a thickness of 10 Å to form an electron injection layer, and Al was deposited thereon to a thickness of 1,000 Å to form a cathode. As a result, an organic light-emitting device was fabricated. The properties of the organic light-emitting device were measured at 10 mA/$cm^2$.

[2-TNATA]

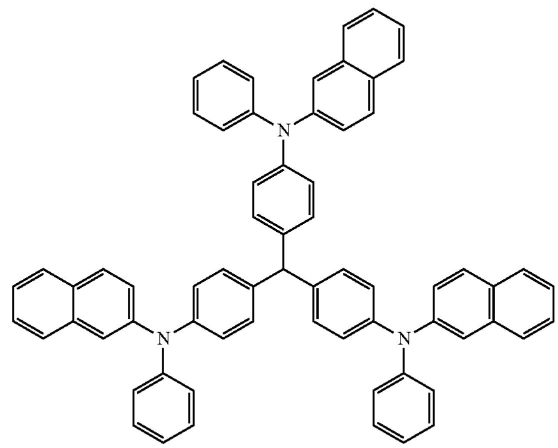

[BH]

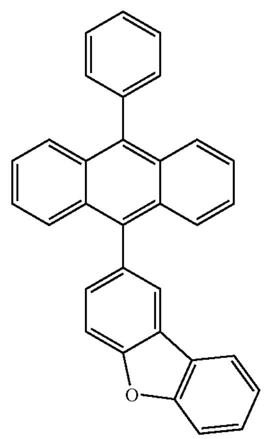

[Formula E-1]

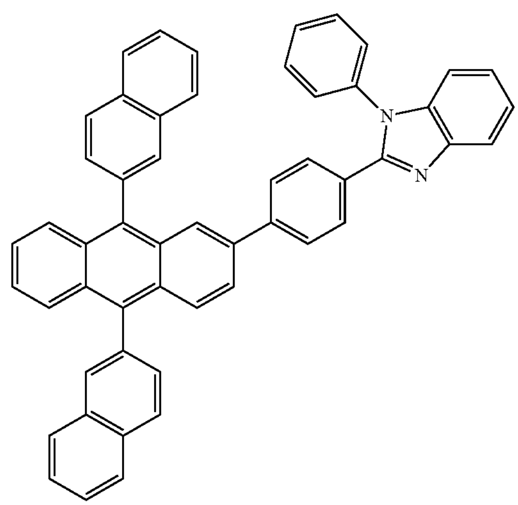

Comparative Examples 1 to 8

Organic light-emitting devices were fabricated in the same manner as in Examples above, except that [HT] and [BD1] were used instead of the compound used as the hole transport layer material and dopant compounds, respectively, in Examples 1 to 15. The properties of the organic light-emitting devices were measured at 10 mA/$cm^2$. The structures of [HT] and [BD1] are as follows.

TABLE 1

[HT]

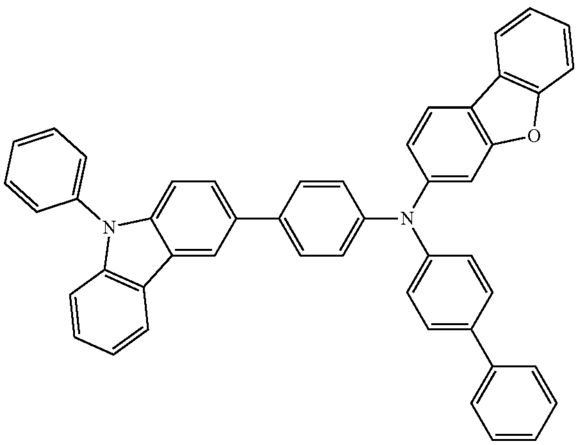 [SMILES: c1ccc(-c2ccc(N(c3ccc(-c4ccc5c(c4)c4ccccc4n5-c4ccccc4)cc3)c3ccc4c(c3)oc3ccccc34)cc2)cc1]

[BD1]

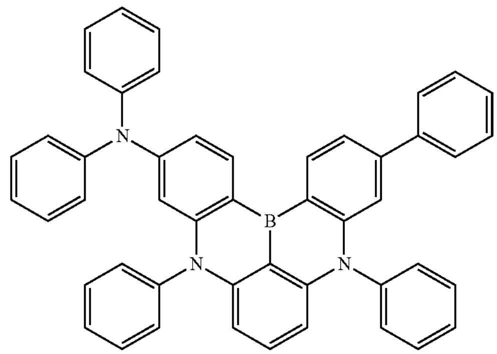 [SMILES: c1ccc(-c2ccc3c(c2)N(c2ccccc2)c2cccc4c2B3c2ccc(N(c3ccccc3)c3ccccc3)cc2N4c2ccccc2)cc1]

| Item | Hole transport layer (Formula A) | Dopant compound (Formula B/C/D) | Voltage (V) | External quantum efficiency (%) |
|---|---|---|---|---|
| Example 1 | 12 | 1 | 3.6 | 11.4 |
| Example 2 | 30 | 1 | 3.6 | 11.7 |
| Example 3 | 44 | 1 | 3.5 | 11.8 |
| Example 4 | 78 | 1 | 3.5 | 11.8 |
| Example 5 | 174 | 1 | 3.6 | 11.2 |
| Example 6 | 30 | 33 | 3.6 | 11.5 |
| Example 7 | 44 | 33 | 3.5 | 11.7 |
| Example 8 | 78 | 33 | 3.5 | 11.9 |
| Example 9 | 102 | 33 | 3.6 | 11.4 |
| Example 10 | 195 | 33 | 3.6 | 11.6 |
| Example 11 | 44 | 95 | 3.5 | 12.0 |
| Example 12 | 78 | 95 | 3.5 | 12.2 |
| Example 13 | 102 | 95 | 3.6 | 11.6 |
| Example 14 | 174 | 95 | 3.6 | 11.5 |
| Example 15 | 195 | 95 | 3.6 | 11.4 |
| Comparative Example 1 | HT | 1 | 3.8 | 8.6 |
| Comparative Example 2 | HT | 33 | 3.7 | 8.4 |
| Comparative Example 3 | HT | 95 | 3.7 | 8.8 |
| Comparative Example 4 | 12 | BD 1 | 3.8 | 7.7 |
| Comparative Example 5 | 44 | BD 1 | 3.8 | 7.9 |
| Comparative Example 6 | 78 | BD 1 | 3.7 | 8.0 |
| Comparative Example 7 | 102 | BD 1 | 3.7 | 7.8 |
| Comparative Example 8 | 195 | BD 1 | 3.8 | 7.6 |

As can be seen from [Table 1] above, the organic light-emitting device according to the present invention using the hole transport material (Formula A) in the hole transport layer, and using the dopant materials (Formula B/C/D) according to the present invention in the light-emitting layer can be operated at a lower voltage and exhibit improved luminous efficacy based on remarkably improved external quantum efficiency compared to the organic light-emitting device using the conventional compound represented by HT, the organic light-emitting device using the conventional compound represented by BD1, and the organic light-emitting device without using the combination of materials according to the present invention.

INDUSTRIAL APPLICABILITY

The organic light-emitting device according to the present invention can be operated at a lower driving voltage and exhibits excellent external quantum efficiency and thus high luminous efficacy by utilizing the compounds having characteristic structures as a hole transport material and a dopant material, respectively, in the hole injection layer or the hole transport layer, and the light-emitting layer, and thus is industrially applicable to flat panel displays, flexible displays, monochromatic or white flat panel lighting systems, monochromatic or white flexible lighting systems, vehicle displays, displays for virtual or augmented reality and the like.

The invention claimed is:

1. An organic light-emitting device comprising:

a first electrode;

a second electrode facing the first electrode; and a hole injection layer or a hole transport layer and a light-emitting layer interposed between the first electrode and the second electrode, wherein (i) the hole injection layer or the hole transport layer comprises at least one compound represented by the following [Formula A], and (ii) the light-emitting layer comprises a compound represented by [Formula D]:

[Formula A]

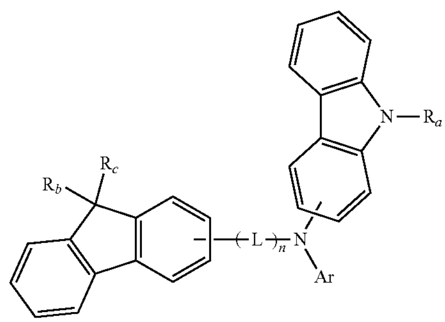

wherein

L is a single bond, a substituted or unsubstituted aromatic C6-C50 hydrocarbon ring, or a substituted or unsubstituted C2-C50 aromatic heterocyclic ring;

n is an integer of 1 to 3, with the proviso that when n is 2 or more, L's are identical to or different from each other;

Ar is selected from a substituted or unsubstituted C5-C50 aryl group and a substituted or unsubstituted C2-C50 heteroaryl group;

$R_a$ to $R_c$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group, with the proviso that $R_b$ and $R_c$ are bonded to each other to further form an alicyclic or aromatic monocyclic or polycyclic ring,

[Formula D]

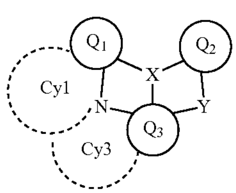

wherein $Q_1$ to $Q_3$ are identical to or different from each other, and are each independently a substituted or unsubstituted aromatic C6-C50 hydrocarbon ring, or a substituted or unsubstituted C2-C50 aromatic heterocyclic group, Y is selected from N—$R_1$, $CR_2R_3$, O, S, Se, and $SiR_4R_5$, with the proviso that Y's are identical to or different from each other, X is selected from B, P and P═O, $R_1$ to $R_5$ are identical to or different from each other, and are each independently hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted C1-C30 alkylamine group, a substituted or unsubstituted C5-C30 arylamine group, a substituted or unsubstituted C1-C30 alkylsilyl group, a substituted or unsubstituted C5-C30 arylsilyl group, a nitro group, a cyano group, and a halogen group, with the proviso that each of $R_1$ to $R_5$ is bonded to the ring $Q_1$ to $Q_3$ to further form an alicyclic or aromatic monocyclic or polycyclic ring, and $R_2$ and $R_3$, and $R_4$ and $R_5$ are bonded to each other to further form an alicyclic or aromatic monocyclic or polycyclic ring, Cy1 is linked to an adjacent nitrogen (N) atom and an aromatic carbon atom in the adjacent $Q_1$ ring to form a fused ring including a nitrogen (N) atom, an aromatic carbon atom in the $Q_1$ ring to which the nitrogen (N) atom is bonded, and an aromatic carbon atom in the $Q_1$ ring to which Cy1 is bonded, with the proviso that the fused ring formed by Cy1 is a substituted or unsubstituted C2-C5 alkylene group, provided that the nitrogen (N) atom, the aromatic carbon atom in the $Q_1$ ring to which the nitrogen (N) atom is bonded, and the aromatic carbon atom in the $Q_1$ ring to which Cy1 is bonded are excluded, and Cy3 is linked to a carbon atom bonded to a nitrogen atom in the adjacent Cy1, and an aromatic carbon atom in the $Q_3$ ring to form a fused ring including the aromatic carbon atom in the $Q_3$ ring to which Cy3 is bonded, the nitrogen (N) atom and the carbon atom in Cy1 bonded to the nitrogen (N) atom, with the proviso that the fused ring formed by Cy3 is a substituted or unsubstituted C1-C4 alkylene group, provided that the aromatic carbon atom in the $Q_3$ ring to which Cy3 is bonded, the nitrogen (N) atom and the carbon atom in Cy1 bonded to the nitrogen (N) atom are excluded.

2. The organic light-emitting device according to claim 1, wherein L in [Formula A] is a single bond, or a substituted or unsubstituted aromatic C6-C50 hydrocarbon ring.

3. The organic light-emitting device according to claim 2, wherein L in [Formula A] is a substituted or unsubstituted phenyl group, a substituted or unsubstituted biphenyl group, a substituted or unsubstituted naphthyl group, a substituted or unsubstituted phenanthryl group, or a substituted or unsubstituted fluorenyl group.

4. The organic light-emitting device according to claim 1, wherein Y in [Formula D] is $NR_1$.

5. The organic light-emitting device according to claim 1, wherein the compound represented by [Formula A] is selected from the compounds represented by the following formulas:

1

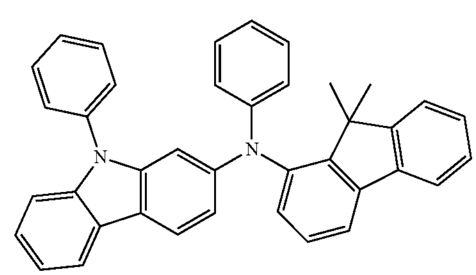

-continued
2
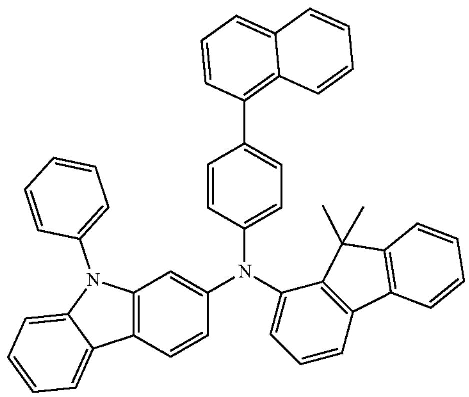
3
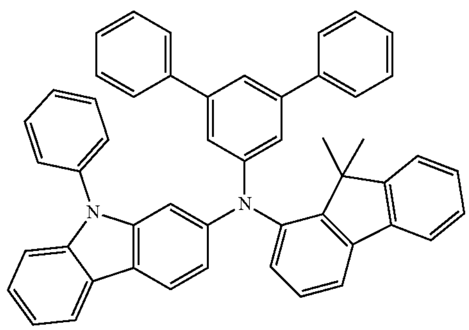
4
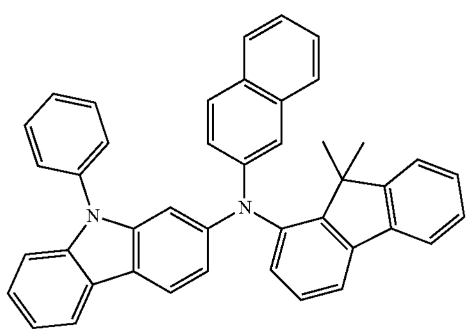
5
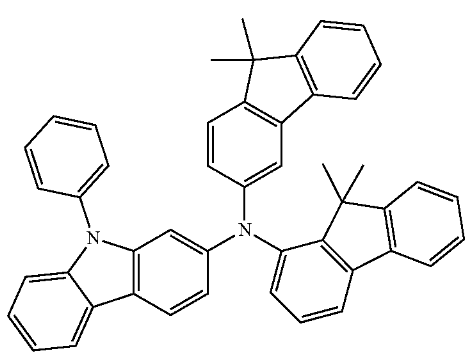
-continued
6
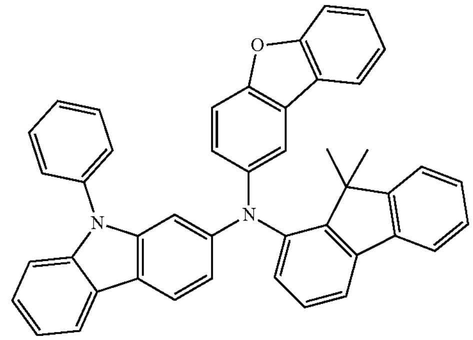
7
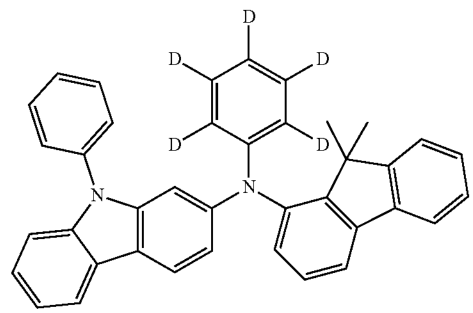
8
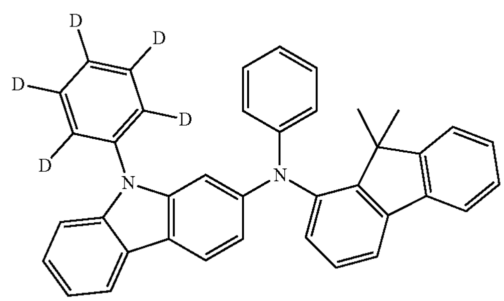
9
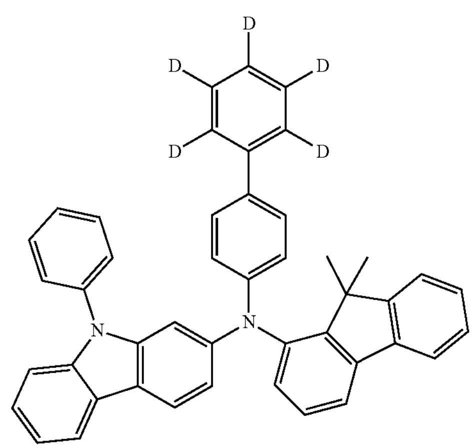

10
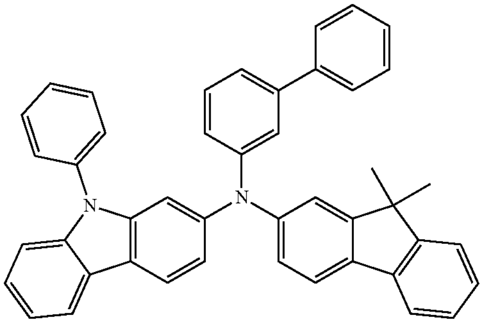
11
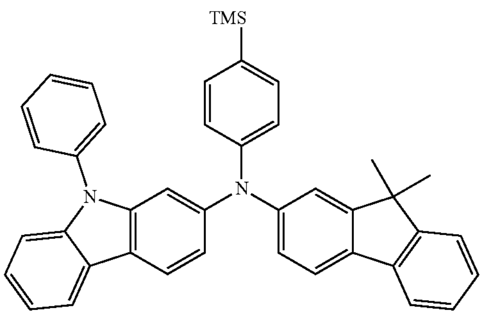
12
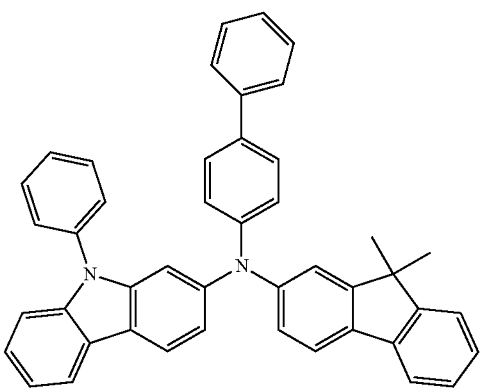
13
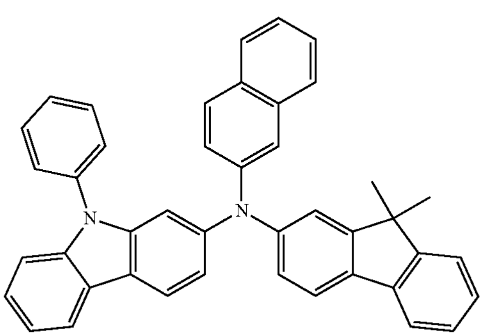
14
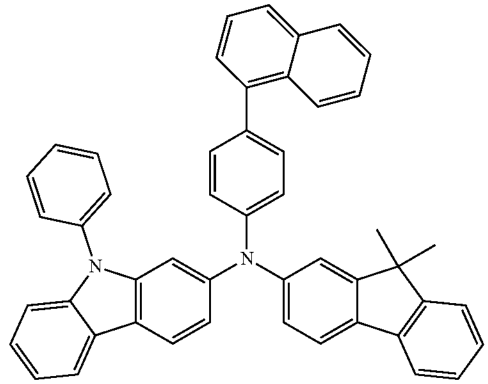
15
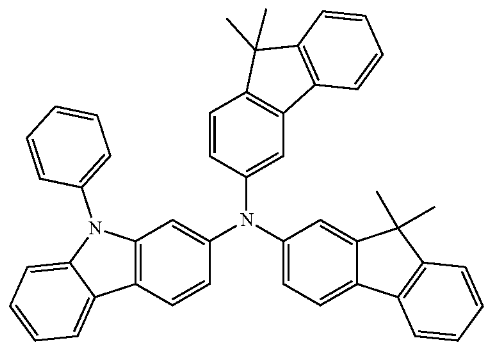
16
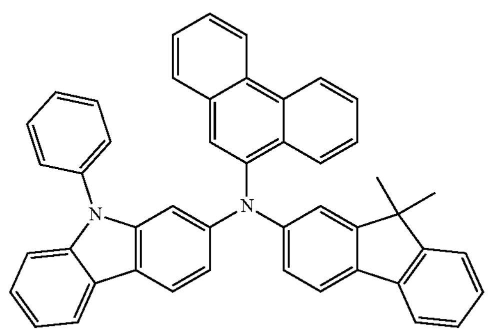
17
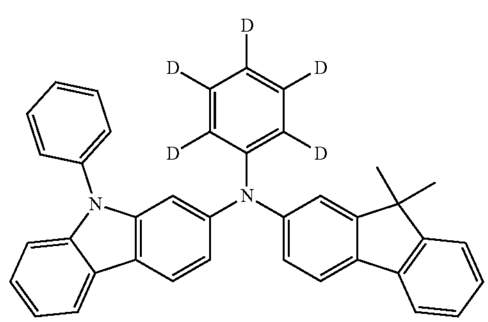

-continued
18
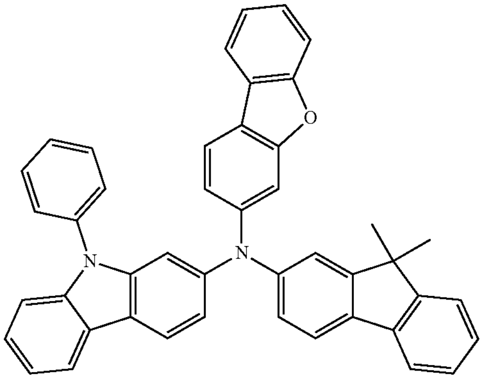
19
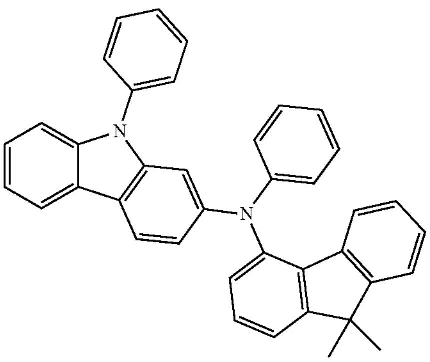
20
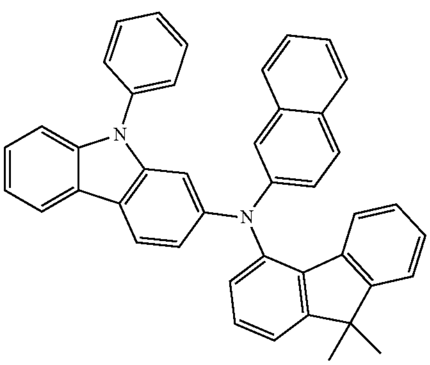
21
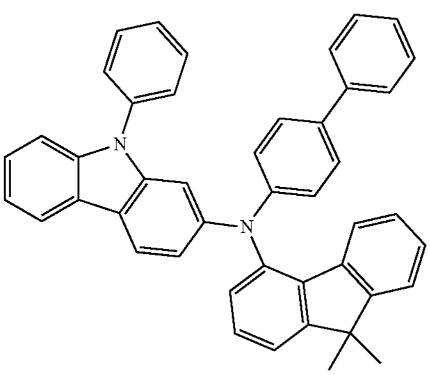
-continued
22
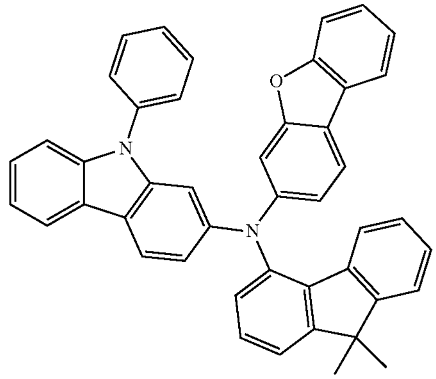
23
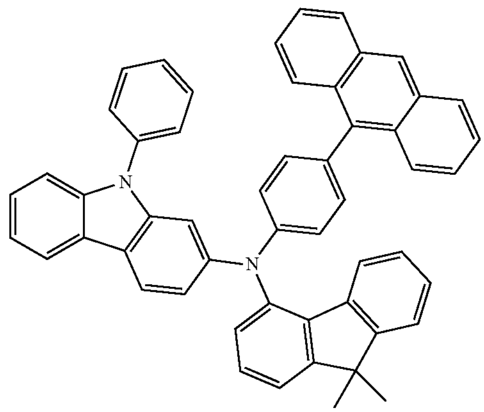
24
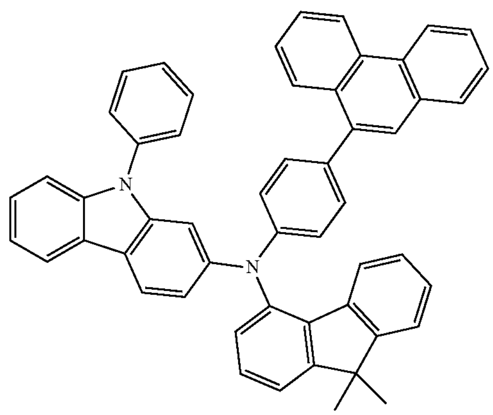
25
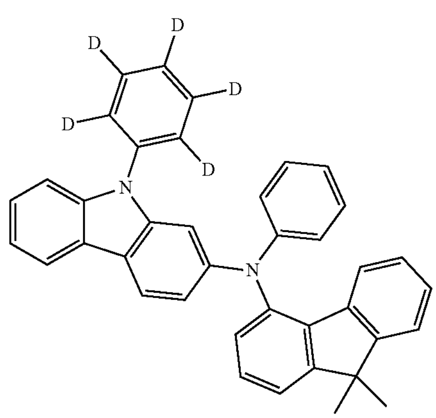

-continued
26
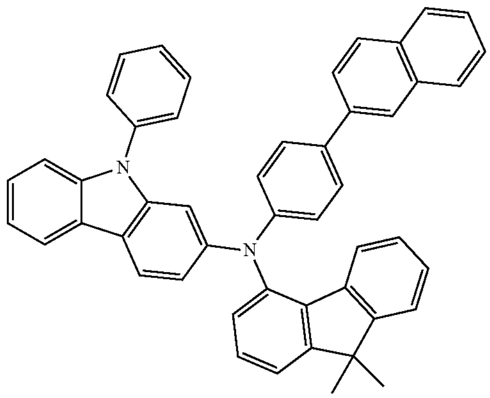
27
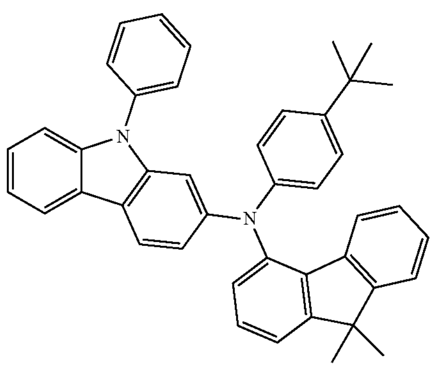
28
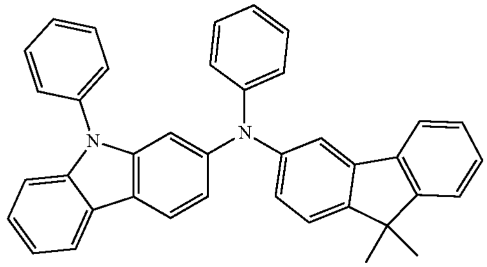
29
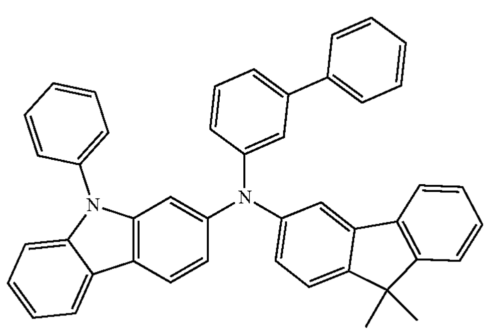
30
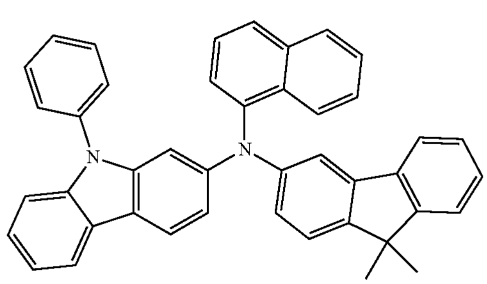
-continued
31
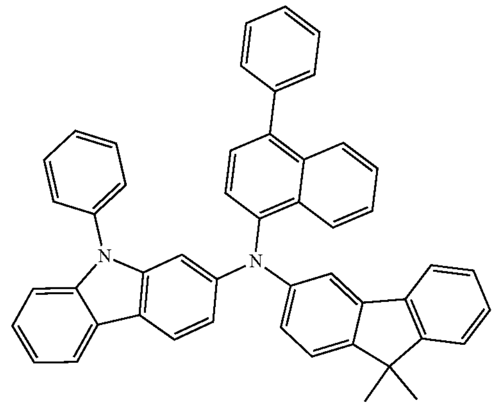
32
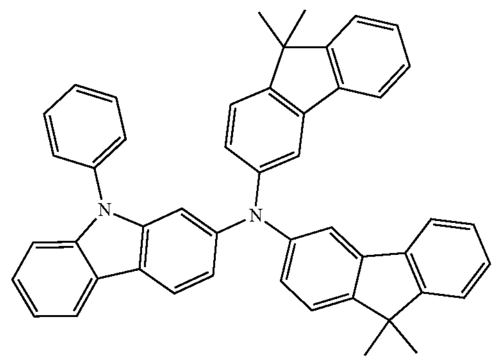
33
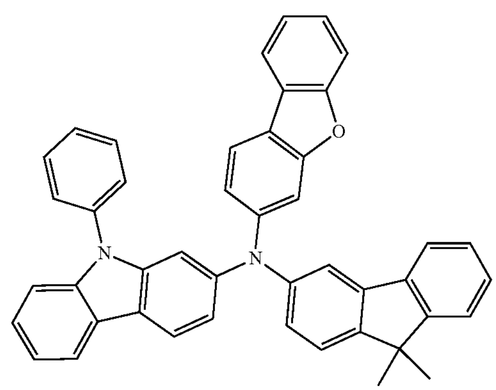
34
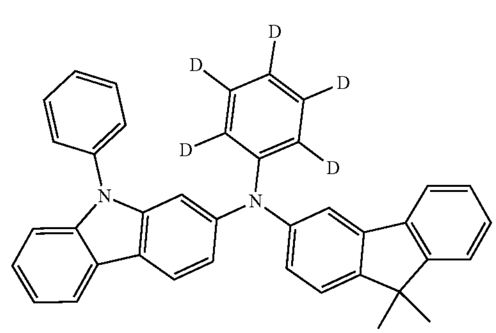

-continued
35
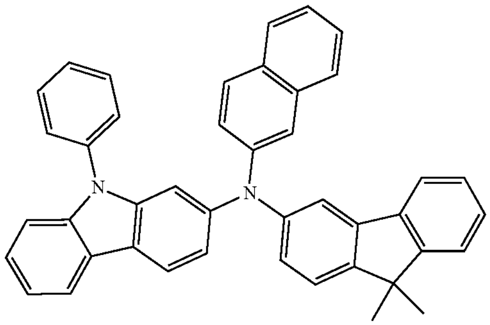
36
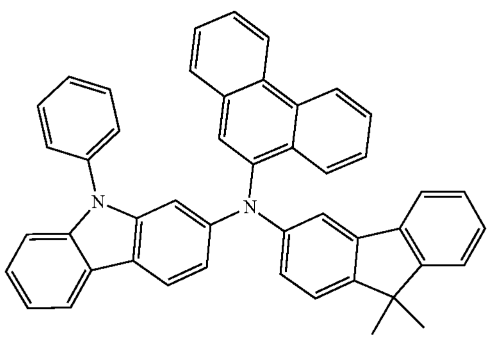
37
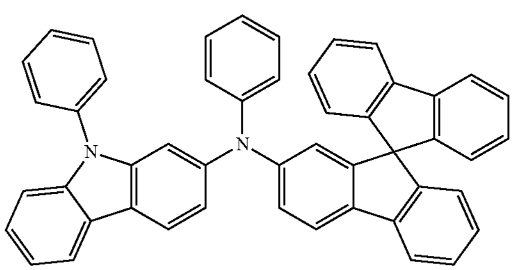
38
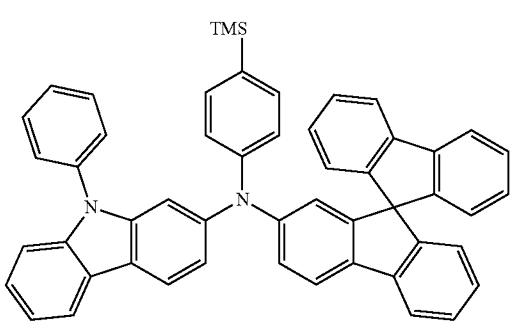
-continued
39
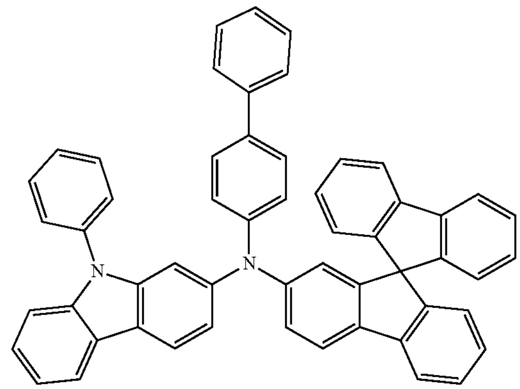
40
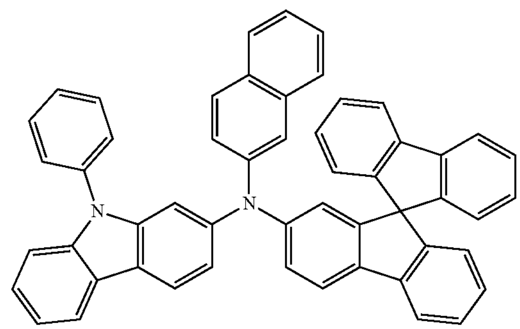
41
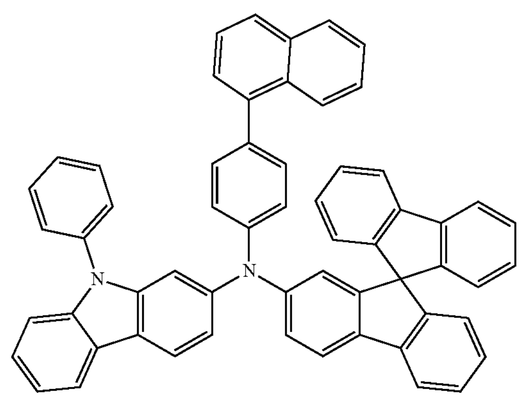
42
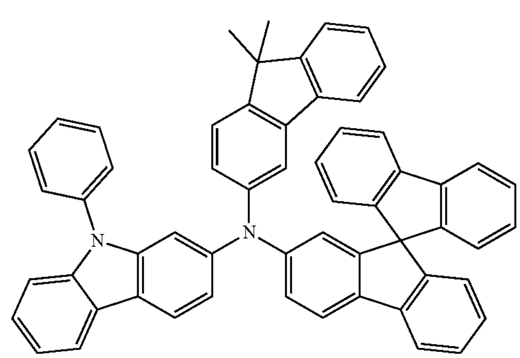

-continued
43
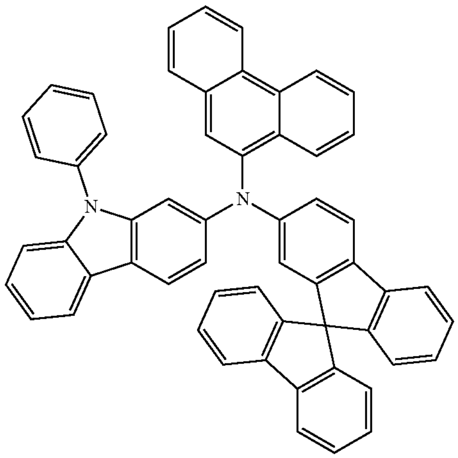
44
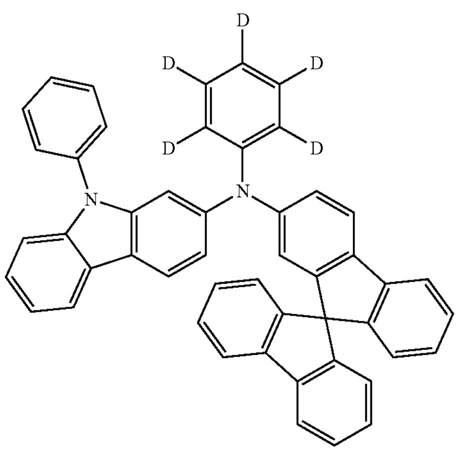
45
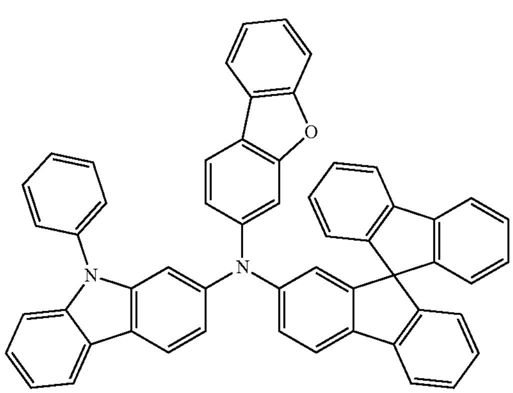
-continued
46
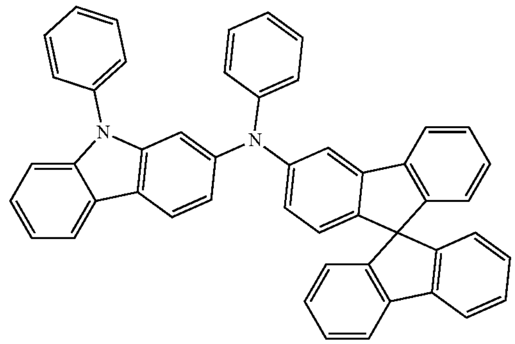
47
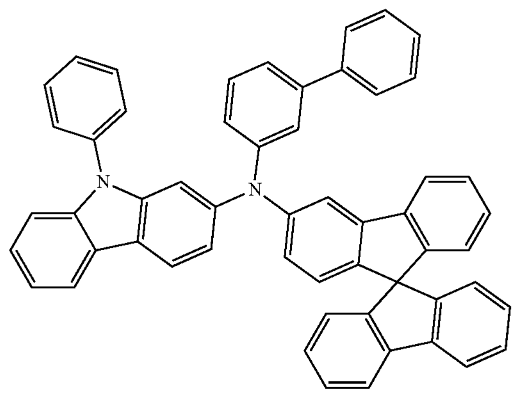
48
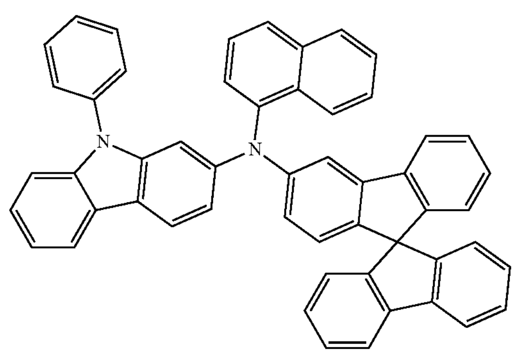
49
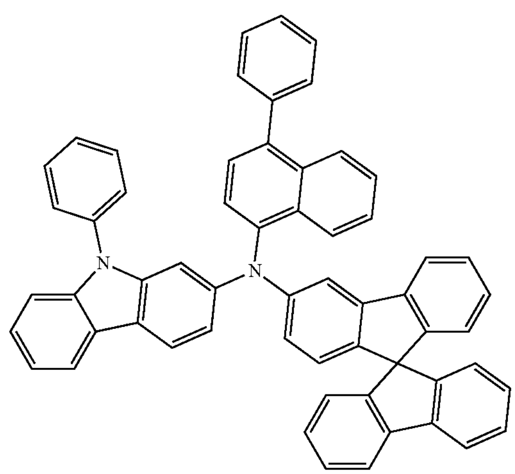

-continued
50
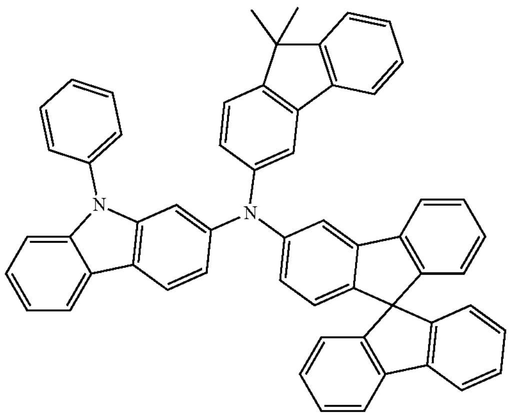
51
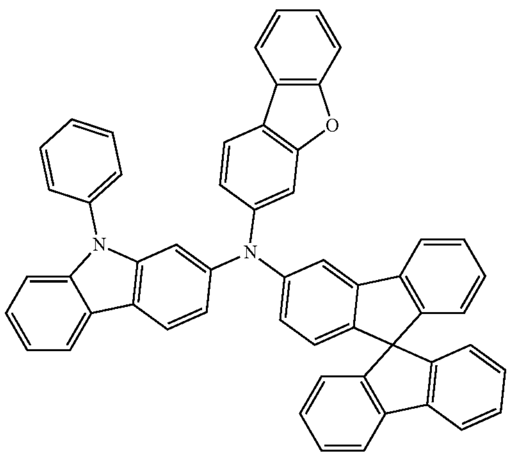
52
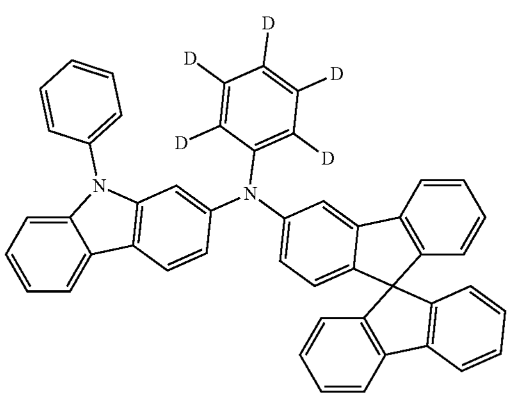
-continued
53
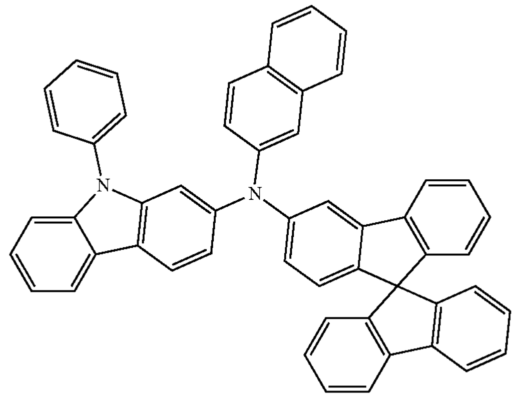
54
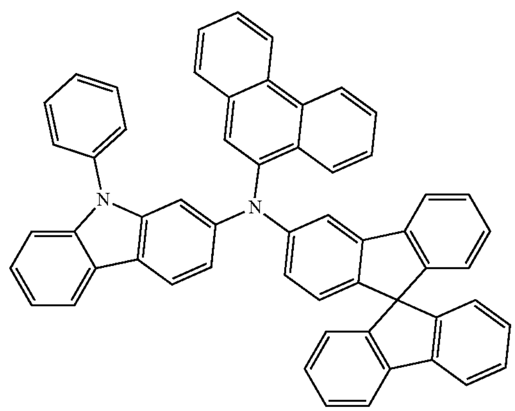
55
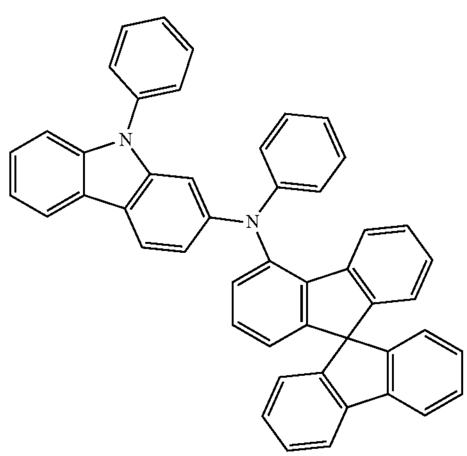

-continued
56
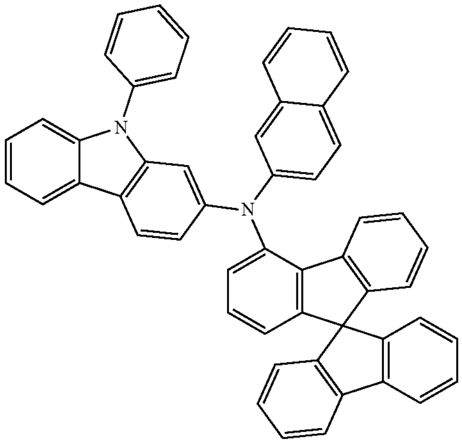
57
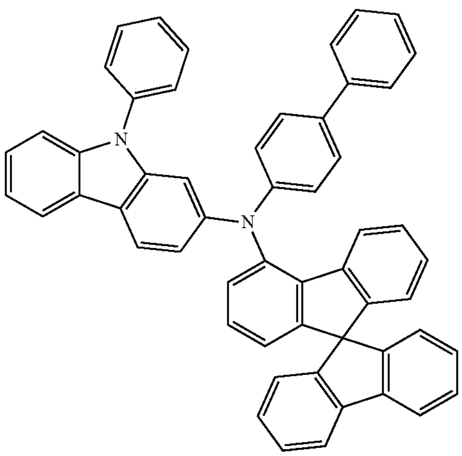
58
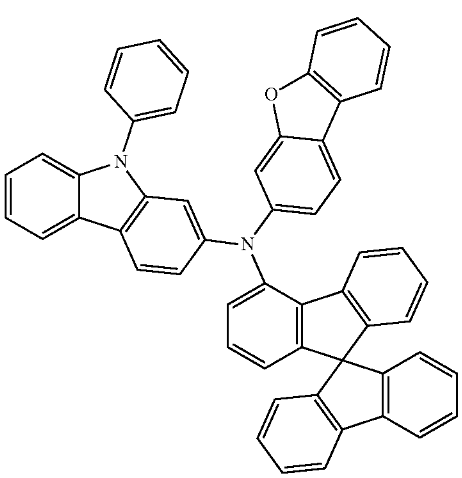
-continued
59
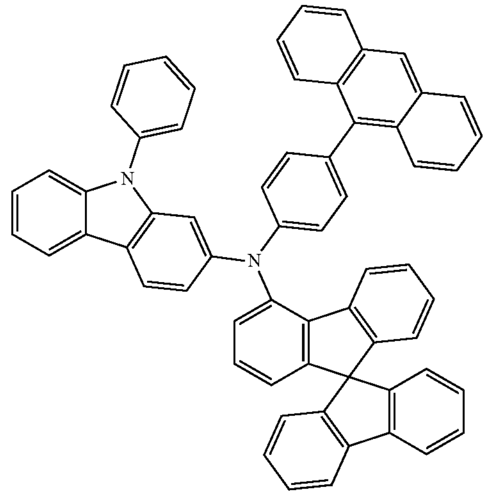
60
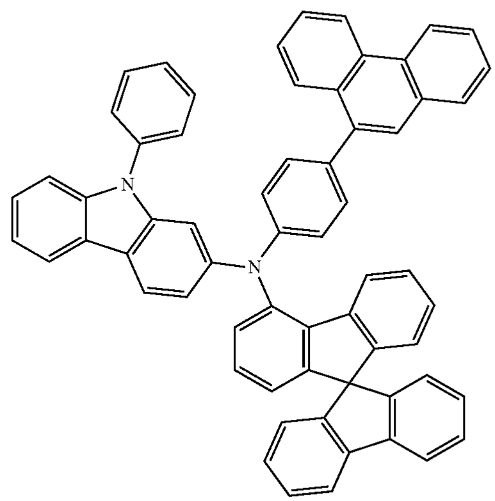
61
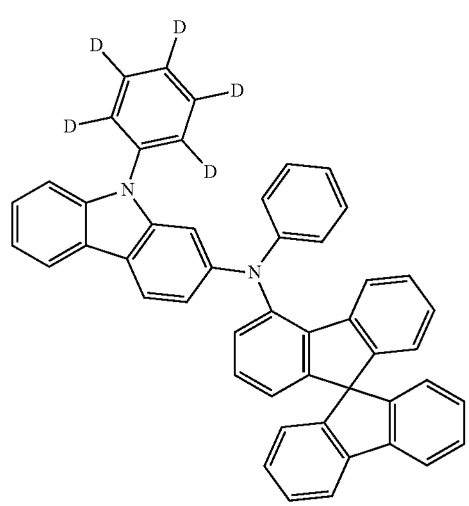

-continued
62
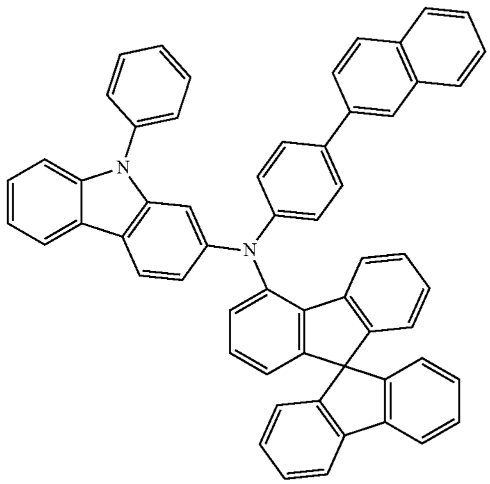
63
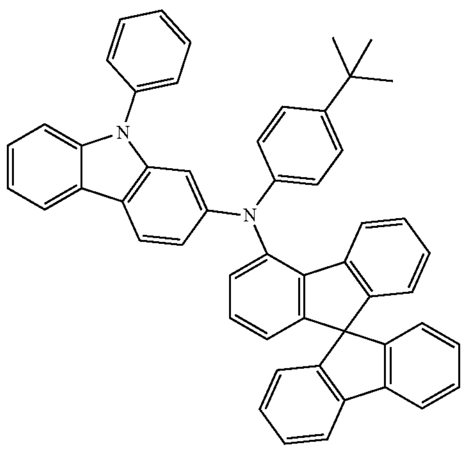
64
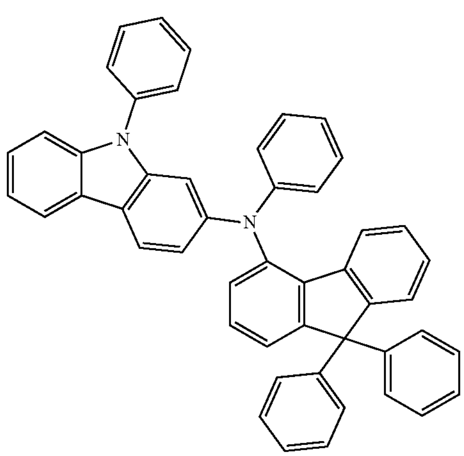
-continued
65
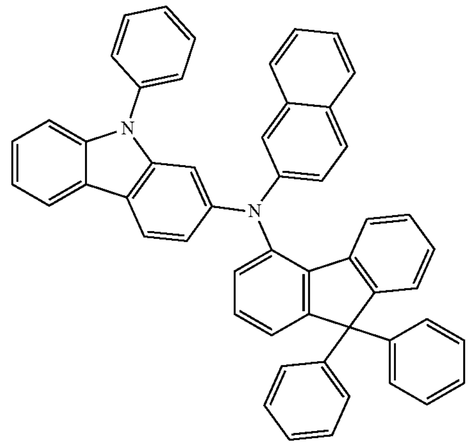
66
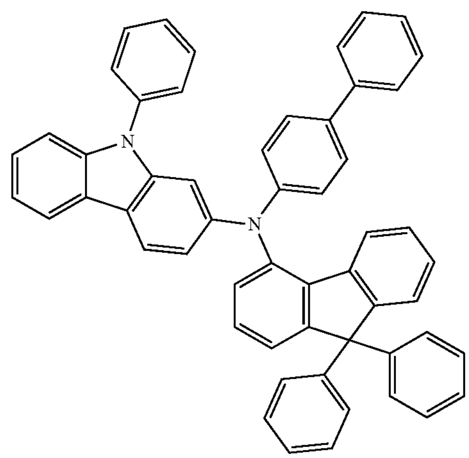
67
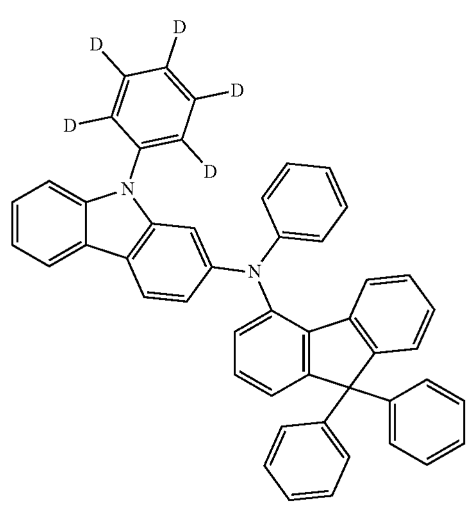

-continued
68
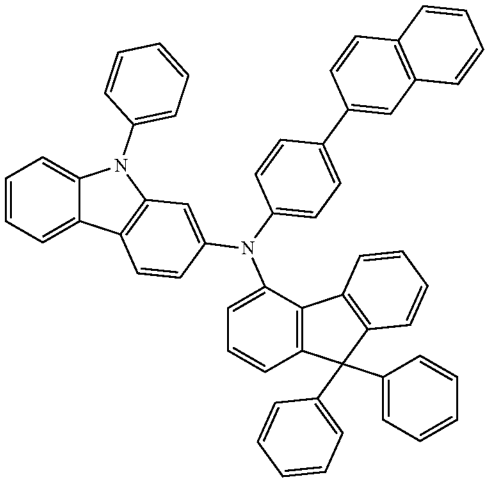
69
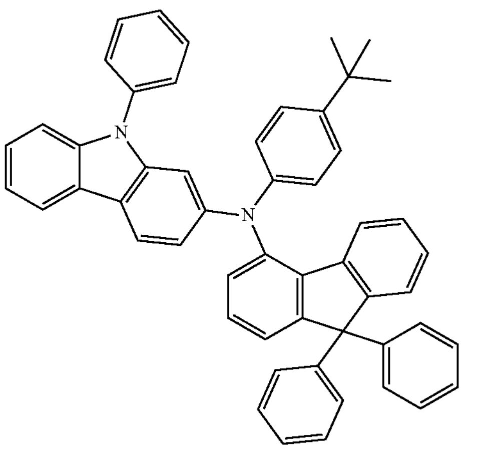
70
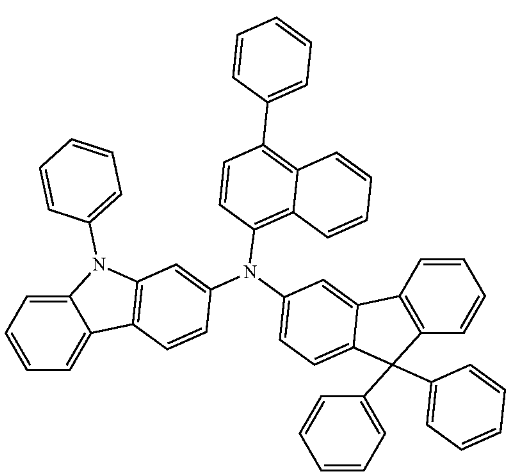
-continued
71
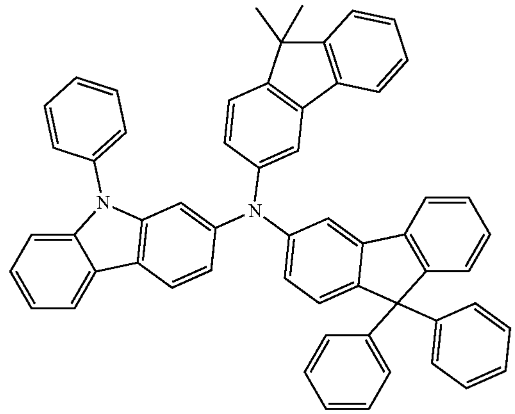
72
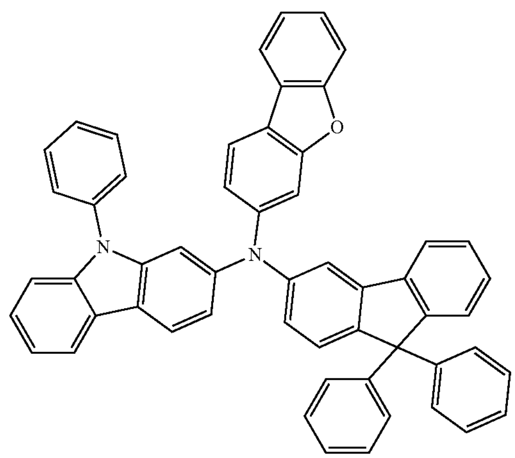
73
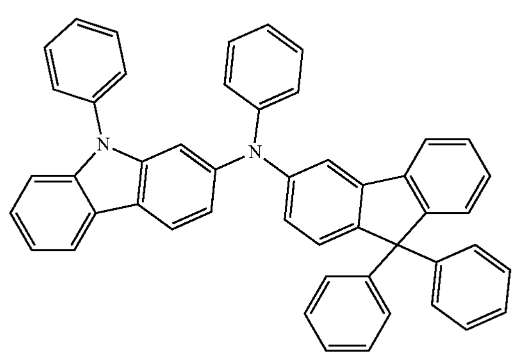

-continued
74
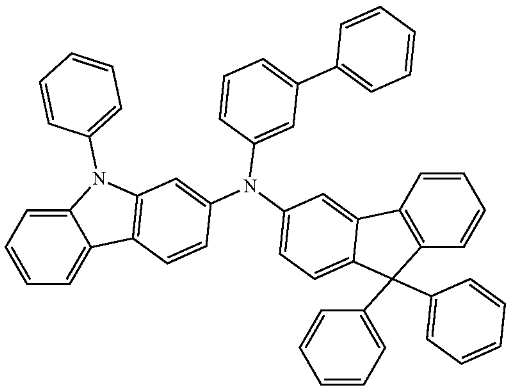
75
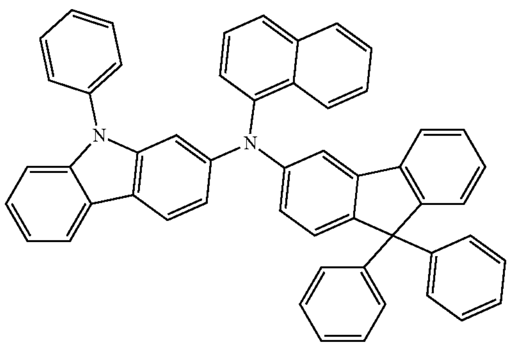
76
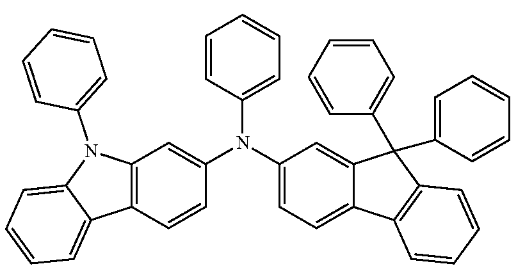
77
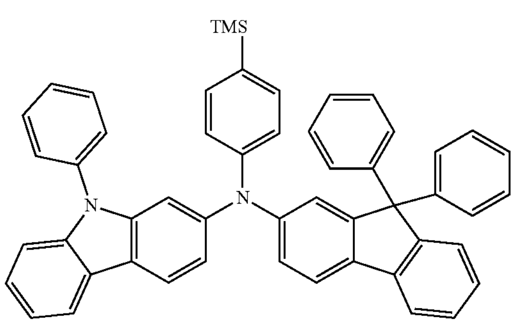
-continued
78
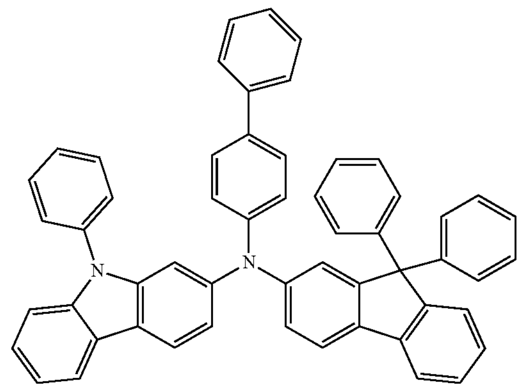
79
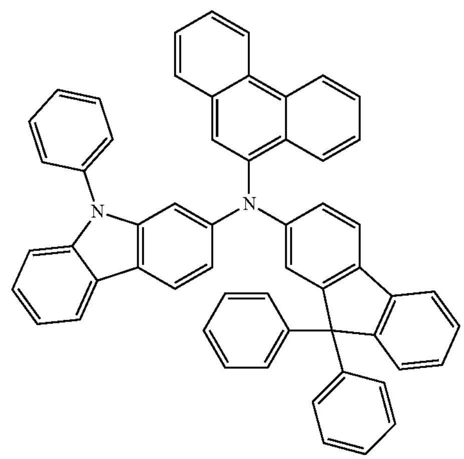
80
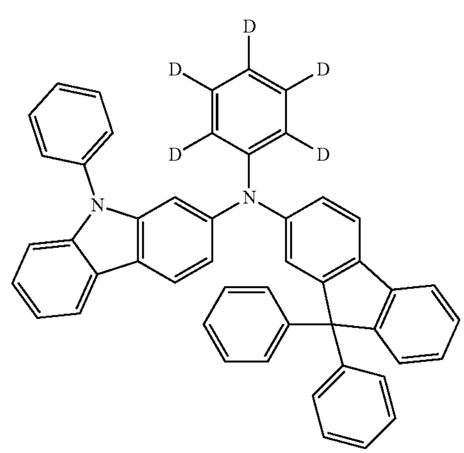

-continued
81
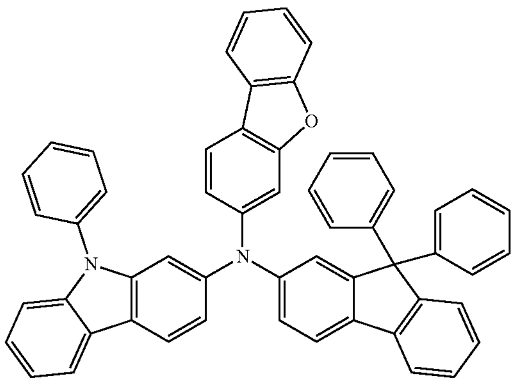
82
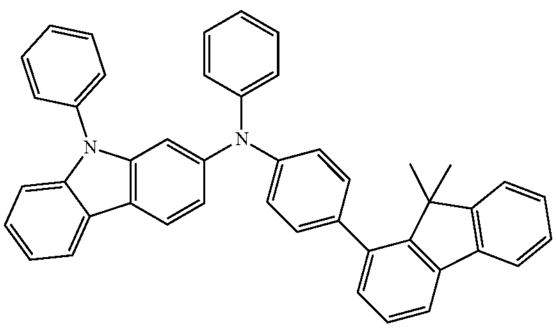
83
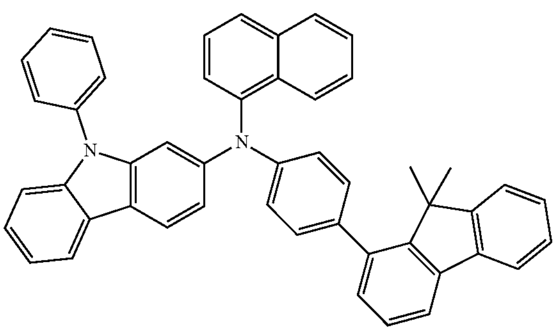
84
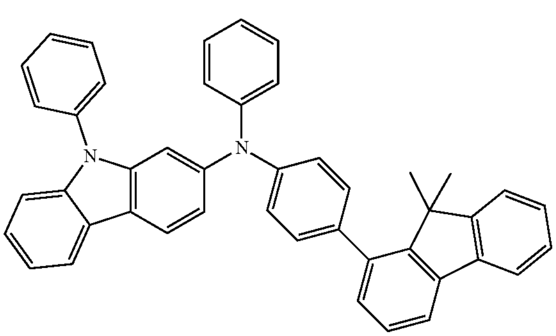
-continued
85
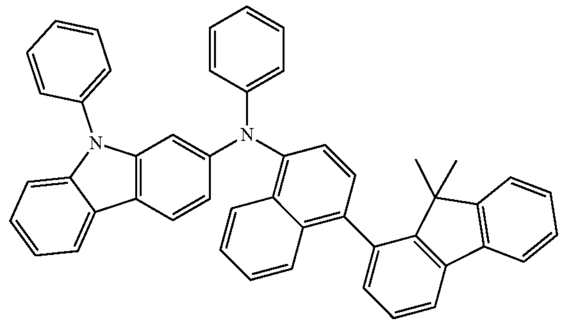
86
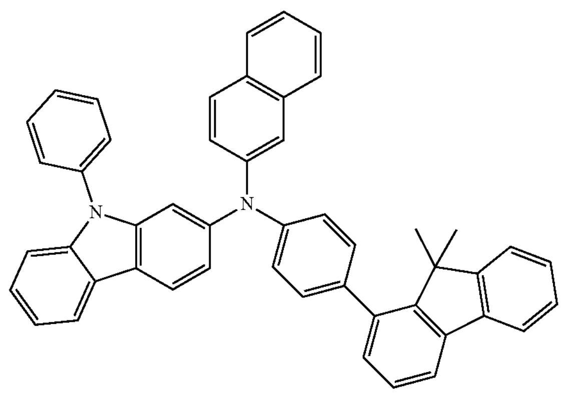
87
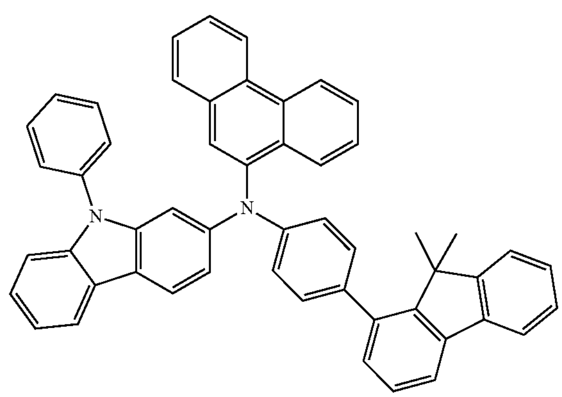
88
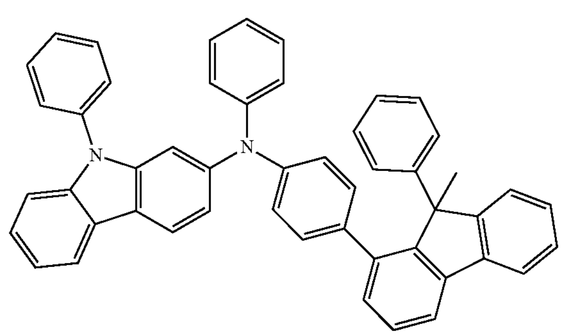

-continued
89
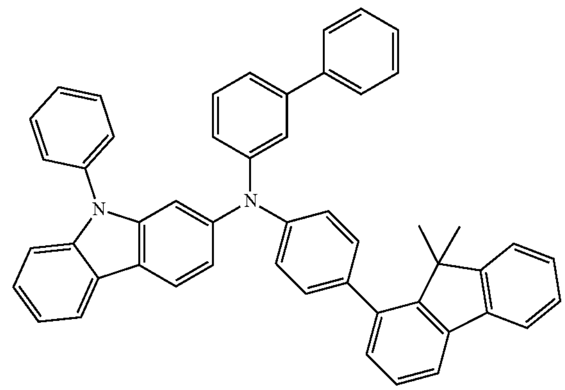
90
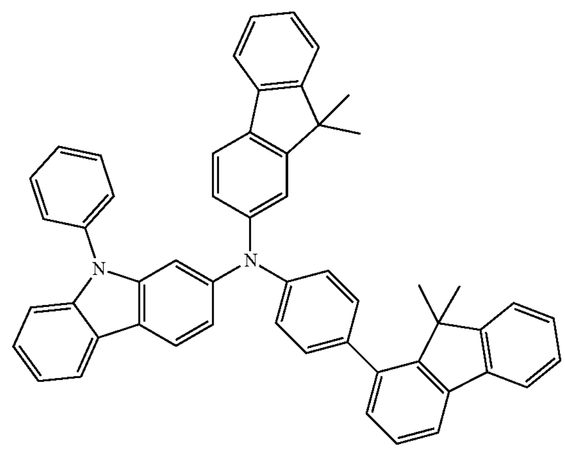
91
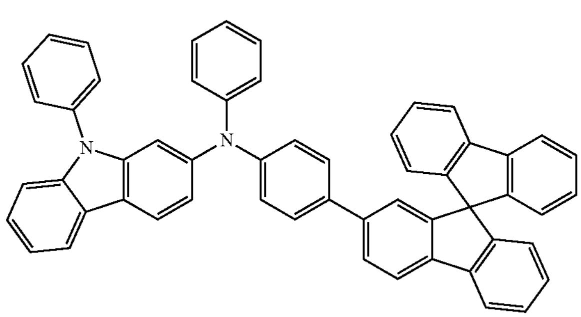
92
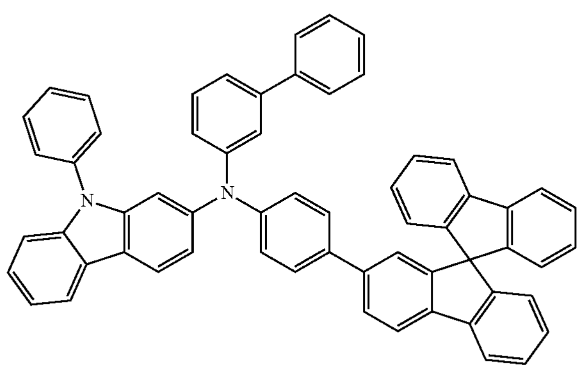
-continued
93
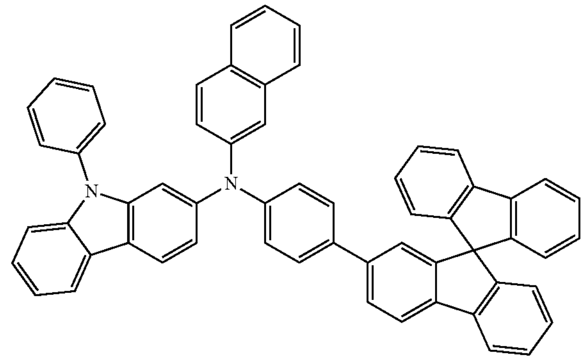
94
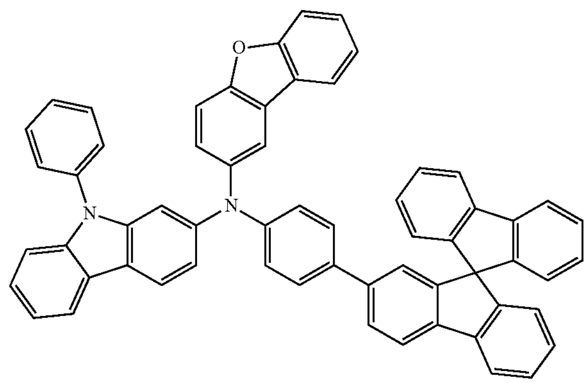
95
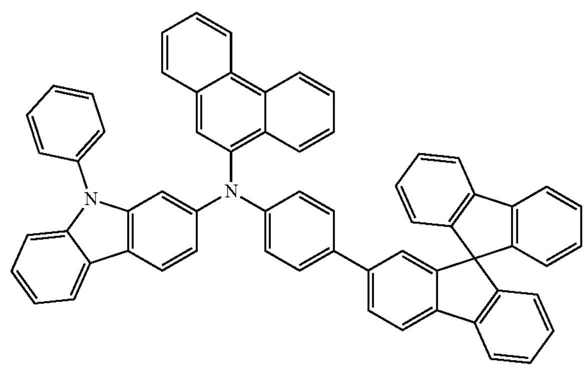
96
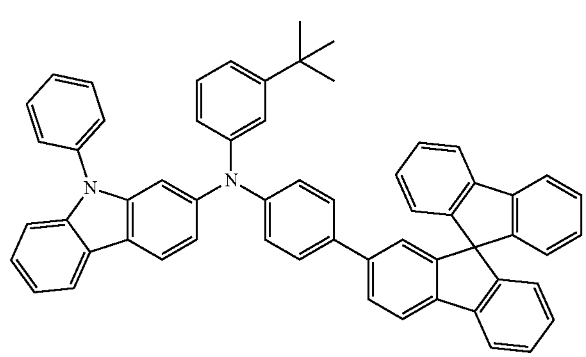

-continued
97
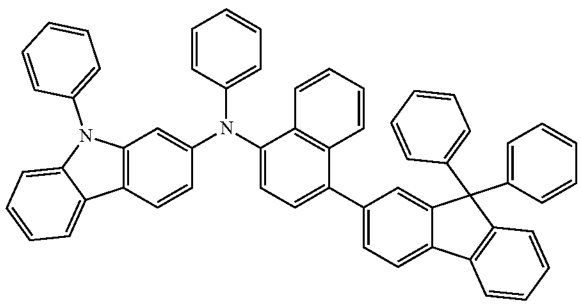
98
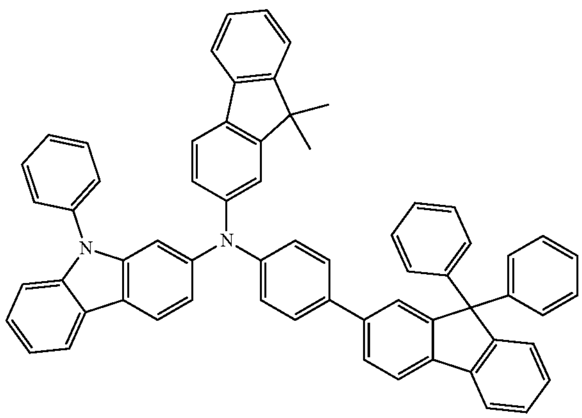
99
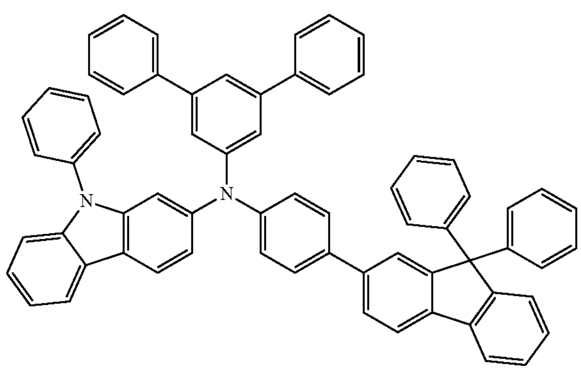
100
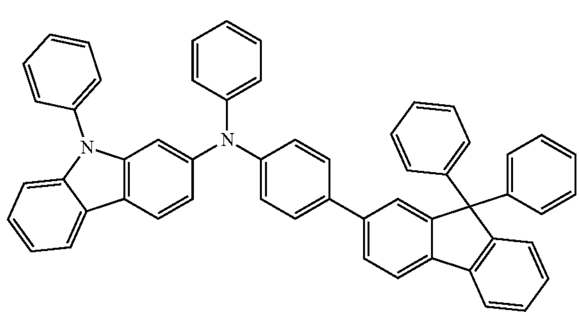
-continued
101
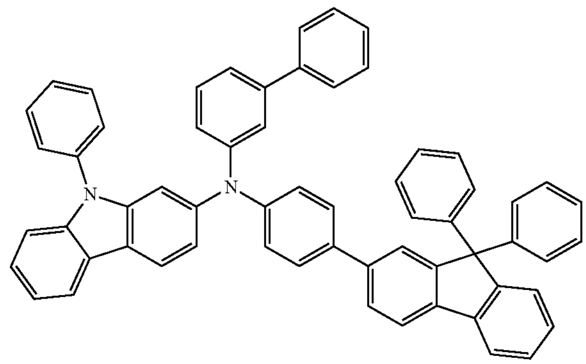
102
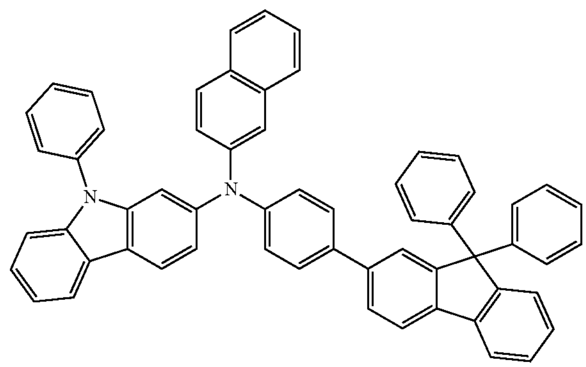
103
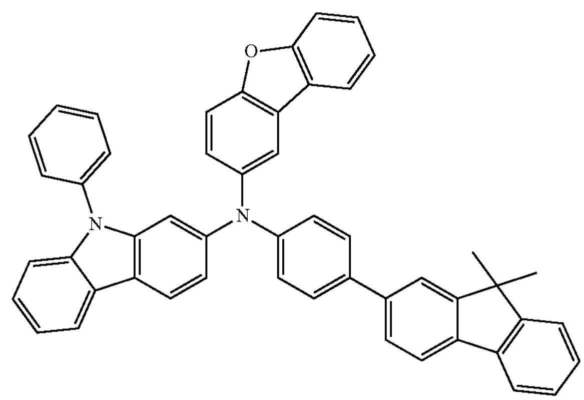
104
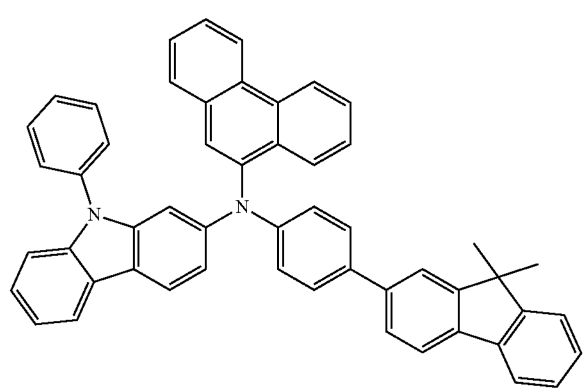

-continued
105
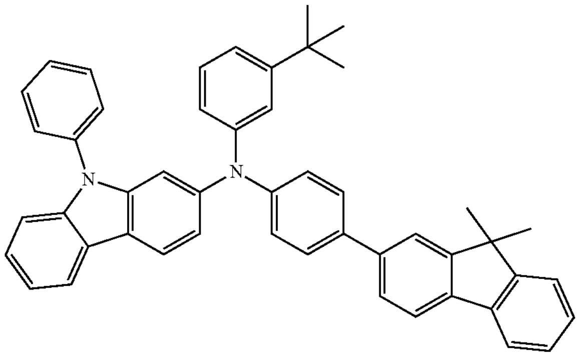
106
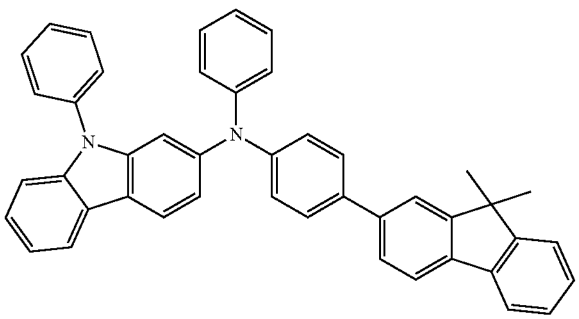
107
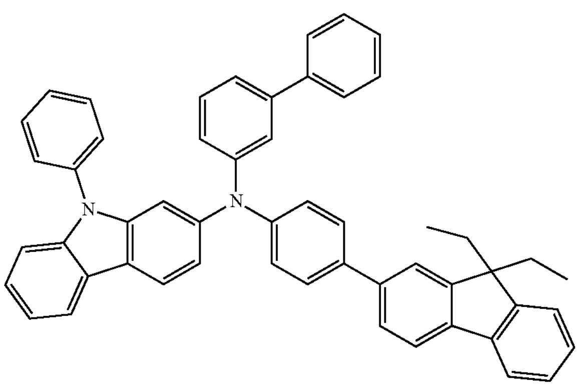
108
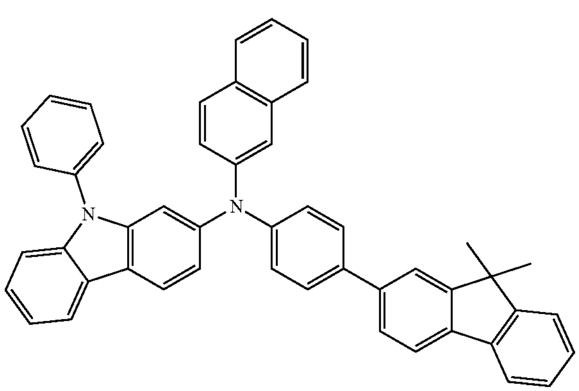
-continued
109
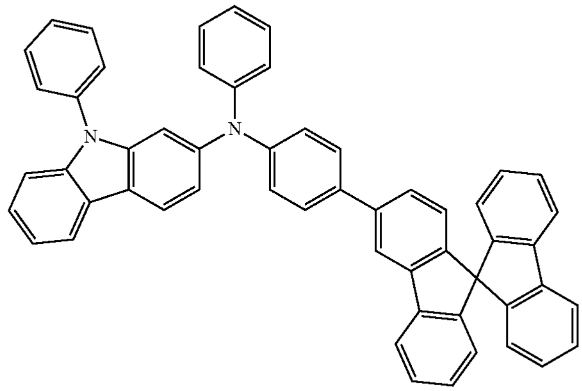
110
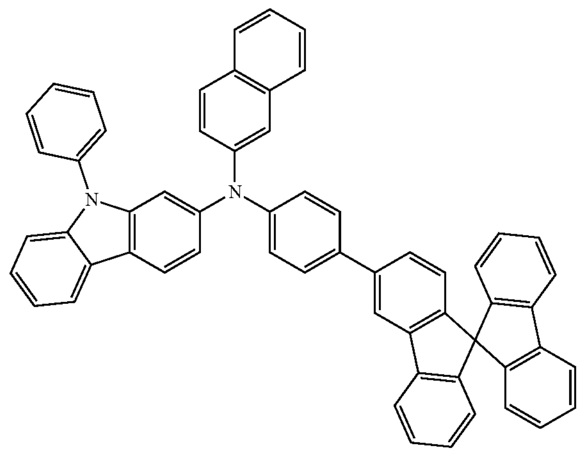
111
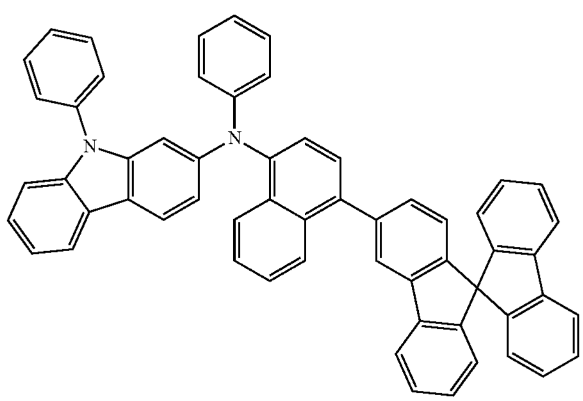

-continued
112
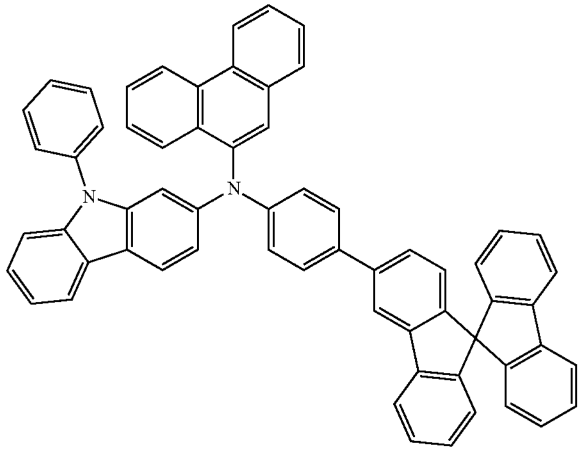
113
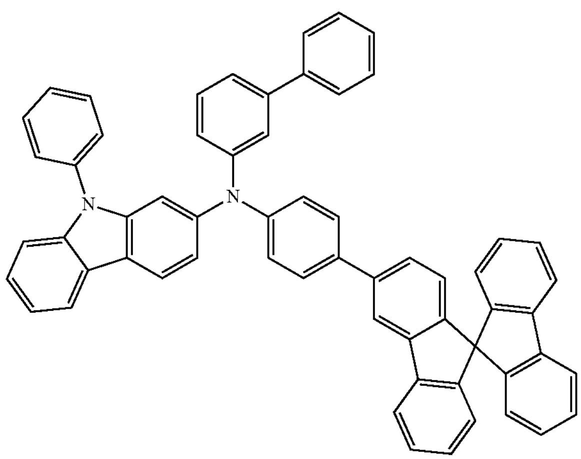
114
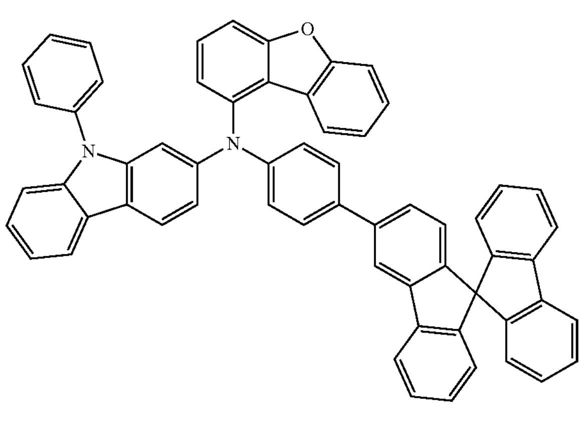
-continued
115
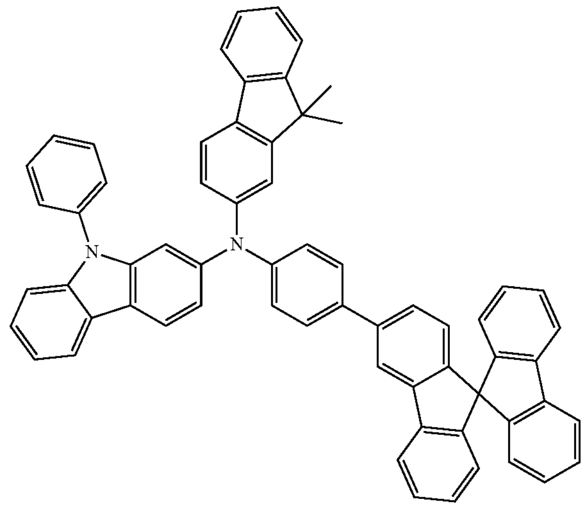
116
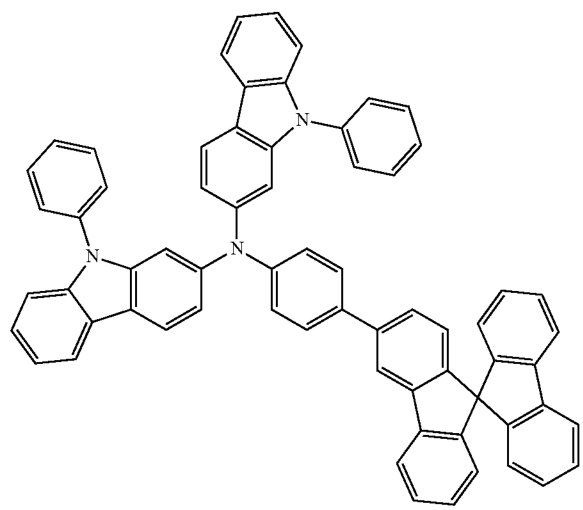
117
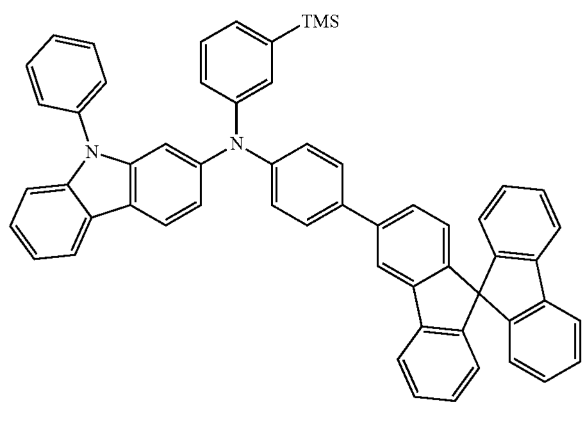

-continued
118
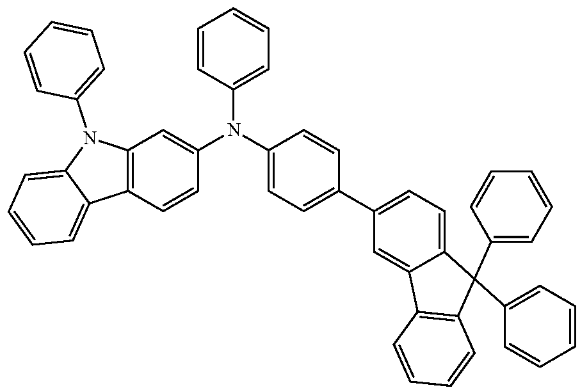
119
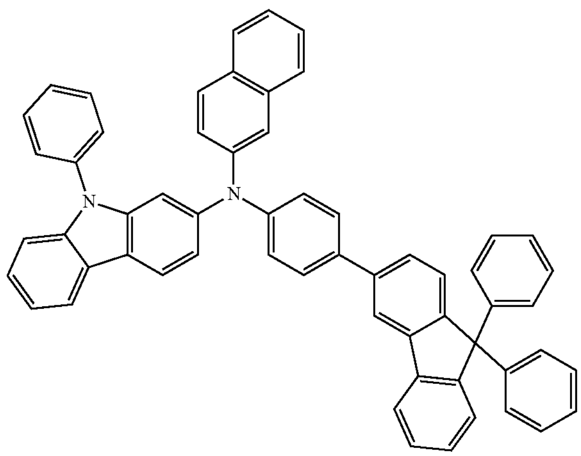
120
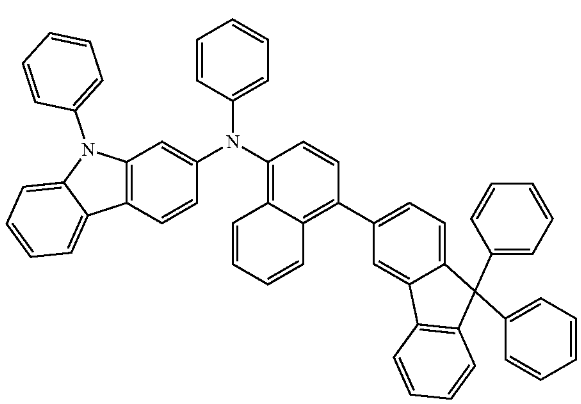
-continued
121
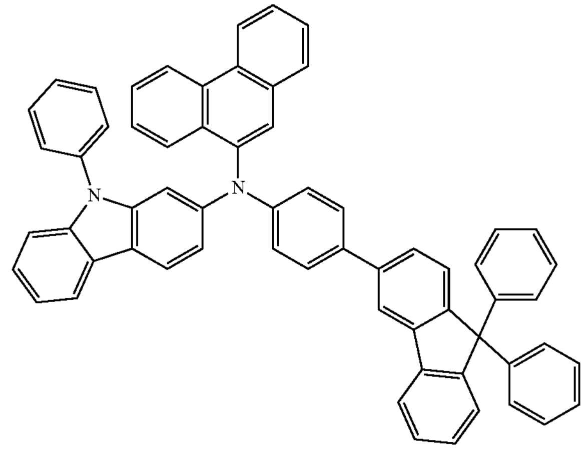
122
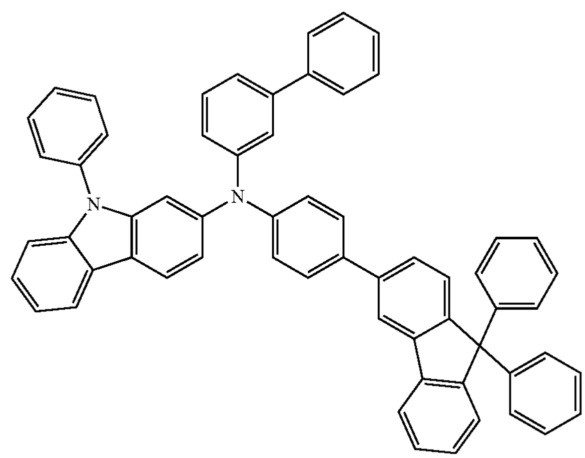
123
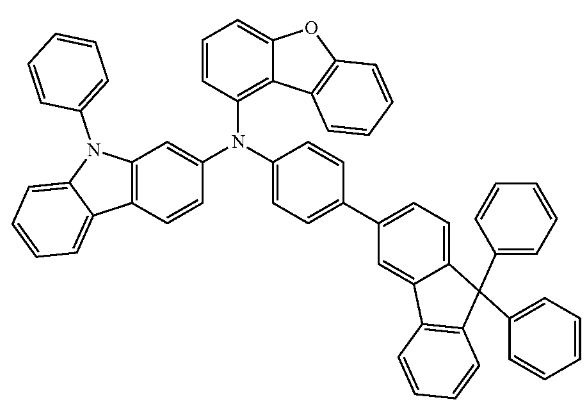

-continued
124
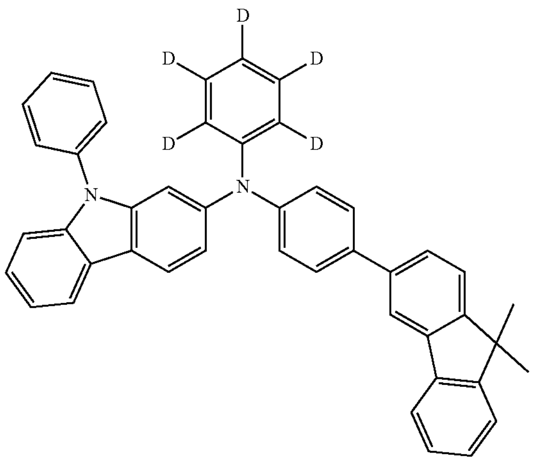
125
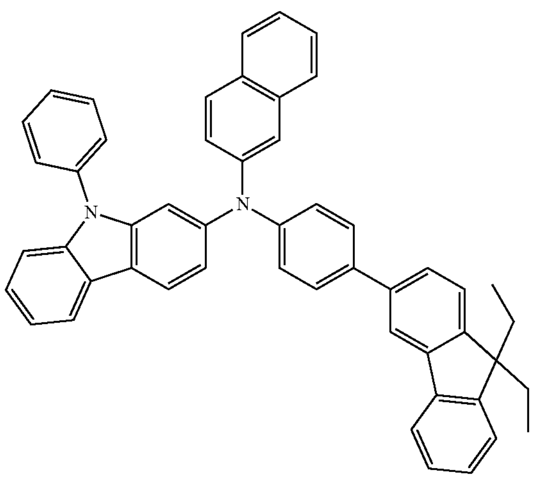
126
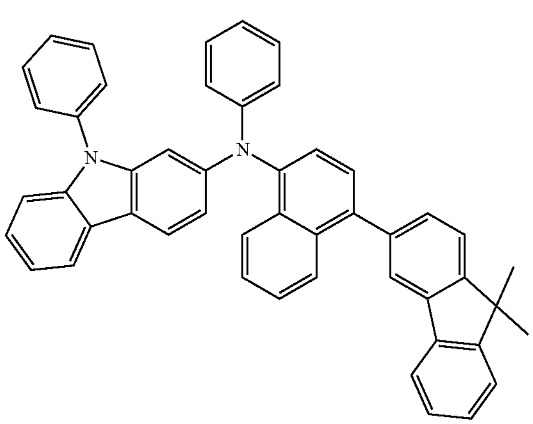
127
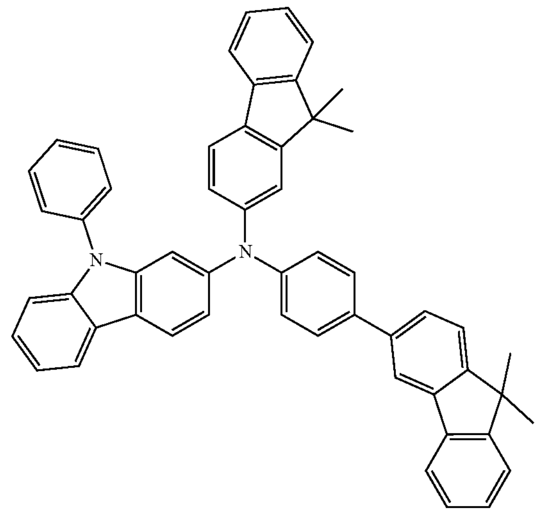
128
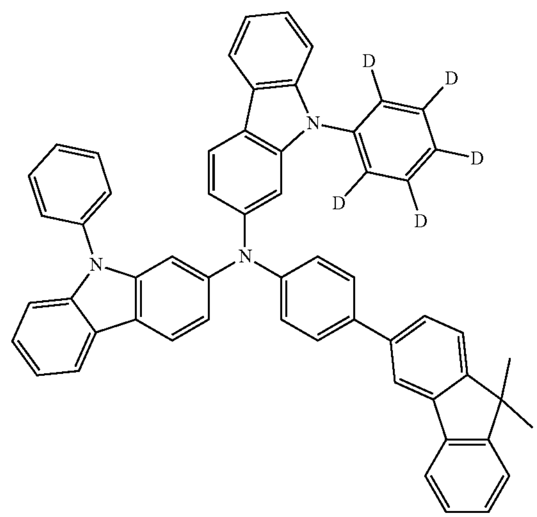
129
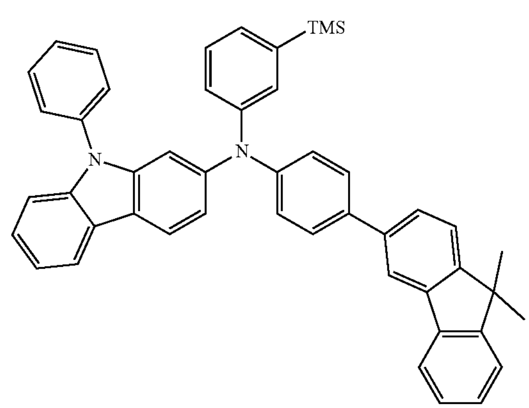

130
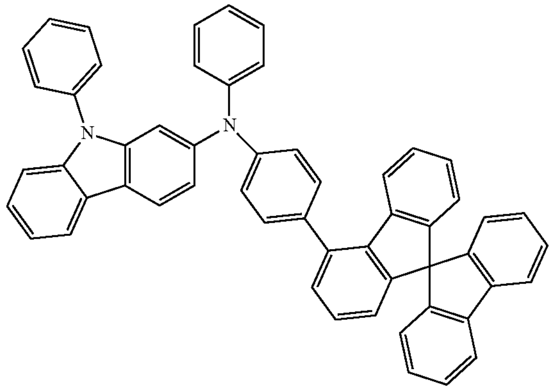
131
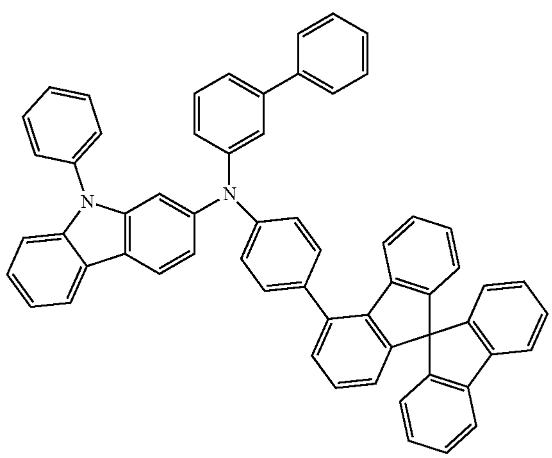
132
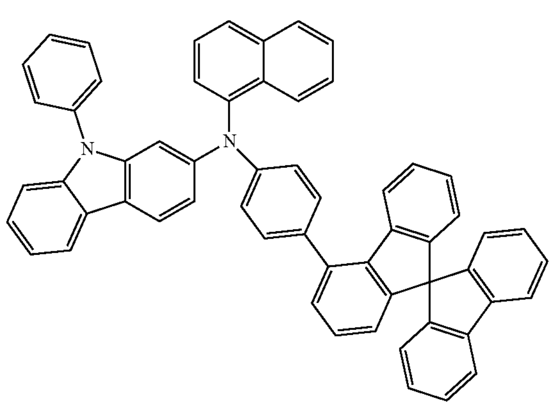
133
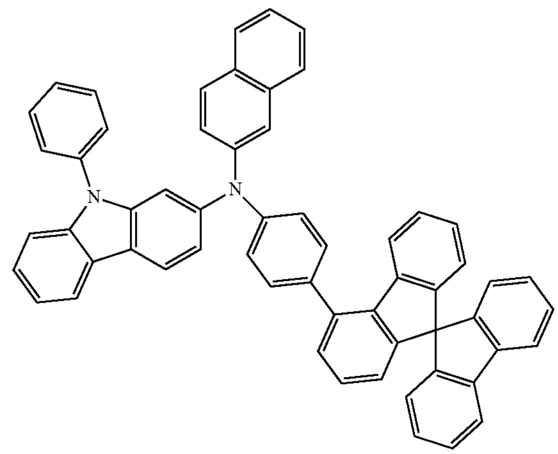
134
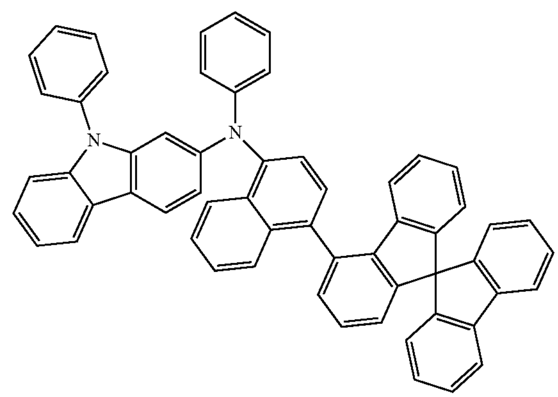
135
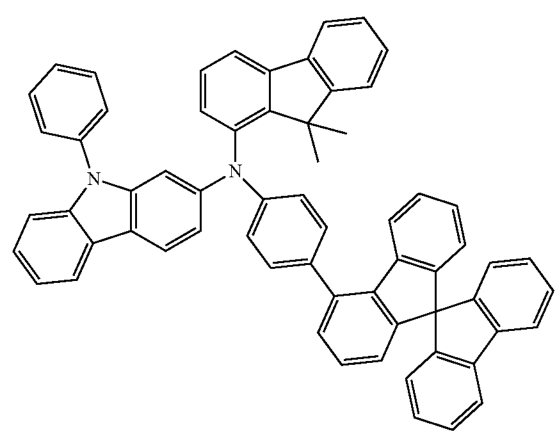

-continued
136
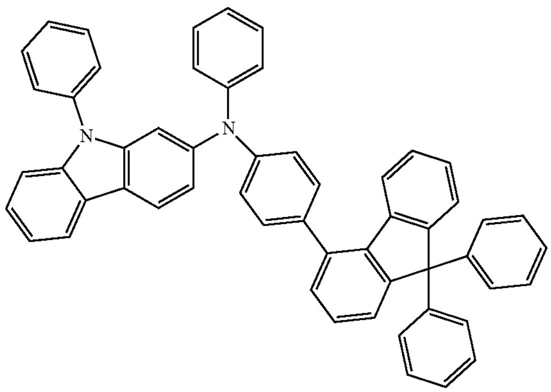
137
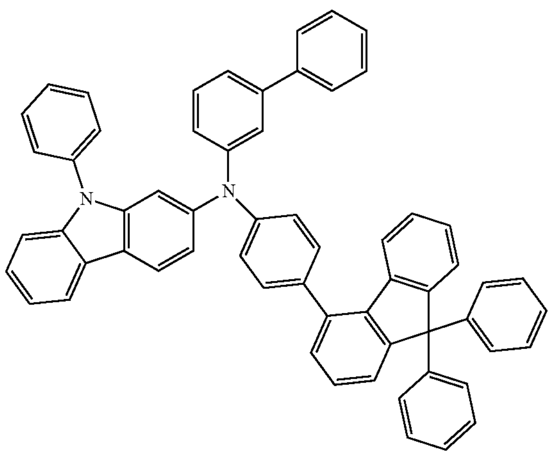
138
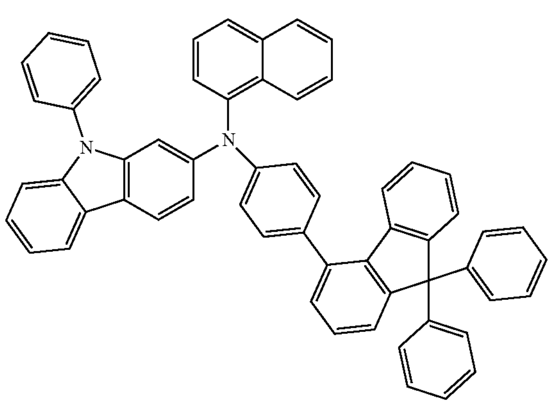
-continued
139
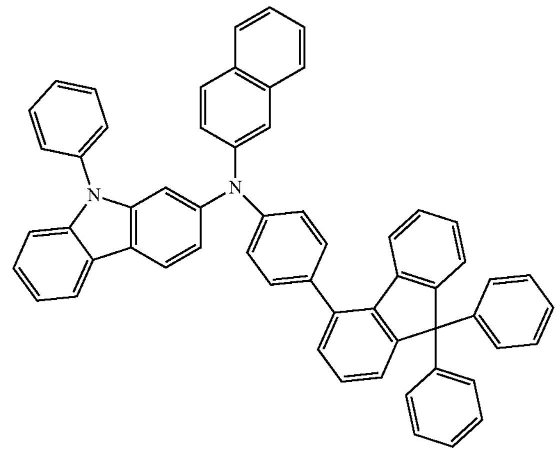
140
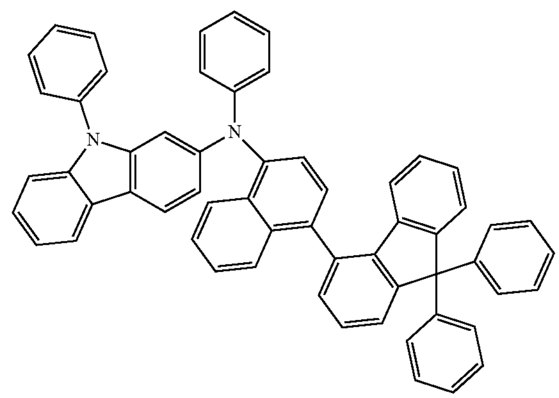
141
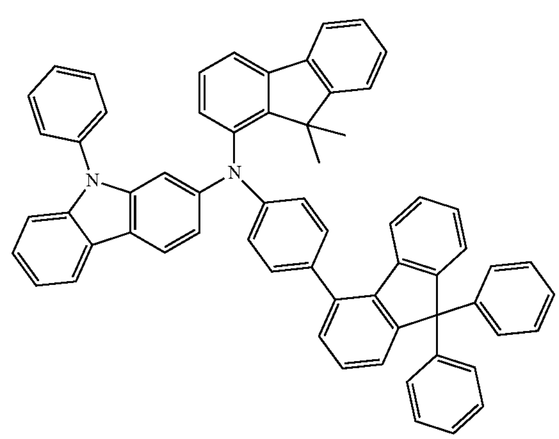

142
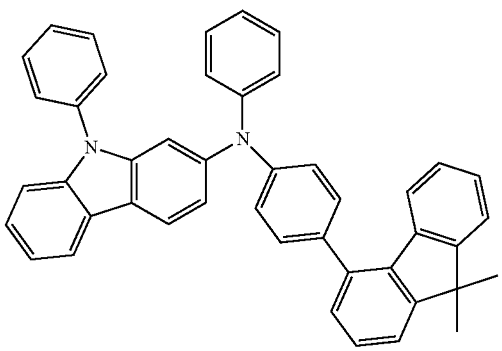
143
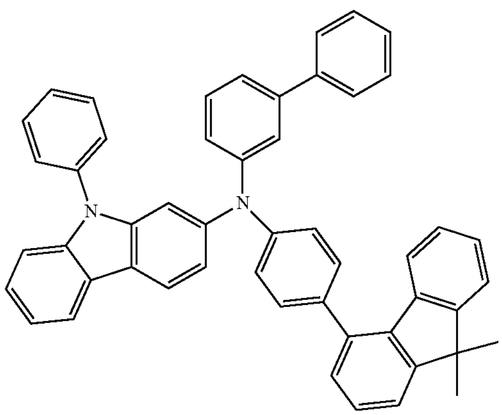
144
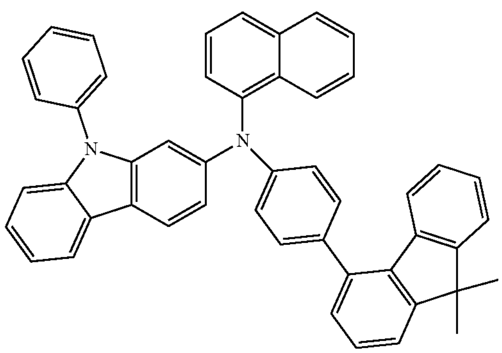
145
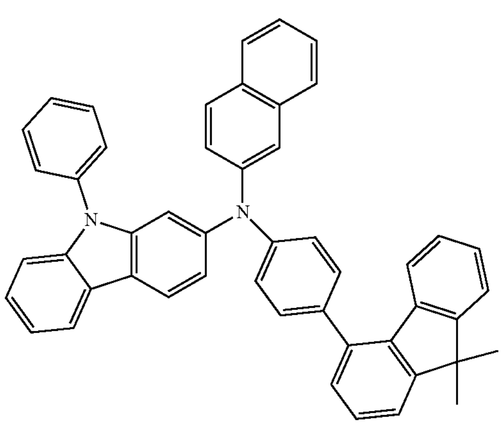
146
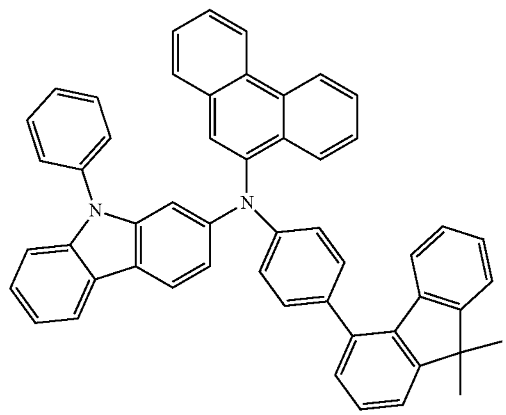
147
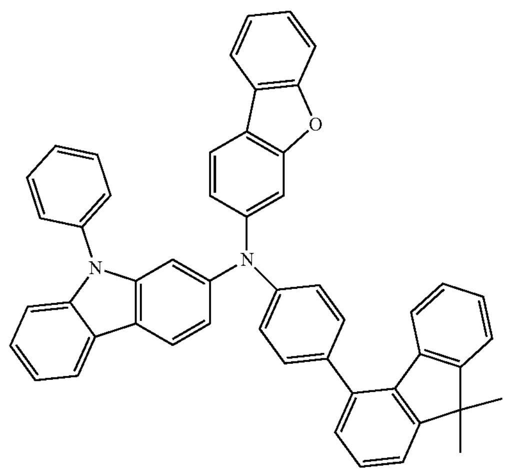
148
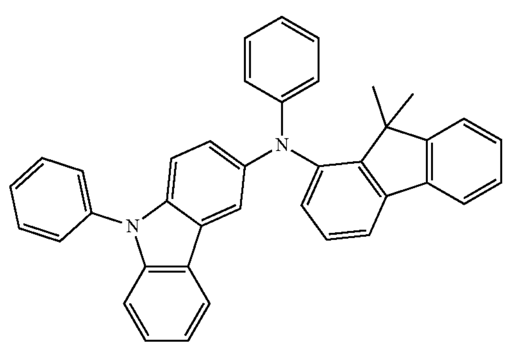

-continued
149
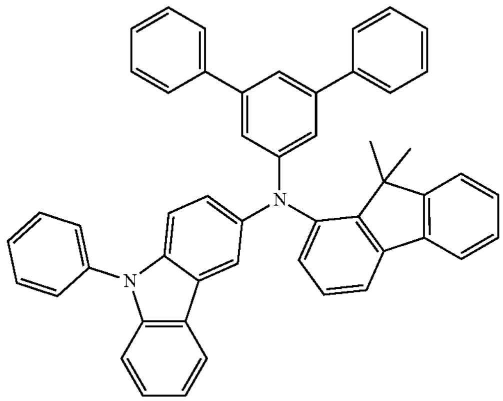
150
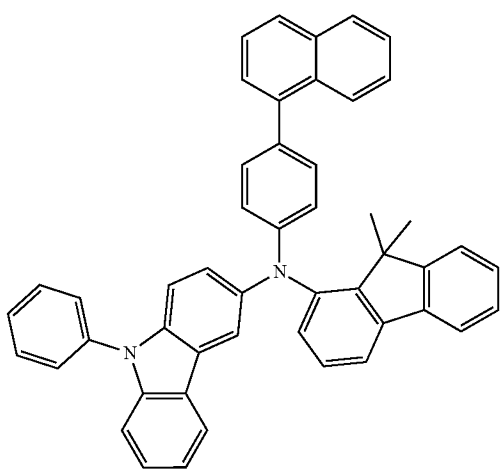
151
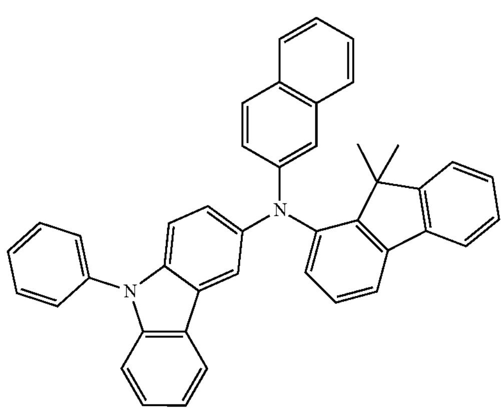
-continued
152
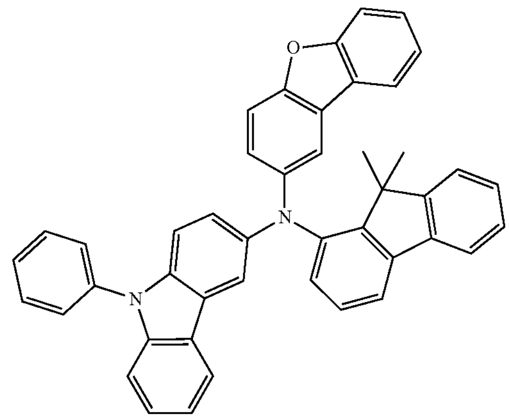
153
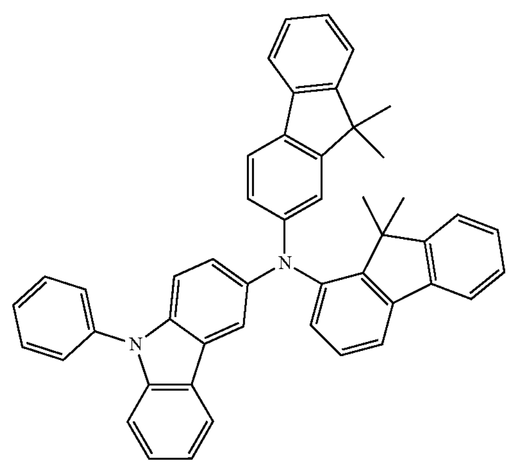
154
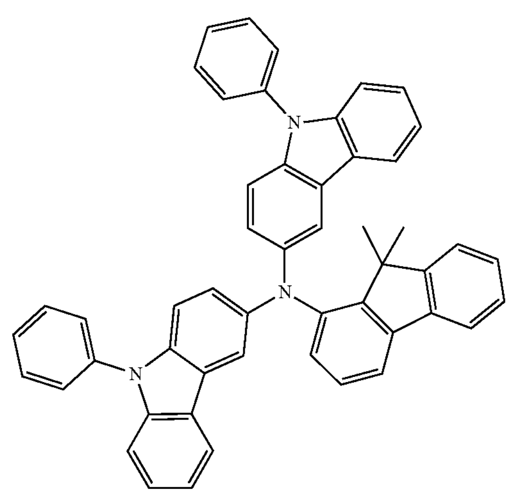

-continued
155
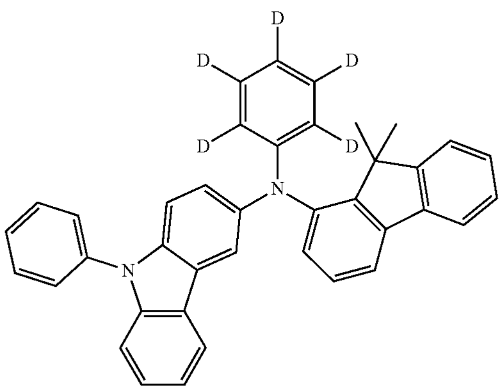
156
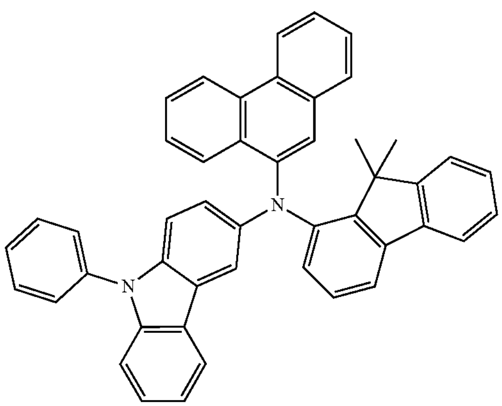
157
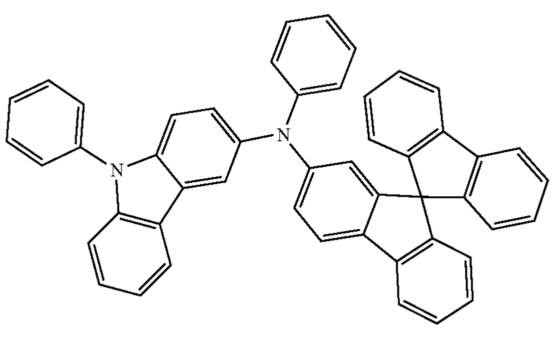
158
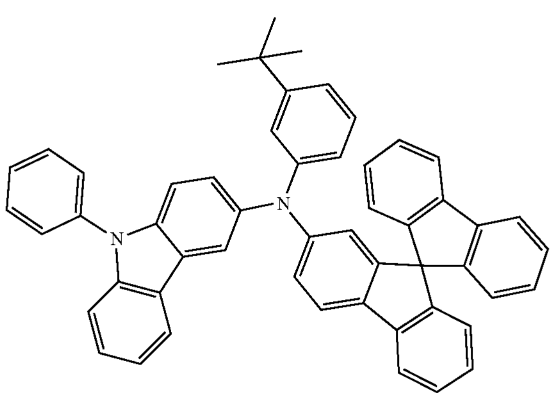
-continued
159
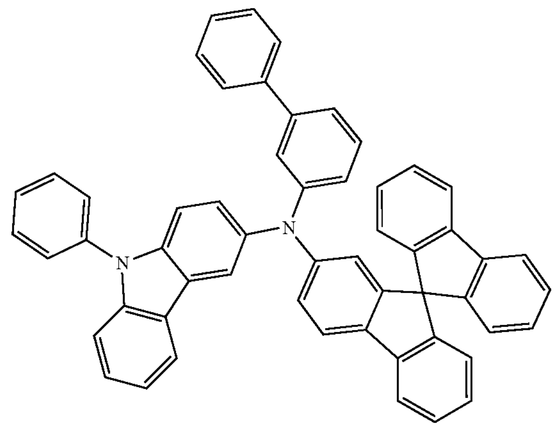
160
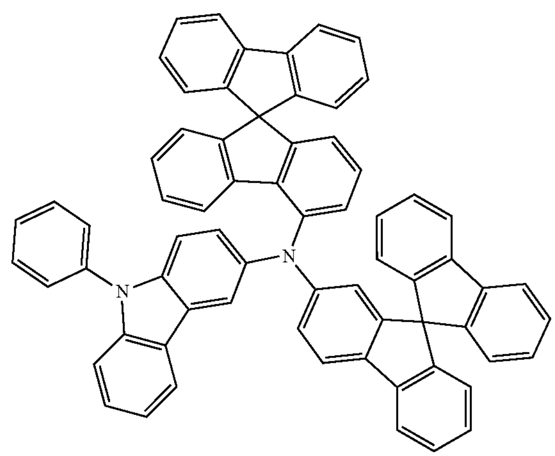
161
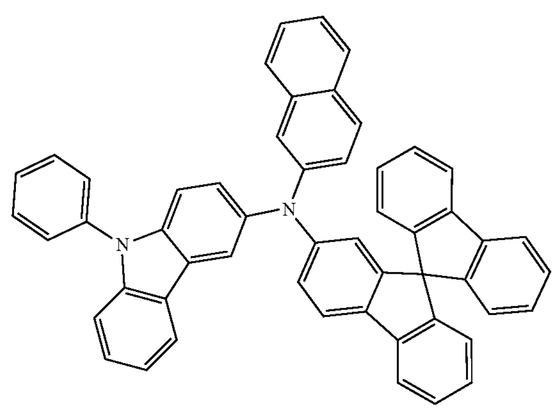

162
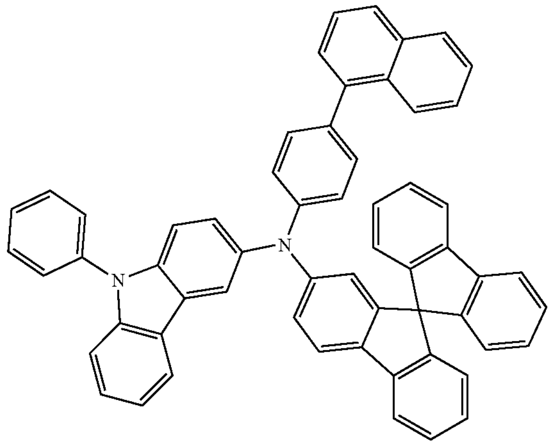
163
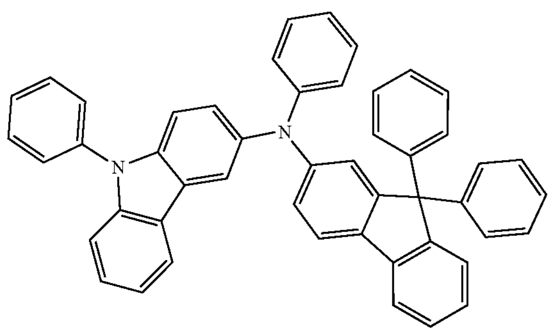
164
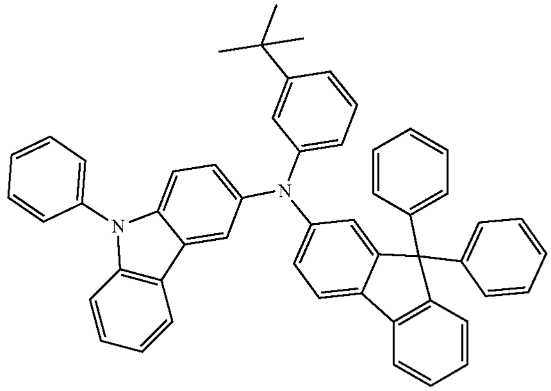
165
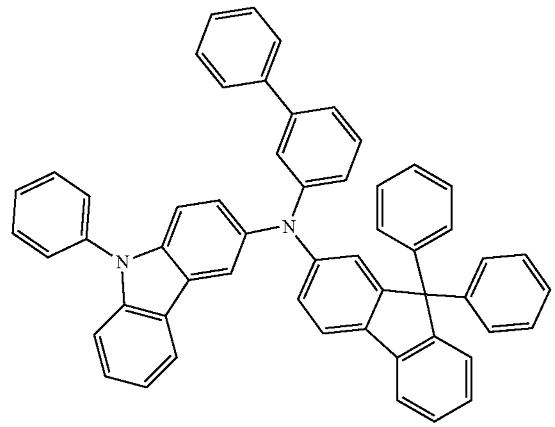
166
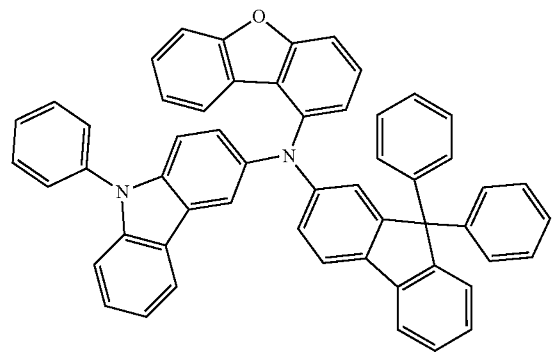
167
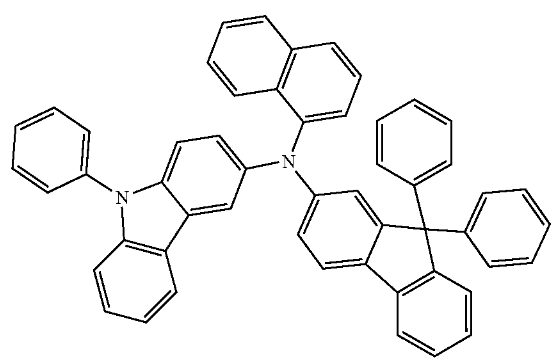
168
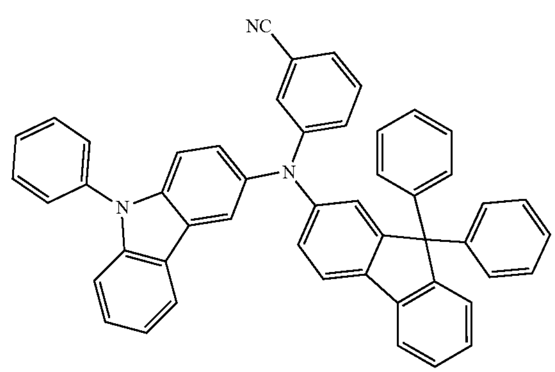

-continued
169
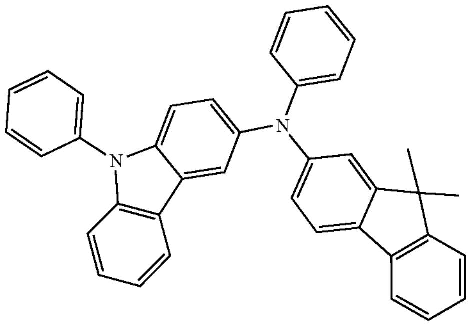
170
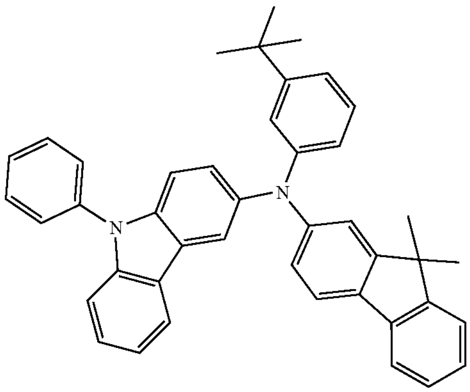
171
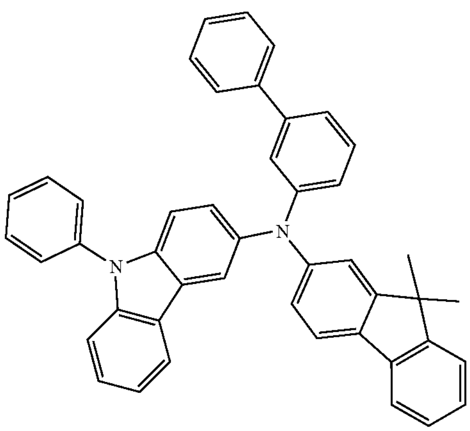
172
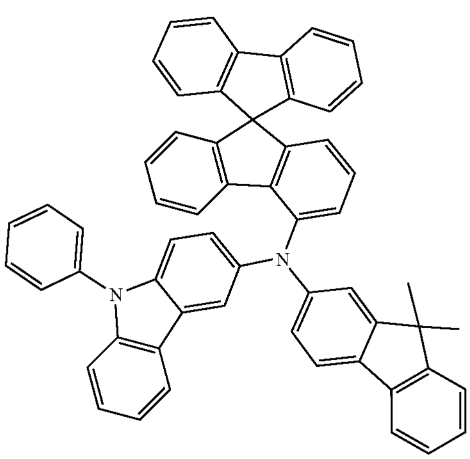
-continued
173
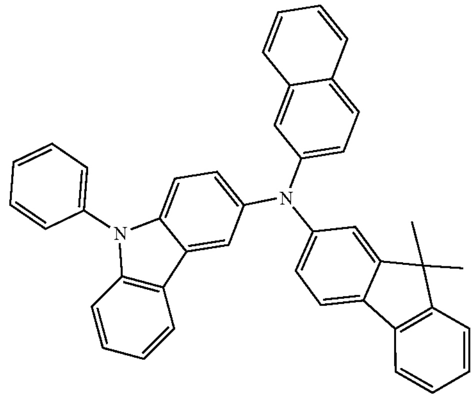
174
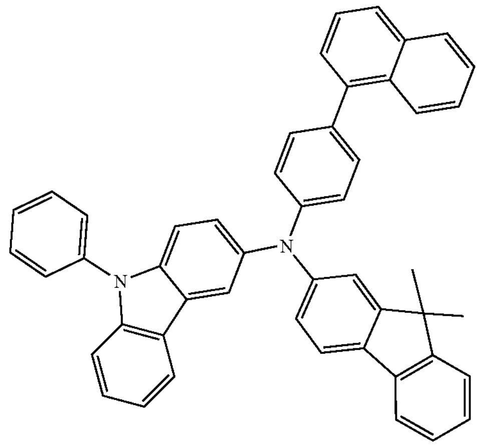
175
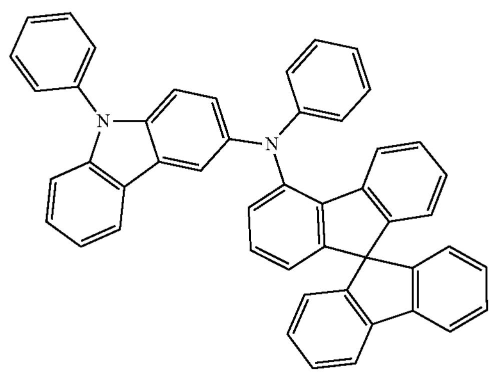
176
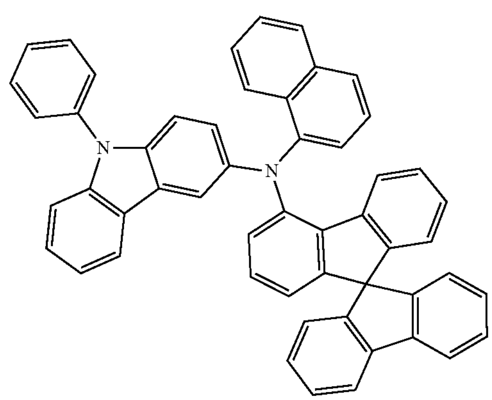

-continued
177
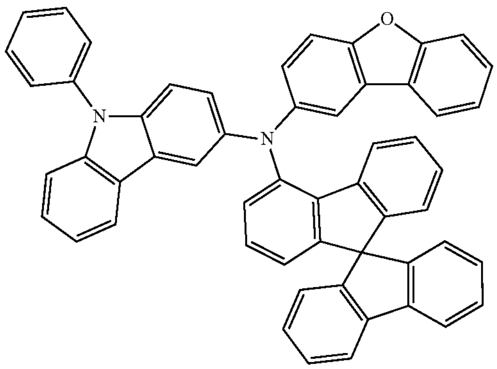
178
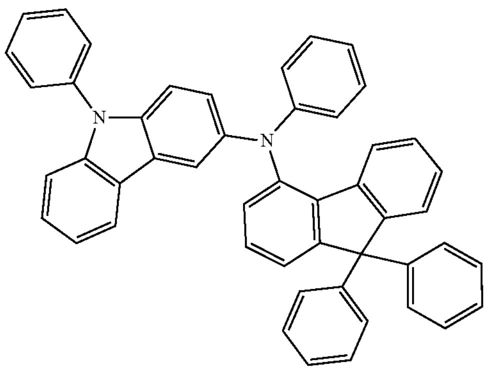
179
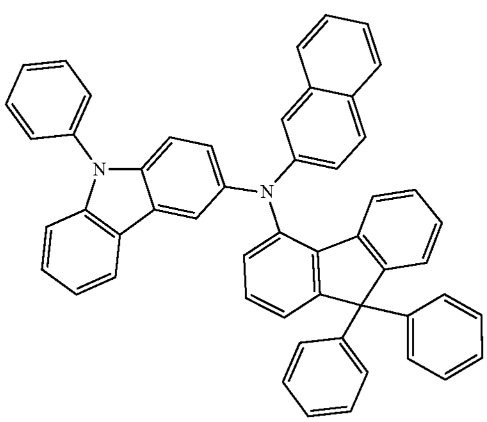
180
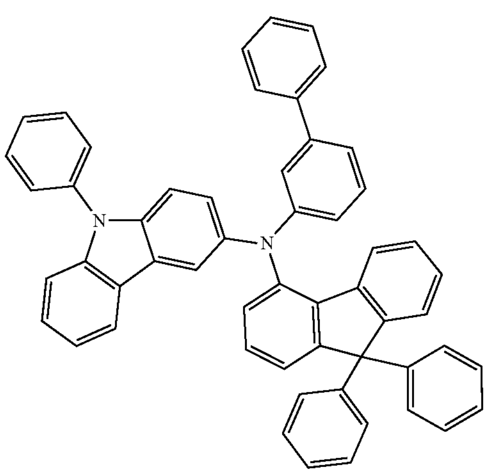
-continued
181
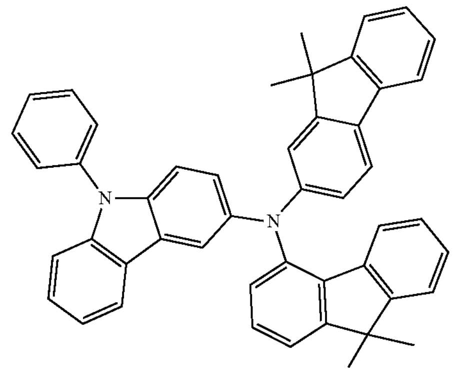
182
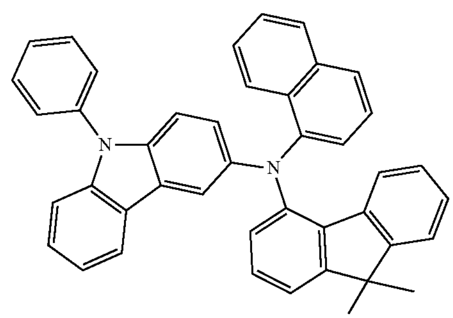
183
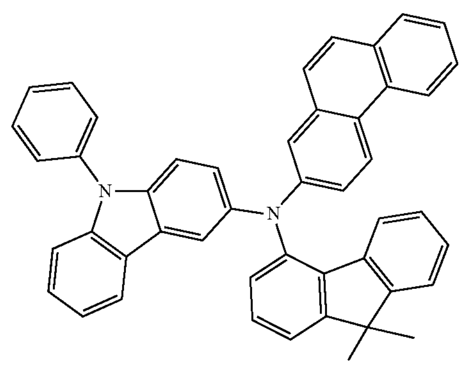
184
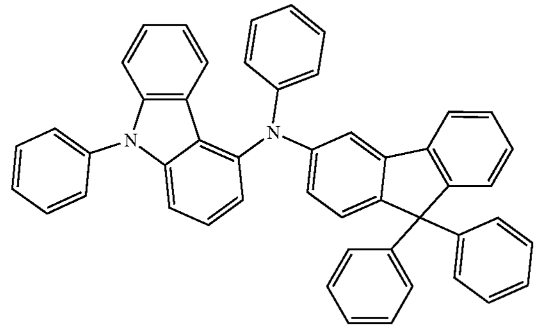

-continued
185
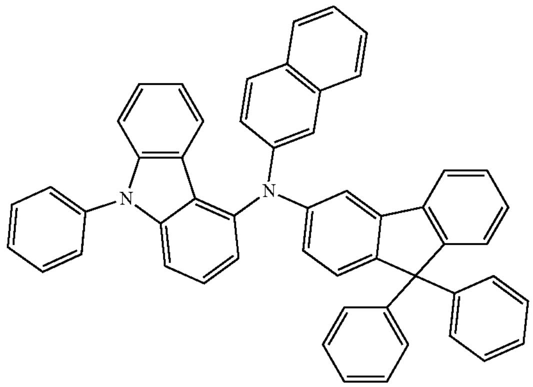
186
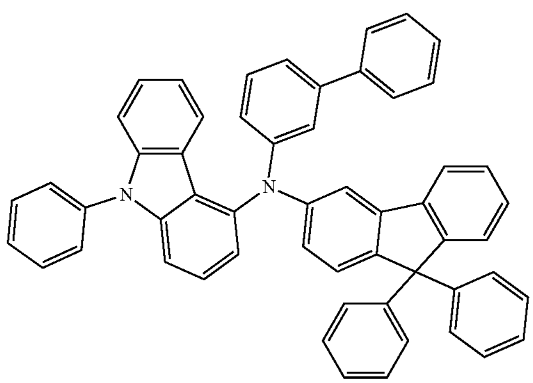
187
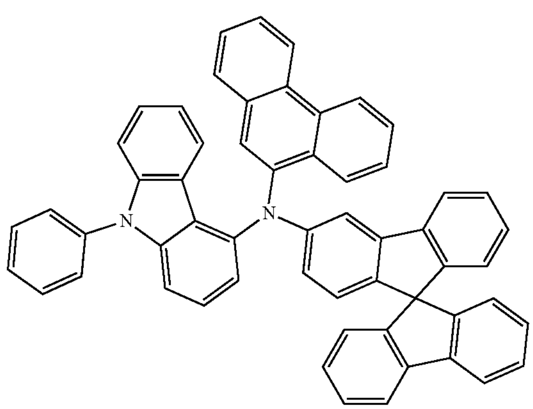
-continued
188
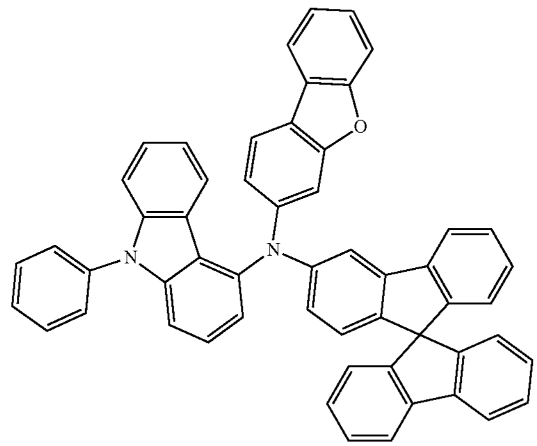
189
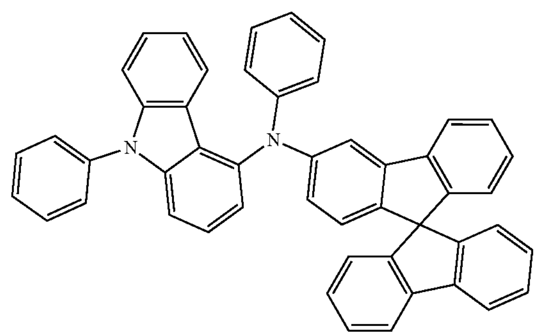
190
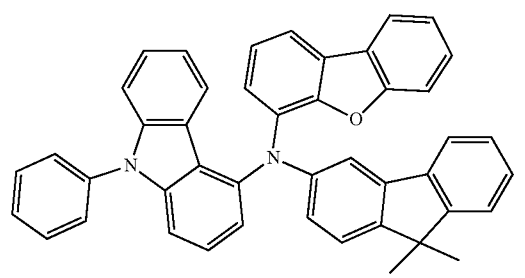
191
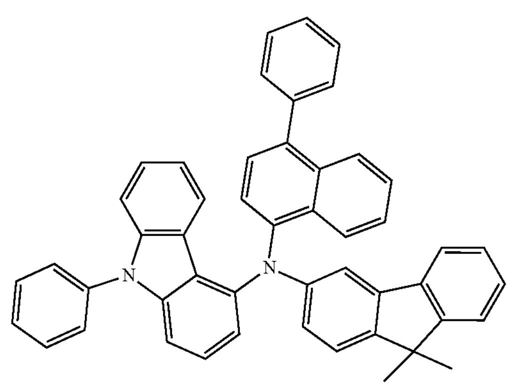

192
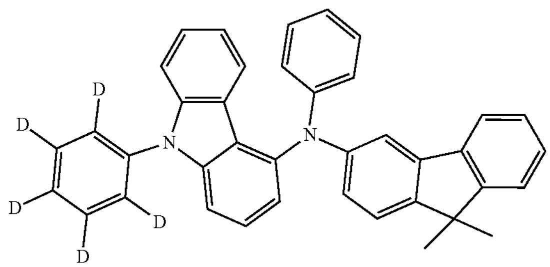
193
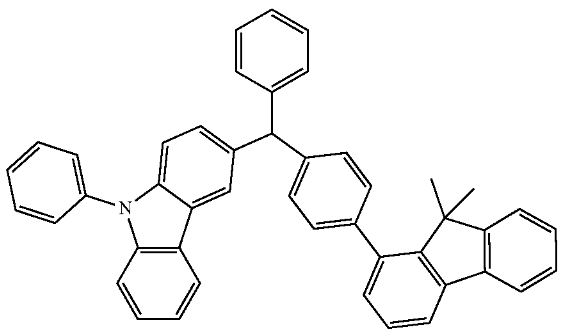
194
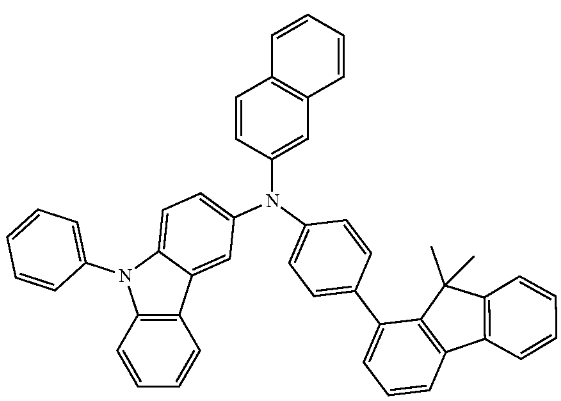
195
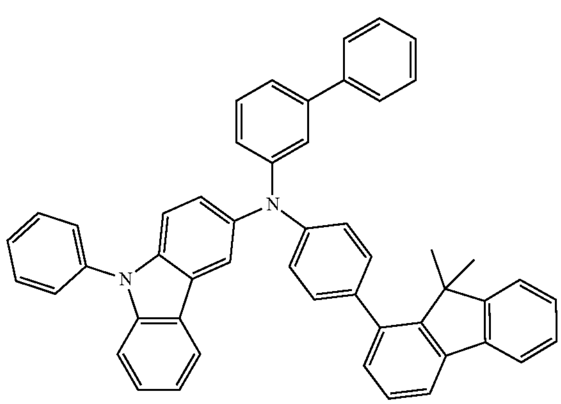
196
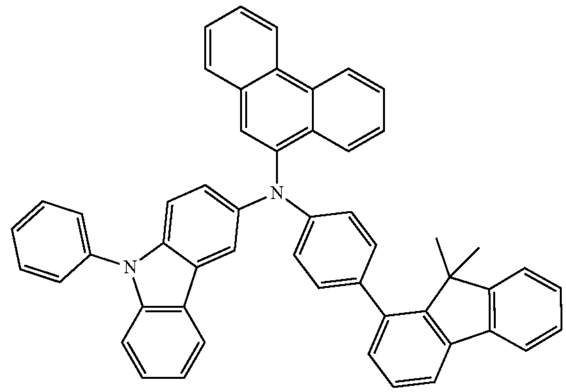
197
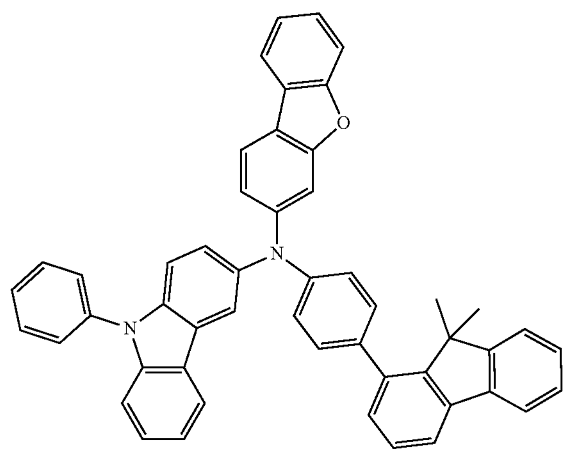
198
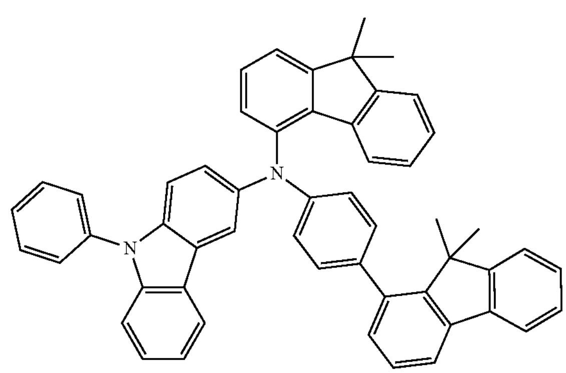

-continued
199
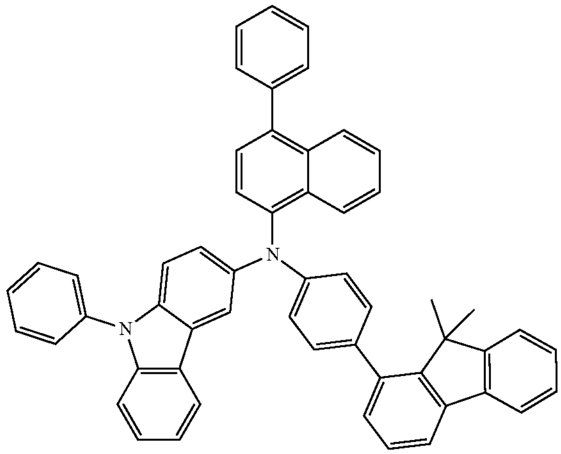
200
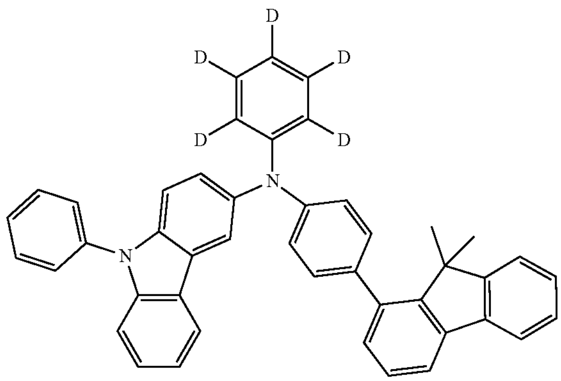
201
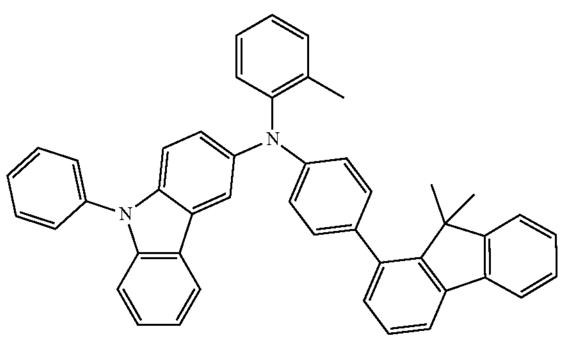
202
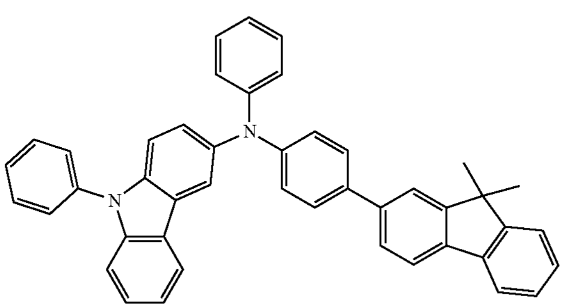
-continued
203
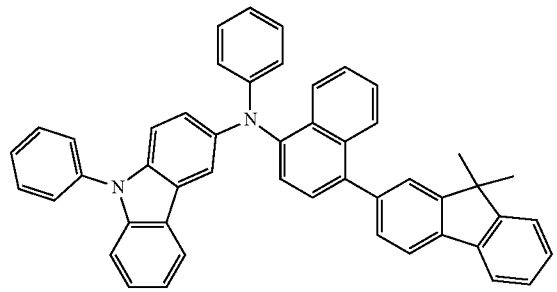
204
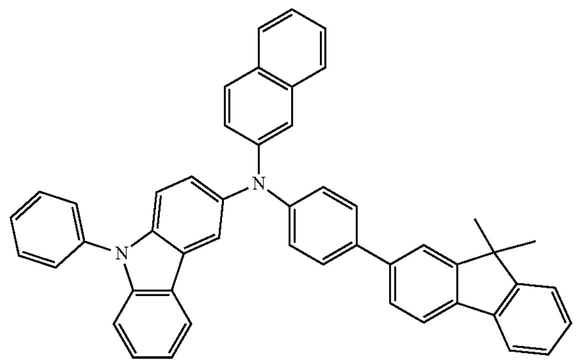
205
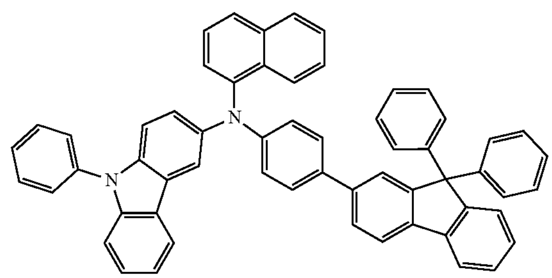
206
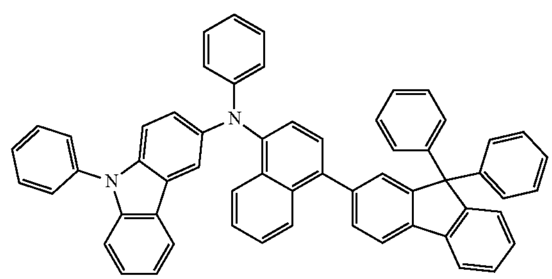
207
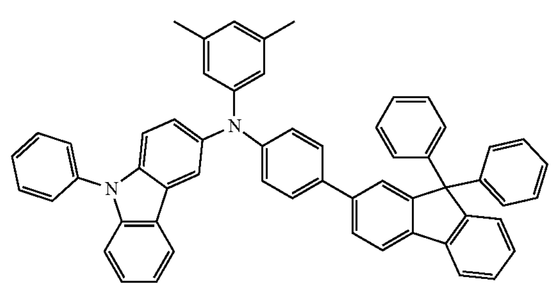

208
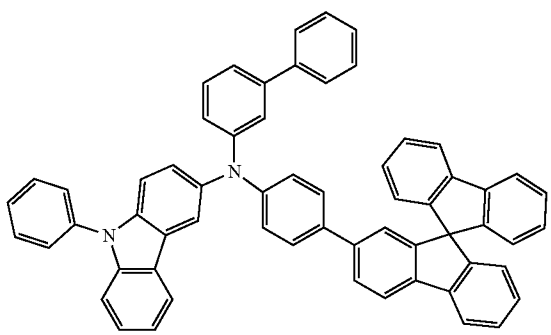
209
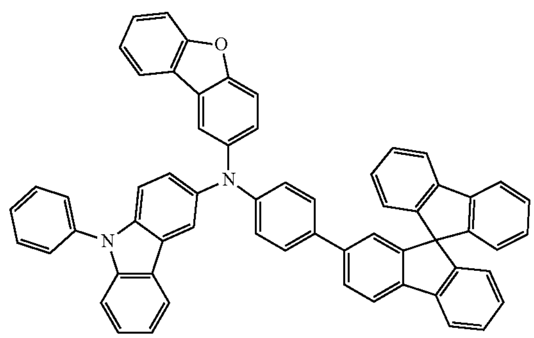
210
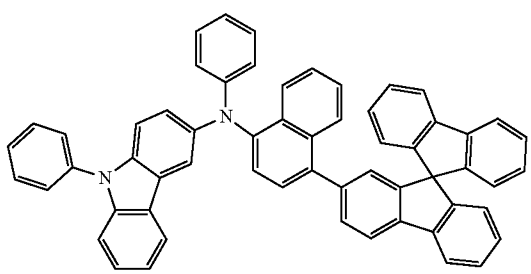
211
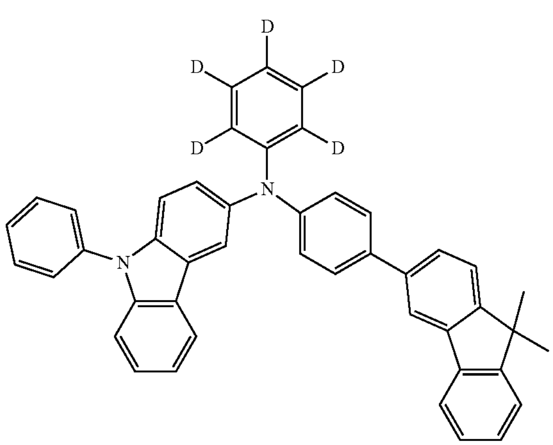
212
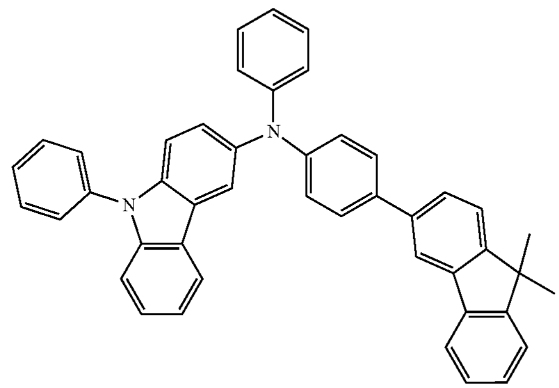
213
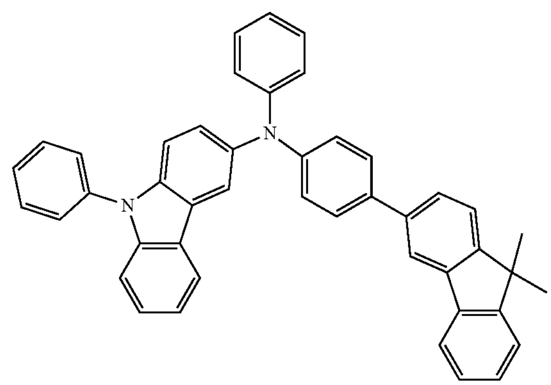
214
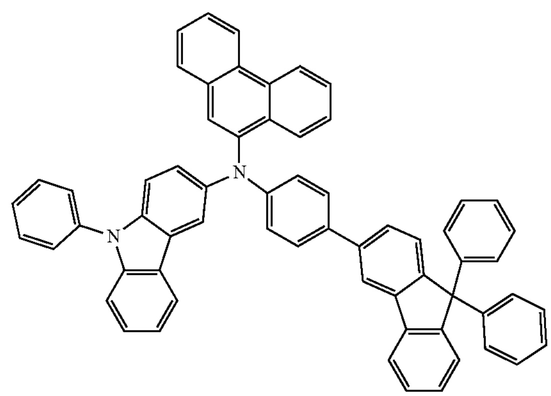
215
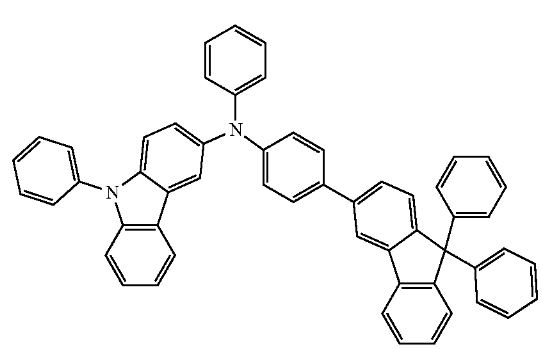

-continued
216
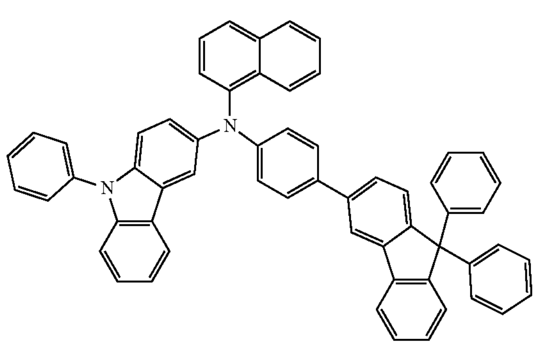
217
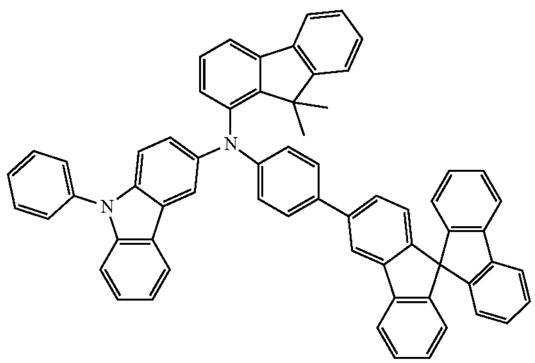
218
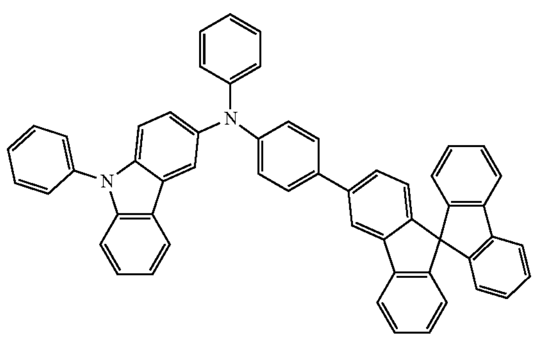
219
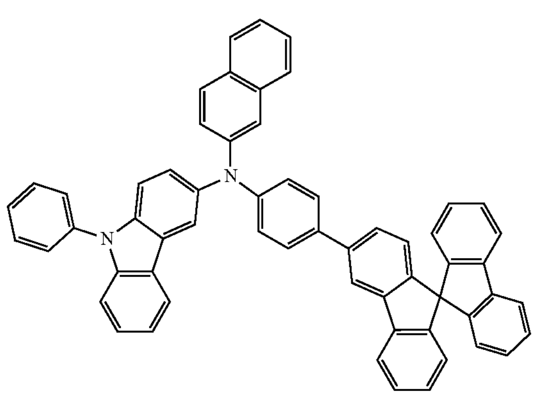
-continued
220
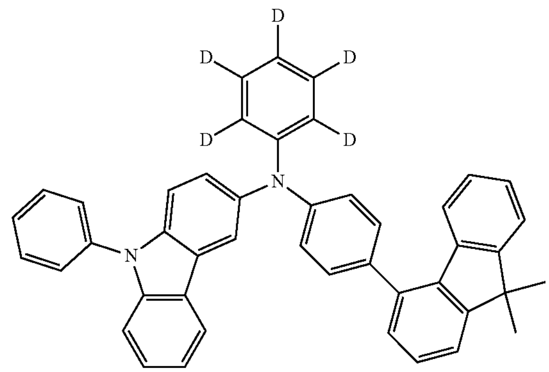
221
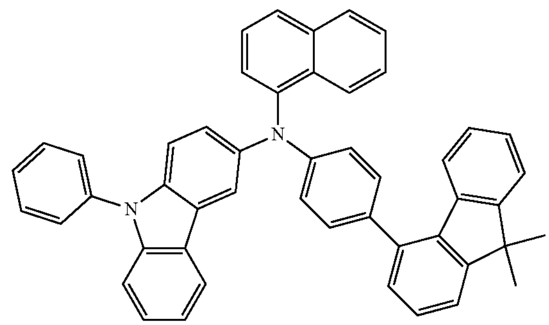
222
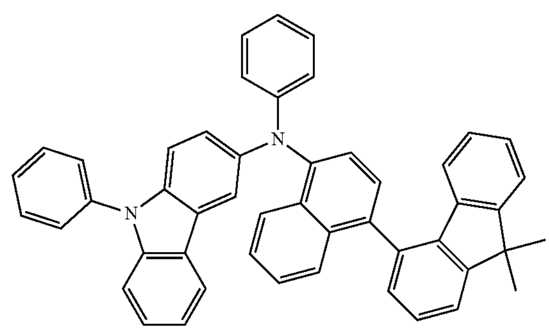
223
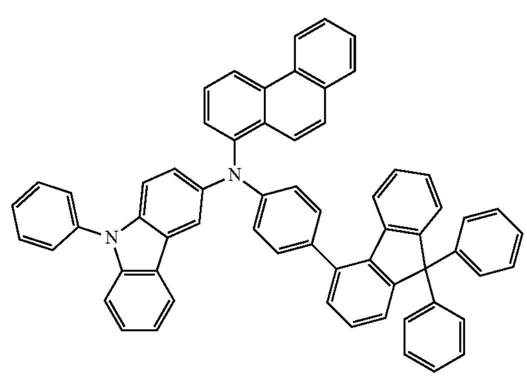

-continued
224
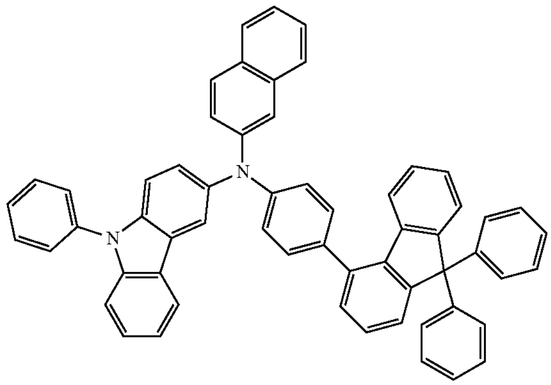
225
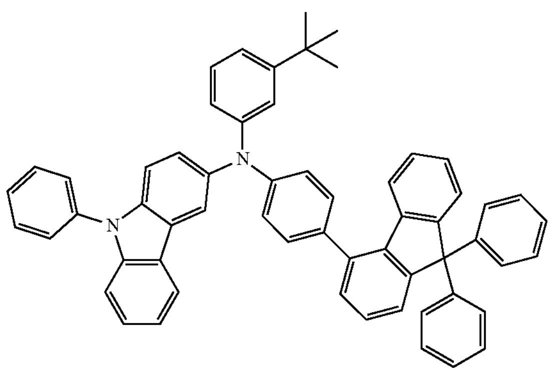
226
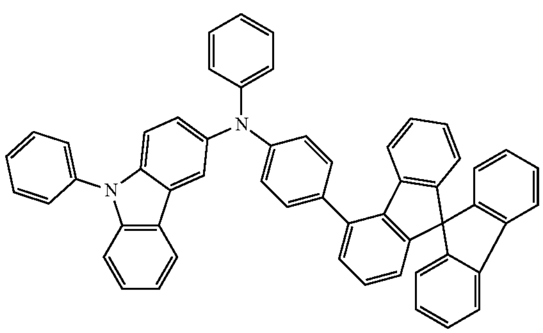
227
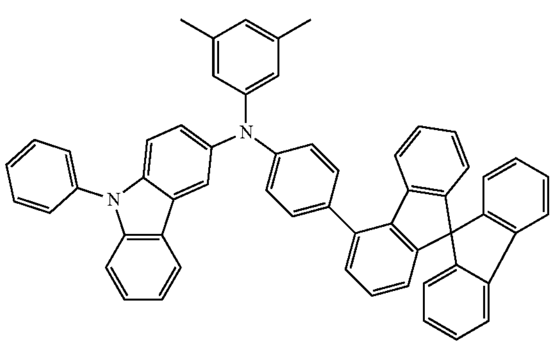
-continued
228
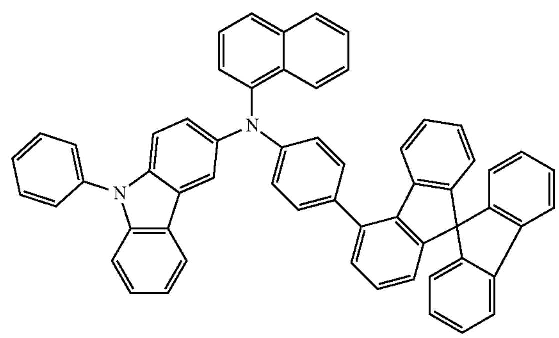
229
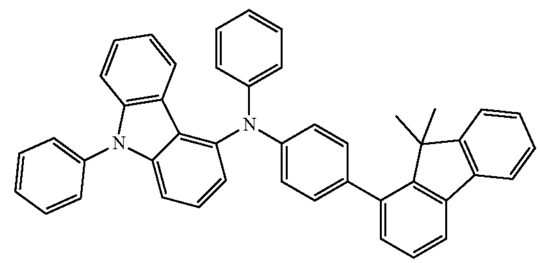
230
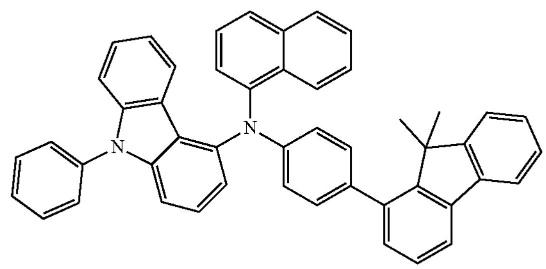
231
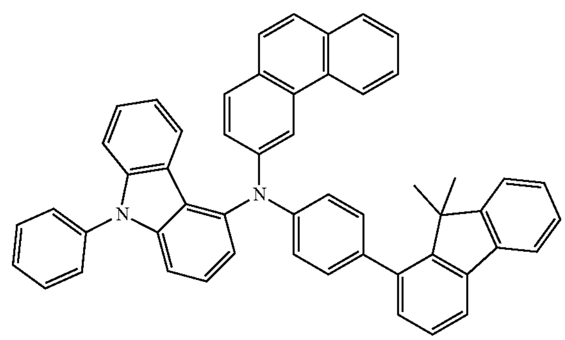
232
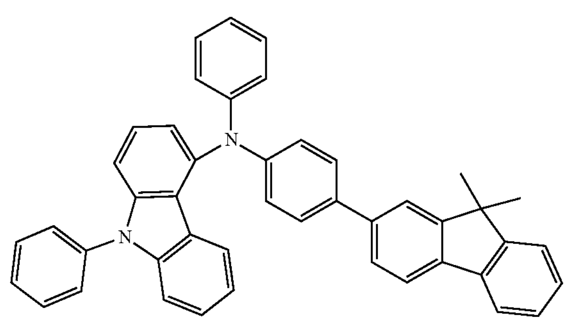

-continued
233
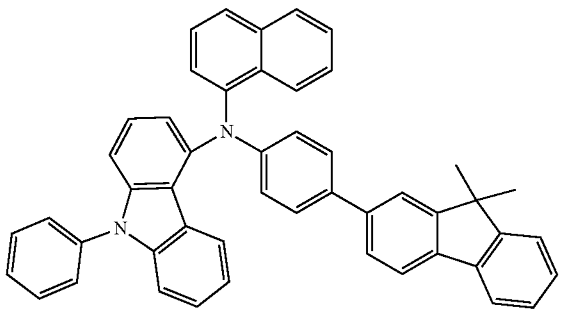
234
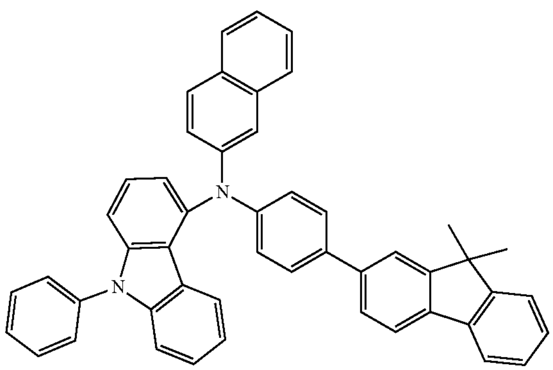
235
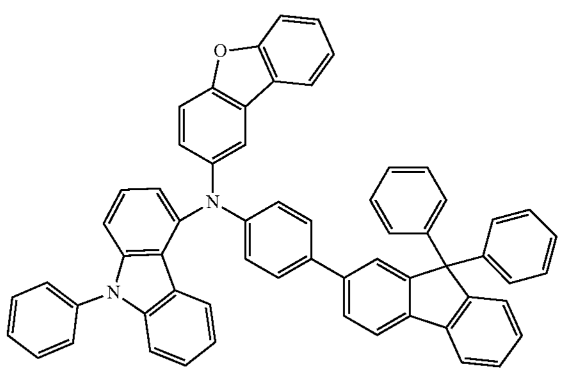
236
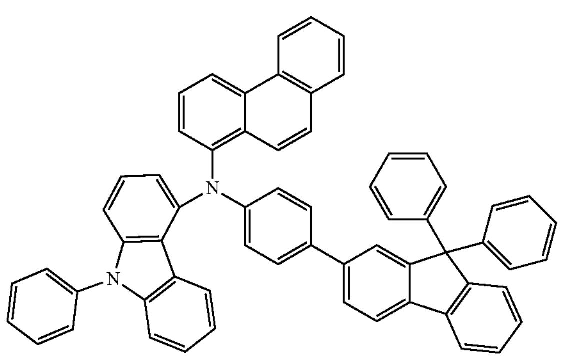
-continued
237
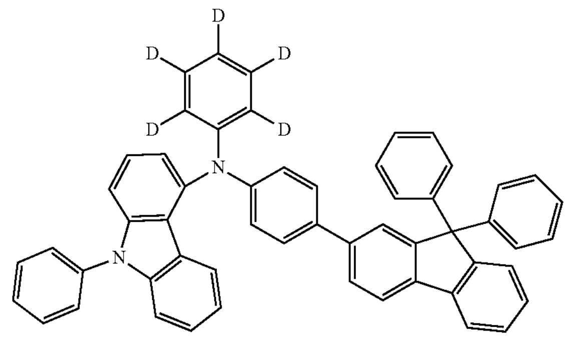
238
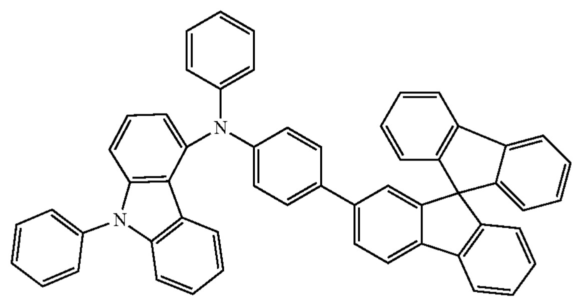
239
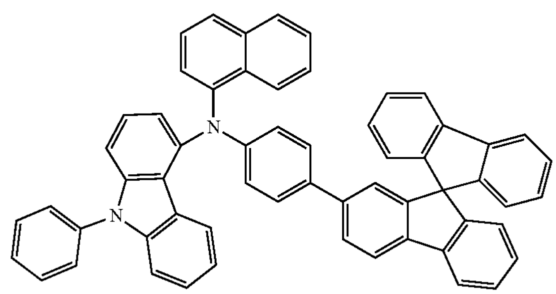
240
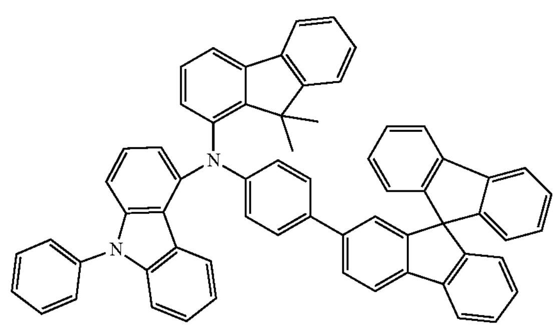

-continued
241
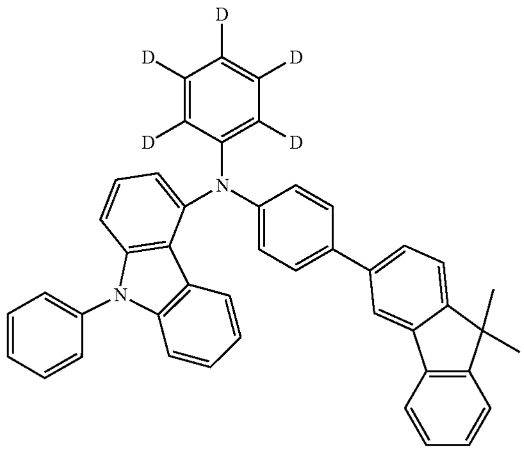
242
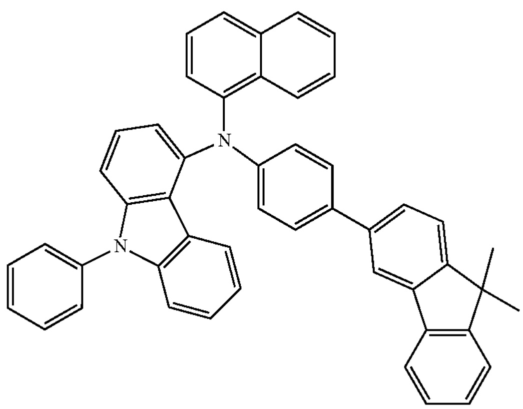
243
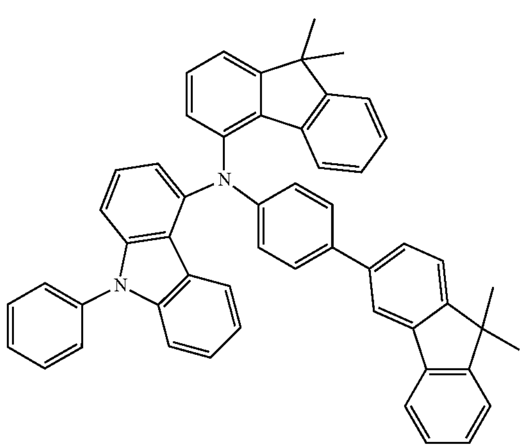
-continued
244
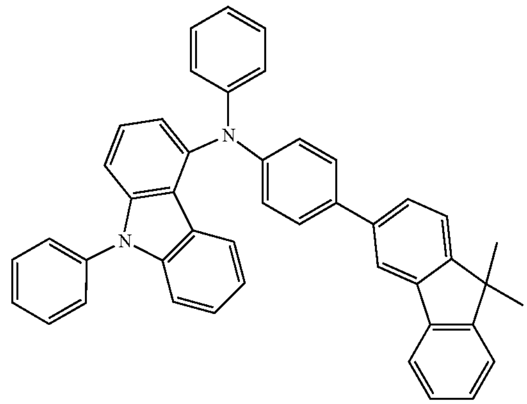
245
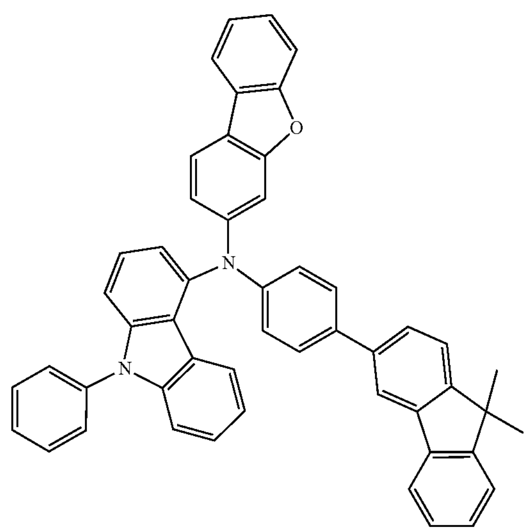
246
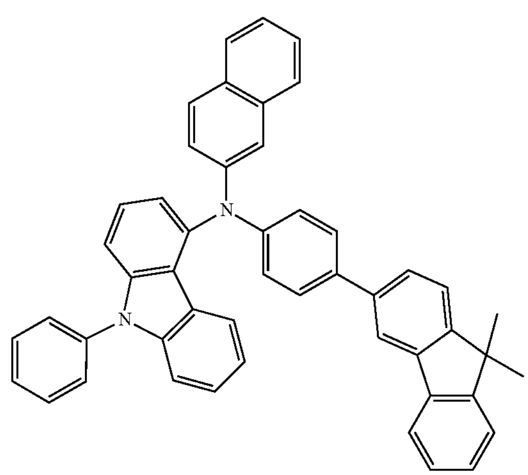

-continued
247
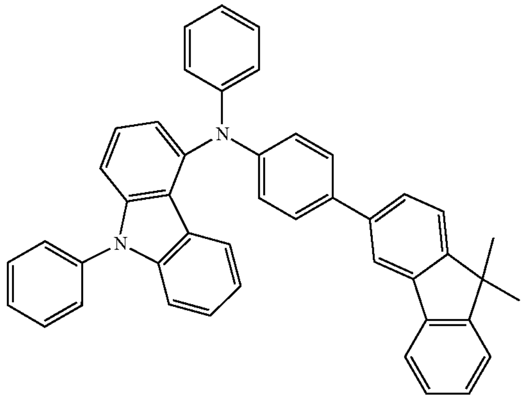
248
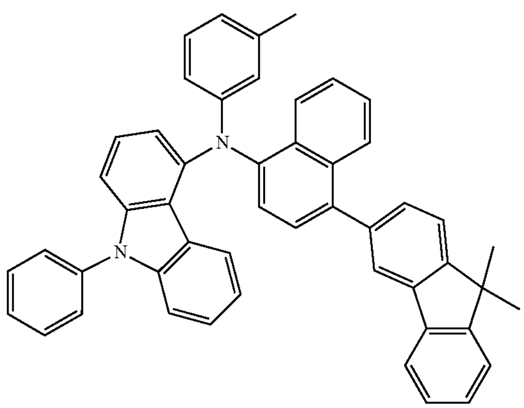
249
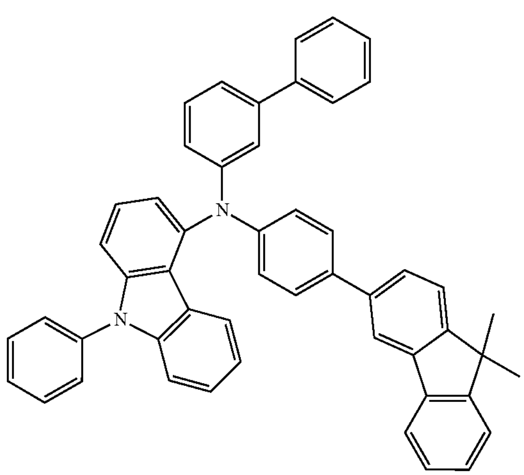
-continued
250
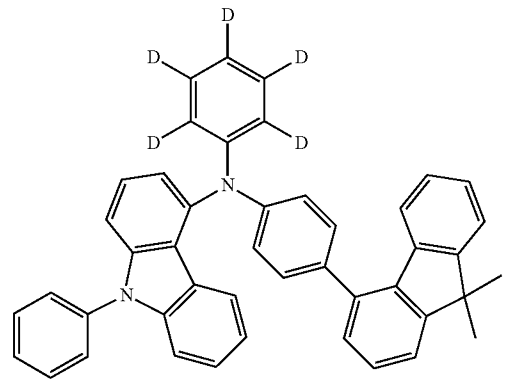
251
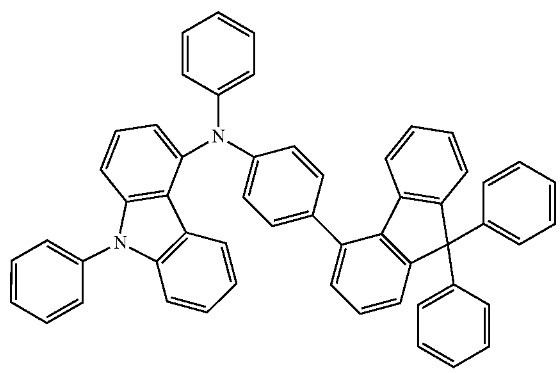
252
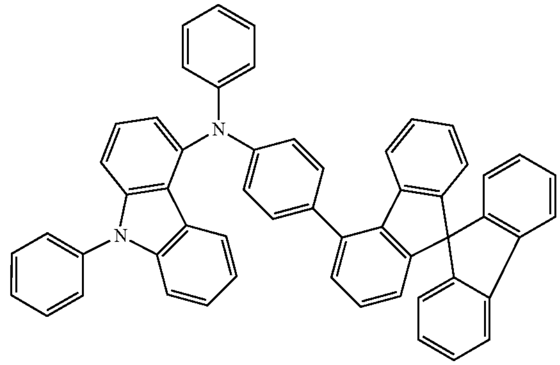

-continued

253

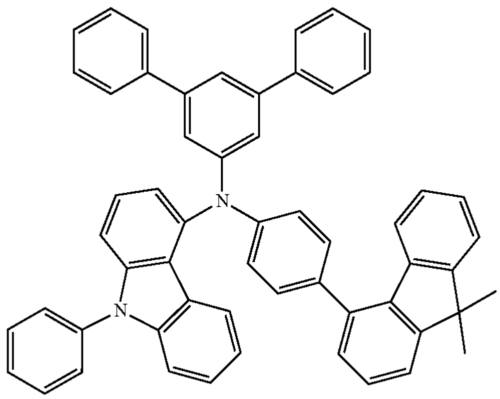

254

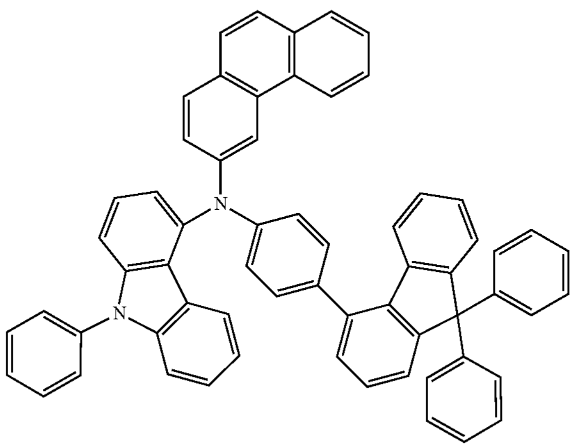

-continued

255

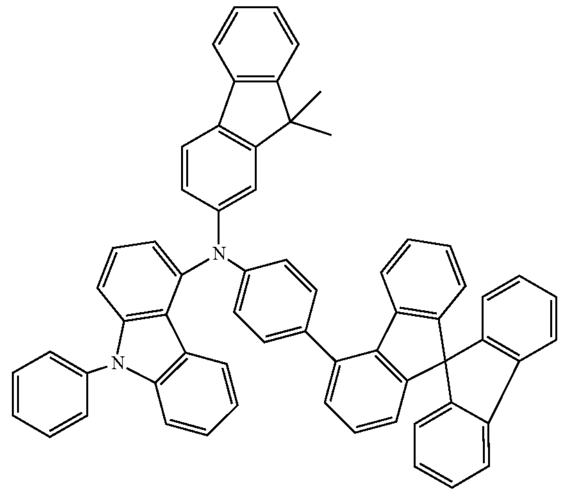

6. The organic light-emitting device according to claim 1, further comprising at least one selected from an electron injection layer, an electron transport layer, an electron blocking layer, a hole blocking layer and a hole auxiliary layer, in addition to the hole injection layer, the hole transport layer and the light emitting layer, between the first electrode and the second electrode.

7. The organic light-emitting device according to claim 6, wherein at least one selected from the layers is formed by a deposition process or a solution process.

8. The organic light-emitting device according to claim 1, wherein the organic light-emitting device is used for a display or lighting system selected from flat panel displays, flexible displays, monochromatic or white flat panel lighting systems, monochromatic or white flexible lighting systems, vehicle displays, and displays for virtual or augmented reality.

* * * * *